US012655167B2

(12) United States Patent
Lee et al.

(10) Patent No.: US 12,655,167 B2
(45) Date of Patent: Jun. 16, 2026

(54) LIGHT-EMITTING DEVICE INCLUDING ORGANOMETALLIC COMPOUND, ELECTRONIC APPARATUS INCLUDING THE LIGHT-EMITTING DEVICE, AND ORGANOMETALLIC COMPOUND

(71) Applicant: Samsung Display Co., Ltd., Yongin-si (KR)

(72) Inventors: Hyunjung Lee, Yongin-si (KR); Iljoon Kang, Yongin-si (KR); Sungbum Kim, Yongin-si (KR); Eunsoo Ahn, Yongin-si (KR); Eunyoung Lee, Yongin-si (KR); Jaesung Lee, Yongin-si (KR); Mina Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 930 days.

(21) Appl. No.: 17/857,987

(22) Filed: Jul. 5, 2022

(65) Prior Publication Data

US 2023/0060808 A1 Mar. 2, 2023

(30) Foreign Application Priority Data

Jul. 7, 2021 (KR) ........................ 10-2021-0089142

(51) Int. Cl.
*C07F 15/00* (2006.01)
*H10K 50/11* (2023.01)
*H10K 50/12* (2023.01)

(52) U.S. Cl.
CPC .......... *C07F 15/0086* (2013.01); *H10K 50/11* (2023.02); *H10K 50/12* (2023.02)

(58) Field of Classification Search
None
See application file for complete search history.

(56) References Cited

U.S. PATENT DOCUMENTS 9,238,668 B2 1/2016 Li et al.
9,318,725 B2 4/2016 Li
9,425,415 B2 8/2016 Li et al.
9,461,254 B2 10/2016 Tsai et al.
9,698,359 B2 7/2017 Li et al.
9,899,614 B2 2/2018 Li et al.
10,340,466 B2 7/2019 Lin et al.
10,988,495 B2 4/2021 Lee et al.
2013/0048963 A1 2/2013 Beers et al.
2014/0364605 A1 12/2014 Li et al.
2019/0074457 A1 3/2019 Choi et al.
2020/0216481 A1 * 7/2020 Chen .................... H10K 85/346
2021/0253446 A1 * 8/2021 Chen .................. H10K 85/6576

FOREIGN PATENT DOCUMENTS

JP 2009-267245 A 11/2009
KR 10-2018-0118447 A 10/2018
KR 10-2018-0119447 A 11/2018
KR 10-2019-0026613 A 3/2019

* cited by examiner

*Primary Examiner* — Robert S Loewe
(74) *Attorney, Agent, or Firm* — Womble Bond Dickinson (US) LLP

(57) ABSTRACT

A light-emitting device may include an organometallic compound represented by Formula 1, and an electronic apparatus may include the light-emitting device including the organometallic compound represented by Formula 1. The light-emitting device may further include: a first electrode; a second electrode facing the first electrode; and an interlayer between the first electrode and the second electrode, the interlayer comprising an emission layer:

Formula 1

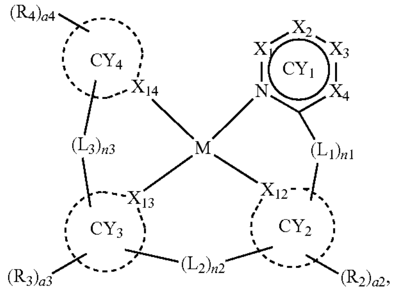

wherein the detailed description of Formula 1 is the same as described in the present specification.

19 Claims, 3 Drawing Sheets

LIGHT-EMITTING DEVICE INCLUDING ORGANOMETALLIC COMPOUND, ELECTRONIC APPARATUS INCLUDING THE LIGHT-EMITTING DEVICE, AND ORGANOMETALLIC COMPOUND

CROSS-REFERENCE TO RELATED APPLICATION

This application claims priority to and the benefit of Korean Patent Application No. 10-2021-0089142, filed on Jul. 7, 2021, in the Korean intellectual Property Office, the entire content of which is incorporated herein by reference.

BACKGROUND

1. Field

One or more aspects of embodiments of the present disclosure relate to a light-emitting device including an organometallic compound, an electronic apparatus including the light-emitting device, and an organometallic compound.

2. Description of the Related Art

From among light-emitting devices, self-emissive devices have wide viewing angles, high contrast ratios, short response times, and excellent characteristics in terms of luminance, driving voltage, and/or response speed.

In an example light-emitting device, a first electrode is arranged on a substrate, and a hole transport region, an emission layer, an electron transport region, and a second electrode are sequentially arranged on the first electrode. Holes provided from the first electrode move toward the emission layer through the hole transport region, and electrons provided from the second electrode move toward the emission layer through the electron transport region. Carriers, such as holes and electrons, recombine In the emission layer to produce excitons. These excitons transition from an excited state to a ground state to thereby generate light.

SUMMARY

One or more aspects of embodiments of the present disclosure are directed towards a light-emitting device including an organometallic compound, an electronic apparatus including the light-emitting device, and an organometallic compound.

Additional aspects will be set forth in part in the description, which follows and, in part, will be apparent from the description, or may be learned by practice of the presented embodiments of the disclosure.

According to one or more embodiments, provided is a light-emitting device including:

a first electrode, a second electrode facing the first electrode, an interlayer arranged between the first electrode and the second electrode and including an emission layer, and an organometallic compound represented by Formula 1.

Formula 1

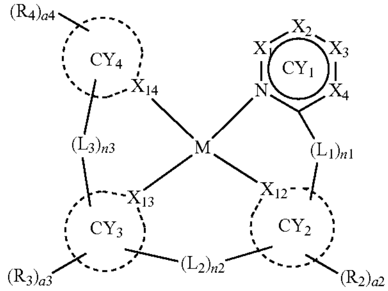

Formula 1A

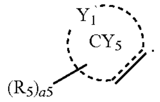

In Formulae 1 and 1A,

M may be platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm), ring $CY_2$ to ring $CY_4$ may each independently be a $C_5$-$C_{30}$ carbocyclic group or a $C_1$-$C_{30}$ heterocyclic group, $X_1$ may be $C(Z_1)$ or N, $X_2$ may be $C(Z_2)$ or N, $X_3$ may be $C(Z_3)$ or N, $X_4$ may be $C(Z_4)$ or N, i) $X_1$ may be $C(Z_1)$, $X_2$ may be $C(Z_2)$, and $Z_1$ and $Z_2$ may be linked to each other to form ring $CY_5$ represented by Formula 1A, ii) $X_2$ may be $C(Z_2)$, $X_3$ may be $C(Z_3)$, and $Z_2$ and $Z_3$ may be linked to each other to form ring $CY_5$ represented by Formula 1A, or iii) $X_3$ may be $C(Z_3)$, $X_4$ may be $C(Z_4)$, and $Z_3$ and $Z_4$ may be linked to each other to form ring $CY_5$ represented by Formula 1A, ring $CY_1$ in Formula 1 and ring $CY_5$ represented by Formula 1A may be condensed with each other,

 in Formula 1A indicates a single bond or a double bond, ring $CY_5$ may be a $C_1$-$C_{30}$ heterocyclic group, $Y_1$ may be Te, O, S, or Se, $X_{12}$ and $X_{13}$ may each independently be C or N, $X_{14}$ may be C, $L_1$ to $L_3$ may each independently be a single bond, $*—C(R_{1a})(R_{1b})—*'$, $*—C(R_{1a})═*'$, $*═C(R_{1a})—*'$, $*—C(R_{1a})═C(R_{1b})—*'$, $*—C(═O)—*'$, $*—C(═S)—*'$, $*—C≡C—*'$, $*—B(R_{1a})—*'$, $*N(R_{1a})—*'$, $*—O—*'$, $*—P(R_{1a})—*'$, $*—Si(R_{1a})(R_{1b})—*'$, $*—P(═O)(R_{1a})—*'$, $*—S—*'$, $*—S(═O)—*'$, $*—S(═O)_2—*'$, or $*—Ge(R_{1a})(R_{1b})—*'$, wherein * and *' each indicate a binding site to a neighboring atom, n1 to n3 may each independently be an integer from 1 to 5, $Z_1$ to $Z_4$, $R_2$ to $R_5$, $R_{1a}$, and $R_{1b}$ may each independently be hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —C(═O)($Q_1$), —S(═O)$_2$($Q_1$), or —P(═O)($Q_1$)($Q_2$), a2 to a5 may each independently be an integer from 0 to 10, $R_{10a}$ may be:

deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —C(═O)($Q_{11}$), —S(═O)$_2$($Q_{11}$), —P(═O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —C(═O)($Q_{21}$), —S(═O)$_2$($Q_{21}$), —P(═O)($Q_{21}$)($Q_{22}$), or any combination thereof, or —$Si(Q_{31})(Q_{32})(Q_{33})$, —$N(Q_{31})(Q_{32})$, —$B(Q_{31})(Q_{32})$, —C(═O)($Q_{31}$), —S(═O)$_2$($Q_{31}$), or —P(═O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

According to one or more embodiments, provided is an electronic apparatus including the light-emitting device.

According to one or more embodiments, provided is the organometallic compound represented by Formula 1.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
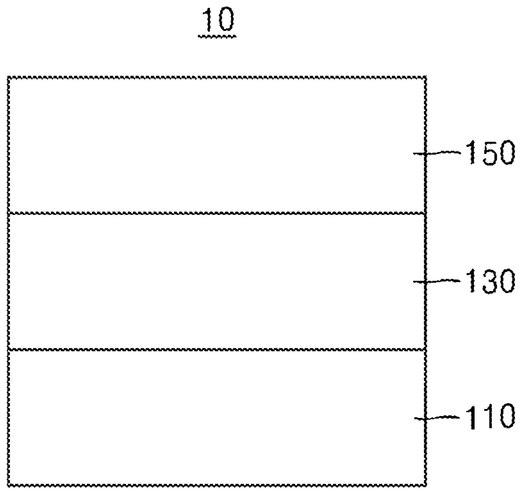
FIG. 1 shows a schematic view of a light-emitting device according to one or more embodiments.

Reference will now be made in more detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. As used herein, expressions such as "at least one of", "one of", and "selected from", when preceding a list of elements, modify the entire list of elements and do not modify the individual elements of the list. For example, throughout the disclosure, the expressions "at least one of a, b or c," "at least one of a, b and c", and "at least one of a, b and/or c" may indicate only a, only b, only c, both (e.g., simultaneously) a and b, both (e.g., simultaneously) a and c, both (e.g., simultaneously) b and c, all of a, b, and c, or variations thereof.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

Further, the use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

One or more embodiments of the present disclosure provide a light-emitting device including: a first electrode; a second electrode facing the first electrode; and an interlayer arranged between the first electrode and the second electrode, the interlayer including an emission layer, wherein the emission layer includes an organometallic compound represented by Formula 1:

Formula 1

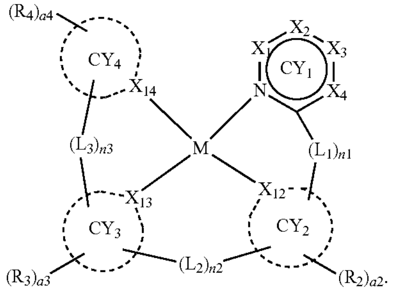

In Formula 1, M may be platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm).

In one or more embodiments, M may be Pt.

In Formula 1, $X_1$ may $C(Z_1)$ or N, $X_2$ may be $C(Z_2)$ or N, $X_3$ may be $C(Z_3)$ or N, and $X_4$ may be $C(Z_4)$ or N.

In one or more embodiments, $X_1$ may be $C(Z_1)$, $X_2$ may be $C(Z_2)$, $X_3$ may be $C(Z_3)$, and $X_4$ may be $C(Z_4)$.

Formula 1A

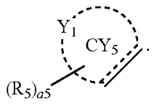

In Formula 1, i) $X_1$ may be $C(Z_1)$, $X_2$ may be $C(Z_2)$, and $Z_1$ and $Z_2$ may be linked to each other to form ring $CY_5$ represented by Formula 1A, ii) $X_2$ may be $C(Z_2)$, $X_3$ may be $C(Z_3)$, and $Z_2$ and $Z_3$ may be linked to each other to form ring $CY_5$ represented by Formula 1A, or iii) $X_3$ may be $C(Z_3)$, $X_4$ may be $C(Z_4)$, and $Z_3$ and $Z_4$ may be linked to each other to form ring $CY_5$ represented by Formula 1A.

In Formula 1, ring $CY_1$ and ring $CY_5$ represented by Formula 1A may be condensed with each other.

In one or more embodiments, $X_1$ may be $C(Z_1)$, $X_2$ may be $C(Z_2)$, $X_3$ may be $C(Z_3)$, and $X_4$ may be $C(Z_4)$, i) $Z_1$ and $Z_2$ may be linked to each other to form ring $CY_5$ represented by Formula 1A, and at least one selected from $Z_3$ and $Z_4$ may not be hydrogen, ii) $Z_2$ and $Z_3$ may be linked to each other to form ring $CY_5$ represented by Formula 1A, and at least one selected from $Z_1$ and $Z_4$ may not be hydrogen, or iii) $Z_3$ and $Z_4$ may be linked to each other to form ring $CY_5$ represented by Formula 1A, and at least one selected from $Z_1$ and $Z_2$ may not be hydrogen.

In one or more embodiments, $X_1$ may be $C(Z_1)$, $X_2$ may be $C(Z_2)$, $X_3$ may be $C(Z_3)$, and $X_4$ may be $C(Z_4)$, wherein $Z_1$ and $Z_2$ may be linked to each other to form ring $CY_5$ represented by Formula 1A, and at least one selected from $Z_3$ and $Z_4$ may be a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, a 2-methylbutyl group, a 2-2dimethylpropyl group, a 1-ethylpropyl group, or a 1,2-dimethylpropyl group.

In one or more embodiments, $X_1$ may be $C(Z_1)$, $X_2$ may be $C(Z_2)$, $X_3$ may be $C(Z_3)$, and $X_4$ may be $C(Z_4)$, wherein $Z_2$ and $Z_3$ may be linked to each other to form ring $CY_5$ represented by Formula 1A, and at least one selected from $Z_1$ and $Z_4$ may be a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, a 2-methylbutyl group, a 2-2dimethylpropyl group, a 1-ethylpropyl group, or a 1,2-dimethylpropyl group.

In one or more embodiments, $X_1$ may be $C(Z_1)$, $X_2$ may be $C(Z_2)$, $X_3$ may be $C(Z_3)$, and $X_4$ may be $C(Z_4)$, wherein $Z_3$ and $Z_4$ may be linked to each other to form ring $CY_5$ represented by Formula 1A, and at least one selected from $Z_1$ and $Z_2$ may be a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, a 2-methylbutyl group, a 2-2dimethylpropyl group, a 1-ethylpropyl group, or a 1,2-dimethylpropyl group.

In Formula 1A,  indicates a single bond or a double bond.

In Formula 1, ring $CY_5$ may be a $C_1$-$C_{30}$ heterocyclic group.

In one or more embodiments, ring $CY_5$ may be a pentagonal ring including $Y_1$.

In Formula 1A, $Y_1$ may be Te, O, S, or Se.

In Formula 1, a group represented by

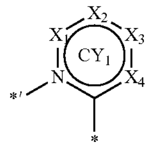

may be one of groups represented by Formulae CY1(1) to CY1(36):

CY1(1)

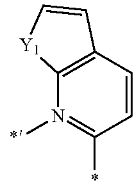

-continued
CY1(2)
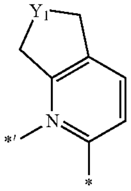
CY1(3)
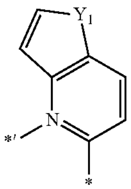
CY1(4)
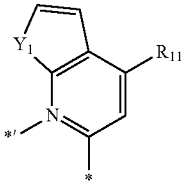
CY1(5)
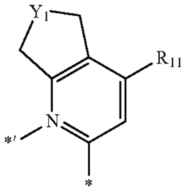
CY1(6)
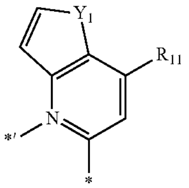
CY1(7)
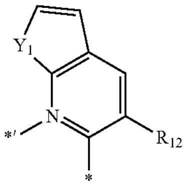
CY1(8)
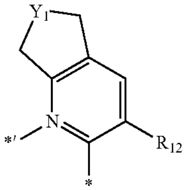
CY1(9)
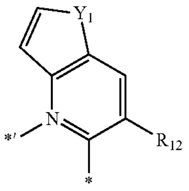
-continued
CY1(10)
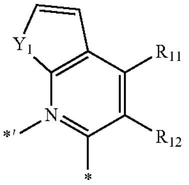
CY1(11)
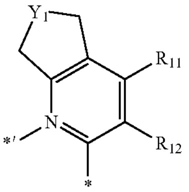
CY1(12)
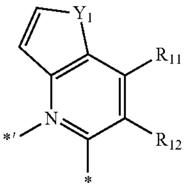
CY1(13)
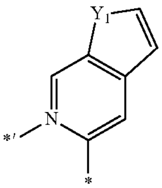
CY1(14)
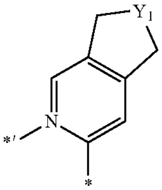
CY1(15)
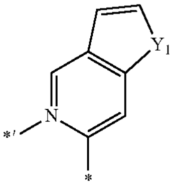
CY1(16)
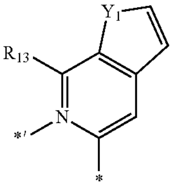
CY1(17)
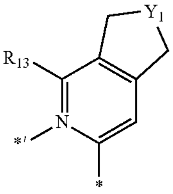

-continued
CY1(18)
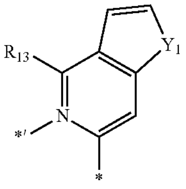
CY1(19)
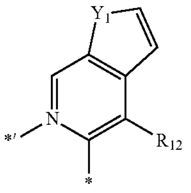
CY1(20)
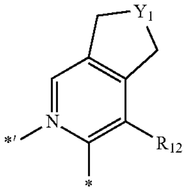
CY1(21)
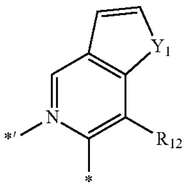
CY1(22)
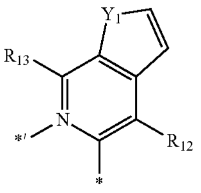
CY1(23)
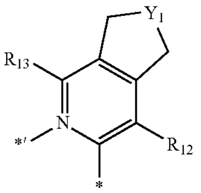
CY1(24)
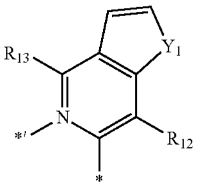
CY1(25)
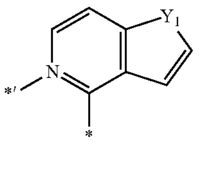
-continued
CY1(26)
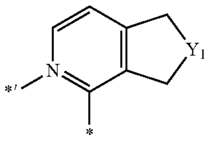
CY1(27)
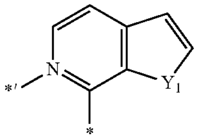
CY1(28)
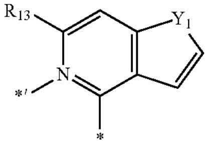
CY1(29)
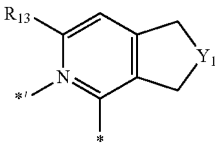
CY1(30)
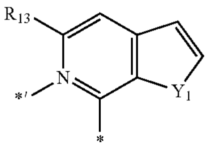
CY1(31)
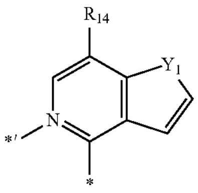
CY1(32)
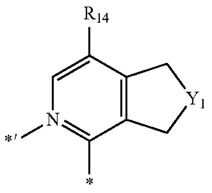
CY1(33)
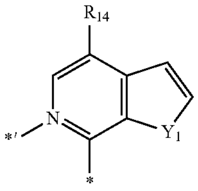
CY1(34)
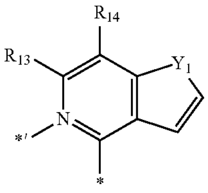

-continued

CY1(35)

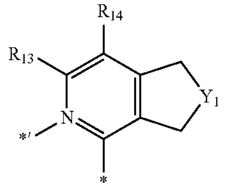

CY1(36)

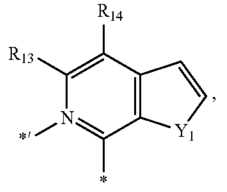

wherein, in Formulae CY1(1) to CY1(36), $R_{11}$ to $R_{14}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_1$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, $Y_1$, $R_{10a}$, and $Q_1$ to $Q_3$ may respectively be the same as described herein, and

* and *' each indicate a binding site to a neighboring atom.

In one or more embodiments, in Formulae CY(1) to CY(36), $R_{11}$ to $R_{14}$ may each independently be a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, a 2-methylbutyl group, a 2-2dimethylpropyl group, a 1-ethylpropyl group, or a 1,2-dimethylpropyl group, each unsubstituted or substituted with deuterium, —F, —Cl, —Br, —I, a hydroxyl group, a cyano group, or a nitro group.

In Formula 1, ring $CY_2$ to ring $CY_4$ may each independently be a $C_5$-$C_{30}$ carbocyclic group or a $C_1$-$C_{30}$ heterocyclic group.

In one or more embodiments, ring $CY_2$ to ring $CY_4$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In one or more embodiments, ring $CY_2$ and ring $CY_4$ may each independently be a $C_1$-$C_{30}$ heterocyclic group, and ring $CY_3$ may be a $C_5$-$C_{30}$ carbocyclic group.

In one or more embodiments, a group represented by

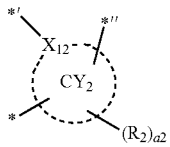

in Formula 1 may be one of groups represented by Formulae CY2(1) to CY2(7):

CY2(1)

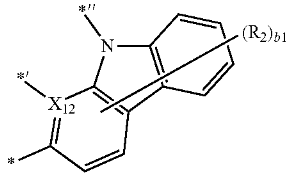

CY2(2)

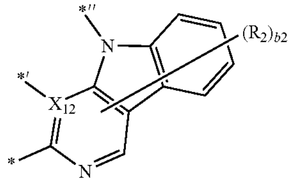

CY2(3)

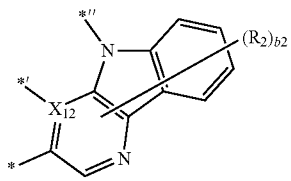

-continued

CY2(4)

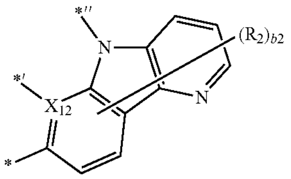

CY2(5)

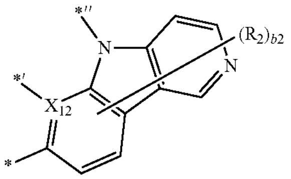

CY2(6)

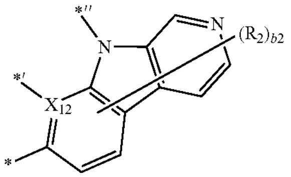

CY2(7)

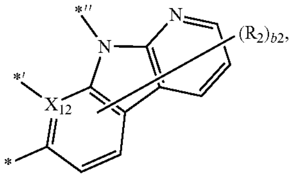

wherein, in Formulae CY2(1) to CY2(7), b1 may be an integer from 0 to 6, b2 may be an integer from 0 to 5, $X_{12}$ and $R_2$ may respectively be the same as described herein, and

*, *', and *" each indicate a binding site to a neighboring atom.

In one or more embodiments, a group represented by

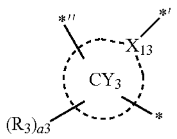

in Formula 1 may be one of groups represented by Formulae CY3(1) to CY3(8):

CY3(1)

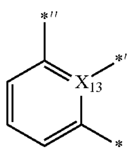

CY3(2)

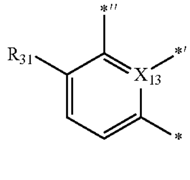

-continued

CY3(3)

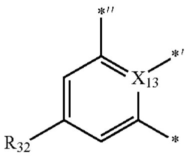

CY3(4)

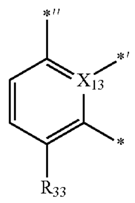

CY3(5)

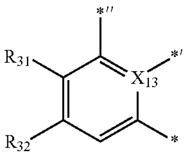

CY3(6)

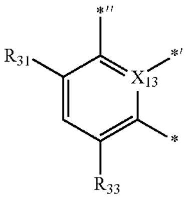

CY3(7)

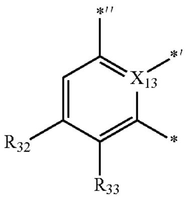

CY3(8)

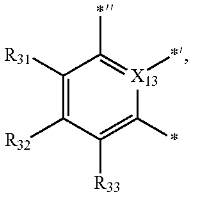

wherein, in Formulae CY3(1) to CY3(8), $R_{31}$ to $R_{33}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, $X_{13}$, $R_{10a}$, and $Q_1$ to $Q_3$ may respectively be the same as described herein, and

*, *', and *" each indicate a binding site to a neighboring atom.

In one or more embodiments, a group represented by

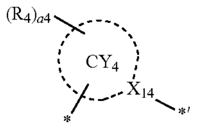

in Formula 1 may be one of groups represented by Formulae CY4(1) to CY4(8):

CY4(1)

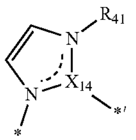

CY4(2)

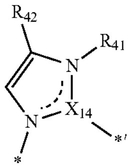

CY4(3)

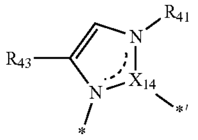

CY4(4)

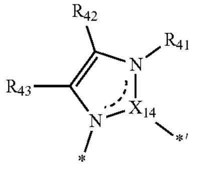

CY4(5)

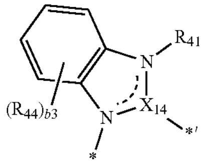

CY4(6)

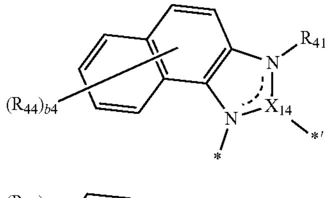

CY4(7)

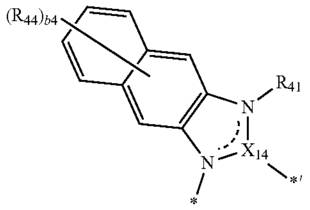

-continued

CY4(8)

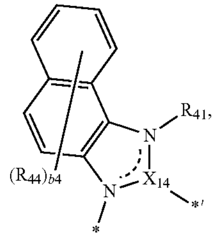

wherein, in Formulae CY4(1) to CY4(8).

$R_{41}$ to $R_{44}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, b3 may be an integer from 0 to 4, b4 may be an integer from 0 to 6, $X_{14}$, $R_{10a}$, and $Q_1$ to $Q_3$ may respectively be the same as described herein, and

* and *' each indicate a binding site to a neighboring atom.

In one or more embodiments,

In Formulae CY4(1) to CY4(8), $R_{41}$ may be a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl-group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzosilolyl group, an isobenzothiazolyl group, a benzooxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, an azafluorenyl group, an azacarbazolyl group, an azadibenzofuranyl group, an azadibenzothiophenyl group, or an azadibenzosilole group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, or any combination thereof.

For example, in Formulae CY4(1) to CY4(8), $R_{41}$ may be a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, or a chrysenyl group, each unsubstituted or substituted with deuterium, $—CD_3$, $—CD_2H$, $—CDH_2$, $—CF_3$, $—CF_2H$, $—CFH_2$, a cyano group, a $C_1$-$C_{20}$ alkyl group, or any combination thereof.

In Formula 1, $X_{12}$ and $X_{13}$ may each independently be C or N.

In one or more embodiments, each of $X_{12}$ and $X_{13}$ may be C.

In Formula 1, $X_{14}$ may be C.

In Formula 1, $L_1$ to $L_3$ may each independently be a single bond, $*—C(R_{1a})(R_{1b})—*'$, $*—C(R_{1a})=*'$, $*=C(R_{1a})—*'$, $*—C(R_{1a})=C(R_{1b})—*'$, $*—C(=O)*'$, $*—C(=S)—*$, $*—C≡C—*'$, $*—B(R_{1a})—*'$, $*—N(R_{1a})—*'$, $*—O—*'$, $*—P(R_{1a})—*'$, $*—Si(R_{1a})(R_{1b})—*$, $*—P(=O)(R_{1a})—*'$, $*—S—*'$, $*—S(=O)—*'$, $*—S(=O)_2—*$, or $*—Ge(R_{1a})(R_{1b})—*$, and

* and *' each indicate a binding site to a neighboring atom.

In one or more embodiments, $L_1$ and $L_3$ may each be a single bond.

In one or more embodiments, $L_2$ may be $*—C(R_{1a})(R_{1b})—*'$, $*—C(R_{1a})=*'$, $*=C(R_{1a})—*'$, $*—C(R_{1a})=C(R_{1b})—*'$, $*—C(=O)—*'$, $*—C(=S)—*'$, $*—C≡C—*'$, $*—B(R_{1a})—*'$, $*—O—*'$, $*—P(R_{1a})—*'$, $*—Si(R_{1a})(R_{1b})—*$, $*—P(=O)(R_{1a})—*'$, $*—S—*'$, $*—S(=O)—*'$, $*—S(=O)_2—*'$, or $*—Ge(R_{1a})(R_{1b})—*'$.

In Formula 1, n1 to n3 may each independently be an integer from 1 to 5.

In Formulae 1 and 1A, $Z_1$ to $Z_4$, $R_2$ to $R_5$, $R_{1a}$, and $R_{1b}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$.

For example, $Z_1$ to $Z_4$, $R_2$ to $R_5$, $R_{1a}$, $R_{1b}$ may each independently be:

hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, a cyclooctyl group, an adamantanyl group, a norbornyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, or an azadibenzosilolyl group, each unsubstituted or substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, and $—P(=O)(Q_{31})(Q_{32})$; or —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), and $Q_1$ to $Q_3$ and $Q_{31}$ to $Q_{33}$ are each independently:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with at least one selected from deuterium, a $C_1$-$C_{10}$ alkyl group, a phenyl group, a biphenyl group, a pyridinyl group, a pyrimidinyl group, a pyridazinyl group, a pyrazinyl group, and a triazinyl group.

In one or more embodiments, $Z_1$ to $Z_4$, $R_2$ to $R_5$, $R_{1a}$, and $R_{1b}$ may each independently be:

hydrogen, deuterium, —F, —Cl, —Br, —I, a hydroxyl group, a cyano group, a nitro group, or a $C_1$-$C_{20}$ alkyl group;

a $C_1$-$C_{20}$ alkyl group substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornyl group, a norbornenyl group, a cyclopentenyl group, a cyclohexenyl group, a cycloheptenyl group, a phenyl group, a biphenyl group, a naphthyl group, a pyridinyl group, and a pyrimidinyl group; or a phenyl group, a biphenyl group, a $C_1$-$C_1$a alkylphenyl group, a naphthyl group, a fluorenyl group, a phenanthrenyl group, an anthracenyl group, a fluoranthenyl group, a triphenylenyl group, a pyrenyl group, or a chrysenyl group, each unsubstituted or substituted with at least one selected from deuterium, —F, —Cl, —Br, —I, —CDs, —$CD_2H$, —$CDH_2$, —$CF_3$, —$CF_2H$, —$CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornyl group, a norbornenyl group, a cyclopentenyl group, a cyclohexenyl group, a cycloheptenyl group, a phenyl group, a biphenyl group, a naphthyl group, a pyridinyl group, and a pyrimidinyl group.

In Formulae 1 and 1A, a2 to a5 may each independently be an integer from 0 to 10.

In one or more embodiments, the organometallic compound represented by Formula 1 may be one of Compounds 1 to 54:

1

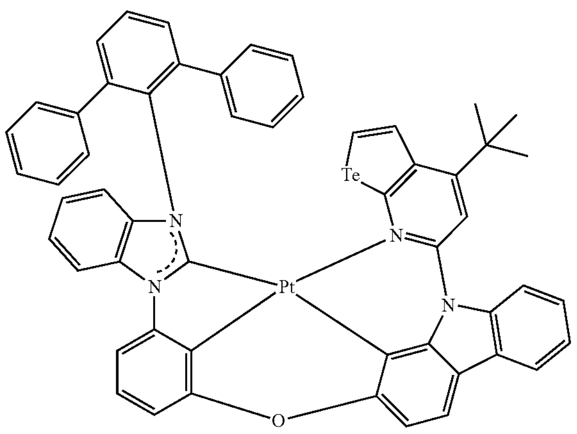

2

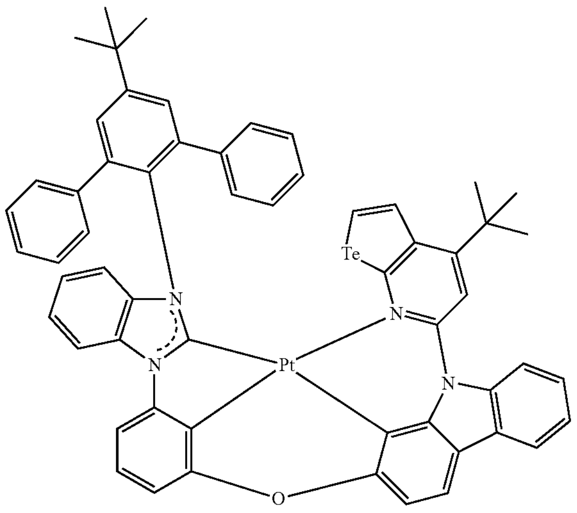

3

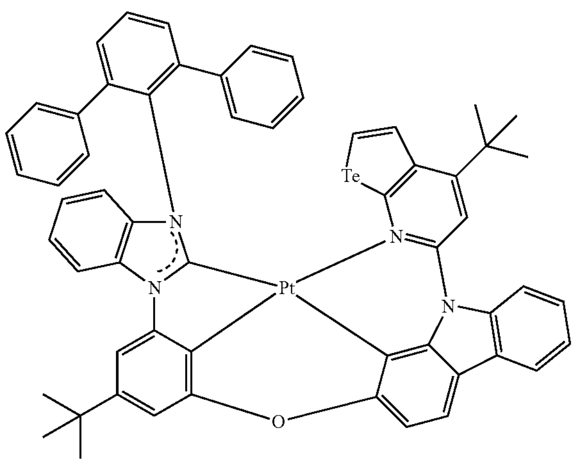

-continued
4
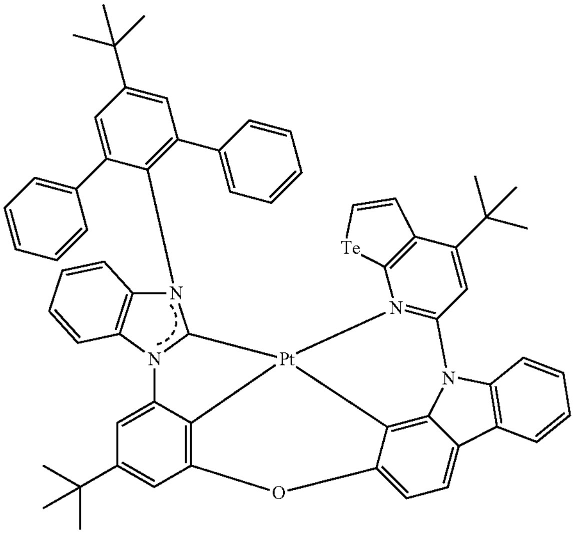
5
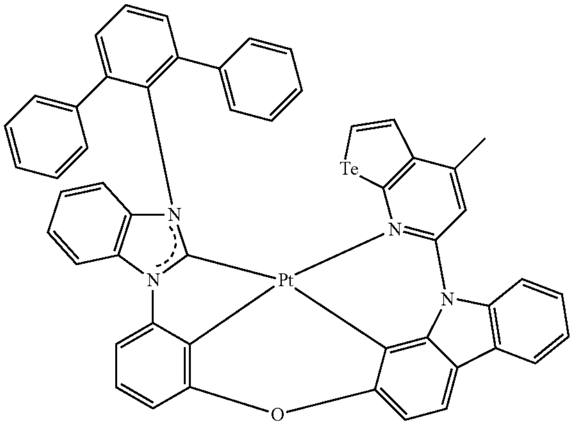
6
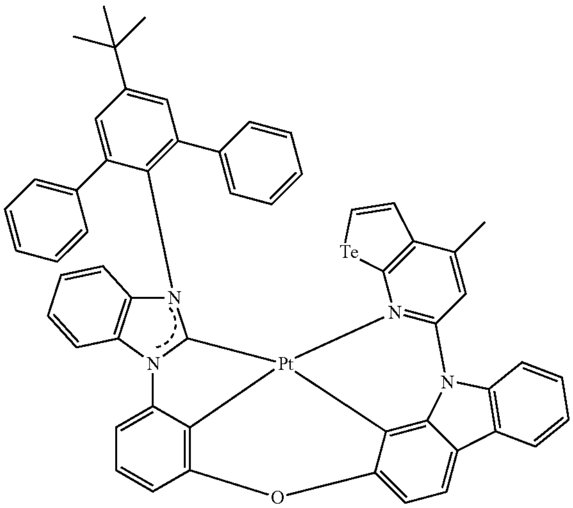
-continued
7
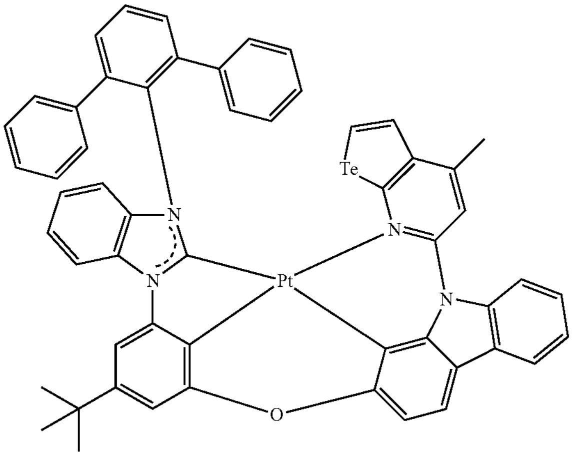
8
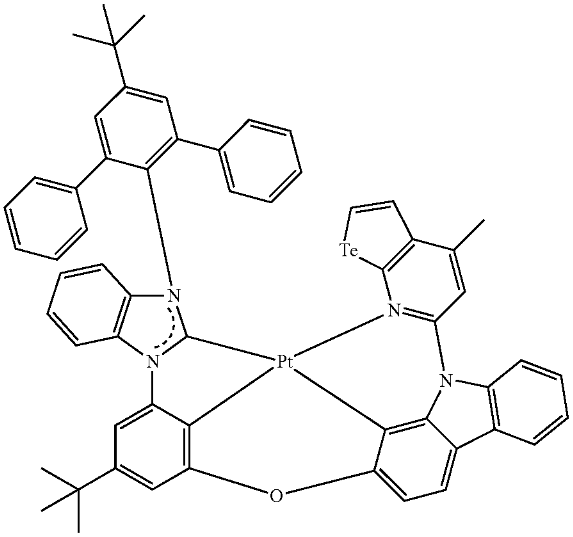
9
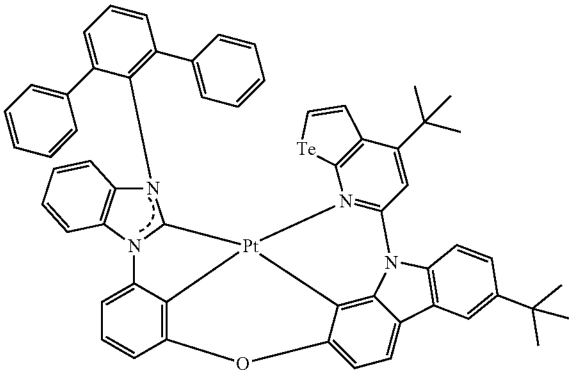

-continued
10
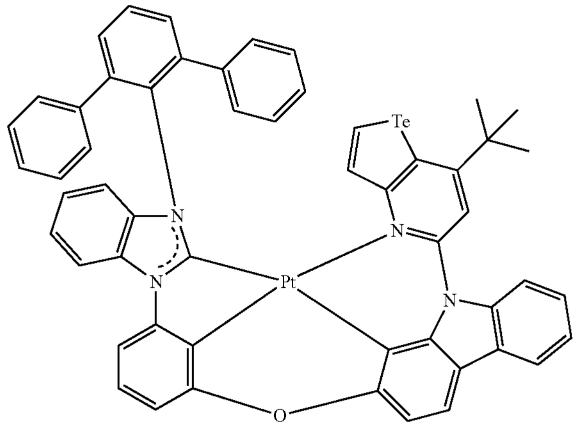
11
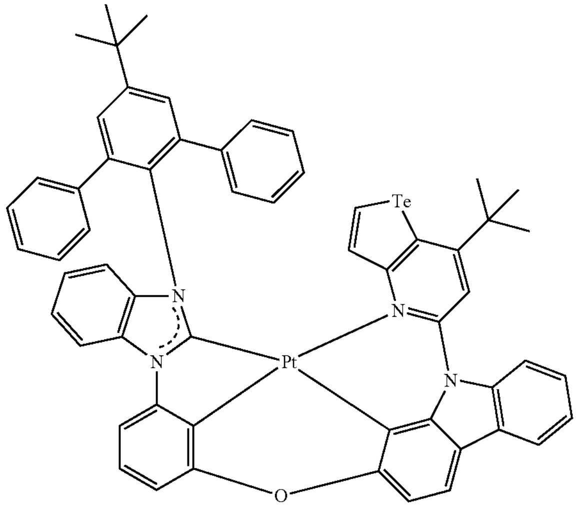
12
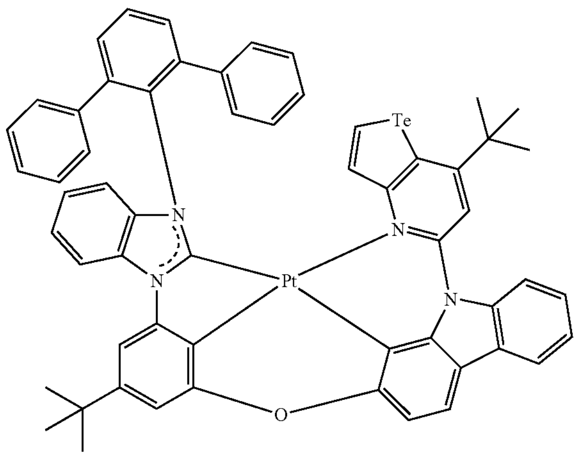
-continued
13
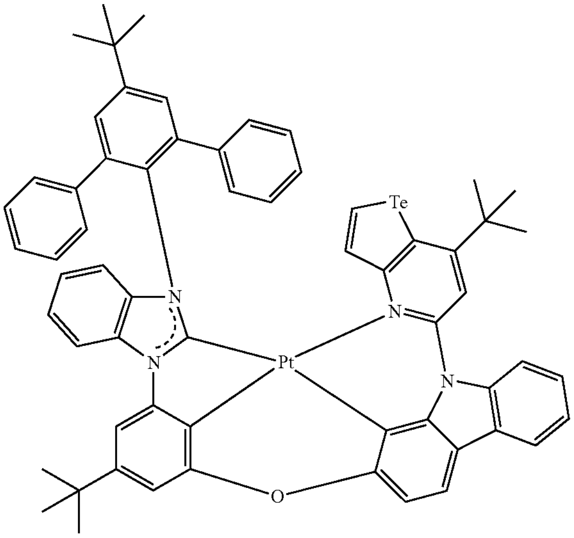
14
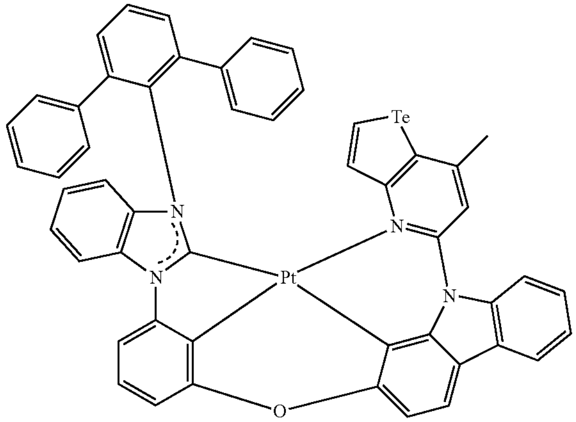
15
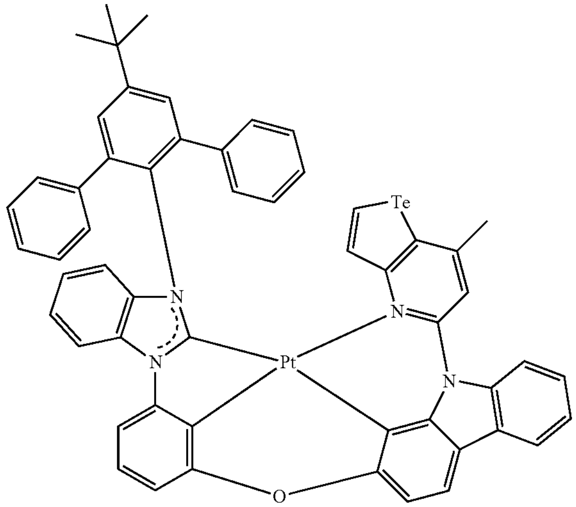

-continued
16
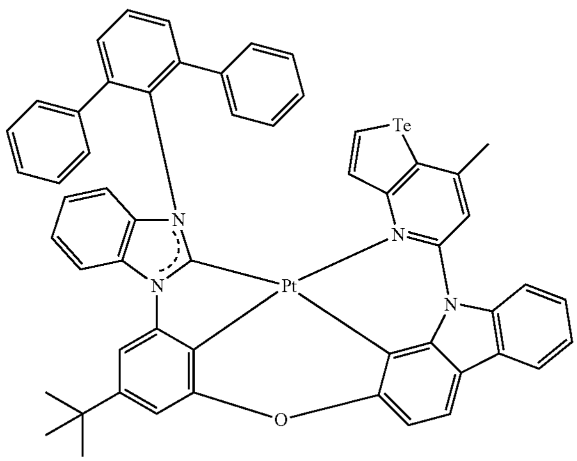
17
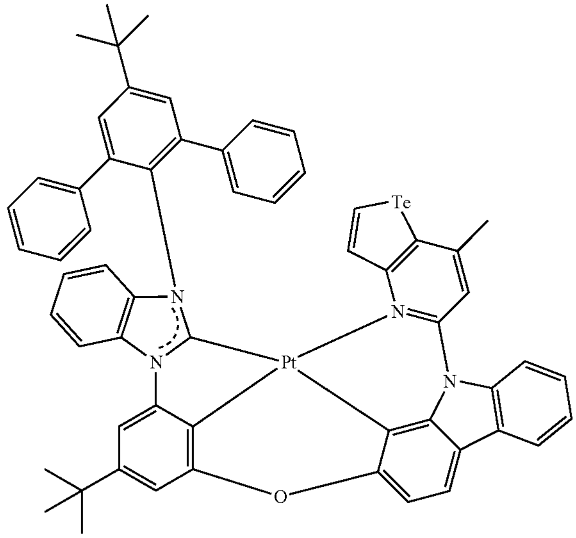
18
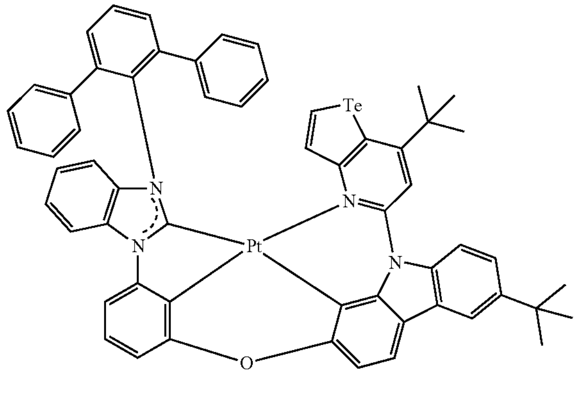
-continued
19
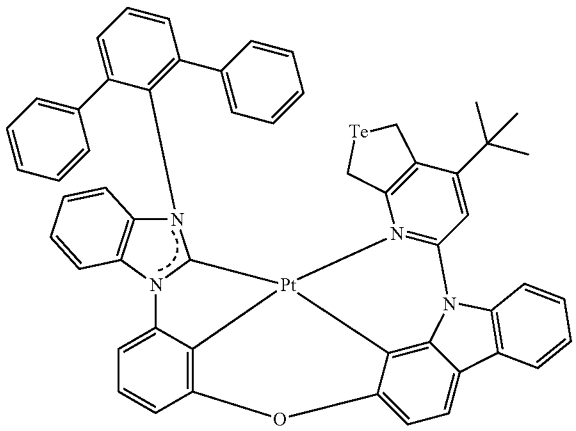
20
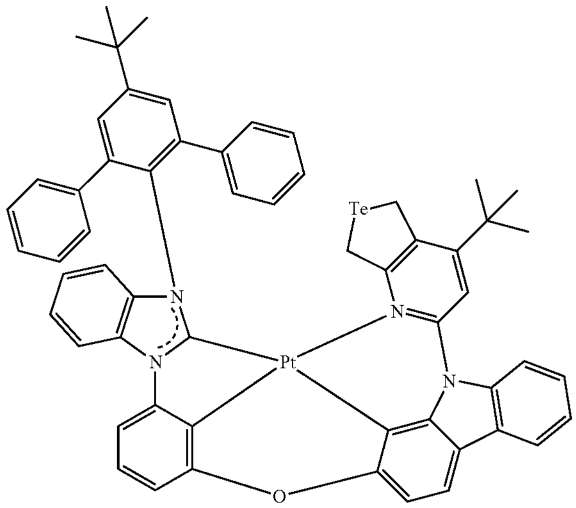
21
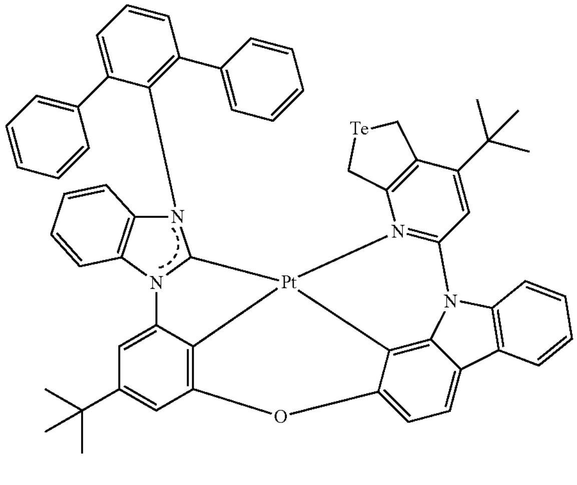

-continued
22
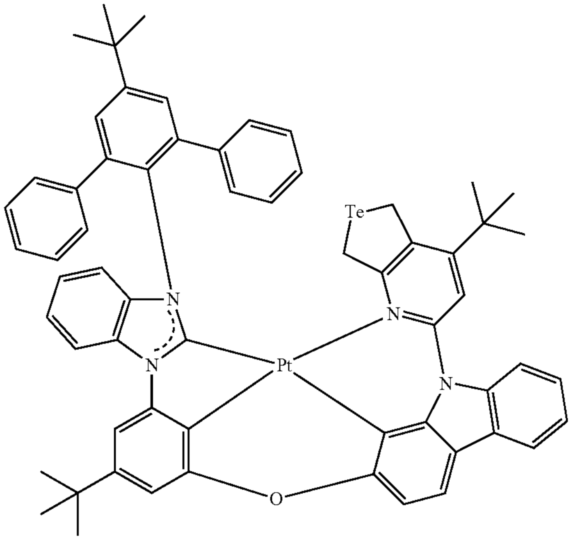
23
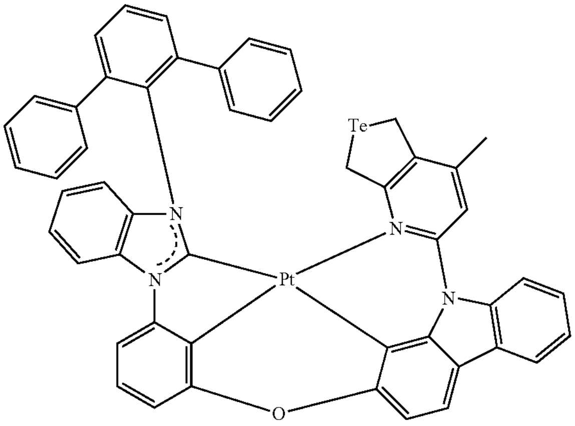
24
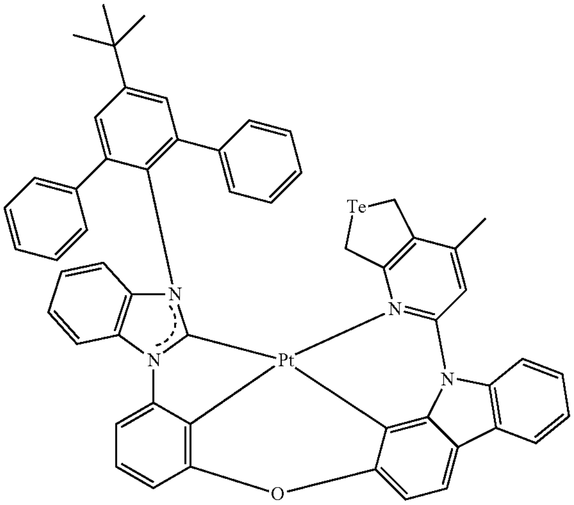
-continued
25
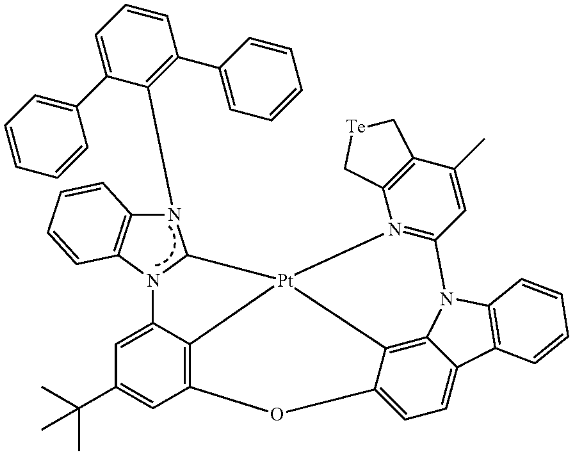
26
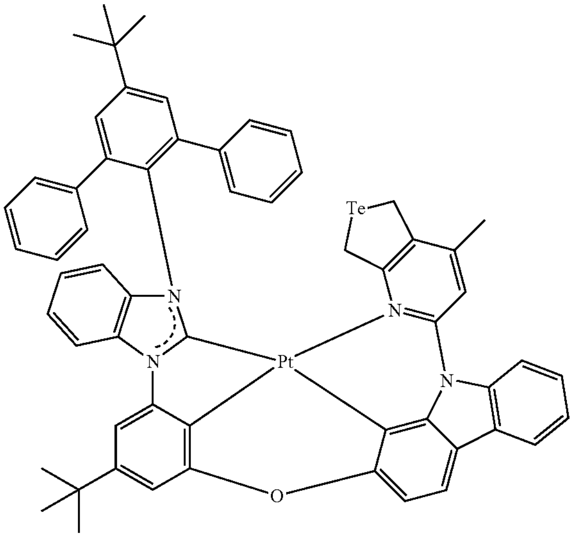
27
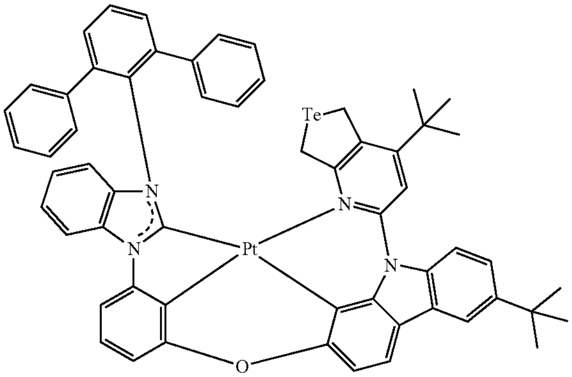

-continued
28
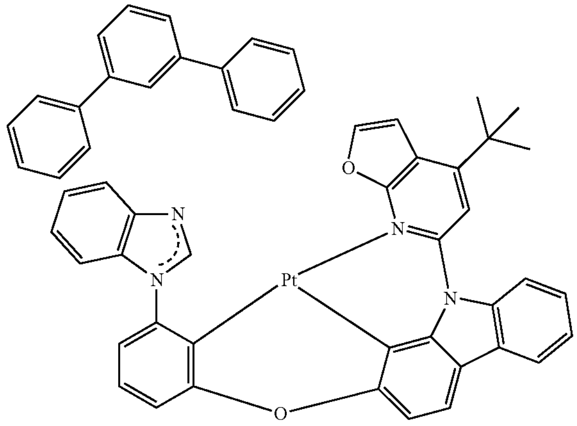
29
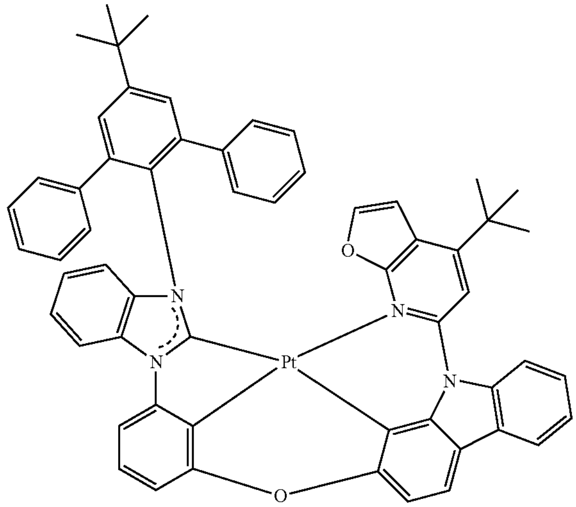
30
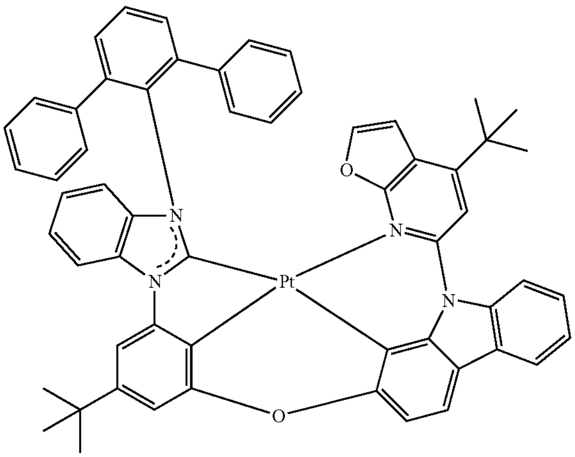
-continued
31
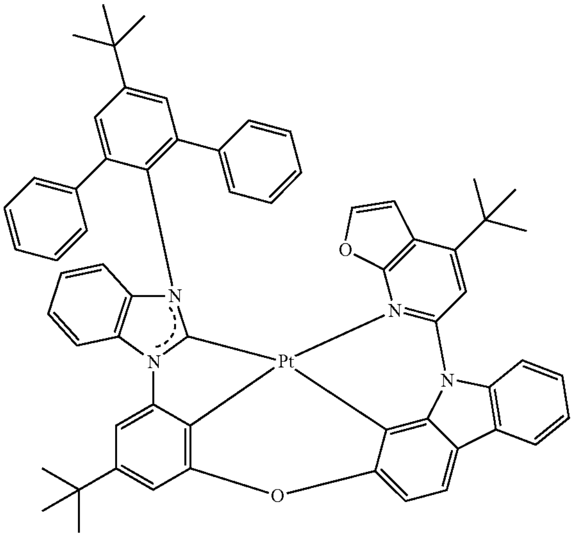
32
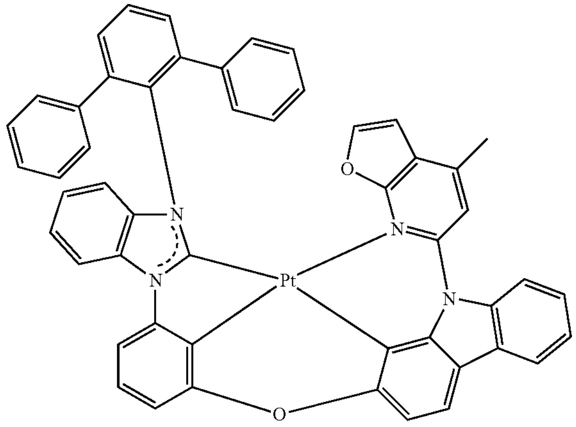
33
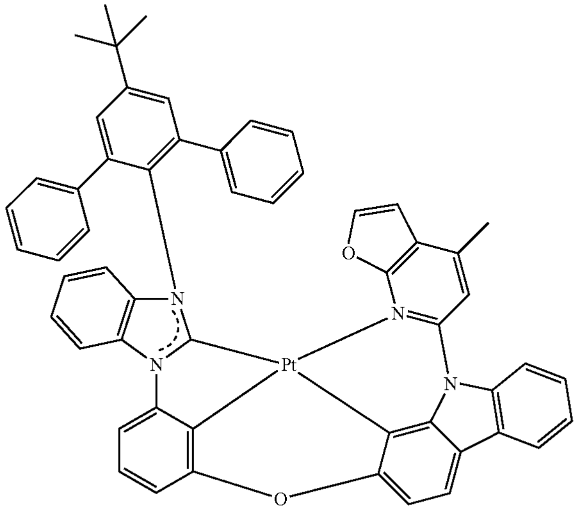

-continued
34
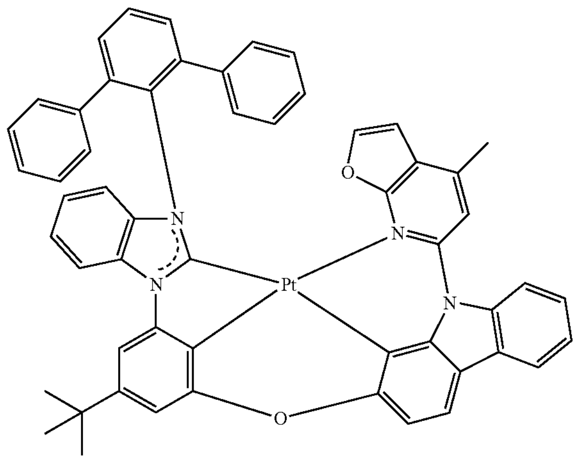
35
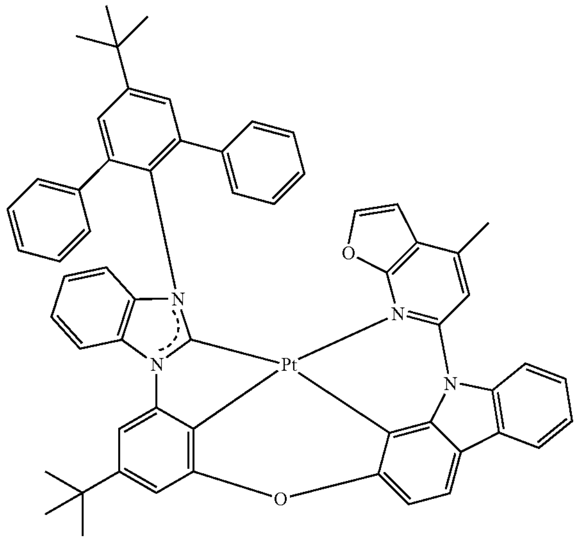
36
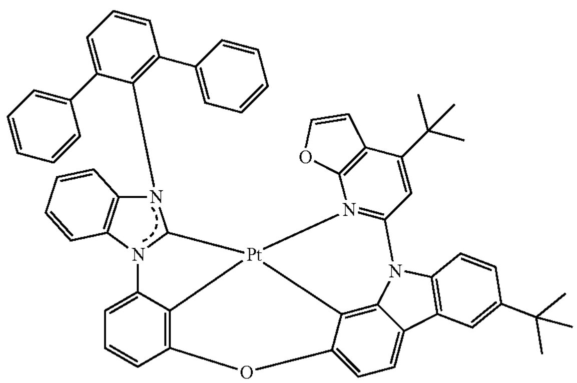
-continued
37
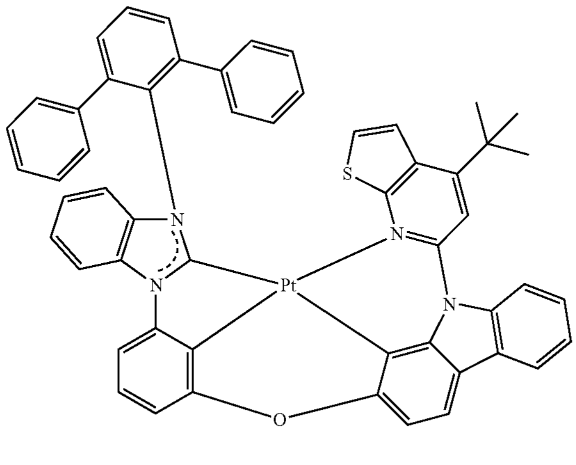
38
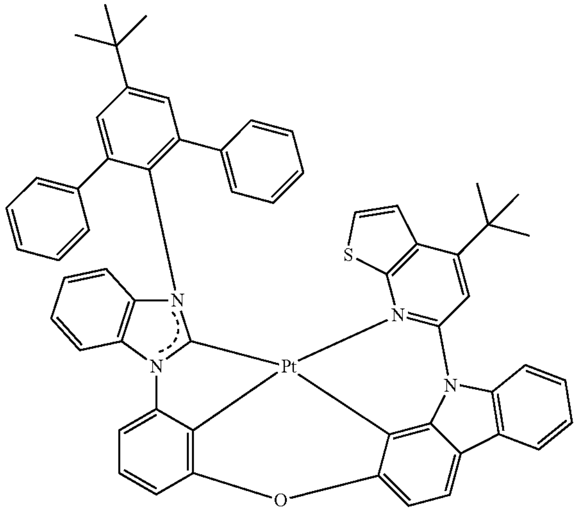
39
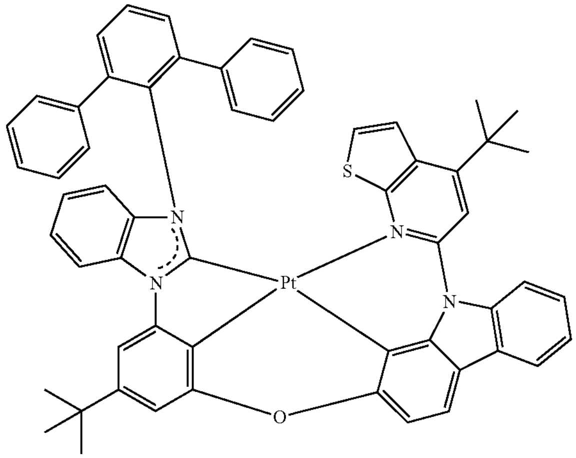

-continued
40
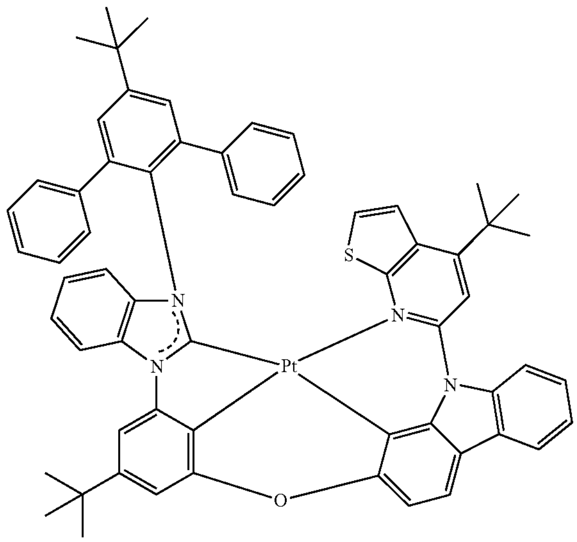
41
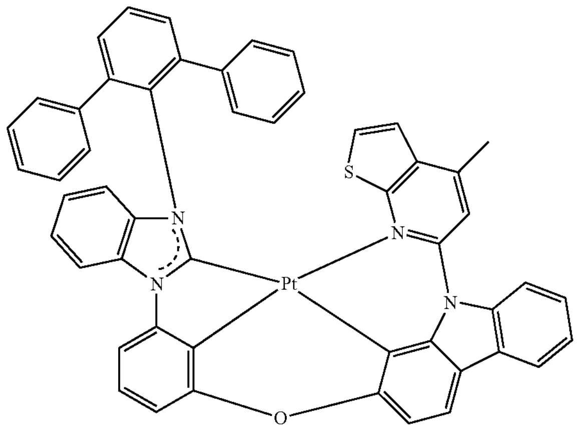
42
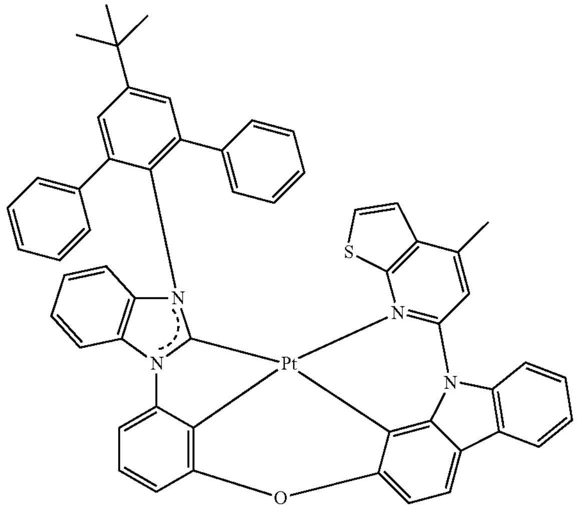
-continued
43
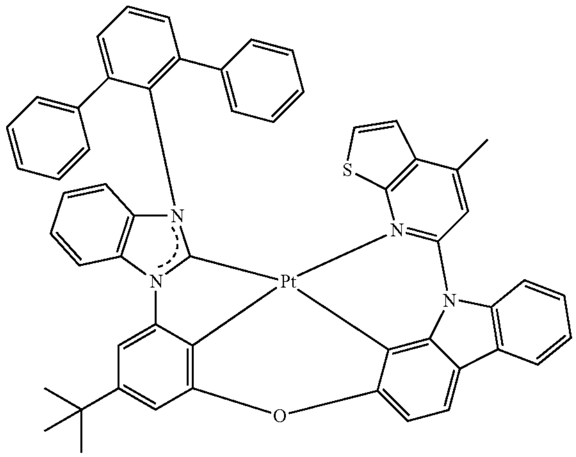
44
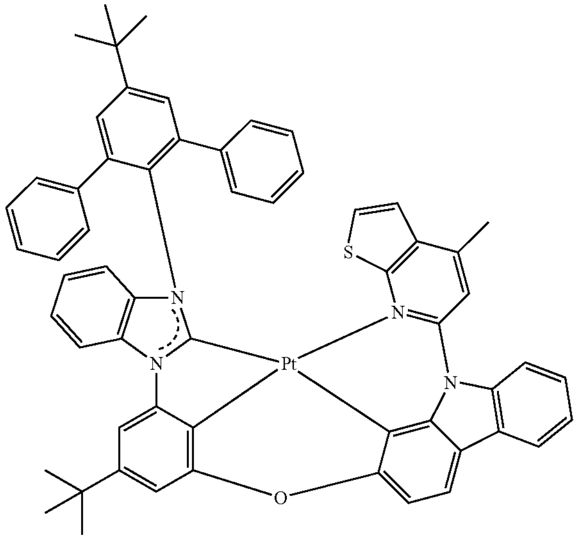
45
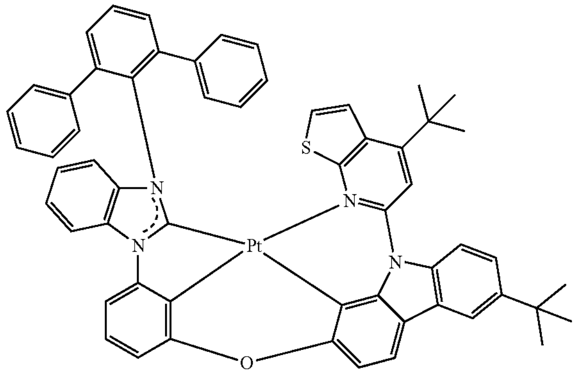

-continued
46
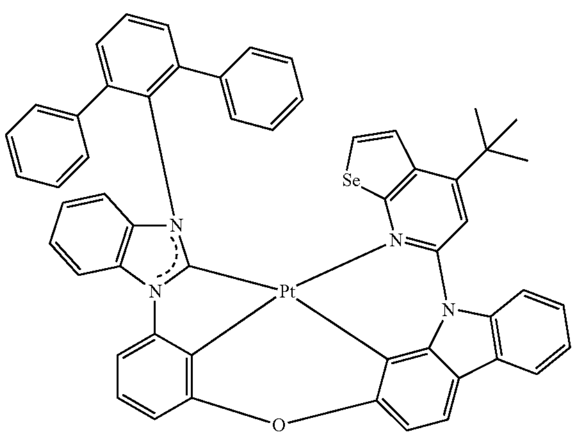
47
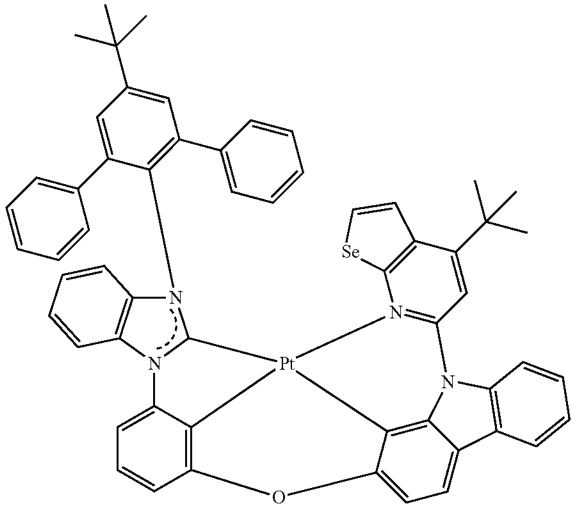
48
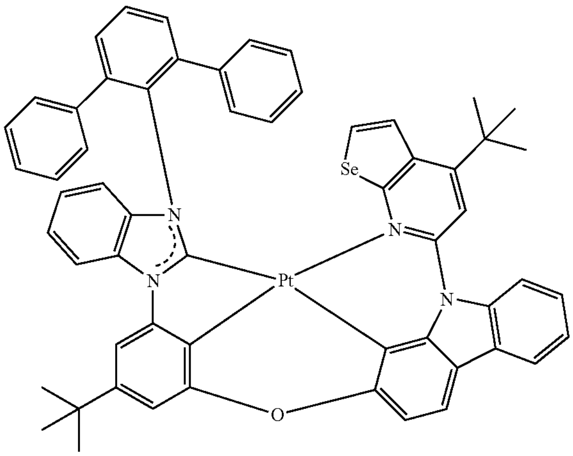
-continued
49
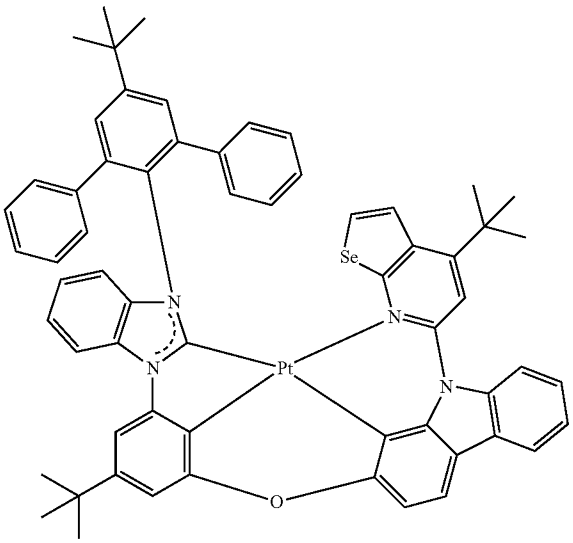
50
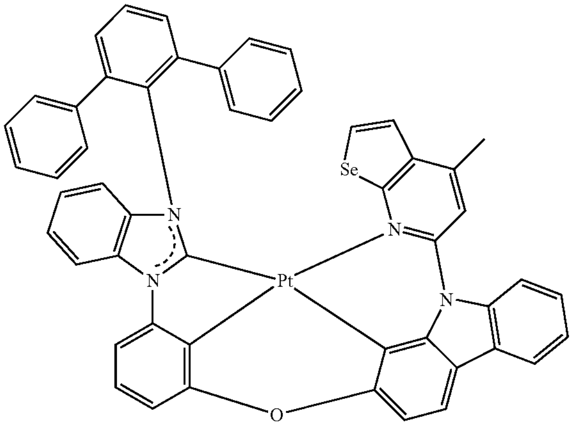
51
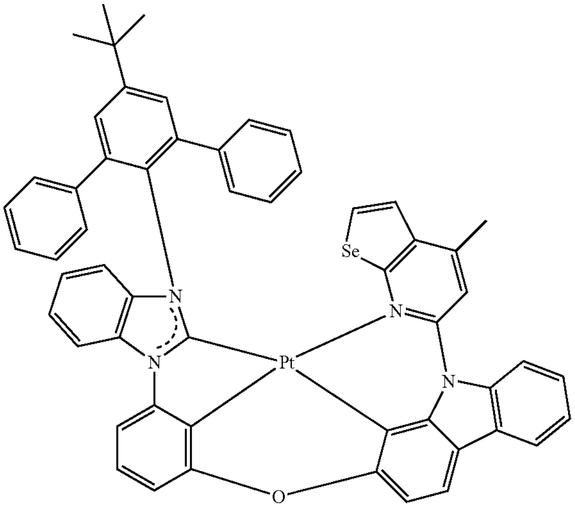

-continued

52

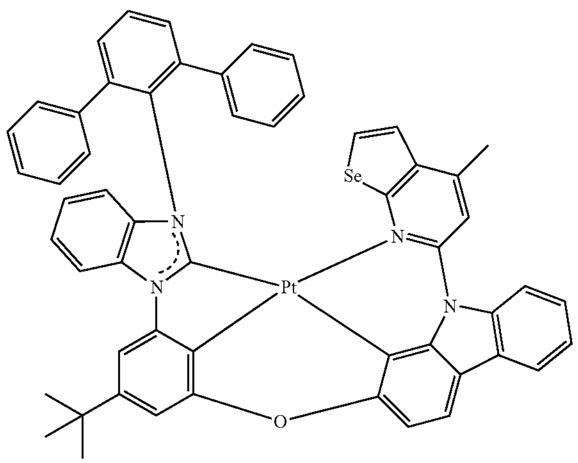

53

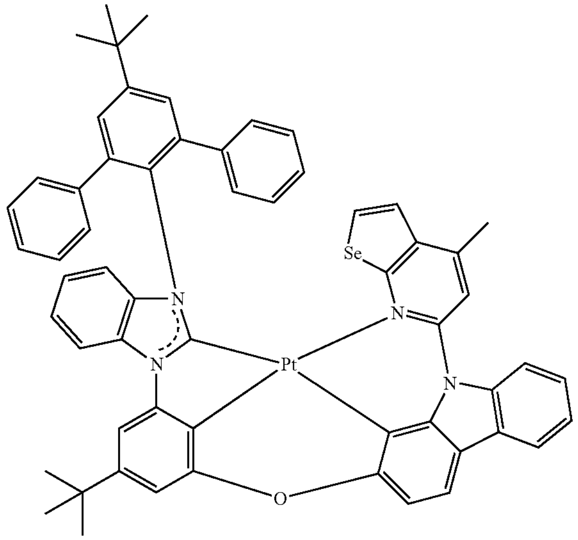

54

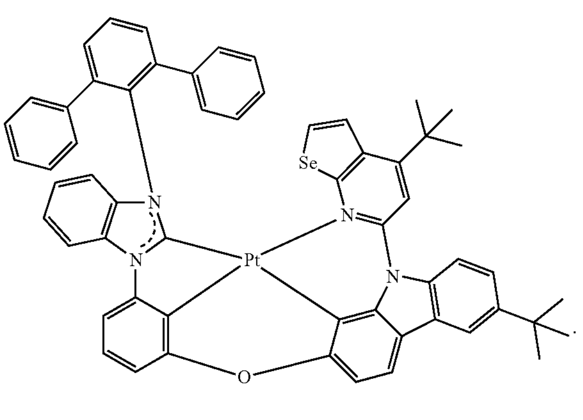

The organometallic compound represented by Formula 1 may include ring $CY_1$ and ring $CY_5$ condensed with ring $CY_1$, and ring $CY_5$ may include $Y_1$ (for example, Te, O, S, or Se) as a ring-forming element. In this regard, the organometallic compound represented by Formula 1 may exhibit relatively excellent (or improved) $^3$MLCT characteristics. Accordingly, due to the use of the organometallic compound, a long-life electronic device (for example, an organic light-emitting device) may be implemented.

In one or more embodiments, the organometallic compound represented by Formula 1 may have a $^3$MLCT value of 9% or more, 9.5% or more, or 10% or more.

In one or more embodiments, the organometallic compound represented by Formula 1 may have an energy level in a $^3$MC state of 0.25 kcal/mol or more or 0.3 kcal/mol or more.

Methods of synthesizing the organometallic compound represented by Formula 1 may be easily understood to those of ordinary skill in the art by referring to Synthesis Examples and/or Examples described herein.

In one or more embodiments, the first electrode of the light-emitting device may be an anode, the second electrode of the light-emitting device may be a cathode, the interlayer may further include a hole transport region between the first electrode and the emission layer and an electron transport region between the emission layer and the second electrode, the hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof.

In one or more embodiments, the interlayer of the light-emitting device may include the organometallic compound represented by Formula 1.

In one or more embodiments, the emission layer of the light-emitting device may include the organometallic compound represented by Formula 1.

In one or more embodiments, the emission layer may emit blue light. For example, the emission layer may emit blue light having a maximum emission wavelength in a range of about 410 nm to about 500 nm, about 420 nm to about 490 nm, about 430 nm to about 480 nm, or about 430 nm to about 470 nm.

In one or more embodiments, the emission layer of the light-emitting device may include a dopant and a host, and the organometallic compound represented by Formula 1 may be included in (e.g., as) the dopant. For example, the organometallic compound may act as a dopant. The emission layer may emit, for example, blue light. The blue light may have a maximum emission wavelength in a range of, for example, about 430 nm to about 470 nm.

In one or more embodiments, the electron transport region of the light-emitting device may include a hole-blocking layer, and the hole-blocking layer may include a phosphine oxide-containing compound, a silicon-containing compound, or any combination thereof. In one or more embodiments, the hole blocking layer may directly contact the emission layer.

In one or more embodiments, the light-emitting device may further include at least one selected from a first capping layer arranged outside the first electrode and a second capping layer arranged outside the second electrode, and the at least one selected from the first capping layer and the second capping layer may include the organometallic compound represented by Formula 1. More details for the first capping layer and/or second capping layer are the same as described in the present specification.

In one or more embodiments, the light-emitting device may further include:

a first capping layer arranged outside the first electrode and including the organometallic compound represented by Formula 1;

a second capping layer arranged outside the second electrode and including the organometallic compound represented by Formula 1; or the first capping layer and the second capping layer.

The wording "(interlayer and/or capping layer) includes an organometallic compound represented by Formula 1" as used herein may be understood as "(interlayer and/or capping layer) may include one or more of the same organometallic compound represented by Formula 1 or two or more different organometallic compounds, each represented by Formula 1".

In one or more embodiments, the interlayer and/or the capping layer may include Compound 1 only as the organometallic compound. In this regard, Compound 1 may be present in the emission layer of the light-emitting device. In one or more embodiments, the interlayer may include, as the organometallic compound, Compound 1 and Compound 2. In this regard, Compound 1 and Compound 2 may exist in the same layer (for example, Compound 1 and Compound 2 may both exist in the emission layer), or may exist in different layers (for example, Compound 1 may exist in the emission layer and Compound 2 may exist in the electron transport region).

The term "interlayer" as used herein refers to a single layer and/or a plurality of layers between a first electrode and a second electrode of a light-emitting device.

In one or more embodiments, the interlayer of the light-emitting device may include:

i) a first compound which is the organometallic compound represented by Formula 1; and ii) a second compound including at least one π electron-deficient nitrogen-containing $C_1$-$C_{60}$ cyclic group, a third compound including a group represented by Formula 3, a fourth compound emitting delayed fluorescence, or any combination thereof, and the first compound, the second compound, the third compound, and the fourth compound may be different from each other:

Formula 3

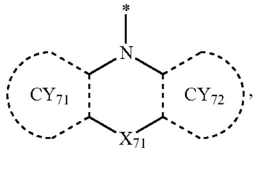

wherein ring $CY_{71}$ and ring $CY_{72}$ in Formula 3 are each independently a π electron-rich $C_3$-$C_{60}$ cyclic group or a pyridine group, $X_{71}$ in Formula 3 may be a single bond or a linking group including O, S, N, B, C, Si, or any combination thereof,

* in Formula 3 indicates a binding site to an adjacent atom in the third compound, and the following compounds may be excluded from the third compound:

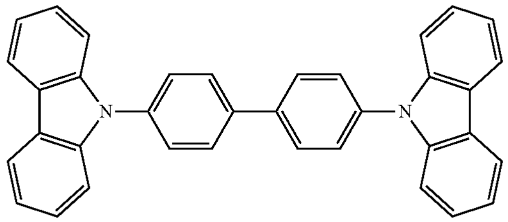

CBP

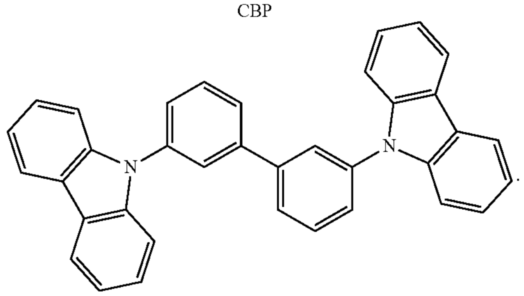

mCBP

In one or more embodiments, the light-emitting device may further include:

the emission layer that may include: i) the first compound; and ii) the second compound, the third compound, the fourth compound, or any combination thereof, and the emission layer may emit phosphorescent light or fluorescent light emitted from the first compound.

Descriptions of Second Compound, Third Compound, and Fourth Compound

The second compound may include a pyridine group, a pyrimidine group, a pyrazine group, a pyridazine group, a triazine group, or any combination thereof.

In one or more embodiments, the light-emitting device may further include at least one selected from the second compound and the third compound, in addition to the first compound.

In one or more embodiments, the light-emitting device may further include the fourth compound, in addition to the first compound.

In one or more embodiments, the light-emitting device may include the first compound, the second compound, the third compound, and the fourth compound.

In one or more embodiments, the interlayer may include the second compound. The interlayer may further include, in addition to the first compound and the second compound, the third compound, the fourth compound, or any combination thereof.

In one or more embodiments, a difference between a triplet energy level (eV) and a singlet energy level (eV) of the fourth compound may be about 0 eV or higher and 0.5 eV or lower (or about 0 eV or higher and about 0.3 eV or lower).

In one or more embodiments, the fourth compound may be a compound including at least one cyclic group including boron (B) and nitrogen (N) as ring-forming atoms.

In one or more embodiments, the fourth compound may be a $C_8$-$C_{60}$ polycyclic group-containing compound including at least two condensed cyclic groups that share B.

In one or more embodiments, the fourth compound may include a condensed ring in which at least one third ring is condensed with at least one fourth ring, the third ring may be a cyclopentane group, a cyclohexane group, a cycloheptane group, a cyclooctane group, a cyclopentene group, a cyclohexene group, a cycloheptene group, a cyclooctene group, an adamantane group, a norbornene group, a norobornane group, a bicyclo[1.1.1]pentane group, a bicyclo[2.1.1]hexane group, a bicyclo[2.2.2]octane group, a benzene group, a pyridine group, a pyrimidine group, a pyridazine group, a pyrazine group, or a triazine group, and the fourth ring may be a 1,2-azaborinine group, a 1,3-azaborinine group, a 1,4-azaborinine group, a 1,2-dihydro-1,2-azaborinine group, a 1,4-oxaborinine group, a 1,4-thiaborinine group, or a 1,4-dihydroborinine group.

In one or more embodiments, the interlayer may include the fourth compound. The interlayer may include, in addition to the first compound and the fourth compound, the second compound, the third compound, or any combination thereof.

In one or more embodiments, the interlayer may include the third compound. For example, the third compound may not include CBP and/or mCBP.

The emission layer in the interlayer may include i) the first compound; and ii) the second compound, the third compound, the fourth compound, or any combination thereof.

The emission layer may emit phosphorescence or fluorescence emitted from the first compound. In one or more embodiments, the phosphorescence or the fluorescence emitted from the first compound may be blue light.

In one or more embodiments, the emission layer in the light-emitting device may include the first compound and the second compound, and the first compound and the second compound may form an exciplex.

In one or more embodiments, the emission layer in the light-emitting device may include the first compound, the second compound, and the third compound, and the first compound and the second compound may form an exciplex.

In one or more embodiments, the emission layer in the light-emitting device may include the first compound and the fourth compound, and the fourth compound may serve to improve color purity, luminescence efficiency, and lifespan characteristics of the light-emitting device.

In one or more embodiments, the second compound may include a compound represented by Formula 2:

Formula 2

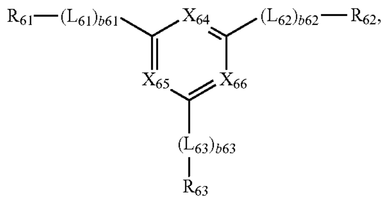

wherein, in Formula 2, $L_{61}$ to $L_{63}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, b61 to b63 may each independently be an integer from 1 to 5, $X_{64}$ may be N or $C(R_{64})$, $X_{65}$ may be N or $C(R_{65})$, $X_{66}$ may be N or $C(R_{66})$, and at least one of $X_{64}$ to $X_{66}$ may be N, $R_{61}$ to $R_{66}$ may respectively be the same as described herein, and $R_{10a}$ may be the same as described herein.

In one or more embodiments, the third compound may include a compound represented by Formula 3-1, a compound represented by Formula 3-2, a compound represented by Formula 3-3, a compound represented by Formula 3-4, a compound represented by Formula 3-5, or any combination thereof:

Formula 3-1

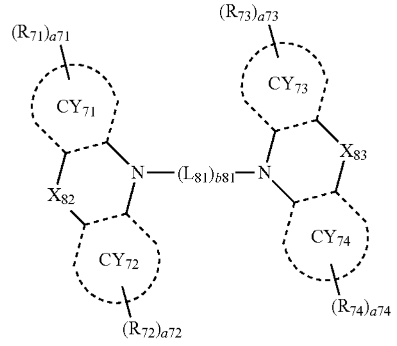

Formula 3-2

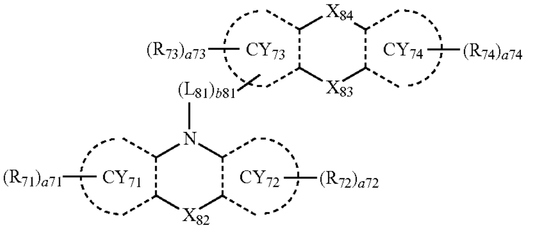

Formula 3-3

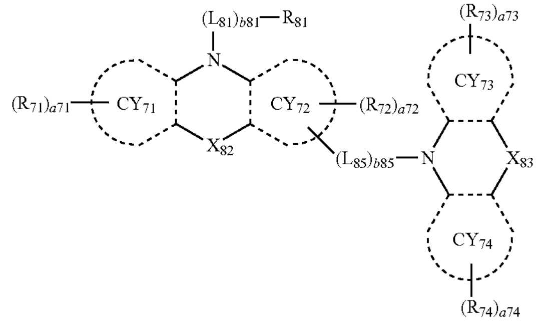

-continued

Formula 3-4

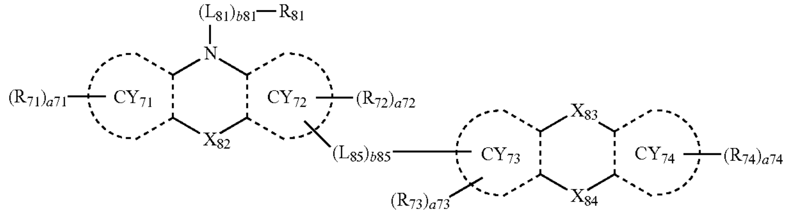

Formula 3-5

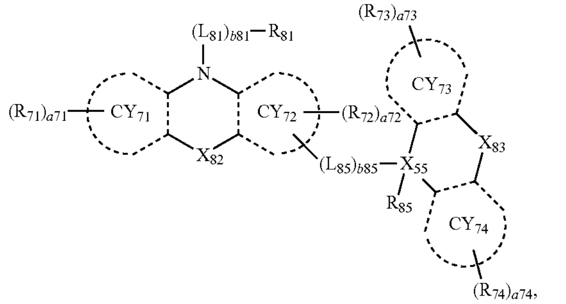

wherein, in Formulae 3-1 to 3-5, ring $CY_{71}$ to ring $CY_{74}$ may each independently be a π electron-rich $C_3$-$C_{60}$ cyclic group or a pyridine group, $X_{82}$ may be a single bond, O, S, N-[$(L_{82})_{b82}$-$R_{82}$], C($R_{82a}$)($R_{82b}$), or Si($R_{82a}$)($R_{82b}$), $X_{83}$ may be a single bond, O, S, N-[$(L_{83})_{b83}$-$R_{83}$], C($R_{83a}$)($R_{83b}$), or Si($R_{83a}$)($R_{83b}$), $X_{84}$ may be O, S, N-[$(L_{84})_{b84}$-$R_{84}$], C($R_{84a}$)($R_{84b}$), or Si($R_{84a}$)($R_{84b}$), $X_{85}$ may be C or Si, $L_{81}$ to $L_{85}$ may each independently be a single bond, *—C($Q_4$)($Q_5$)-*', *—Si($Q_4$)($Q_5$)-*', a π electron-rich $C_3$-$C_{60}$ cyclic group unsubstituted or substituted with at least one $R_{10a}$, or a pyridine group unsubstituted or substituted with at least one $R_{10a}$, and $Q_4$ and $Q_5$ may each be the same as described in connection with $Q_1$, b81 to b85 may each independently be an integer from 1 to 5, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ may respectively be the same as described herein, a71 to a74 may each independently be an integer from 0 to 20, and $R_{10a}$ may be the same as described herein.

In one or more embodiments, the fourth compound may be a compound represented by Formula 502, a compound represented by Formula 503, or any combination thereof:

Formula 502

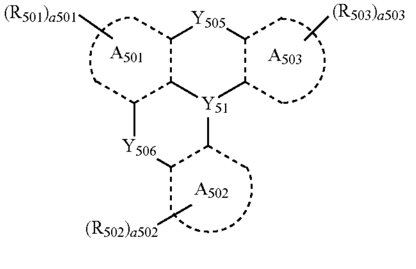

-continued

Formula 503

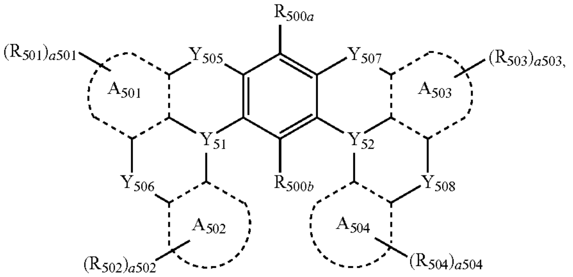

wherein, in Formulae 502 and 503, ring $A_{501}$ to ring $A_{504}$ may each independently be a $C_3$-$C_{60}$ carbocyclic group or a $C_1$-$C_{60}$ heterocyclic group, $Y_{505}$ may be O, S, N($R_{505}$), B($R_{505}$), C($R_{505a}$)($R_{505b}$), or Si($R_{505a}$)($R_{505b}$), $Y_{506}$ may be O, S, N($R_{506}$), B($R_{506}$), C($R_{506a}$)($R_{506b}$), or Si($R_{506a}$)($R_{506b}$), $Y_{507}$ may be O, S, N($R_{507}$), B($R_{507}$), C($R_{507a}$)($R_{507b}$), or Si($R_{507a}$)($R_{507b}$), $Y_{508}$ may be O, S, N($R_{508}$), B($R_{508a}$), C($R_{508a}$)($R_{508b}$), or Si($R_{508a}$)($R_{508b}$), $Y_{51}$ and $Y_{52}$ may each independently be B, P(═O), or S(═O), $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ may respectively be the same as described herein, a501 to a504 may each independently be an integer from 0 to 20, and $R_{10a}$ may be the same as described herein.

Description of Formulae 2 to 4

In Formula 2, b61 to b63 may respectively indicate the number of $L_{61}$(s) to the number of $L_{63}$(s), and b61 to b63 may each be an integer from 1 to 5. At least two $L_{61}$(s) may be identical to or different from each other when b61 is 2 or more, at least two $L_{62}$(s) may be identical to or different from each other when b62 is 2 or more, and at least two $L_{63}$(s) may be identical to or different from each other when b63 is 2 or more. In one or more embodiments, b61 to b63 may each independently be 1 or 2.

In Formula 2, $L_{61}$ to $L_{63}$ may each independently be:

a single bond; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a dibenzooxacilline group, a dibenzothiacilline group, a dibenzodihydroazacilline group, a dibenzodihydrodicilline group, a dibenzodihydrocilline group, a dibenzodioxane group, a dibenzooxathiene group, a dibenzooxazine group, a dibenzopyran group, a dibenzodithiine group, a dibenzothiazine group, a dibenzothiopyran group, a dibenzocyclohexadiene group, a dibenzodihydropyridine group, or a dibenzodihydropyrazine group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, $-O(Q_{31})$, $-S(Q_{31})$, $-Si(Q_{31})(Q_{32})(Q_{33})$, $-N(Q_{31})(Q_{32})$, $-B(Q_{31})(Q_{32})$, $-P(Q_{31})(Q_{32})$, $-C(=O)(Q_{31})$, $-S(=O)_2(Q_{31})$, $-P(=O)(Q_{31})(Q_{32})$, or any combination thereof, and $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In one or more embodiments, in Formula 2, a bond between $L_{61}$ and $R_{61}$, a bond between $L_{62}$ and $R_{62}$, a bond between $L_{63}$ and $R_{63}$, a bond between two or more $L_{61}$(s), a bond between two or more $L_{62}$(s), a bond between two or more $L_{63}$(s), a bond between $L_{61}$ and carbon between $X_{64}$ and $X_{65}$ in Formula 2, a bond between $L_{62}$ and carbon between $X_{64}$ and $X_{66}$ in Formula 2, and a bond between $L_{63}$ and carbon between $X_{65}$ and $X_{66}$ in Formula 2 may each be a "carbon-carbon single bond".

In Formula 2, $X_{64}$ may be N or $C(R_{64})$, $X_{65}$ may be N or $C(R_{65})$, $X_{66}$ may be N or $C(R_{66})$, and at least one of $X_{64}$ to $X_{66}$ may be N. $R_{64}$ to $R_{66}$ may respectively be the same as described herein. For example, two or three of $X_{64}$ to $X_{66}$ may each be N.

$R_{61}$ to $R_{66}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $-C(Q_1)(Q_2)(Q_3)$, $-Si(Q_1)(Q_2)(Q_3)$, $-N(Q_1)(Q_2)$, $-B(Q_1)(Q_2)$, $-C(=O)(Q_1)$, $-S(=O)_2(Q_1)$, or $-P(=O)(Q_1)(Q_2)$, and $Q_1$ to $Q_3$ may respectively be the same as described herein.

In one or more embodiments, i) $R_{61}$ to $R_{66}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in Formulae 2, 3-1 to 3-5, 502, and 503 and ii) $R_{10a}$ may each independently be:

hydrogen, deuterium, —F, —Cl, —Br, —I, a hydroxyl group, a cyano group, a nitro group, a $C_1$-$C_2$m alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $-CD_3$, $-CD_2H$, $-CDH_2$, $-CF_3$, $-CF_2H$, $-CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, $-CD_3$, $-CD_2H$, $-CDH_2$, $-CF_3$, $-CF_2H$, —$CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —$O(Q_{31})$, —$S(Q_{31})$, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, —$P(=O)(Q_{31})(Q_{32})$, or any combination thereof; or —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, and $Q_1$ to $Q_3$ and $Q_{31}$ to $Q_{33}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof:

Formula 91

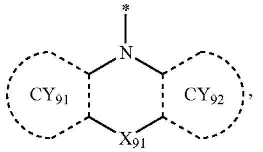

wherein, in Formula 91, ring $CY_{91}$ and ring $CY_{92}$ may each independently be a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $X_{91}$ may be a single bond, O, S, $N(R_{91})$, $B(R_{91})$, $C(R_{91a})(R_{91b})$, or $Si(R_{91a})(R_{91b})$, $R_{91}$, $R_{91a}$, and $R_{91b}$ may respectively be the same as described in connection with $R_{82}$, $R_{82a}$, and $R_{82b}$, $R_{10a}$ may be the same as described herein, and

* indicates a binding site to a neighboring atom.

For example, in Formula 91, ring $CY_{91}$ and ring $CY_{92}$ may each independently be a benzene group, a pyridine group, a pyrimidine group, a pyrazine group, a pyridazine group, or a triazine group, each unsubstituted or substituted with at least one $R_{10a}$, $R_{91}$, $R_{91a}$, and $R_{91b}$ may each independently be:

hydrogen or a $C_1$-$C_{10}$ alkyl group; or a phenyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof.

In one or more embodiments, i) $R_{61}$ to $R_{66}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in Formulae 2, 3-1 to 3-5, 502, and 503; and ii) $R_{10a}$ may each independently be:

hydrogen, deuterium, —F, a cyano group, a nitro group, —CHs, —$CD_3$, —$CD_2H$, —$CDH_2$, —$CF_3$, —$CF_2H$, —$CFH_2$, a group represented by one of Formulae 9-1 to 9-19, a group represented by one of Formulae 10-1 to 10-249, —$C(Q_1)(Q_2)(Q_3)$, —$Si(Q_1)(Q_2)(Q_3)$, —$N(Q_1)(Q_2)$, or —$P(=O)(Q_1)(Q_2)$ (wherein $Q_1$ to $Q_3$ may respectively be the same as described herein):

9-1

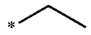

9-2

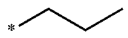

9-3

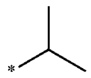

9-4

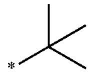

9-5

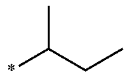

9-6

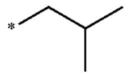

9-7

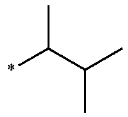

9-8

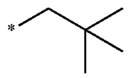

9-9

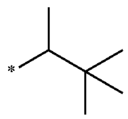

9-10

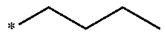

-continued
9-11
9-12
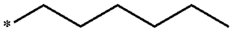
9-13
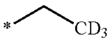
9-14
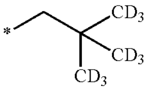
9-15
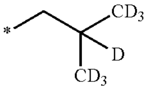
9-16
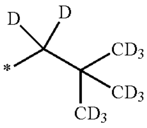
9-17
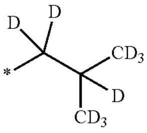
9-18
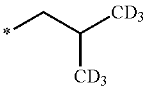
9-19
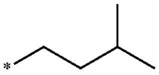
10-1
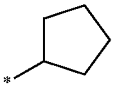
10-2
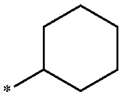
10-3
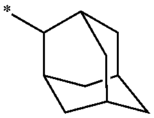
10-4
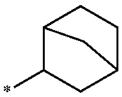
10-5
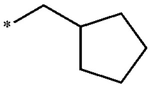
10-6
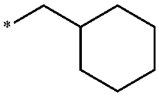
-continued
10-7
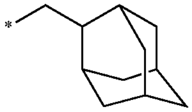
10-8
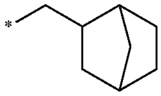
10-9
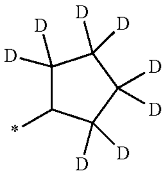
10-10
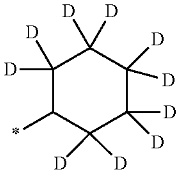
10-11
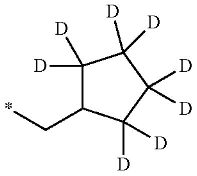
10-12
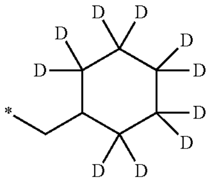
10-13
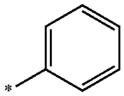
10-14
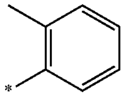
10-15
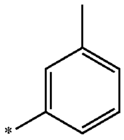
10-16
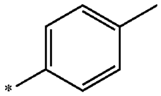
10-17
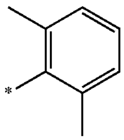

-continued
10-18
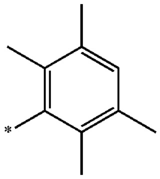
10-19
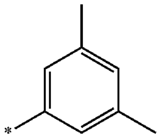
10-20
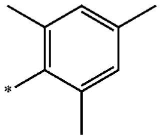
10-21
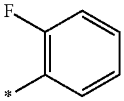
10-22
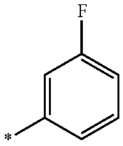
10-23
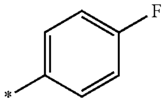
10-24
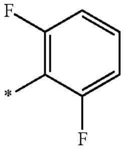
10-25
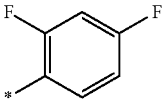
10-26
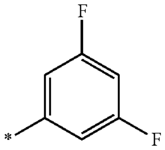
10-27
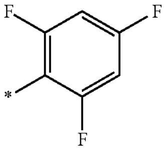
10-28
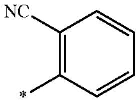
-continued
10-29
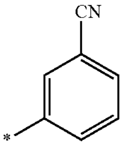
10-30
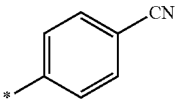
10-31
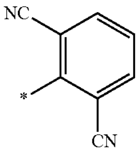
10-32
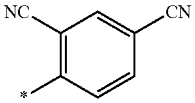
10-33
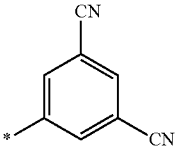
10-34
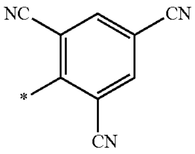
10-35
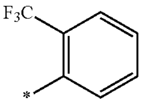
10-36
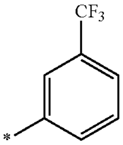
10-37
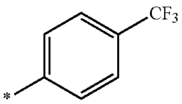
10-38
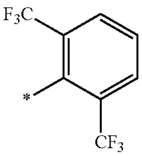
10-39
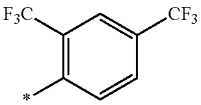

-continued
10-40
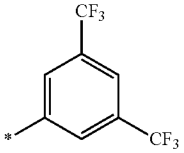
10-41
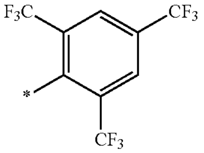
10-42
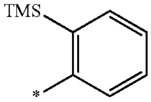
10-43
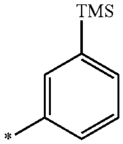
10-44
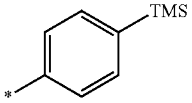
10-45
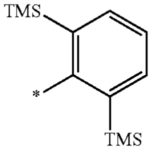
10-46
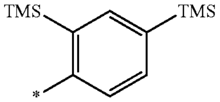
10-47
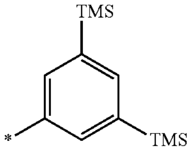
10-48
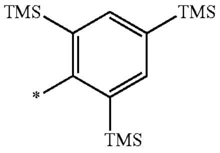
10-49
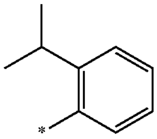
-continued
10-50
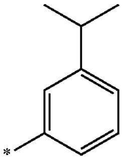
10-51
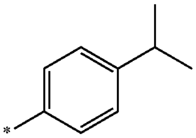
10-52
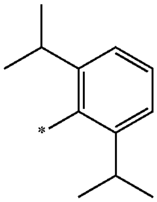
10-53
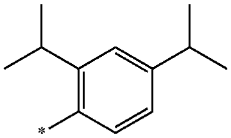
10-54
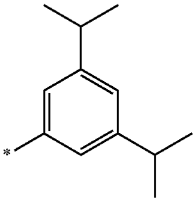
10-55
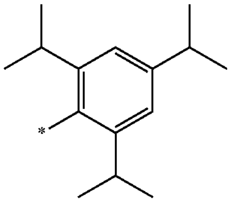
10-56
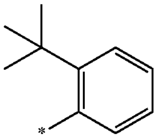
10-57
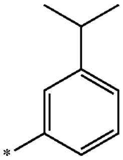
10-58
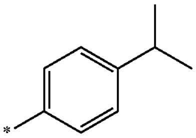

-continued
10-59
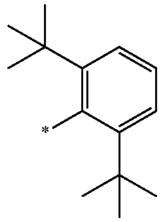
10-60
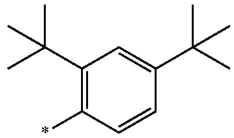
10-61
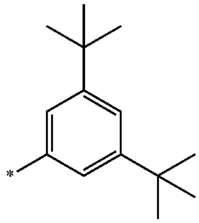
10-62
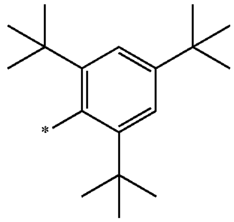
10-63
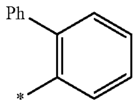
10-64
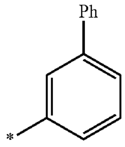
10-65
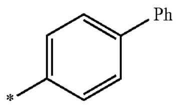
10-66
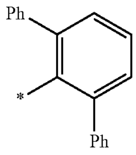
10-67
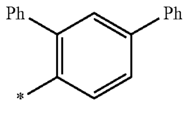
-continued
10-68
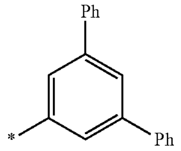
10-69
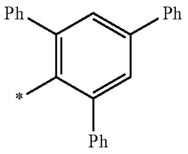
10-70
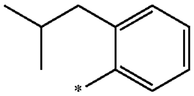
10-71
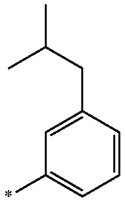
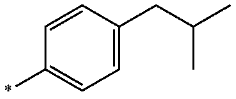
10-73
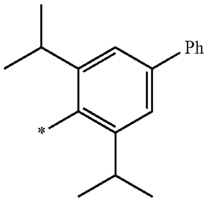
10-74
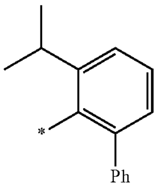
10-75
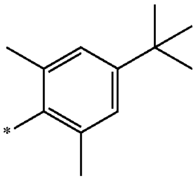

-continued
10-76
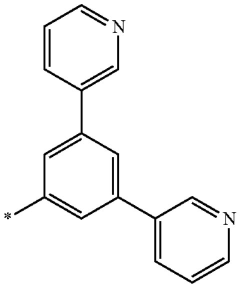
10-77
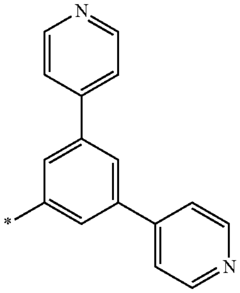
10-78
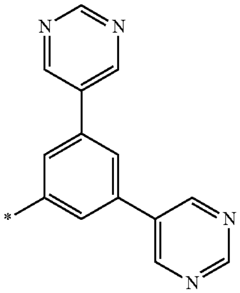
10-79
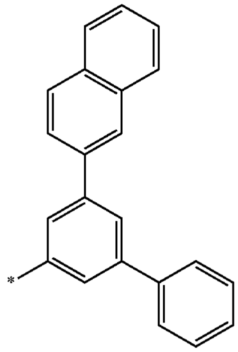
10-80
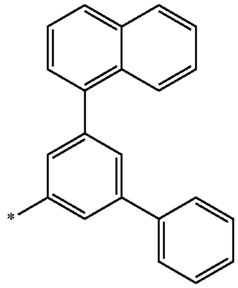
-continued
10-81
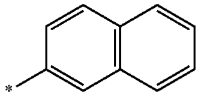
10-82
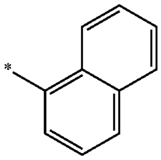
10-83
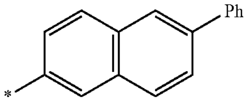
10-84
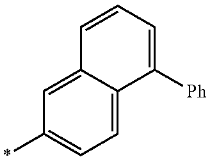
10-85
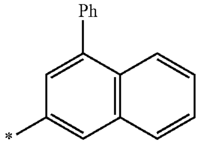
10-86
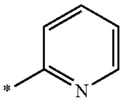
10-87
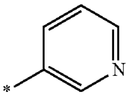
10-88
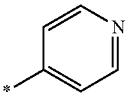
10-89
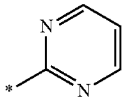
10-90
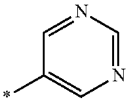
10-91
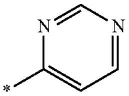
10-92
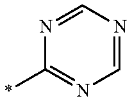

-continued
10-93
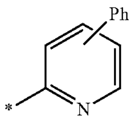
10-94
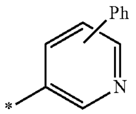
10-95
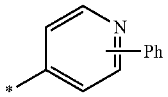
10-96
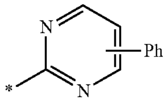
10-97
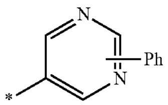
10-98
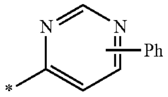
10-99
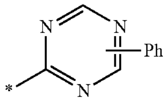
10-100
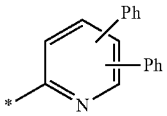
10-101
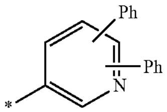
10-102
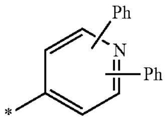
10-103
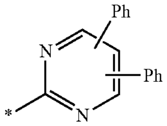
10-104
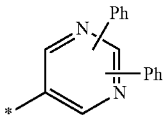
10-105
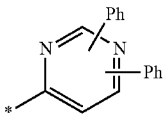
-continued
10-106
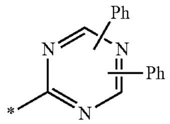
10-107
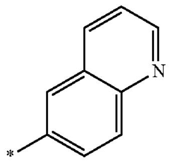
10-108
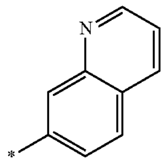
10-109
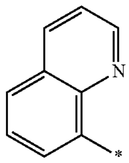
10-110
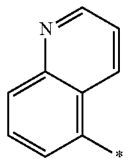
10-111
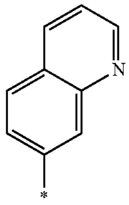
10-112
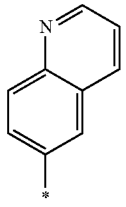
10-113
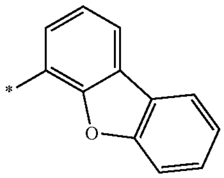
10-114
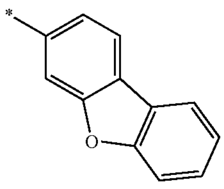

-continued
10-115
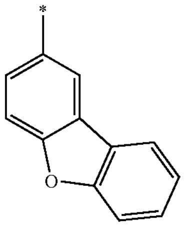
10-116
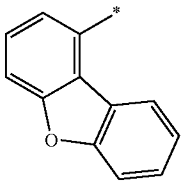
10-117
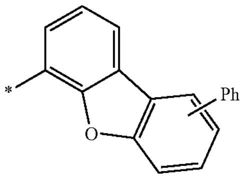
10-118
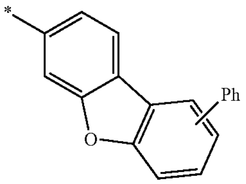
10-119
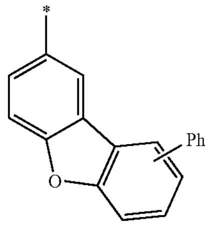
10-120
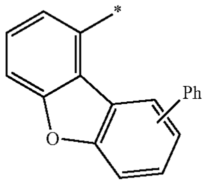
10-121
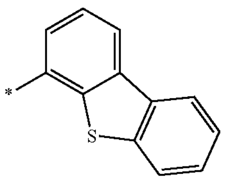
10-122
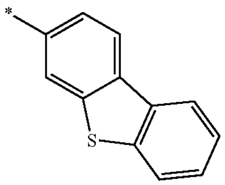
-continued
10-123
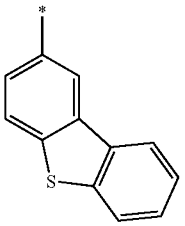
10-124
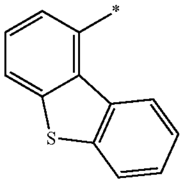
10-125
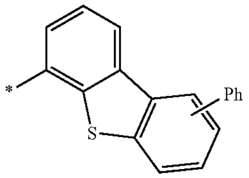
10-126
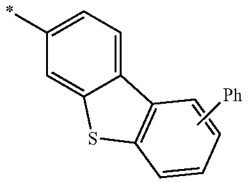
10-127
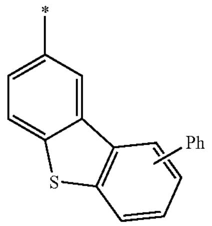
10-128
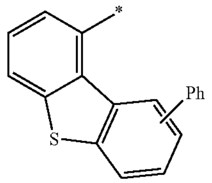
10-129
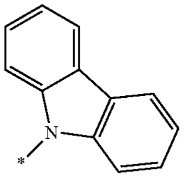
10-130
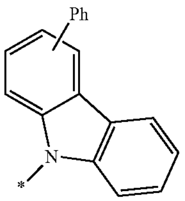

-continued
10-131
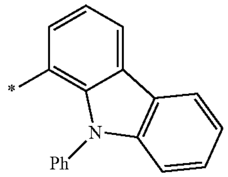
10-132
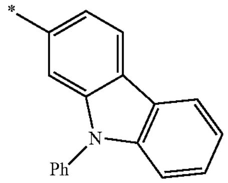
10-133
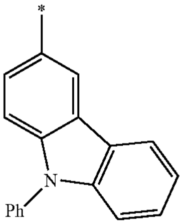
10-134
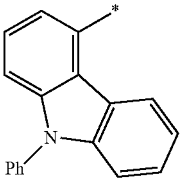
10-135
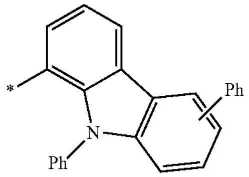
10-136
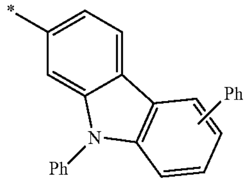
10-137
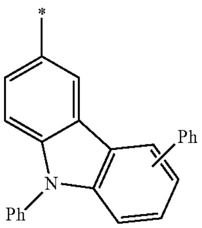
10-138
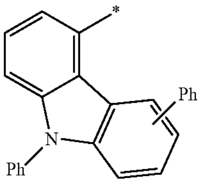
-continued
10-139
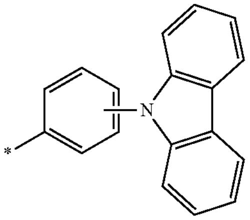
10-140
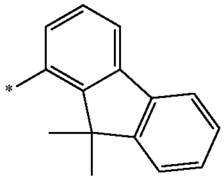
10-141
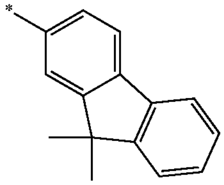
10-142
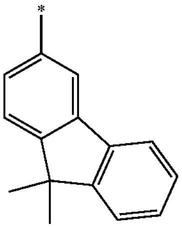
10-143
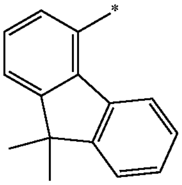
10-144
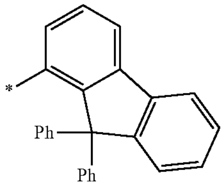
10-145
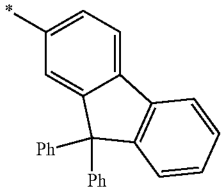

-continued
10-146
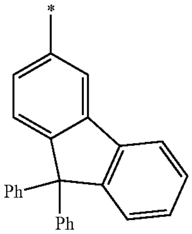
10-147
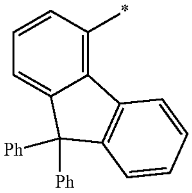
10-148
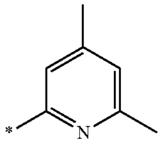
10-149
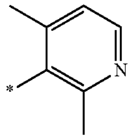
10-150
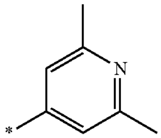
10-151
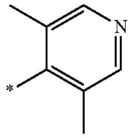
10-152
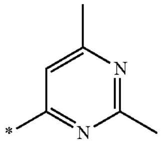
10-153
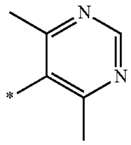
10-154
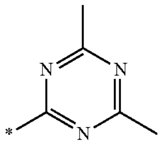
10-155
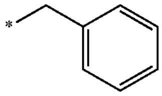
-continued
10-156
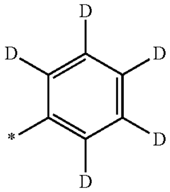
10-157
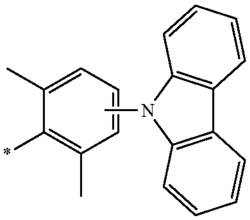
10-158
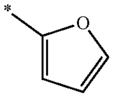
10-159
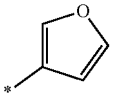
10-160
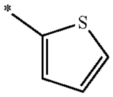
10-161
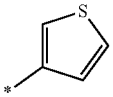
10-162
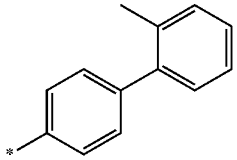
10-163
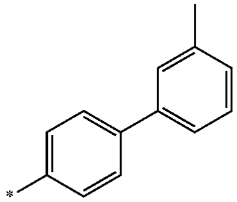
10-164
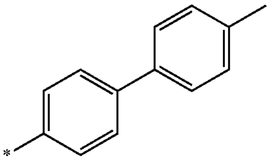
10-165
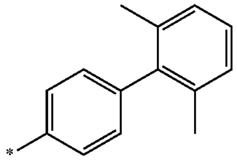

-continued
10-166
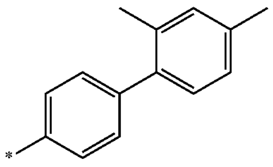
10-167
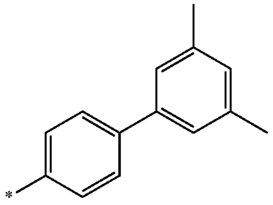
10-168
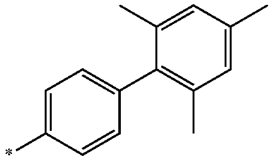
10-169
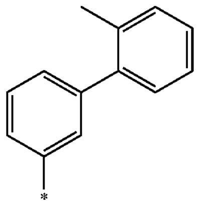
10-170
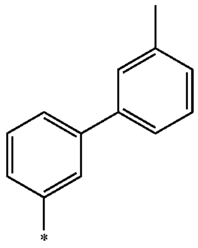
10-171
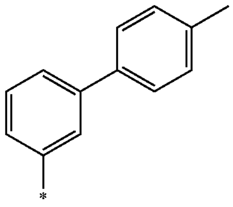
10-172
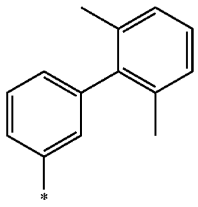
-continued
10-173
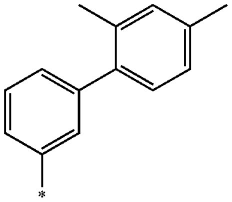
10-174
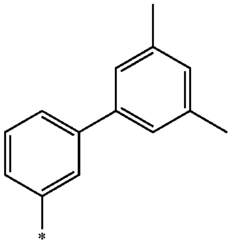
10-175
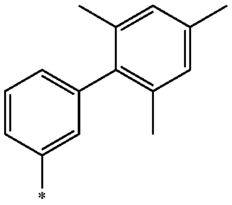
10-176
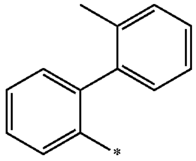
10-177
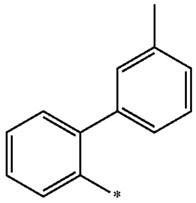
10-178
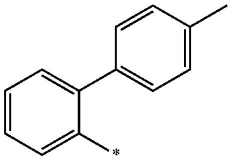
10-179
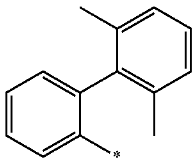
10-180
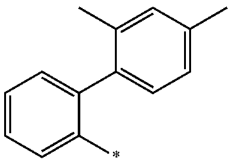

-continued
10-181
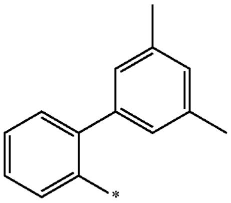
10-182
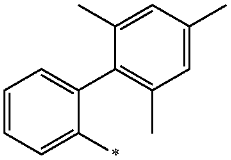
10-183
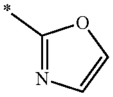
10-184
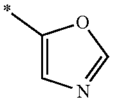
10-185
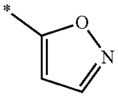
10-186
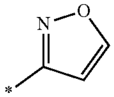
10-187
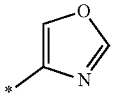
10-188
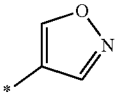
10-189
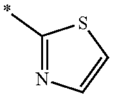
10-190
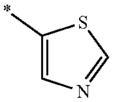
10-191
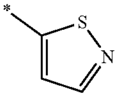
10-192
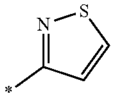
10-193
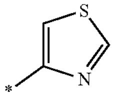
-continued
10-194
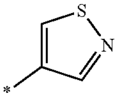
10-195
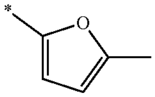
10-196
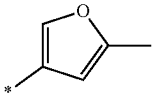
10-197
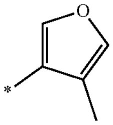
10-198
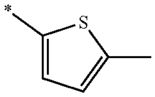
10-199
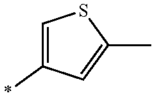
10-200
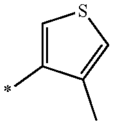
10-201
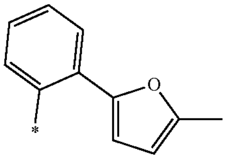
10-202
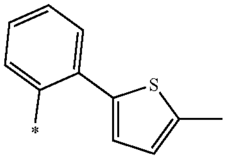
10-203
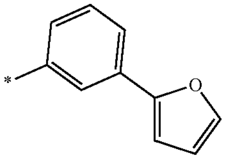
10-204
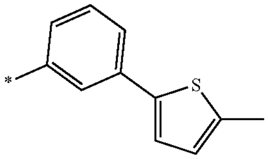

-continued
10-205
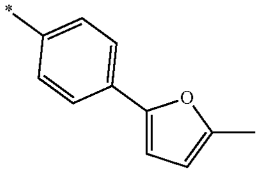
10-206
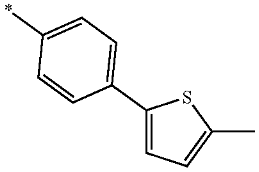
10-207
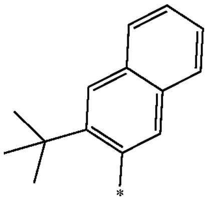
10-208
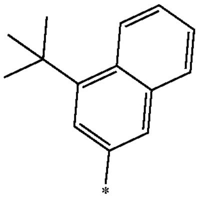
10-209
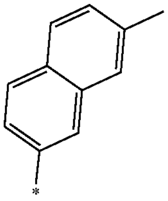
10-210
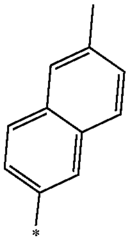
10-211
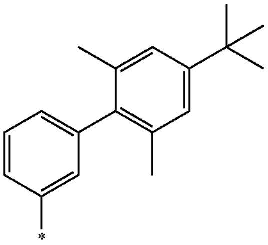
-continued
10-212
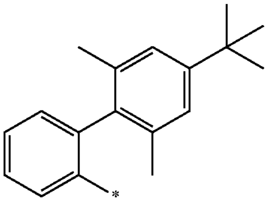
10-213
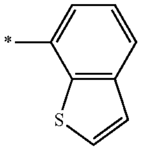
10-214
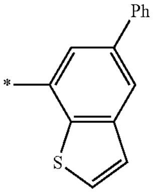
10-215
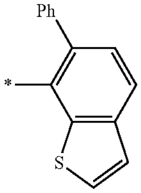
10-216
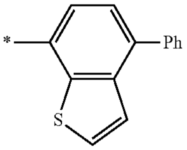
10-217
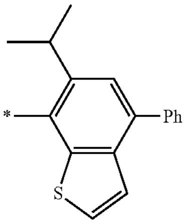
10-218
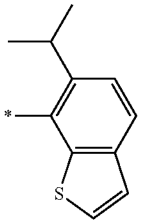
10-219
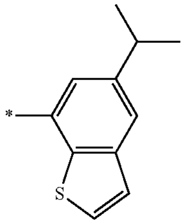

-continued
10-220
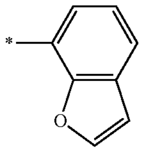
10-221
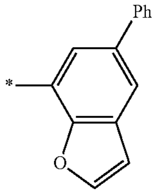
10-222
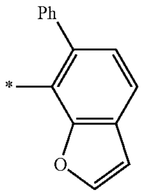
10-223
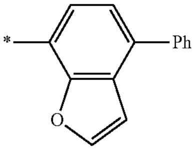
10-224
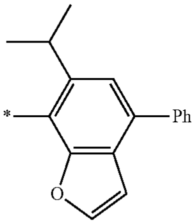
10-225
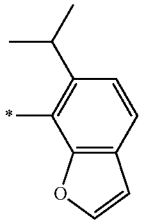
10-226
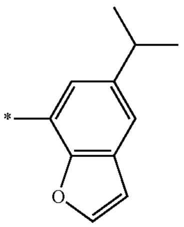
10-227
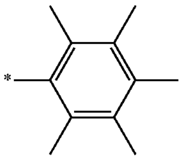
-continued
10-228
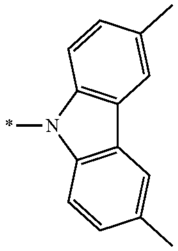
10-229
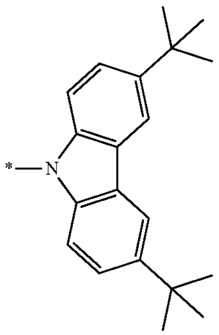
10-230
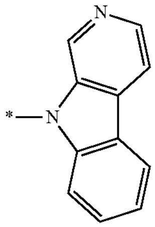
10-231
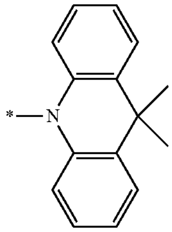
10-232
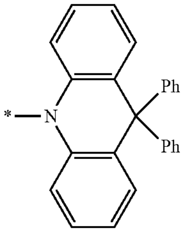
10-233
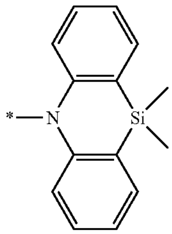

-continued 10-234

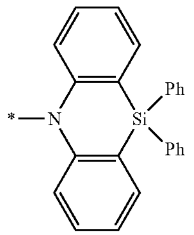

10-235

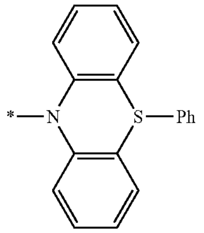

10-236

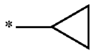

10-237

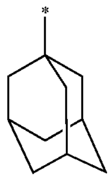

10-238

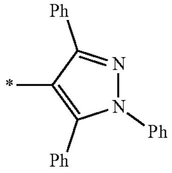

10-239

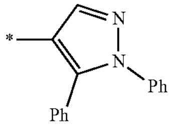

10-240

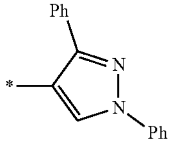

10-241

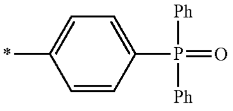

10-242

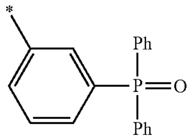

10-243

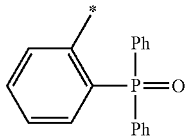

-continued 10-244

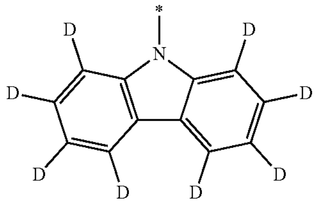

10-245

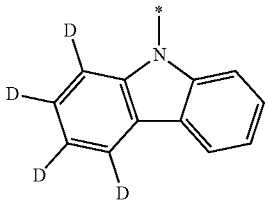

10-246

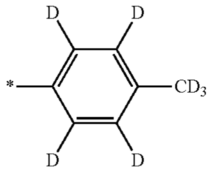

10-247

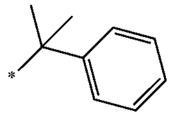

10-248

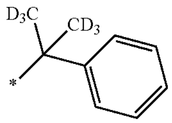

10-249

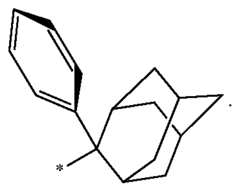

In Formulae 9-1 to 9-19 and 10-1 to 10-249, * indicates a binding site to a neighboring atom, Ph is a phenyl group, and TMS is a trimethylsilyl group.

In Formulae 3-1 to 3-5, 502, and 503, a71 to a74 and a501 to a504 may respectively indicate the number of $R_{71}$(s) to the number of $R_{74}$(s) and the number of $R_{501}$(s) to the number of $R_{504}$(s), and a71 to a74 and a501 to a504 may each independently be an integer from 0 to 20. At least two $R_{71}$(s) may be identical to or different from each other when a71 is 2 or more, at least two $R_{72}$(s) may be identical to or different from each other when a72 is 2 or more, at least two $R_{73}$(s) may be identical to or different from each other when a73 is 2 or more, at least two $R_{74}$(s) may be identical to or different from each other when a74 is 2 or more, at least two $R_{501}$(s) may be identical to or different from each other when a501 is 2 or more, at least two $R_{502}$(s) may be identical to or different from each other when a502 is 2 or more, at least two $R_{503}$(s) may be identical to or different from each other when a503 is 2 or more, and at least two $R_{504}$(s) may be identical to or different from each other when a504 is 2 or more. For example, a71 to a74 and a501 to a504 may each independently be an integer from 0 to 8.

In one or more embodiments, in Formula 2, each of the group represented by $*-(L_{61})_{b61}-R_{61}$ and the group represented by $*-(L_{62})_{b62}-R_{62}$ may not be a phenyl group.

In one or more embodiments, in Formula 2, the group represented by $*-(L_{61})_{b61}-R_{61}$ may be identical to the group represented by $*-(L_{62})_{b62}-R_{62}$.

In one or more embodiments, in Formula 2, the group represented by $*-(L_{61})_{b61}-R_{61}$ and the group represented by $*-(L_{62})_{b62}-R_{62}$ may be different from each other.

In one or more embodiments, in Formula 2, b61 and b62 may each be 1, 2, or 3, $L_{61}$ and $L_{62}$ may each independently be a benzene group, a pyridine group, a pyrimidine group, a pyridazine group, a pyrazine group, or a triazine group, each unsubstituted or substituted with at least one $R_{10a}$.

In one or more embodiments, in Formula 2, $R_{61}$ and $R_{62}$ may each independently be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—C(Q_1)(Q_2)(Q_3)$, or $—Si(Q_1)(Q_2)(Q_3)$, and $Q_1$ to $Q_3$ may each independently be a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In one or more embodiments, in Formula 2, the group represented by $*-(L_{61})_{b61}-R_{61}$ may be a group represented by one of Formulae CY51-1 to CY51-26, and/or the group represented by $*-(L_{62}))_{b62}-R_{62}$ may be a group represented by one of Formulae CY52-1 to CY52-26, and/or the group represented by $*-(L_{63})_{b63}-R_{63}$ may be a group represented by one of Formulae CY53-1 to CY53-27, $—C(Q_1)(Q_2)(Q_3)$, or $—Si(Q_1)(Q_2)(Q_3)$:

CY51-1

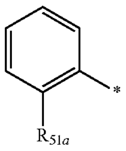

CY51-2

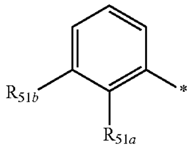

CY51-3

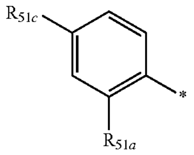

CY51-4

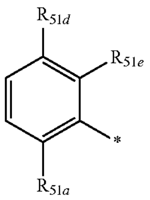

-continued

CY51-5

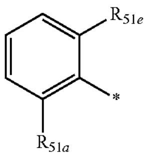

CY51-6

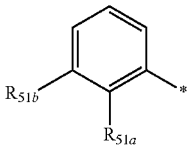

CY51-7

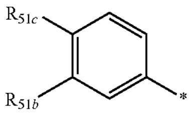

CY51-8

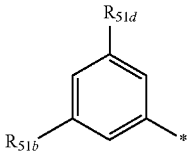

CY51-9

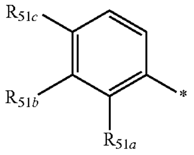

CY51-10

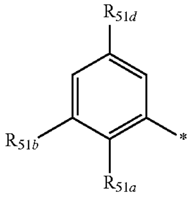

CY51-11

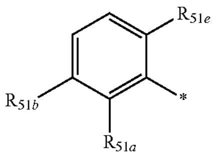

CY51-12

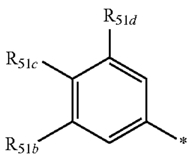

CY51-13

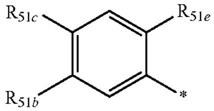

-continued
CY51-14
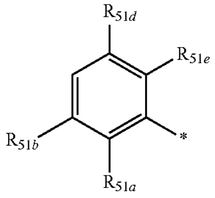
CY51-15
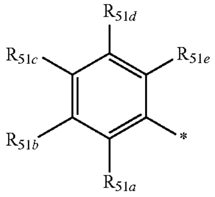
CY51-16
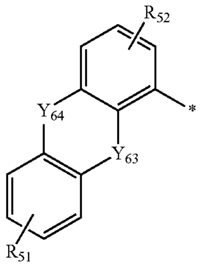
CY51-17
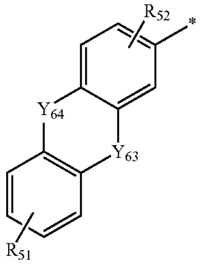
CY51-18
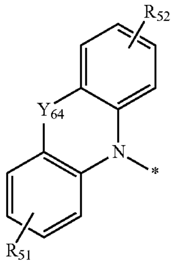
CY51-19
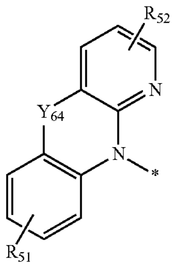
-continued
CY51-20
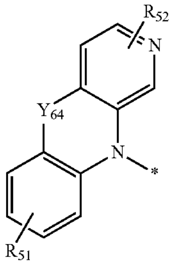
CY51-21
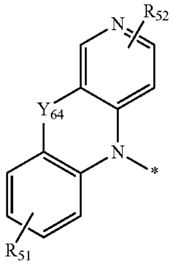
CY51-22
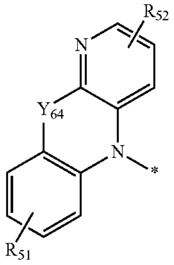
CY51-23
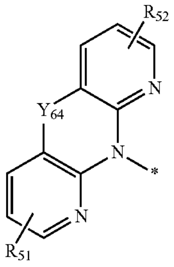
CY51-24
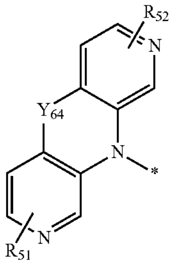
CY51-25
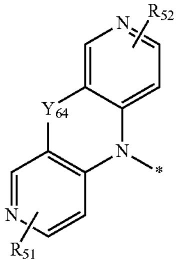

-continued
CY51-26
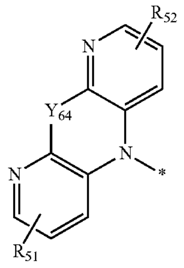
CY52-1
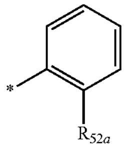
CY52-2
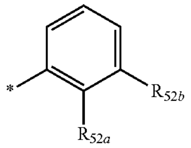
CY52-3
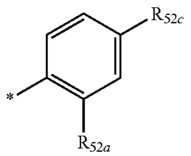
CY52-4
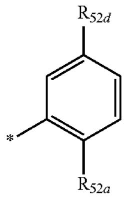
CY52-5
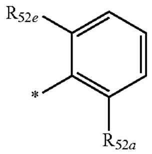
CY52-6
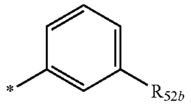
CY52-7
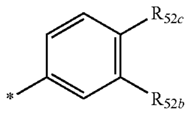
CY52-8
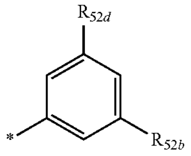
-continued
CY52-9
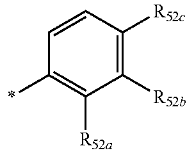
CY52-10
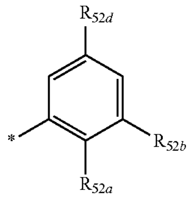
CY52-11
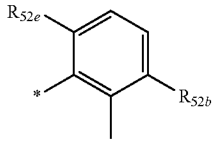
CY52-12
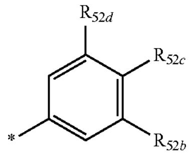
CY52-13
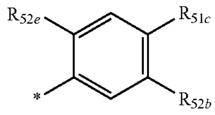
CY52-14
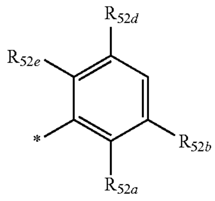
CY52-15
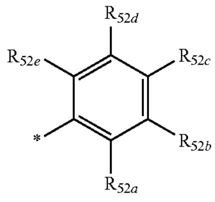
CY52-16
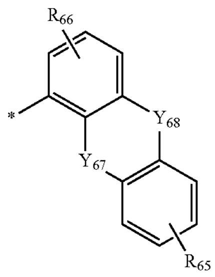

-continued
CY52-17
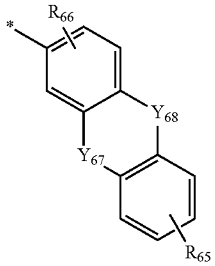
CY52-18
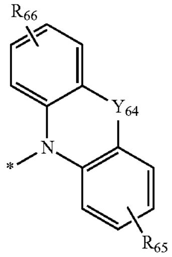
CY52-19
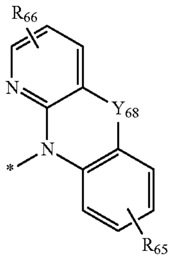
CY52-20
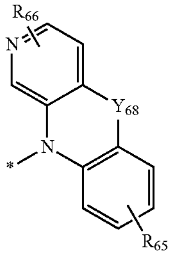
CY52-21
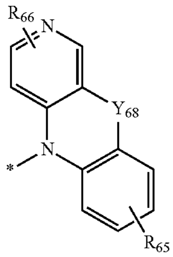
CY52-22
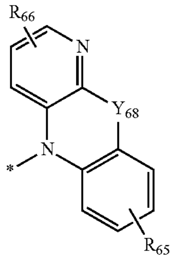
-continued
CY52-23
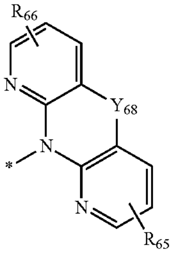
CY52-24
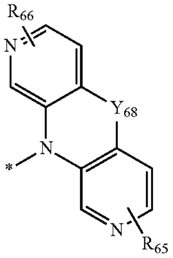
CY52-25
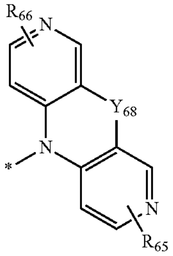
CY52-26
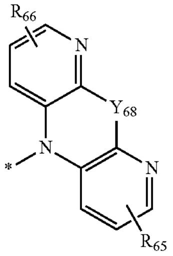
CY53-1
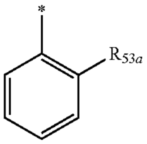
CY53-2
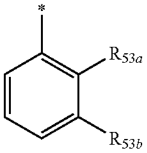
CY53-3
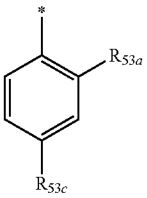

-continued
CY53-4
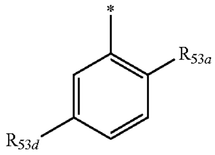
CY53-5
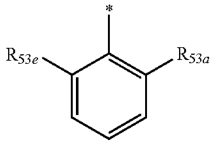
CY53-6
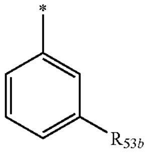
CY53-7
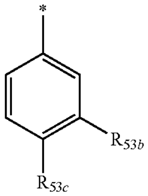
CY53-8
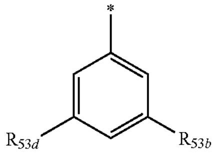
CY53-9
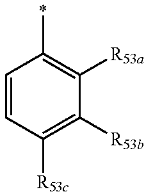
CY53-10
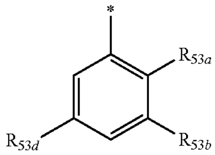
CY53-11
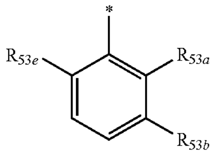
CY53-12
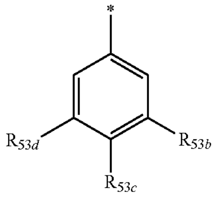
-continued
CY53-13
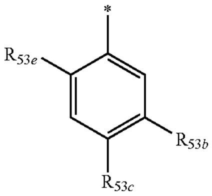
CY53-14
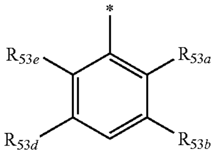
CY53-15
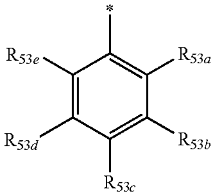
CY53-16
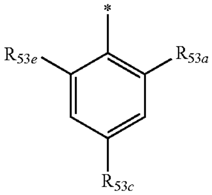
CY53-17
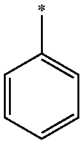
CY53-18
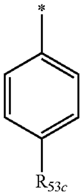
CY53-19
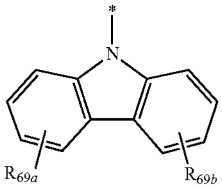
CY53-20
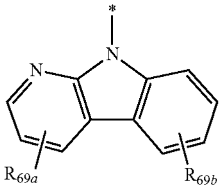

-continued

CY53-21

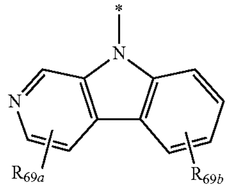

CY53-22

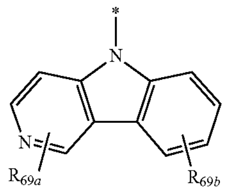

CY53-23

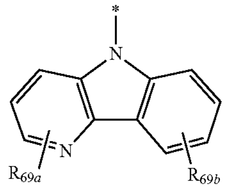

CY53-24

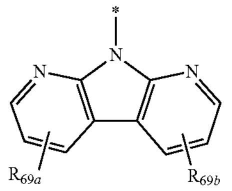

CY53-25

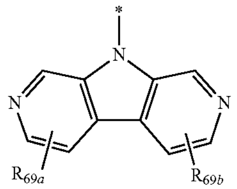

CY53-26

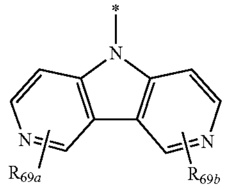

CY53-27

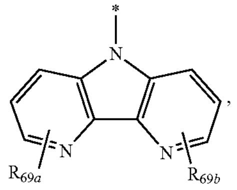

wherein, in Formulae CY51-1 to CY51-26, CY52-1 to CY52-26, and CY53-1 to CY53-27, $Y_{63}$ may be a single bond, O, S, $N(R_{63})$, $B(R_{63})$, $C(R_{63a})(R_{63b})$, or $Si(R_{63a})(R_{63b})$, $Y_{64}$ may be a single bond, O, S, $N(R_{64})$, $B(R_{64})$, $C(R_{64a})(R_{64b})$, or $Si(R_{64a})(R_{64b})$, $Y_{67}$ may be a single bond, O, S, $N(R_{67})$, $B(R_{67})$, $C(R_{67a})(R_{67b})$, or $Si(R_{67a})(R_{67b})$, $Y_{68}$ may be a single bond, O, S, $N(R_{68})$, $B(R_{68})$, $C(R_{68a})(R_{68b})$, or $Si(R_{68a})(R_{68b})$, $Y_{63}$ and $Y_{64}$ in Formulae CY51-16 and CY51-17 may each not be a single bond at the same time, $Y_{67}$ and $Y_{68}$ in Formulae CY52-16 and CY52-17 may each not be a single bond at the same time, $R_{51a}$ to $R_{51e}$, $R_{61}$ to $R_{64}$, $R_{63a}$, $R_{63b}$, $R_{64a}$, and $R_{64b}$ may respectively be the same as described in connection with $R_{61}$, wherein $R_{51a}$ to $R_{51e}$ may not all be hydrogen, $R_{52a}$ to $R_{52e}$, $R_{65}$ to $R_{68}$, $R_{67a}$, $R_{67b}$, $R_{68a}$, and $R_{68b}$ may respectively be the same as described in connection with $R_{62}$, wherein $R_{52a}$ to $R_{52e}$ may not all be hydrogen, $R_{53a}$ to $R_{53a}$, $R_{69a}$, and $R_{69b}$ may respectively be the same as described in connection with $R_{63}$, wherein $R_{53a}$ to $R_{53e}$ may not all be hydrogen, and

* indicates a binding site to a neighboring atom.

For example, $R_{51a}$ to $R_{51e}$ and $R_{52a}$ to $R_{52e}$ in Formulae CY51-1 to CY51-26 and CY52-1 to 52-26 may each independently be:

a cyclopentyl group, a cyclohexyl group, a cycloheptyl group, a cyclooctyl group, an adamantanyl group, a norbornyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_2$m alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof; or —$C(Q_1)(Q_2)(Q_3)$ or —$Si(Q_1)(Q_2)(Q_3)$, and $Q_1$ to $Q_3$ may each independently be a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof.

In Formulae CY51-16 and CY51-17, i) $Y_{63}$ may be O or S and $Y_{64}$ may be $Si(R_{64a})(R_{64b})$, or ii) $Y_{63}$ may be $Si(R_{63a})(R_{63b})$ and $Y_{64}$ may be O or S, and in Formulae CY52-16 and CY52-17, i) $Y_{67}$ may be O or S, and $Y_{68}$ may be $Si(R_{68a})(X_{68b})$, or ii) $Y_{67}$ may be $Si(R_{67a})(R_{67b})$, and $Y_{68}$ may be O or S.

In Formulae 3-1 to 3-5, $L_{81}$ to $L_{85}$ may each independently be:

a single bond;

*—$C(Q_4)(Q_5)$-*' or *—$Si(Q_4)(Q_5)$-*'; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —$O(Q_{31})$, —$S(Q_{31})$, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, —$P(=O)(Q_{31})(Q_{32})$, or any combination thereof, and $Q_4$, $Q_5$, and $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In one or more embodiments, in Formulae 3-1 and 3-2, a group represented by

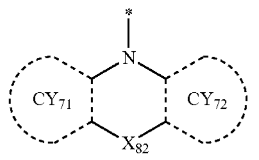

may be represented by one of Formulae CY71-1(1) to CY71-1(8), and/or in Formulae 3-1 and 3-3, a group represented by

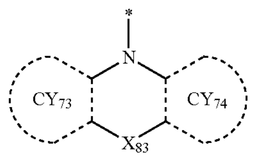

may be represented by one of Formulae CY71-2(1) to CY71-2(8), and/or in Formulae 3-2 and 3-4, a group represented by

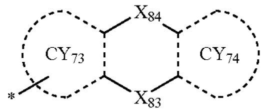

may be represented by one of Formulae CY71-3(1) to CY71-3(32), and/or in Formulae 3-3 to 3-5, a group represented by

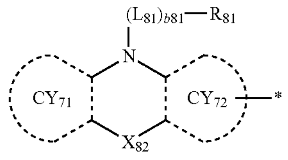

may be represented by one of Formulae CY71-4(1) to CY71-4(32), and/or in Formula 3-5, a group represented by

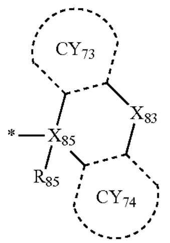

may be represented by one of Formulae CY71-5(1) to CY71-5(8):

CY71-1(1)
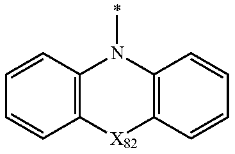
CY71-1(2)
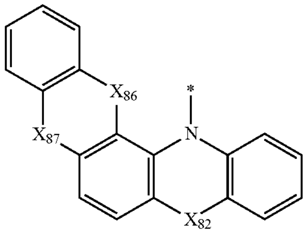
CY71-1(3)
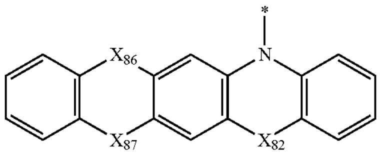
CY71-1(4)
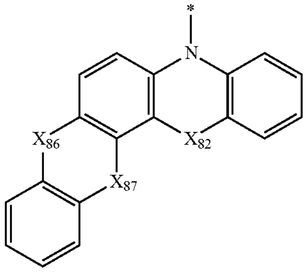
CY71-1(5)
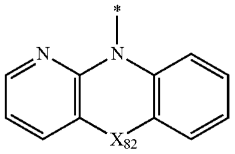
CY71-1(6)
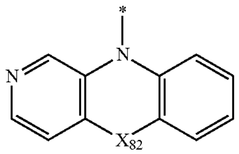
CY71-1(7)
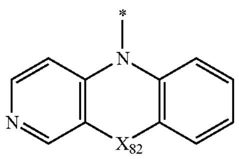
CY71-1(8)
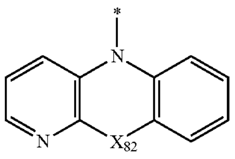
-continued
CY71-2(1)
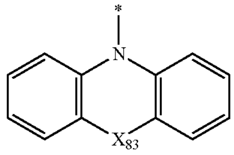
CY71-2(2)
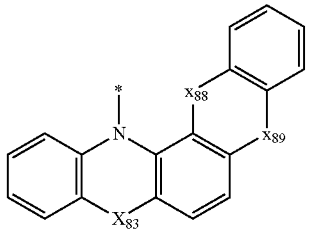
CY71-2(3)
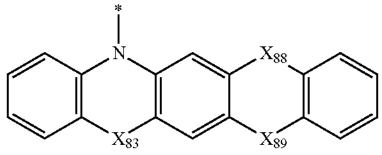
CY71-2(4)
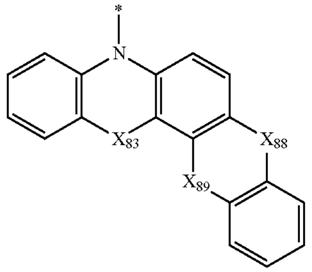
CY71-2(5)
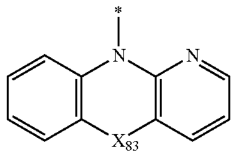
CY71-2(6)
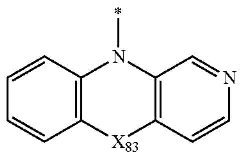
CY71-2(7)
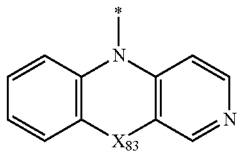
CY71-2(8)
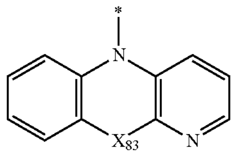

-continued
CY71-3(1)
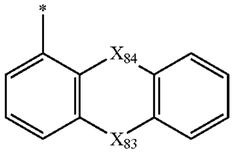
CY71-3(2)
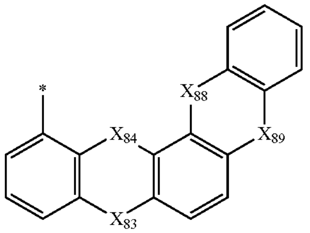
CY71-3(3)
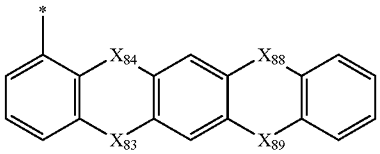
CY71-3(4)
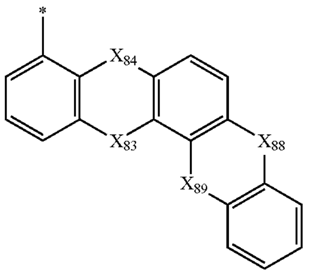
CY71-3(5)
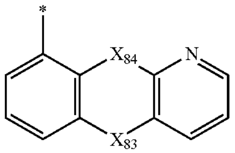
CY71-3(6)
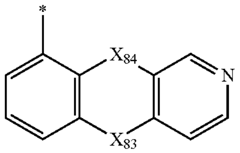
CY71-3(7)
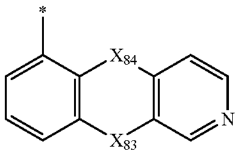
CY71-3(8)
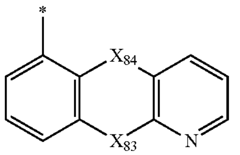
CY71-3(9)
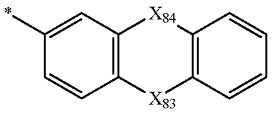
-continued
CY71-3(10)
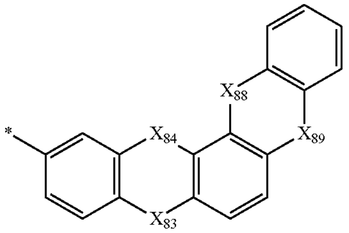
CY71-3(11)
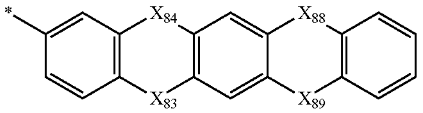
CY71-3(12)
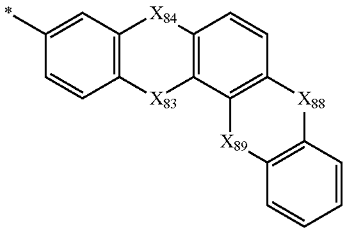
CY71-3(13)
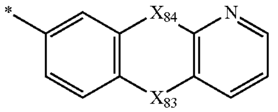
CY71-3(14)
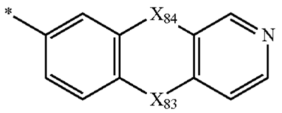
CY71-3(15)
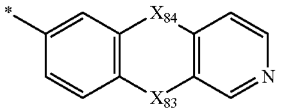
CY71-3(16)
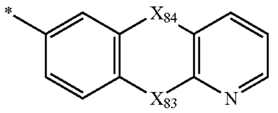
CY71-3(17)
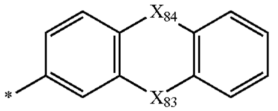
CY71-3(18)
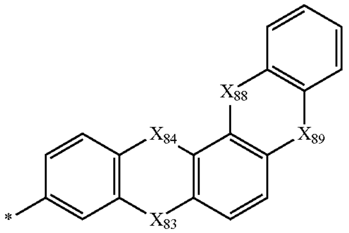
CY71-3(19)
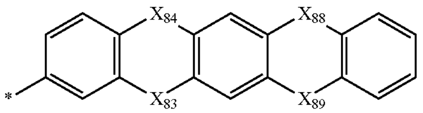

-continued
CY71-3(20)
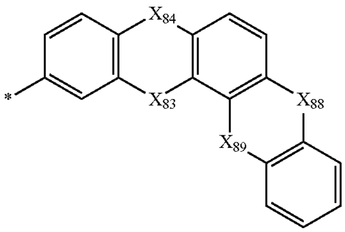
CY71-3(21)
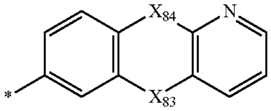
CY71-3(22)
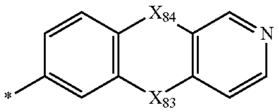
CY71-3(23)
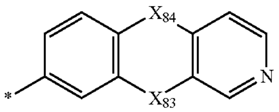
CY71-3(24)
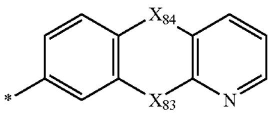
CY71-3(25)
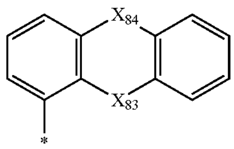
CY71-3(26)
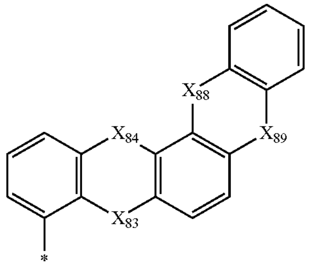
CY71-3(27)
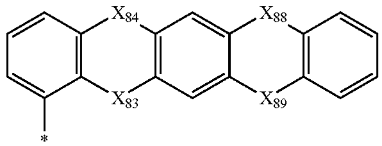
CY71-3(28)
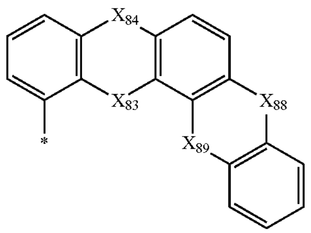
-continued
CY71-3(29)
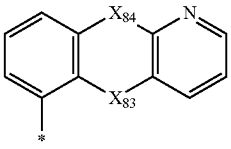
CY71-3(30)
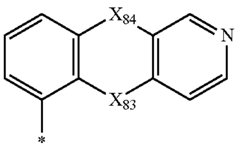
CY71-3(31)
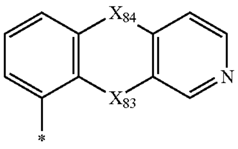
CY71-3(32)
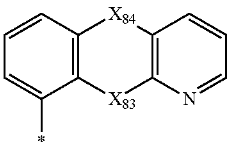
CY71-4(1)
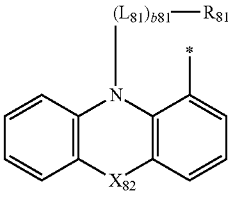
CY71-4(2)
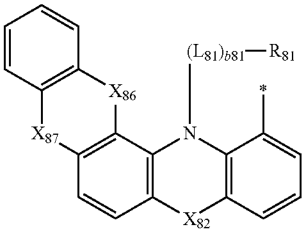
CY71-4(3)
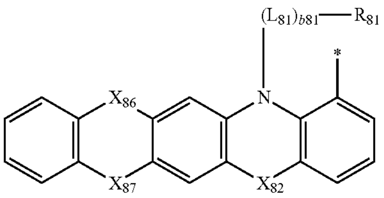
CY71-4(4)
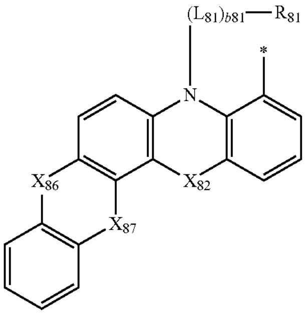

-continued
CY71-4(5)
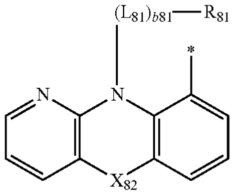
CY71-4(6)
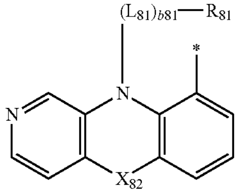
CY71-4(7)
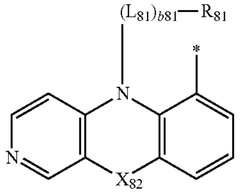
CY71-4(8)
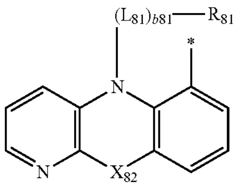
CY71-4(9)
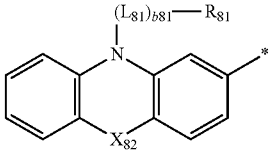
CY71-4(10)
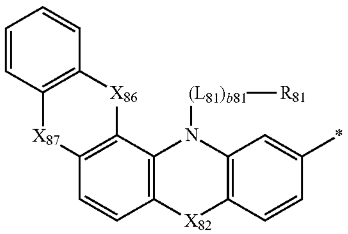
CY71-4(11)
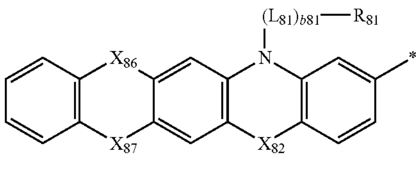
-continued
CY71-4(12)
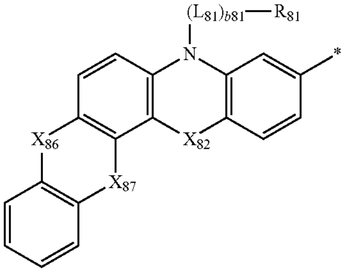
CY71-4(13)
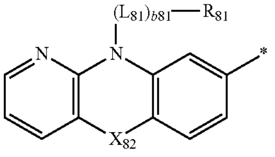
CY71-4(14)
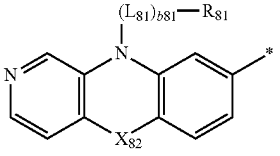
CY71-4(15)
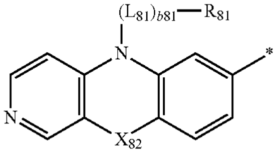
CY71-4(16)
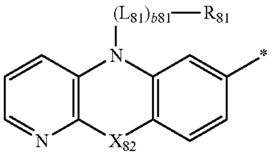
CY71-4(17)
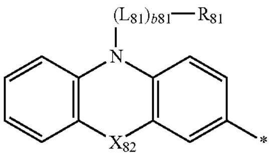
CY71-4(18)
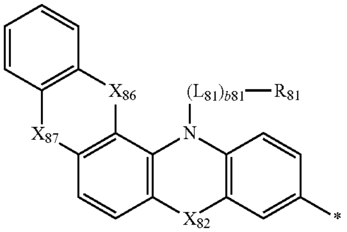
CY71-4(19)
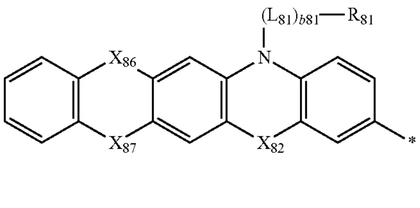

-continued
CY71-4(20)
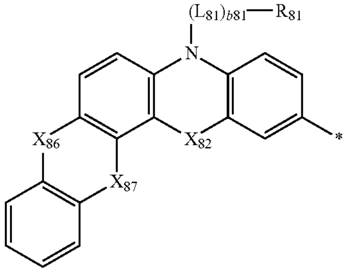
CY71-4(21)
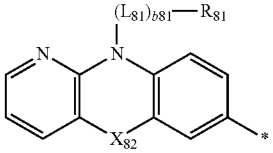
CY71-4(22)
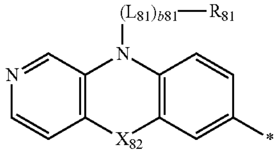
CY71-4(23)
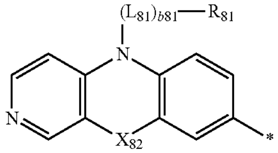
CY71-4(24)
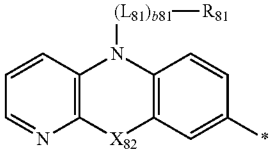
CY71-4(25)
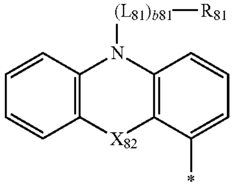
CY71-4(26)
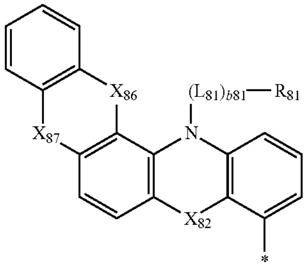
CY71-4(27)
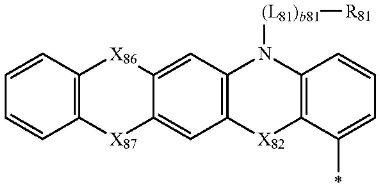
-continued
CY71-4(28)
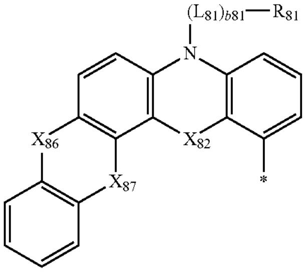
CY71-4(29)
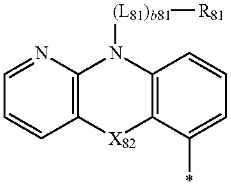
CY71-4(30)
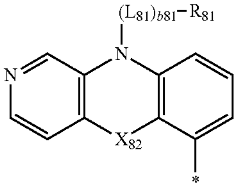
CY71-4(31)
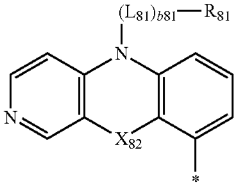
CY71-4(32)
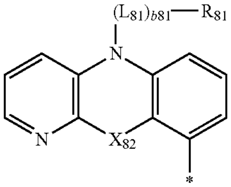
CY71-5(1)
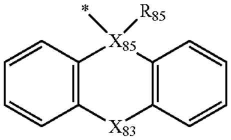
CY71-5(2)
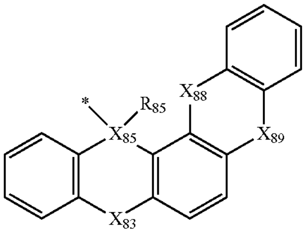
CY71-5(3)
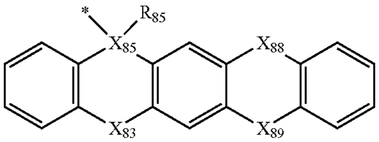

-continued

CY71-5(4)

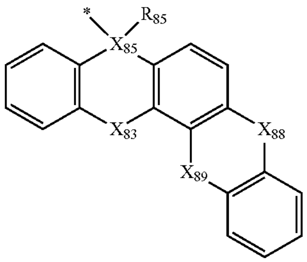

CY71-5(5)

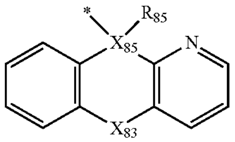

CY71-5(6)

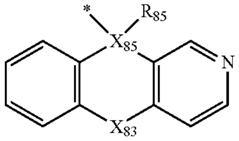

CY71-5(7)

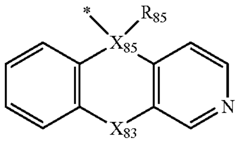

CY71-5(8)

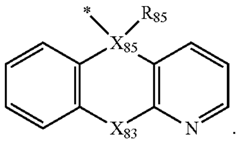

.

In Formulae CY71-1(1) to CY71-1(8), CY71-2(1) to CY71-2(8), CY71-3(1) to CY71-3(32), CY71-4(1) to CY71-4(32), and CY71-5(1) to CY71-5(8), $X_{81}$ to $X_{85}$, $L_{81}$, b81, $R_{81}$, and $R_{85}$ may respectively be the same as described herein, $X_{86}$ may be a single bond, O, S, $N(R_{86})$, $B(R_{86})$, $C(R_{86a})(R_{86b})$, or $Si(R_{86a})(R_{86b})$, $X_{87}$ may be a single bond, O, S, $N(R_{87})$, $B(R_{87})$, $C(R_{87a})(R_{87b})$, or $Si(R_{87a})(R_{87b})$, in Formulae CY71-1(1) to CY71-1(8) and CY71-4(1) to CY71-4(32), $X_{86}$ and $X_{87}$ may not be a single bond at the same time, $X_{88}$ may be a single bond, O, S, $N(R_{88})$, $B(R_{88})$, $C(R_{88a})(R_{88b})$, or $Si(R_{88a})(R_{88b})$, and $X_{89}$ may be a single bond, O, S, $N(R_{89})$, $B(R_{89})$, $C(R_{89a})(R_{89b})$, or $Si(R_{89a})(R_{98b})$.

In Formulae CY71-2(1) to CY71-2(8), CY71-3(1) to CY71-3(32), and CY71-5(1) to CY71-5(8), $X_{88}$ and $X_{89}$ may not be a single bond at the same time, and $R_{86}$ to $R_{89}$, $R_{86a}$, $R_{86b}$, $R_{87a}$, $R_{87b}$, $R_{88a}$, $R_{88b}$, $R_{89a}$, and $R_{89b}$ may respectively be the same as described in connection with $R_{81}$.

Examples of Second Compound, Third Compound, and Fourth Compound

In one or more embodiments, the second compound may include at least one of Compounds ETH1 to ETH84:

ETH1

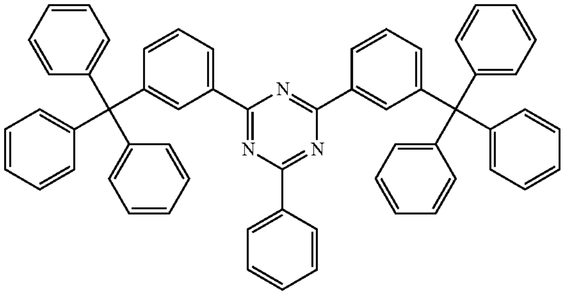

ETH2

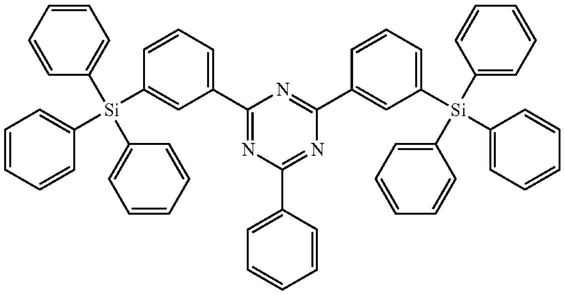

ETH3

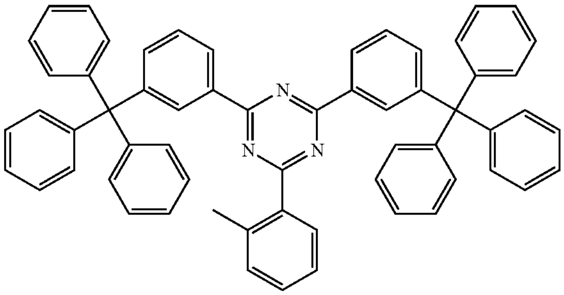

ETH4

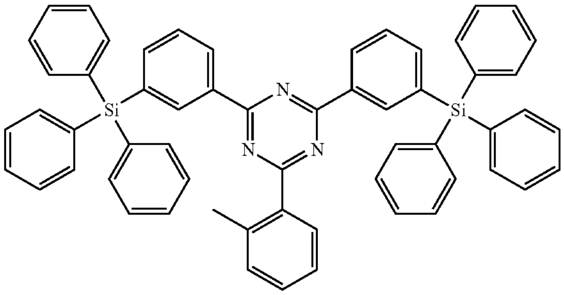

ETH5

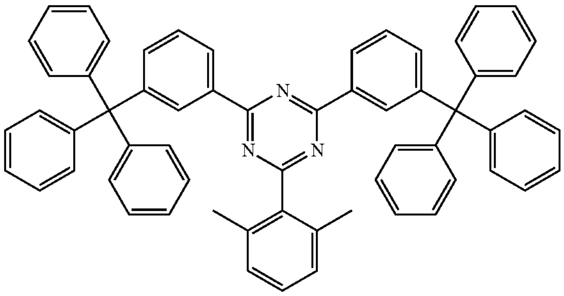

-continued
ETH6
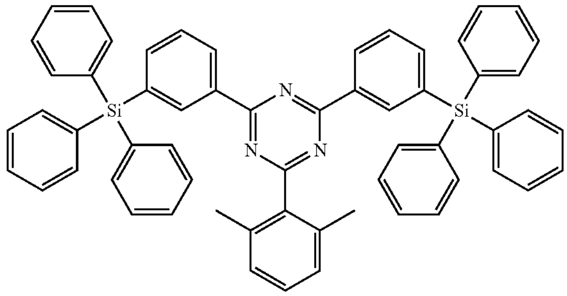
ETH7
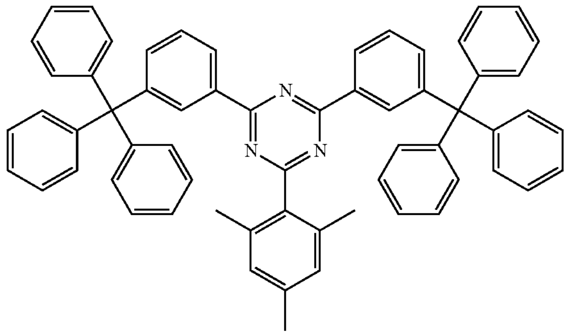
ETH8
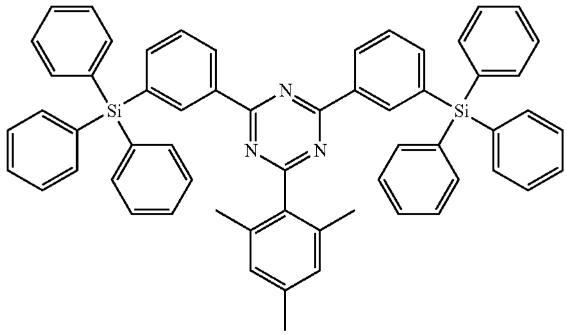
ETH9
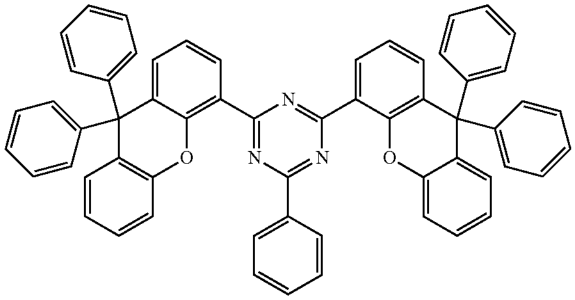
-continued
ETH10
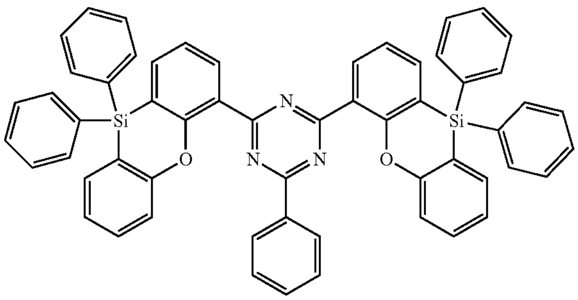
ETH11
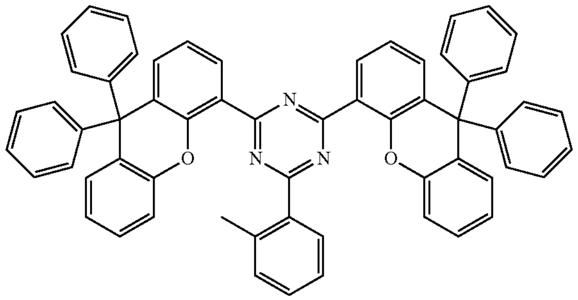
ETH12
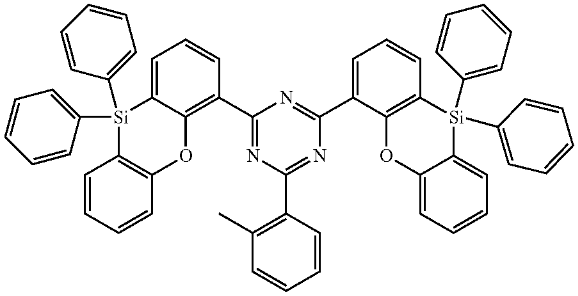
ETH13
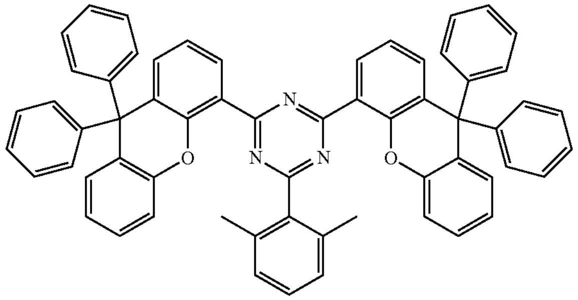
ETH14
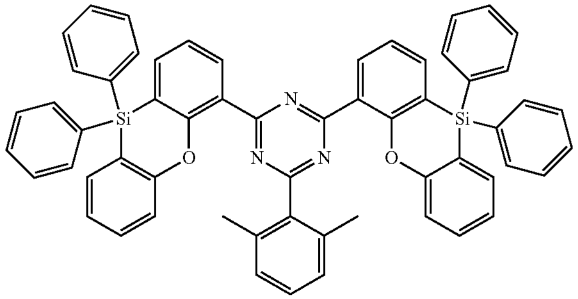

-continued
ETH15
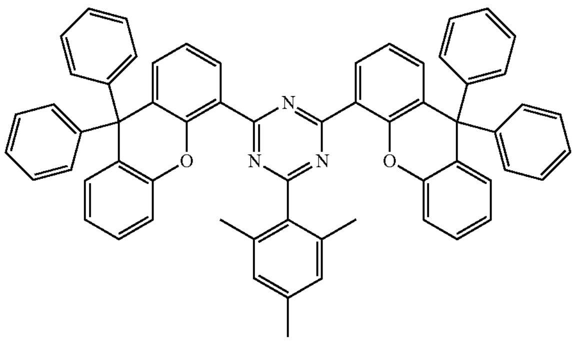
ETH16
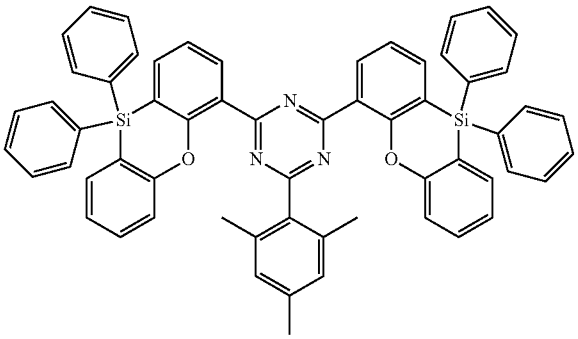
ETH17
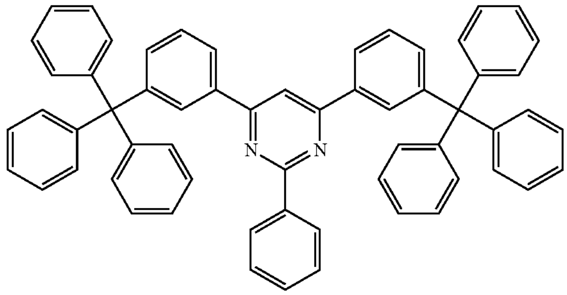
ETH18
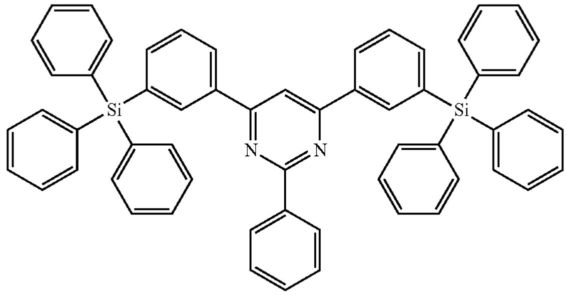
-continued
ETH19
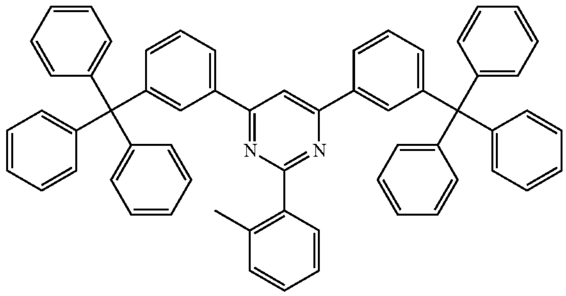
ETH20
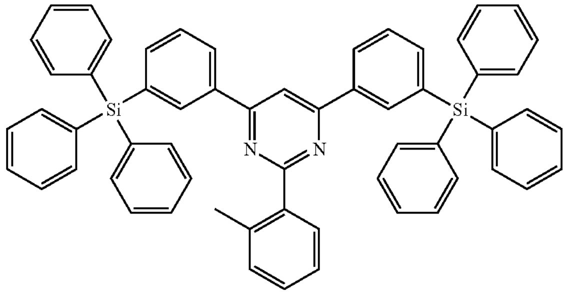
ETH21
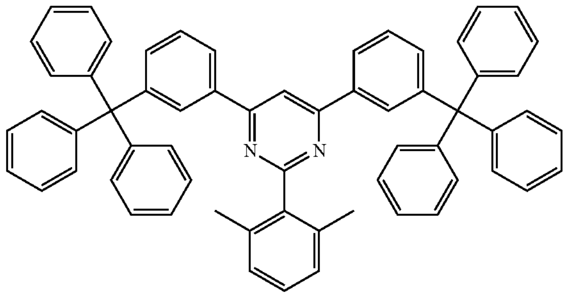
ETH22
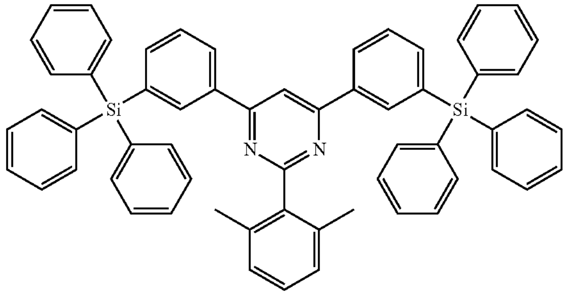
ETH23
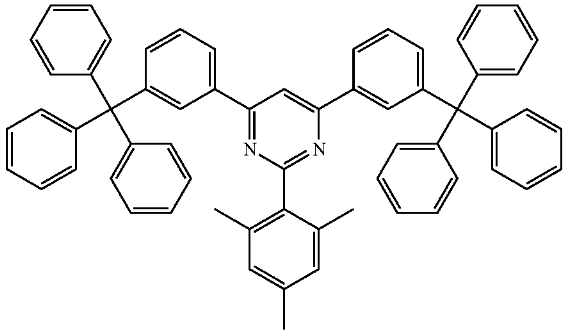

-continued
ETH24
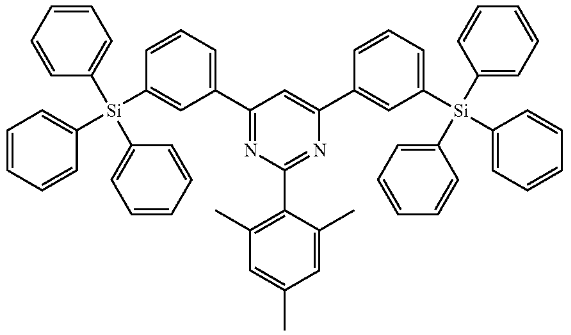
ETH25
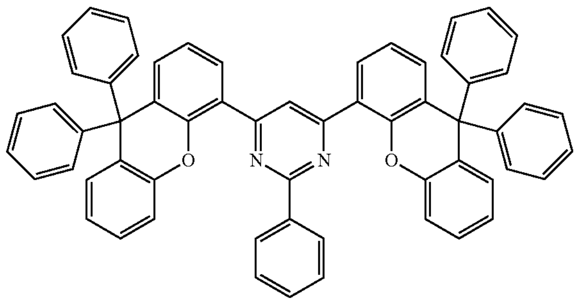
ETH26
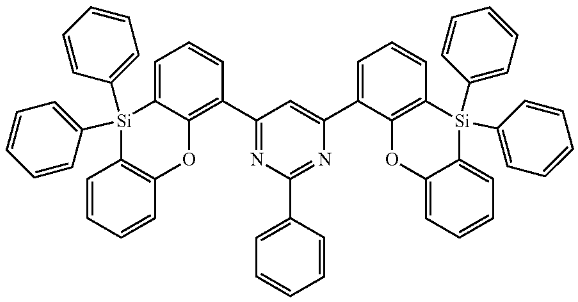
ETH27
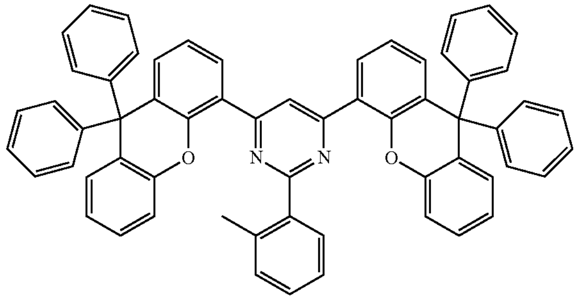
-continued
ETH28
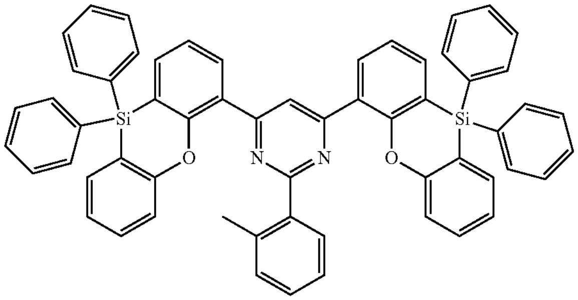
ETH29
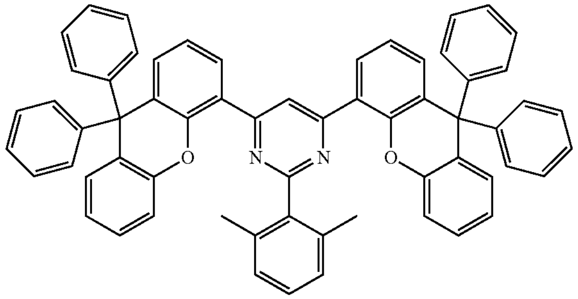
ETH30
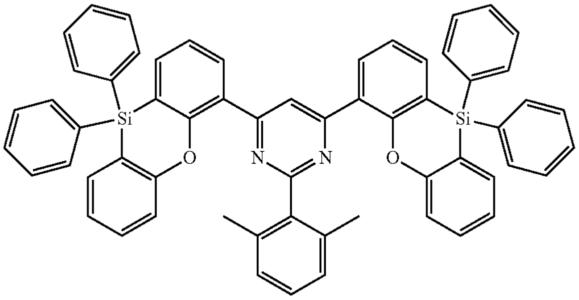
ETH31
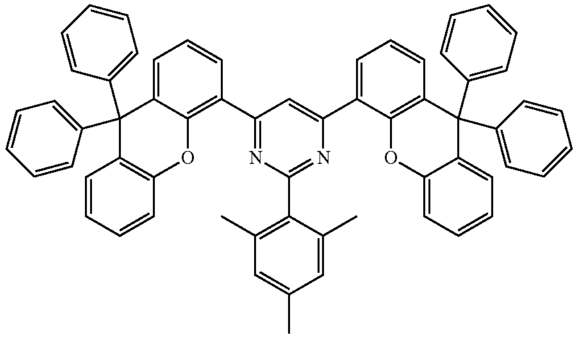

-continued
ETH32
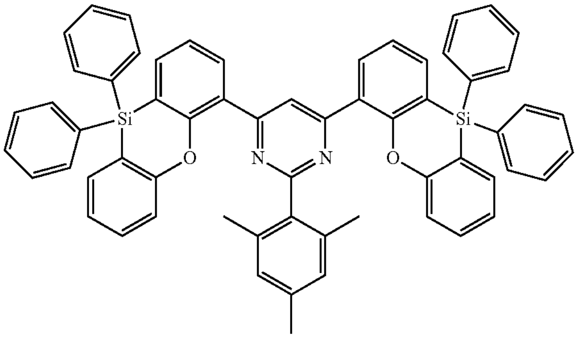
ETH33
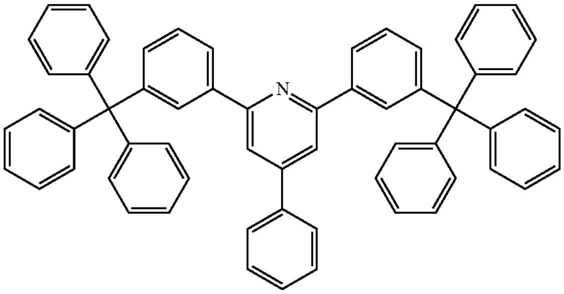
ETH34
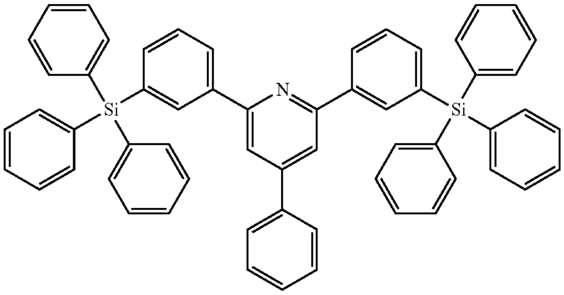
ETH35
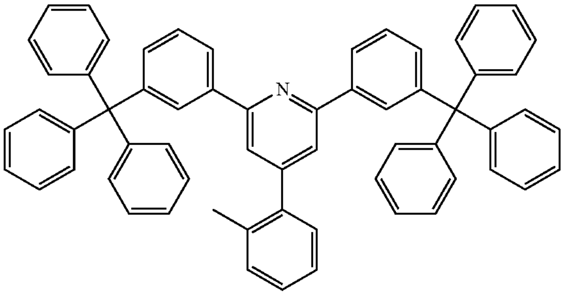
ETH36
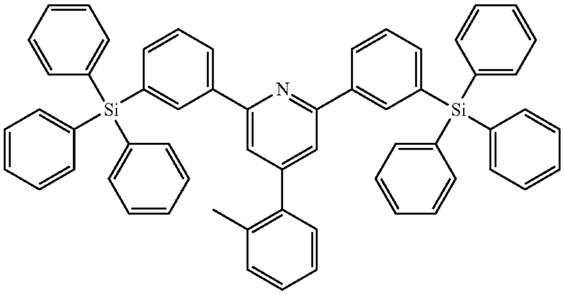
-continued
ETH37
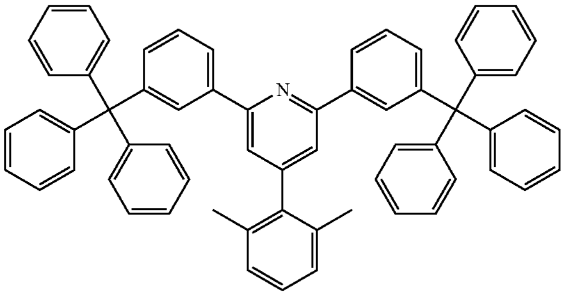
ETH38
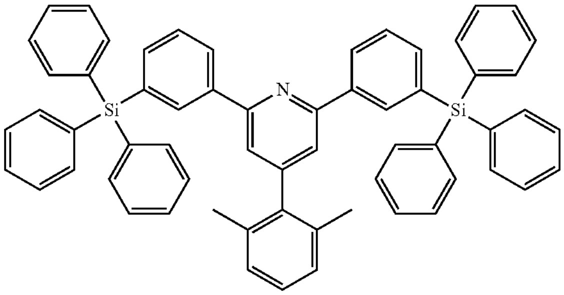
ETH39
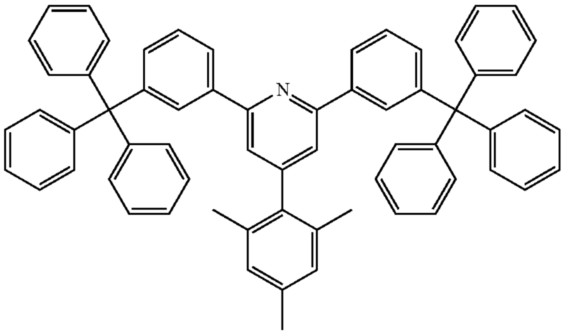
ETH40
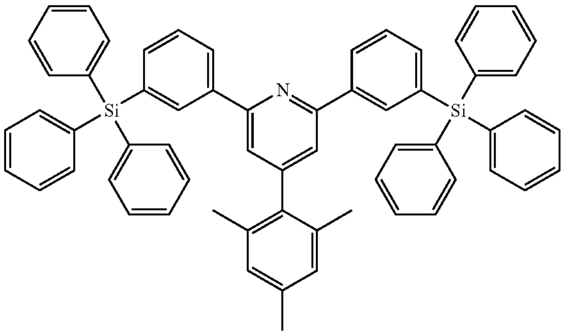

-continued
ETH41
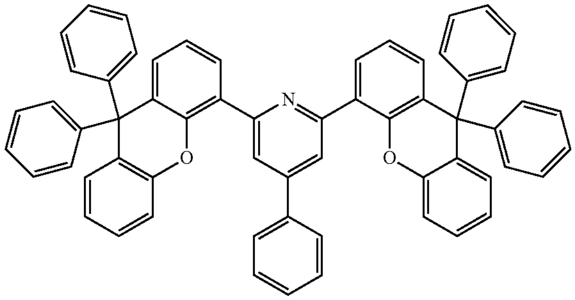
ETH42
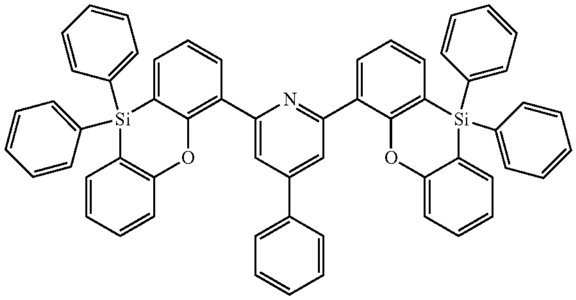
ETH43
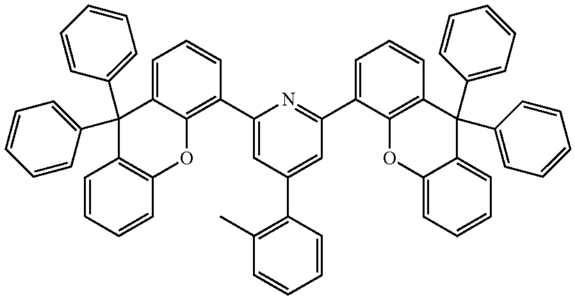
ETH44
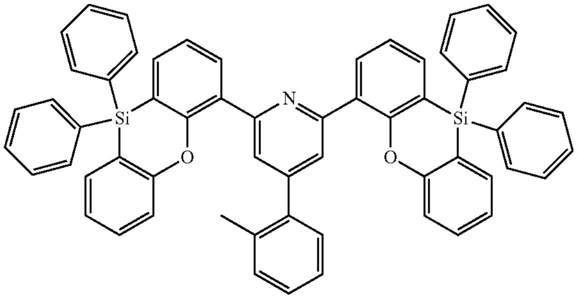
ETH45
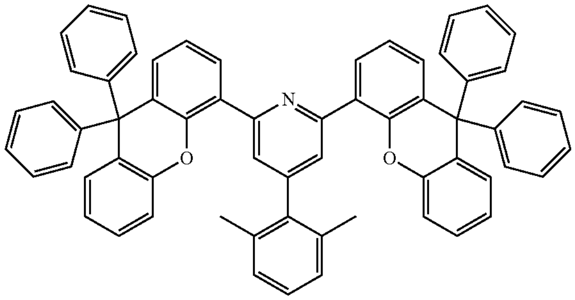
-continued
ETH46
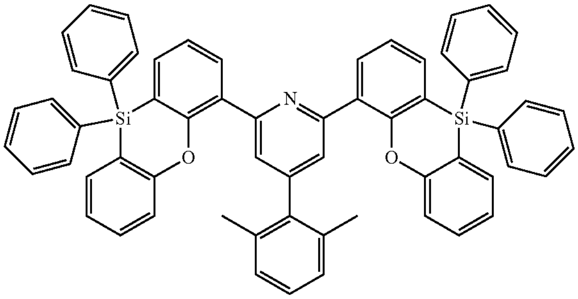
ETH47
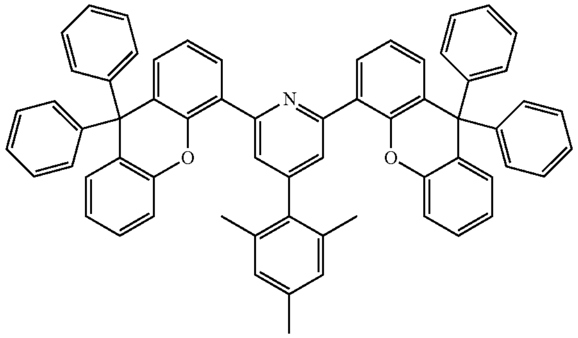
ETH48
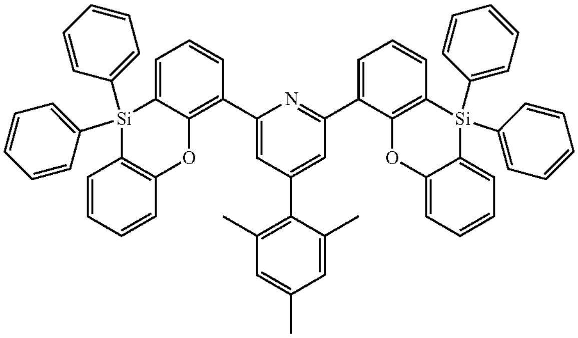
ETH49
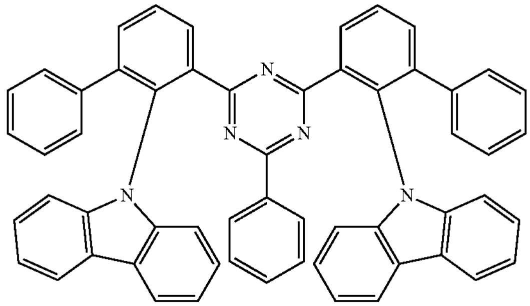

-continued
ETH50
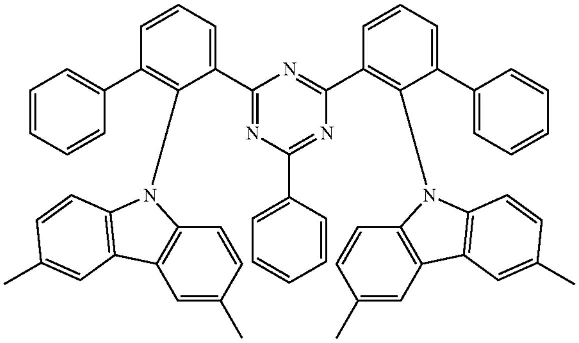
ETH51
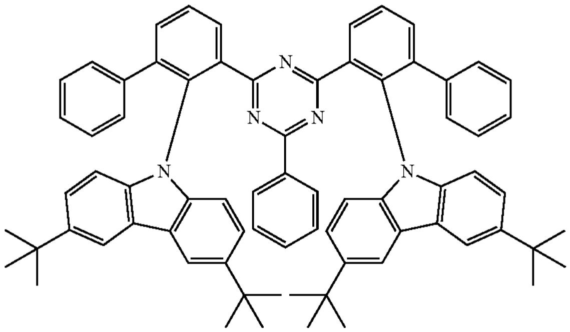
ETH52
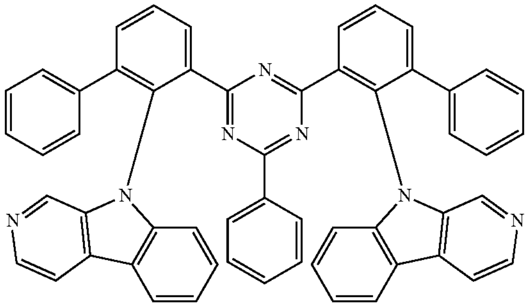
ETH53
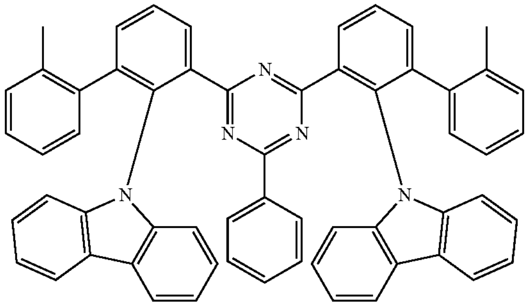
-continued
ETH54
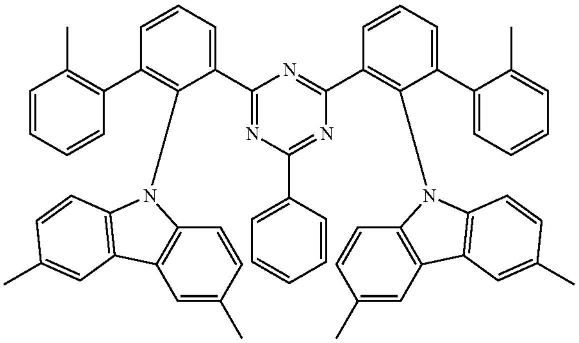
ETH55
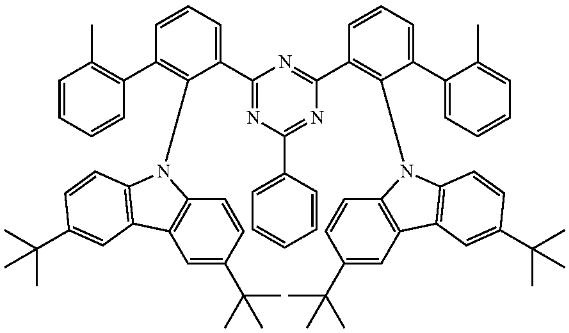
ETH56
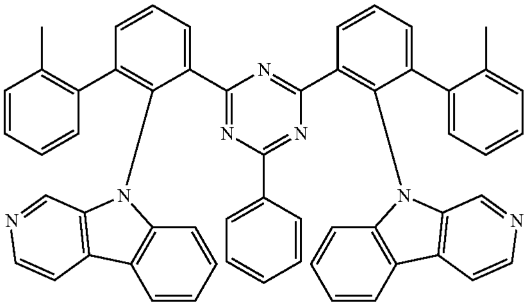
ETH57
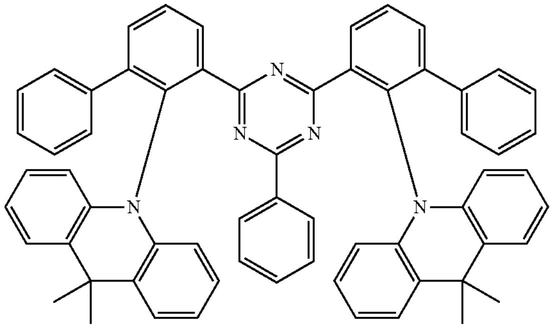

-continued
ETH58
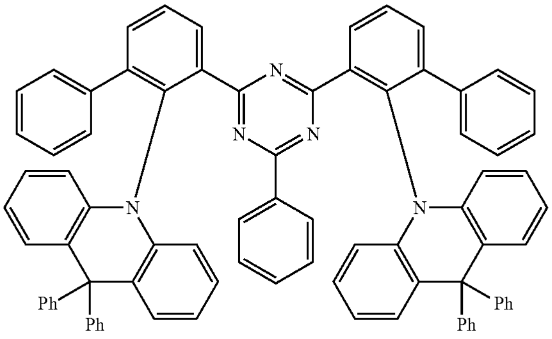
ETH59
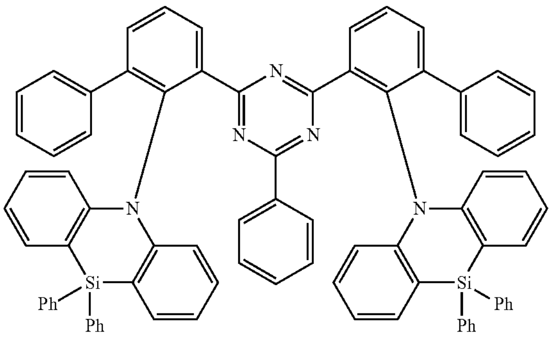
ETH60
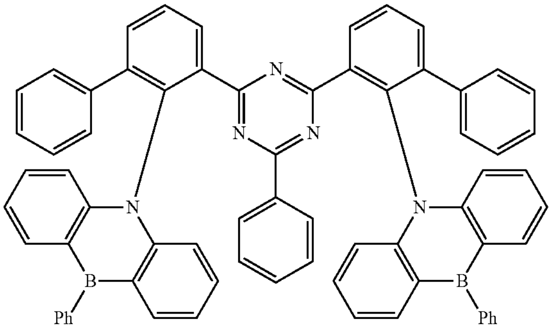
ETH61
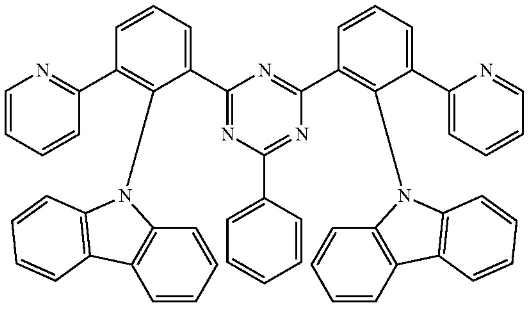
-continued
ETH62
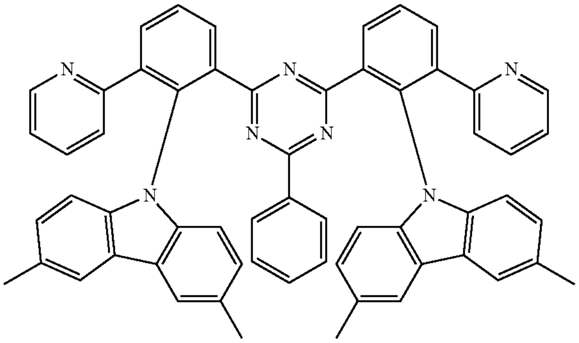
ETH63
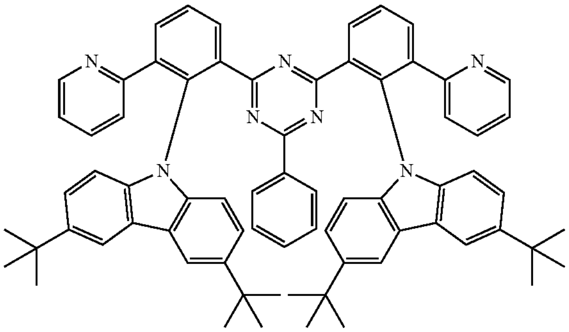
ETH64
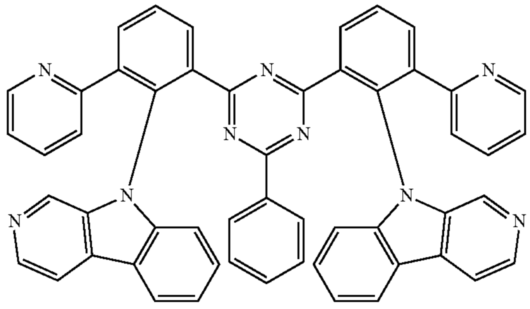
ETH65
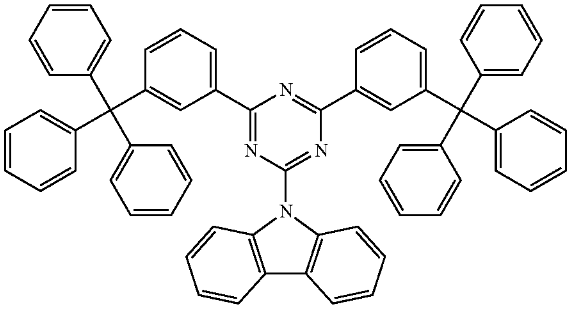

-continued
ETH66
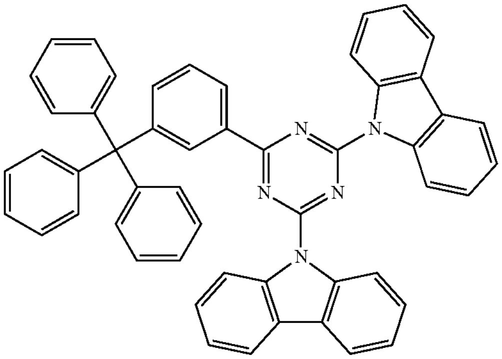
ETH67
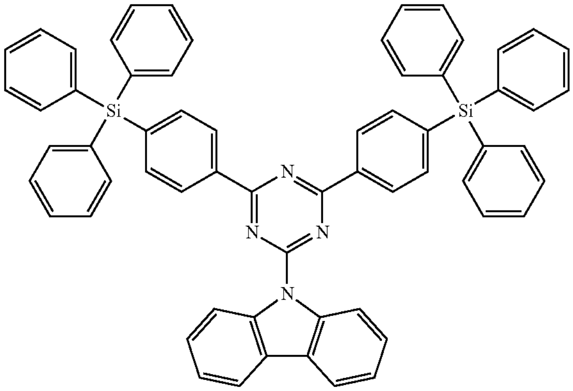
ETH68
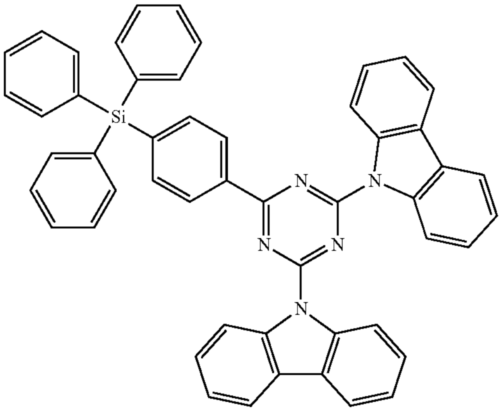
ETH69
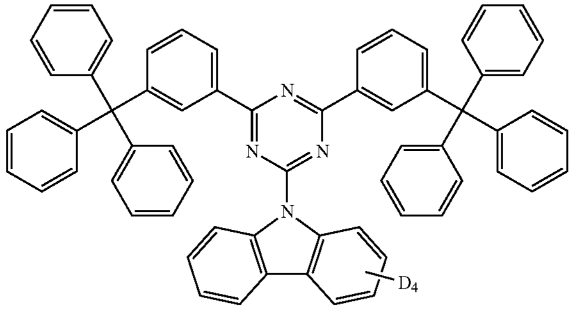
-continued
ETH70
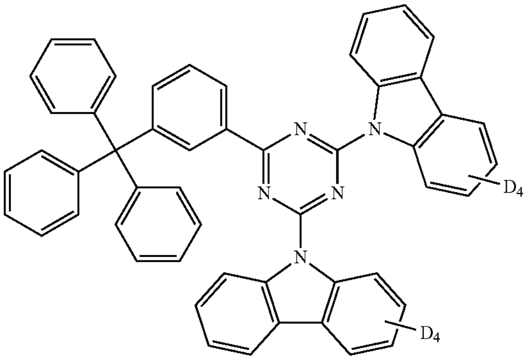
ETH71
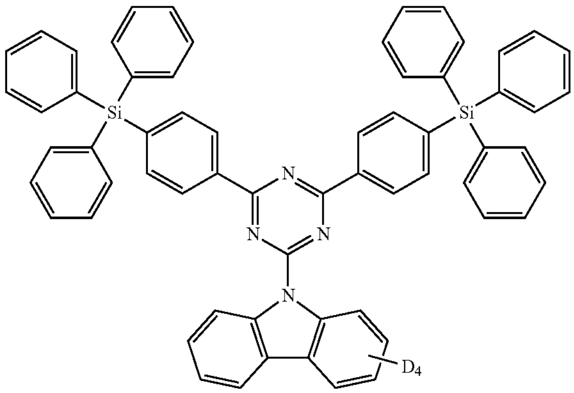
ETH72
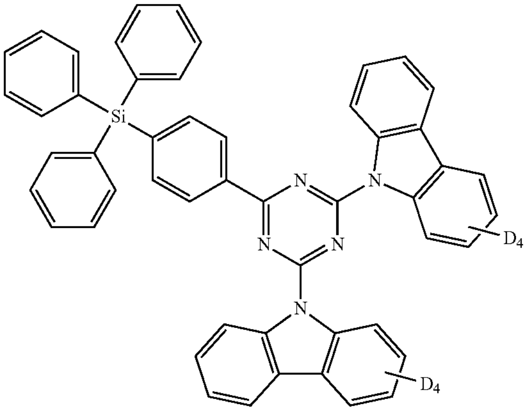
ETH73
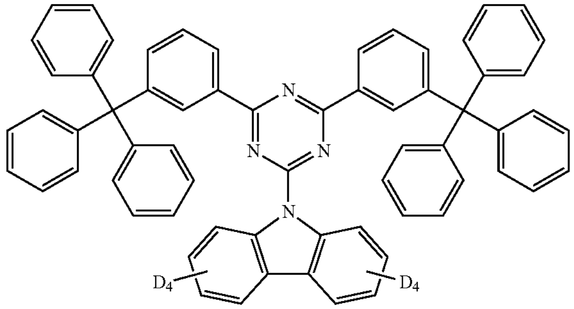

-continued
ETH74
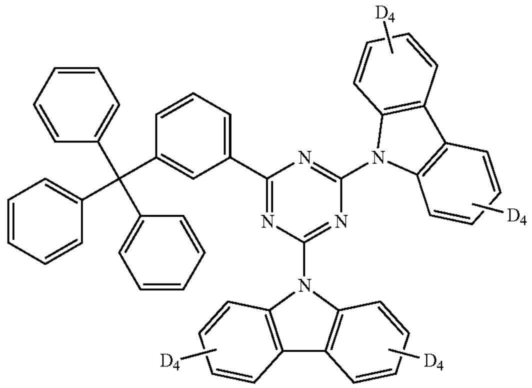
ETH75
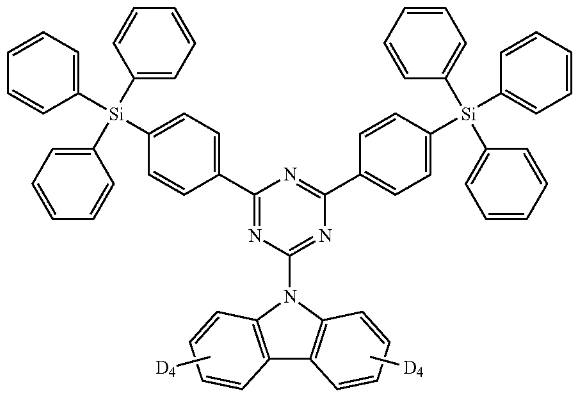
ETH76
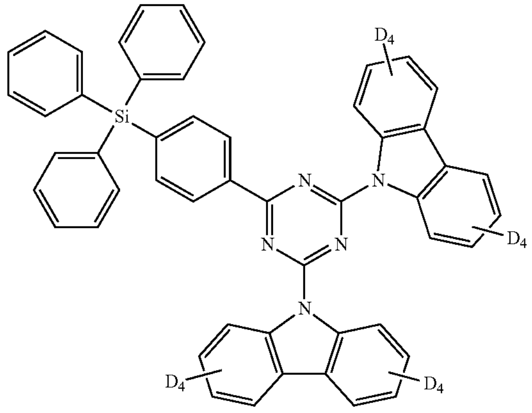
-continued
ETH77
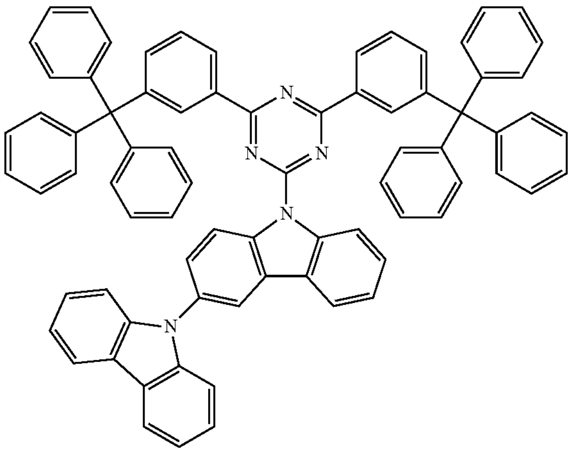
ETH78
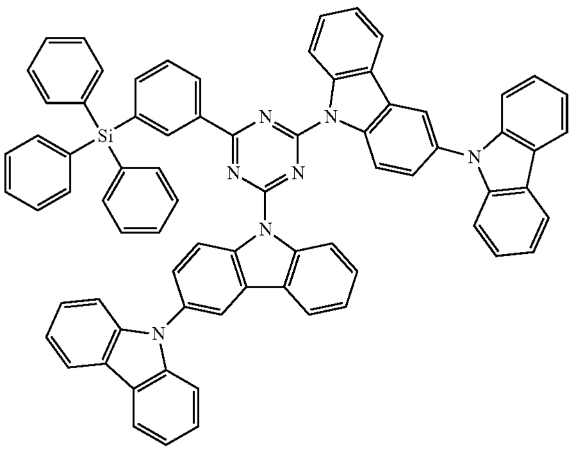
ETH79
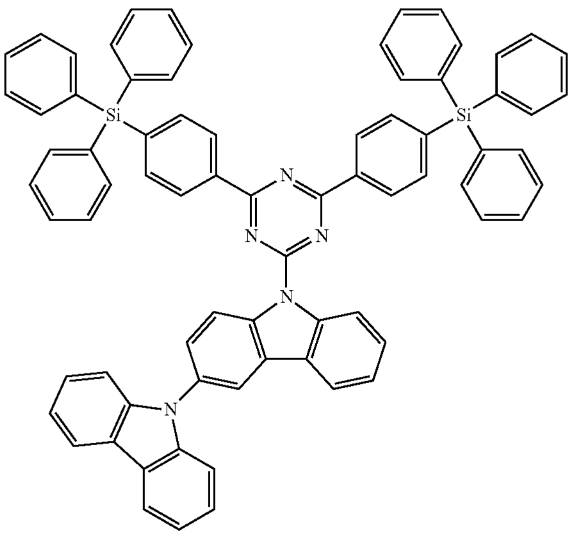

-continued
ETH80
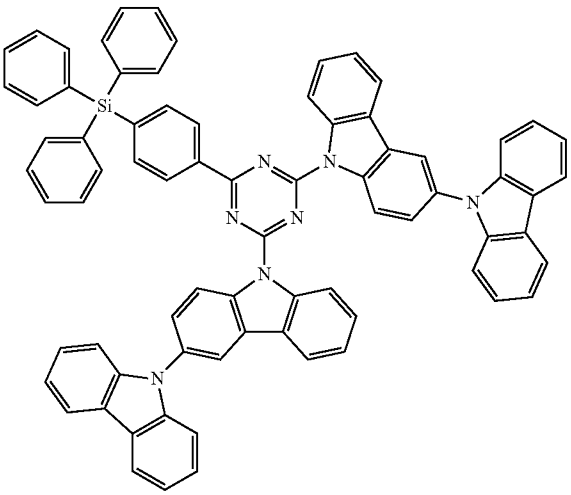
ETH81
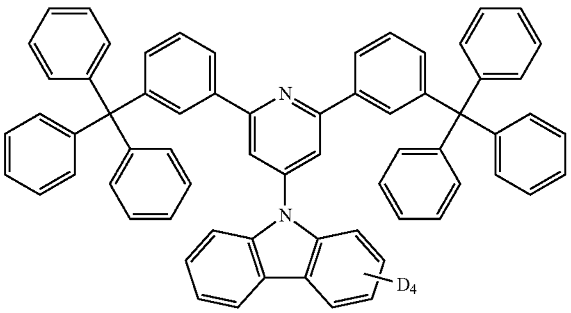
ETH82
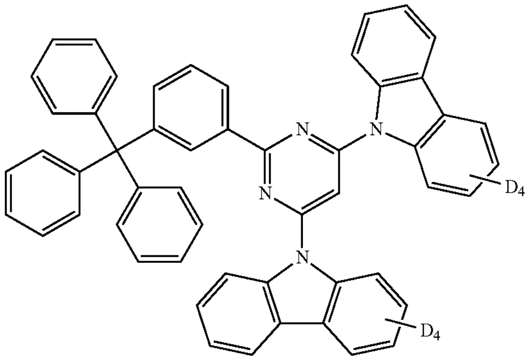
ETH83
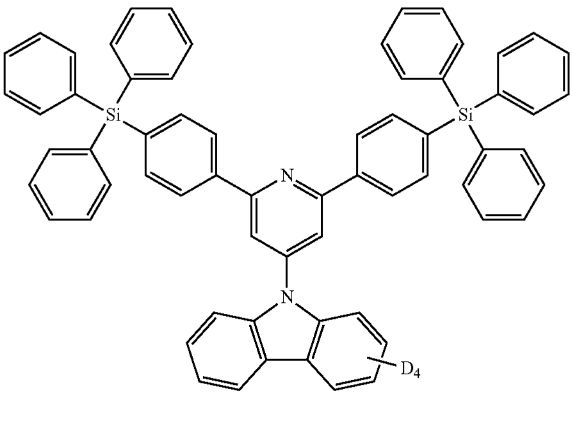
-continued
ETH84
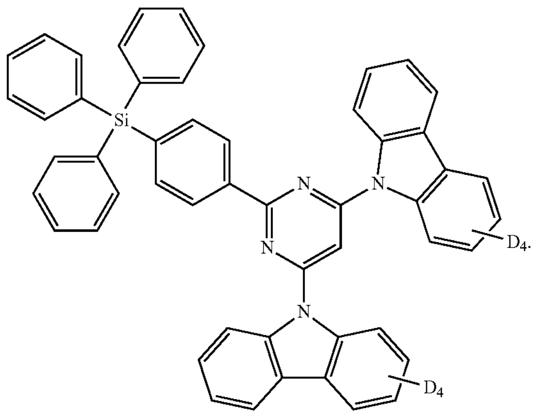
In one or more embodiments, the third compound may include at least one of Compounds HTH1 to HTH52:2
HTH1
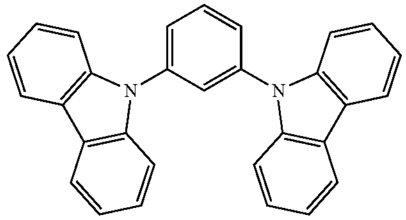
HTH2
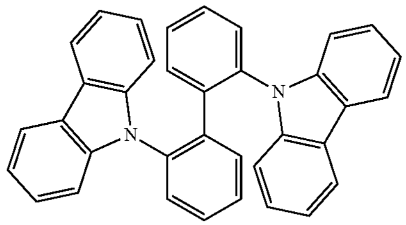
HTH3
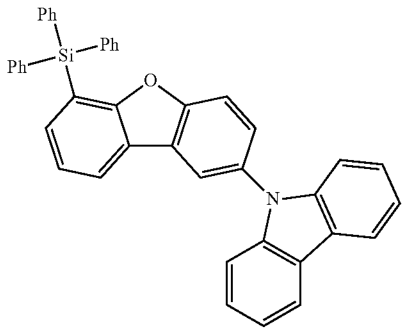

-continued
HTH4
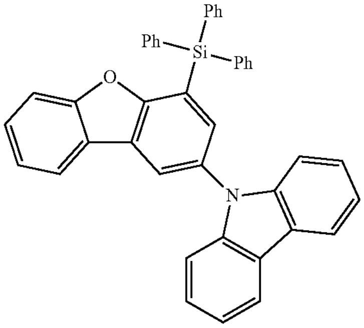
HTH5
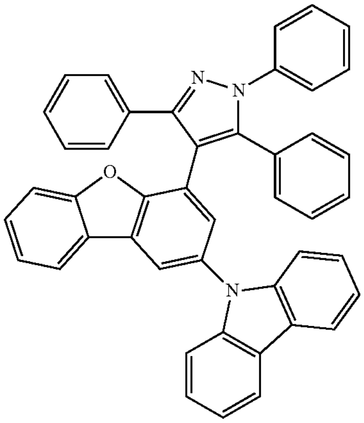
HTH6
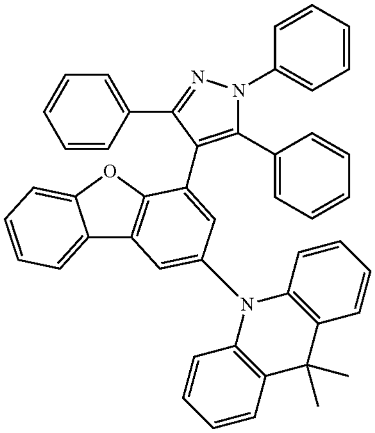
HTH7
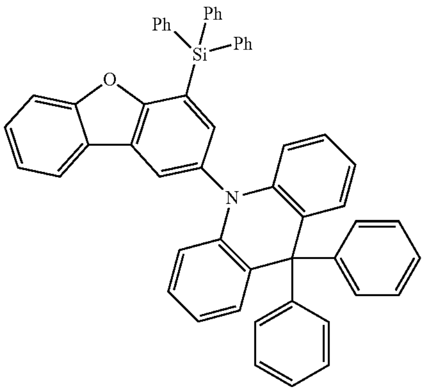
-continued
HTH8
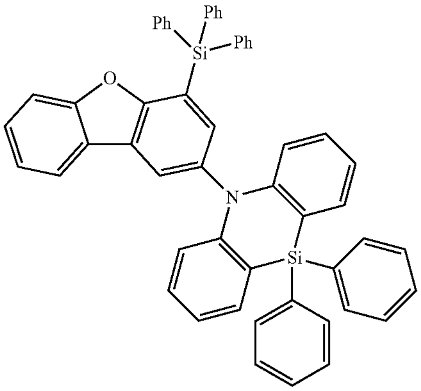
HTH9
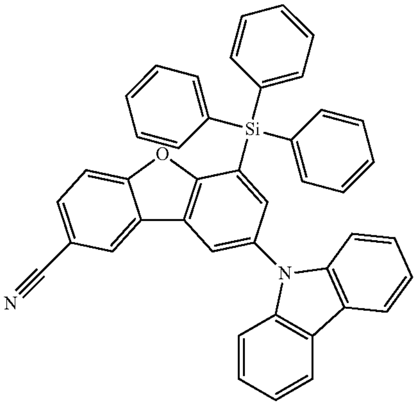
HTH10
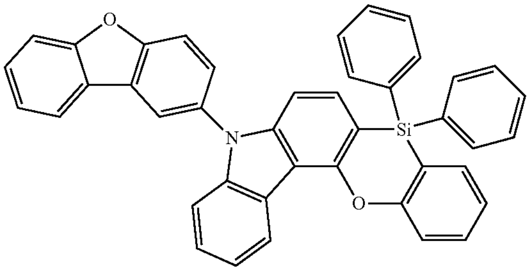
HTH11
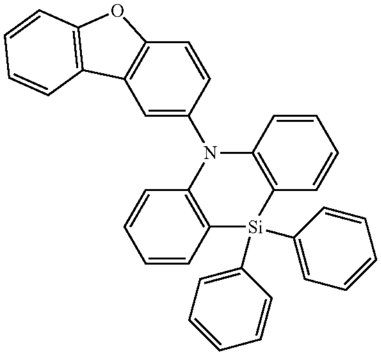

-continued
HTH12
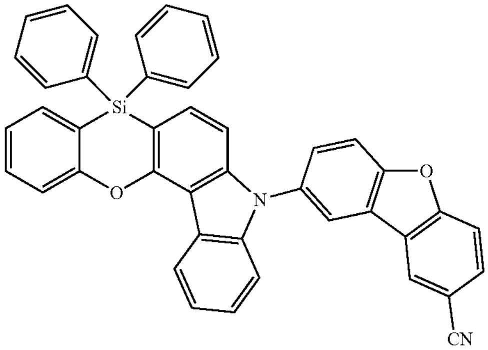
HTH13
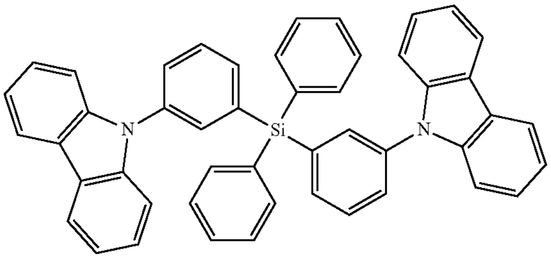
HTH14
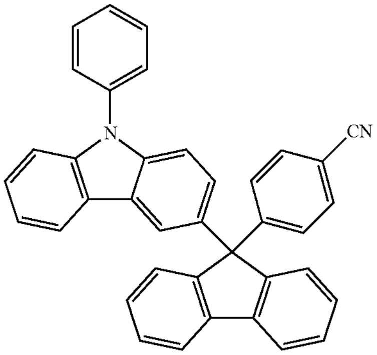
HTH15
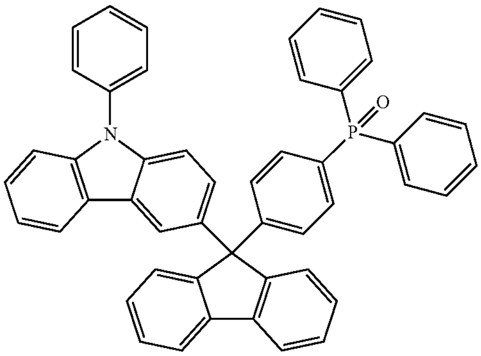
-continued
HTH16
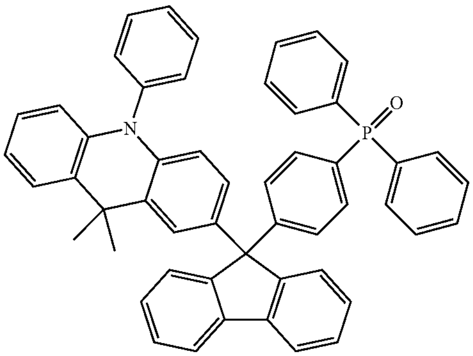
HTH17
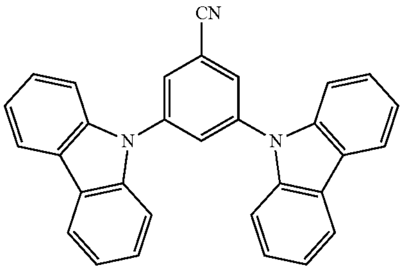
HTH18
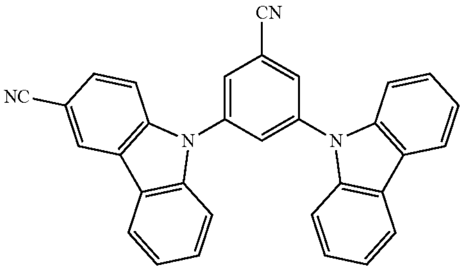
HTH19
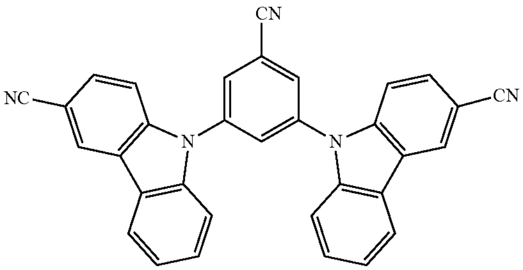
HTH20
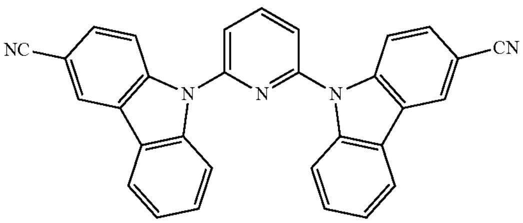

-continued
HTH21
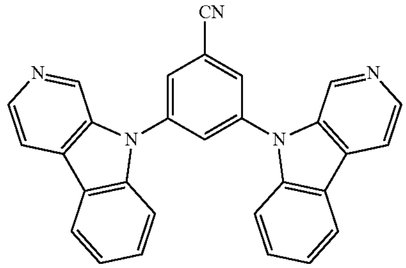
HTH22
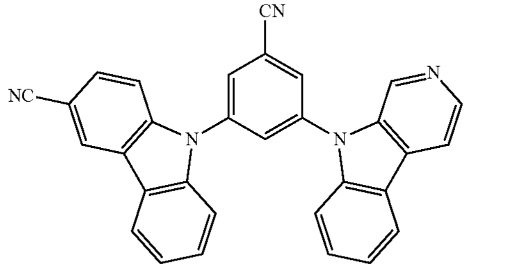
HTH23
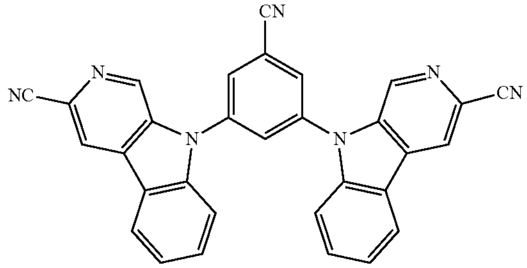
HTH24
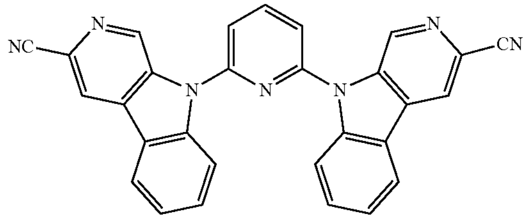
HTH25
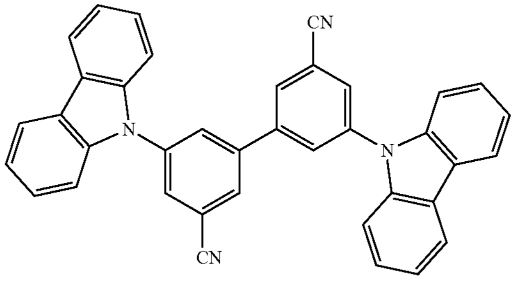
-continued
HTH26
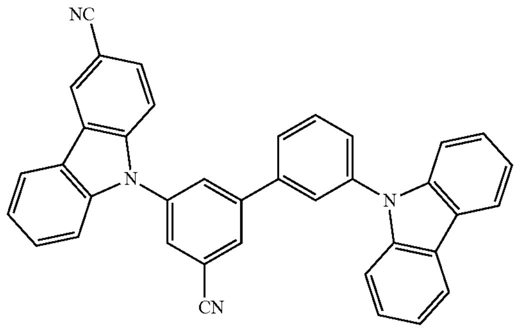
HTH27
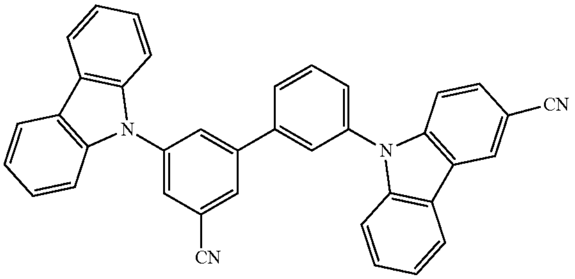
HTH28
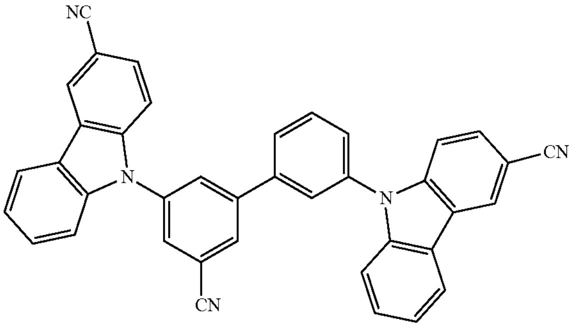
HTH29
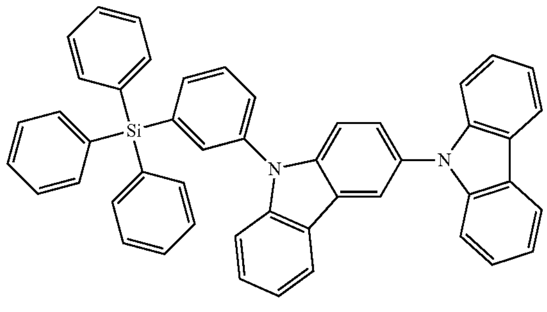

-continued
HTH30
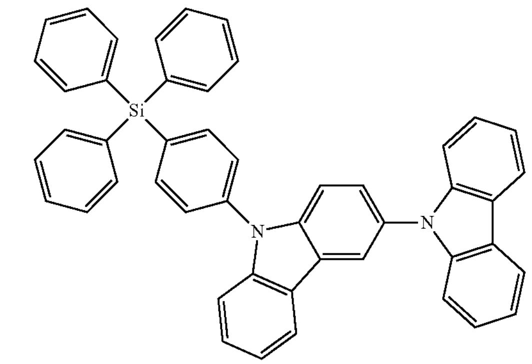
HTH31
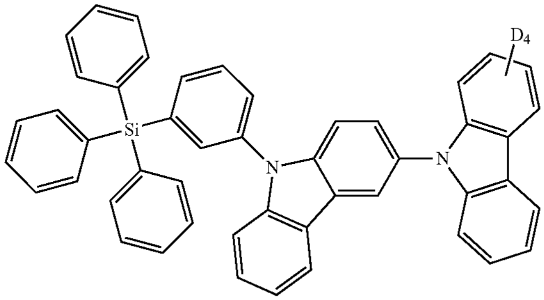
HTH32
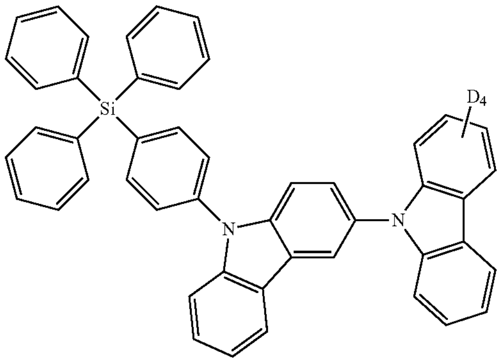
HTH33
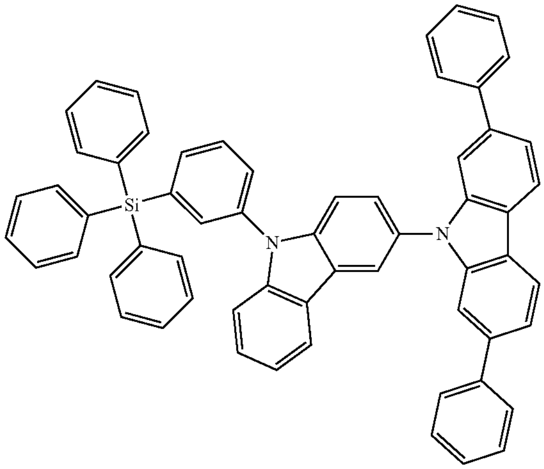
-continued
HTH34
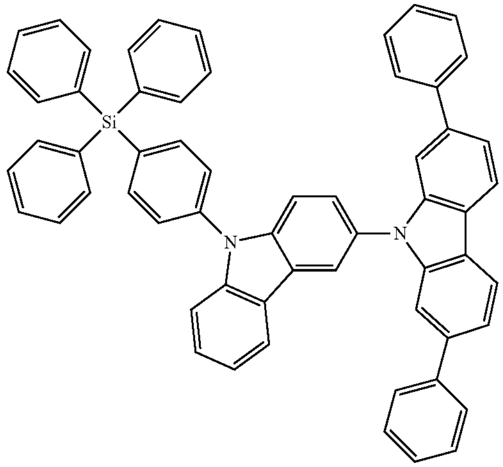
HTH35
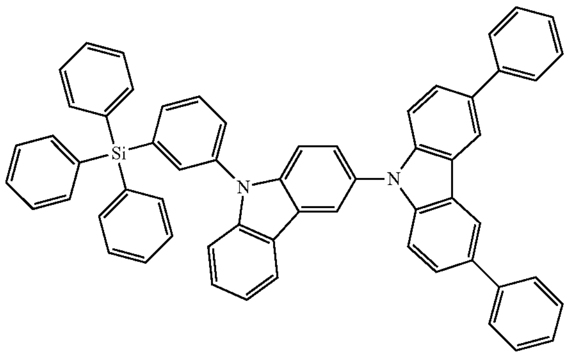
HTH36
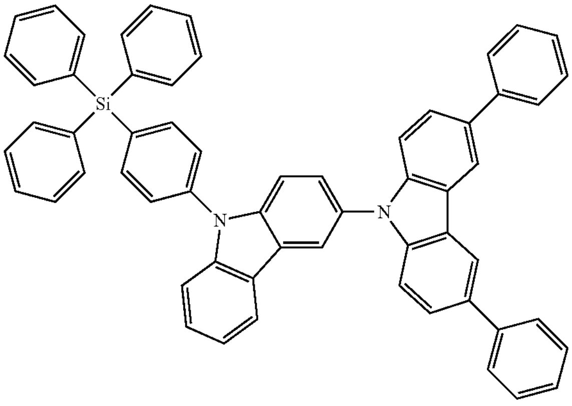
HTH37
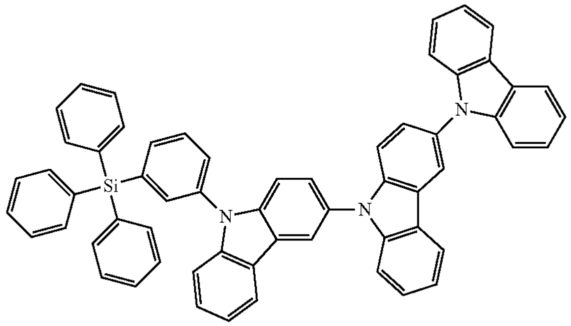

-continued
HTH38
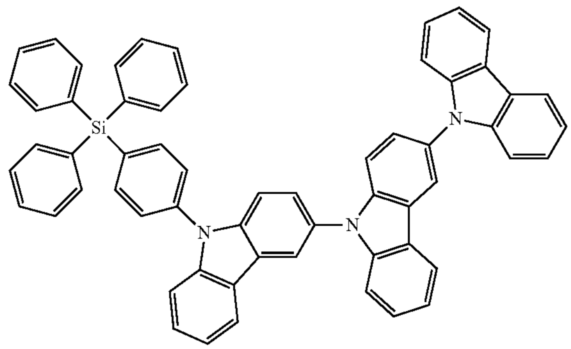
HTH39
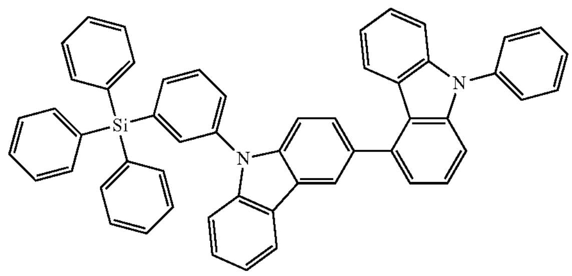
HTH40
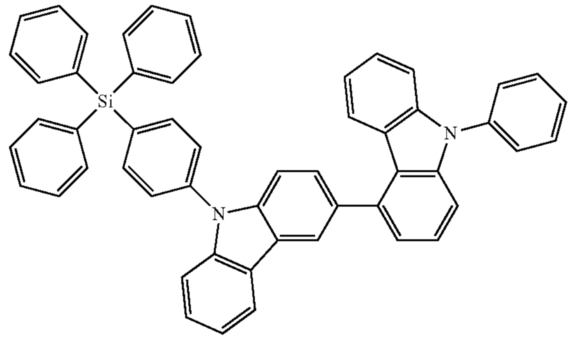
HTH41
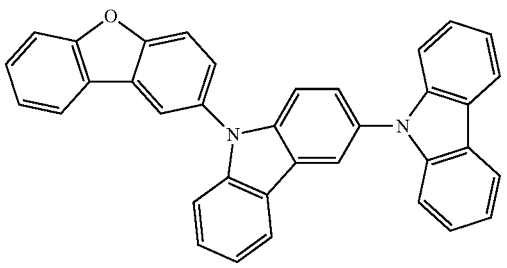
HTH42
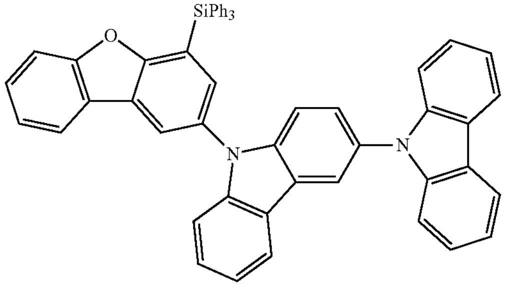
-continued
HTH43
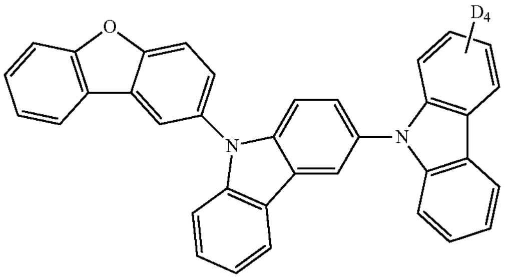
HTH44
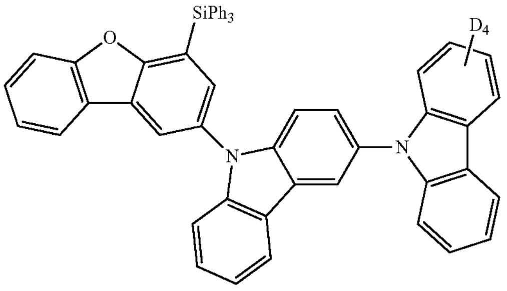
HTH45
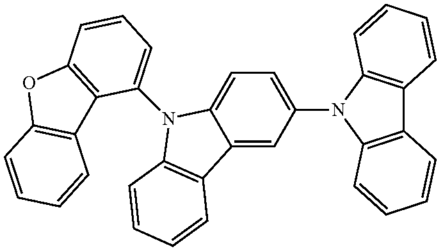
HTH46
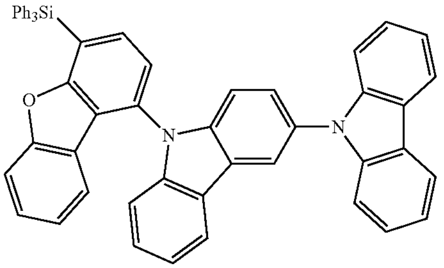
HTH47
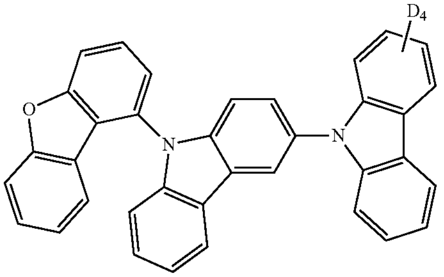

-continued
HTH48
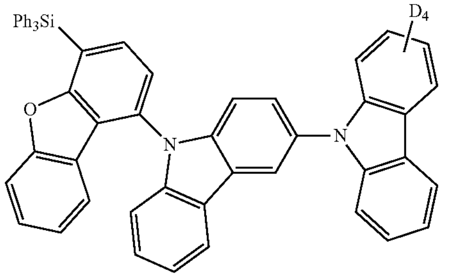
HTH49
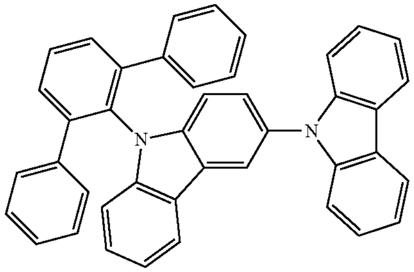
HTH50
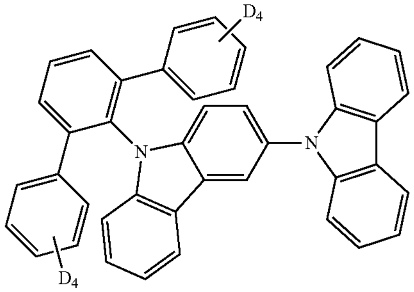
HTH51
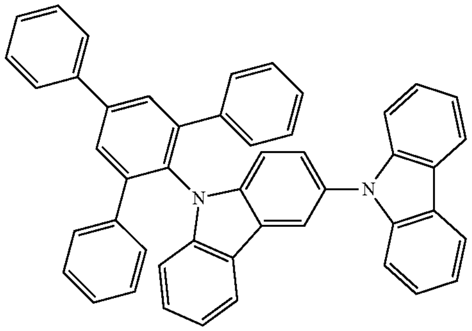
HTH52
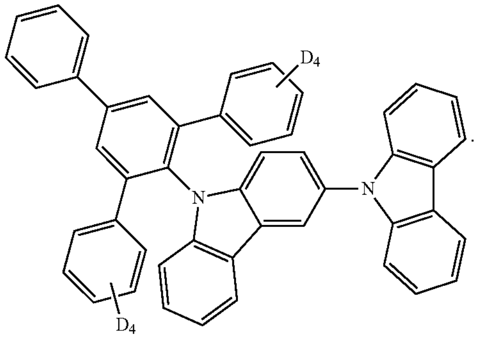
.
In one or more embodiments, the fourth compound may include at least one of Compounds DFD1 to DFD12:
DFD1
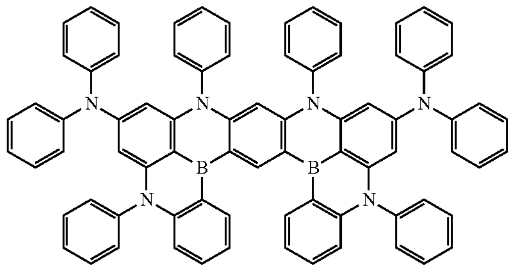
DFD2
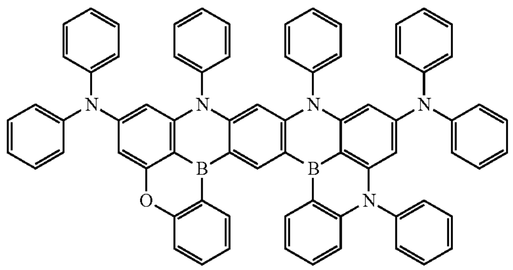
DFD3
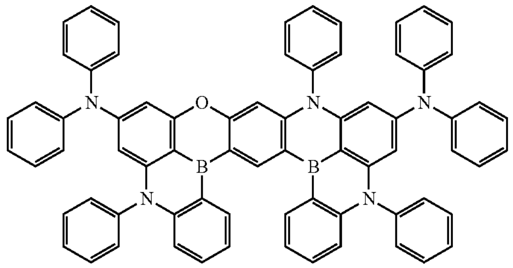
DFD4
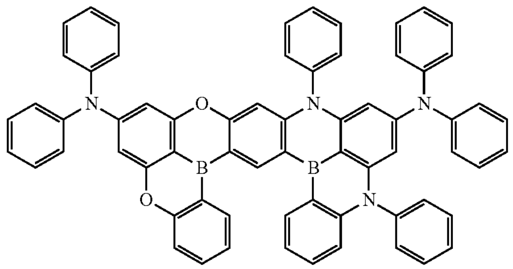
DFD5
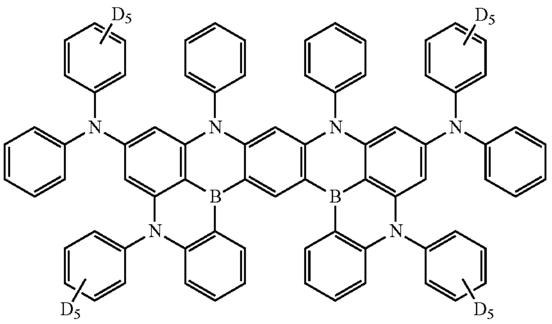

-continued
DFD6
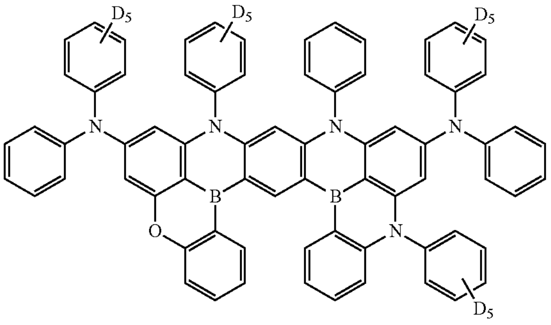
DFD7
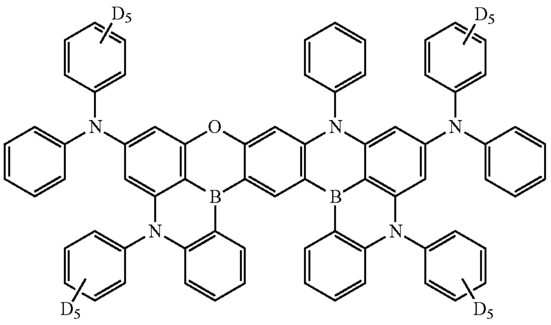
DFD8
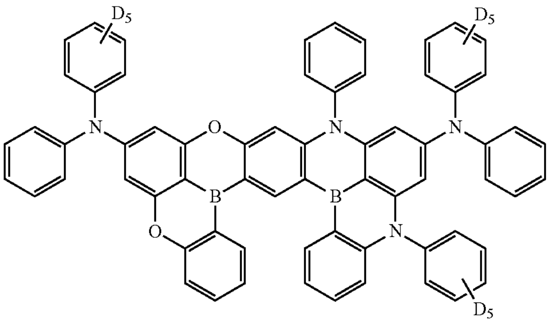
DFD9
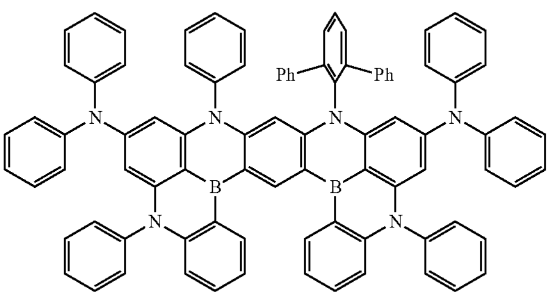
-continued
DFD10
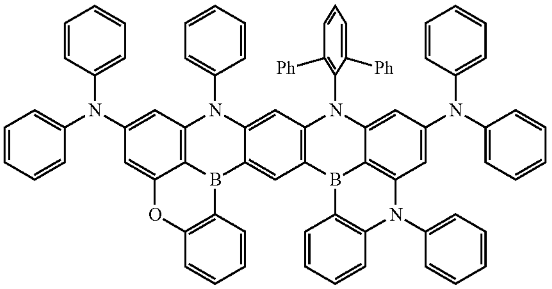
DFD11
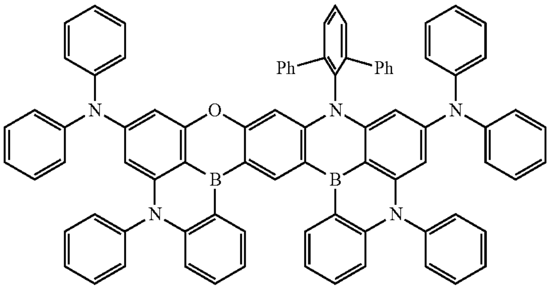
DFD12
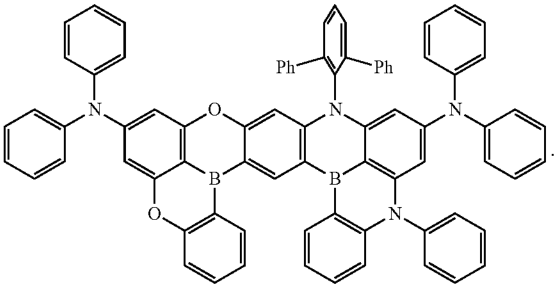
In the compounds above, "Ph" represents a phenyl group, "$D_5$" represents substitution with five deuterium atoms, and "$D_4$" represents substitution with four deuterium atoms. For example, a group represented by
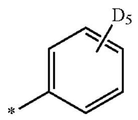
may be identical to a group represented by
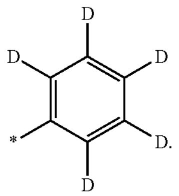

In one or more embodiments, the light-emitting device may satisfy at least one of Conditions 1 to 4:

Condition 1 lowest unoccupied molecular orbital (LUMO) energy level (eV) of the third compound >LUMO energy level (eV) of the first compound;

Condition 2

LUMO energy level (eV) of the first compound >LUMO energy level (eV) of the second compound;

Condition 3 highest occupied molecular orbital (HOMO) energy level (eV) of the first compound >HOMO energy level (eV) of the third compound; and Condition 4

HOMO energy level (eV) of the third compound >HOMO energy level (eV) of the second compound.

Each of the HOMO energy level and LUMO energy level of each of the first compound, the second compound, and the third compound may be a negative value which may be measured according to any suitable method in the art.

In one or more embodiments, an absolute value of a difference between the LUMO energy level of the first compound and the LUMO energy level of the second compound may be about 0.1 eV or more and about 1.0 eV or less; an absolute value of a difference between the LUMO energy level of the first compound and the LUMO energy level of the third compound may be about 0.1 eV more and about 1.0 eV or less; an absolute value of a difference between the HOMO energy level of the first compound and the HOMO energy level of the second compound may be about 1.25 eV or less (e.g., about 1.25 eV or less and about 0.2 eV or more); and an absolute value of a difference between the HOMO energy level of the first compound and the HOMO energy level of the third compound may be about 1.25 eV or less (e.g., about 1.25 eV or less and about 0.2 eV or more).

When the relationships between LUMO energy level and HOMO energy level satisfy the conditions as described above, the balance between holes and electrons injected into the emission layer may be achieved.

The light-emitting device may have a structure according to a first embodiment or a second embodiment:

Description of First Embodiment

According to the first embodiment, the first compound may be included in the emission layer of the interlayer in the light-emitting device, wherein the emission layer may further include a host, which is different from the first compound, and the emission layer may emit phosphorescence or fluorescence from the first compound. For example, according to the first embodiment, the first compound may be a dopant or an emitter. For example, the first compound may be a phosphorescent dopant or a phosphorescence emitter.

The phosphorescence or the fluorescence emitted from the first compound may be blue light.

The emission layer may further include an auxiliary dopant. The auxiliary dopant may serve to effectively (or suitably) transfer energy to the first compound, which is a dopant or an emitter, so that the luminescence efficiency from the first compound may be improved.

The auxiliary dopant may be different from the first compound and the host.

In one or more embodiments, the auxiliary dopant may be a delayed fluorescence-emitting compound.

In one or more embodiments, the auxiliary dopant may be a compound including at least one cyclic group including B and N as ring-forming atoms.

Description of Second Embodiment

According to the second embodiment, the first compound may be included in the emission layer of the interlayer in the light-emitting device, wherein the emission layer may further include a host and a dopant, the first compound may be different from the host and the dopant, and the emission layer may emit phosphorescence or fluorescence (e.g., delayed fluorescence) from the dopant.

In one or more embodiments, the first compound in the second embodiment may serve as an auxiliary dopant that transfers energy to a dopant (or an emitter), not as a dopant itself.

In one or more embodiments, the first compound in the second embodiment may serve as an emitter, and may additionally serve as an auxiliary dopant that transfers energy to a dopant (or an emitter).

For example, the phosphorescence or the fluorescence emitted from the dopant (or the emitter) in the second embodiment may be blue phosphorescence or blue fluorescence (e.g., blue delayed fluorescence).

The dopant (or the emitter) in the second embodiment may be a phosphorescent dopant material (e.g., the organometallic compound represented by Formula 1, an organometallic compound represented by Formula 401, or any combination thereof) or a fluorescent dopant material (e.g, the compound represented by Formula 501, the compound represented by Formula 502, the compound represented by Formula 503, or any combination thereof).

The blue light of the first embodiment and the second embodiment may have a maximum emission wavelength in a range of about 430 nm to about 480 nm, about 430 nm to about 475 nm, about 440 nm to about 475 nm, or about 455 nm to about 470 nm.

The auxiliary dopant in the first embodiment may include, for example, the fourth compound represented by Formula 502 or 503.

In one or more embodiments, the host in the first embodiment and the second embodiment may be any suitable host material (e.g., the compound represented by Formula 301, the compound represented by 301-1, the compound represented by Formula 301-2, or any combination thereof).

In one or more embodiments, the host in the first embodiment and the second embodiment may be the second compound, the third compound, or any combination thereof.

Another aspect of the present disclosure provides an electronic apparatus including the light-emitting device. The electronic apparatus may further include a thin-film transistor. For example, the electronic apparatus may further include a thin-film transistor including a source electrode and a drain electrode, wherein the first electrode of the light-emitting device may be electrically connected (e.g., electrically coupled) to the source electrode or the drain electrode. In one or more embodiments, the electronic apparatus may further include a color filter, a color conversion layer, a touch screen layer, a polarizing layer, or any combination thereof. More details for the electronic apparatus are as described herein.

Another aspect provides the organometallic compound represented by Formula 1, wherein details for Formula 1 are the same as described herein.

Description of FIG. 1

FIG. 1 is a schematic cross-sectional view of a light-emitting device 10 according to one or more embodiments. The light-emitting device 10 includes a first electrode 110, an interlayer 130, and a second electrode 150.

Hereinafter, the structure of the light-emitting device 10 according to one or more embodiments and a method of manufacturing the light-emitting device 10 will be described with reference to FIG. 1.

First Electrode 110

In FIG. 1, a substrate may be additionally arranged under the first electrode 110 or above the second electrode 150. In one or more embodiments, the substrate may be a glass substrate and/or a plastic substrate. In one or more embodiments, the substrate may be a flexible substrate, and for example, may include plastics with excellent (or suitable) heat resistance and durability, such as polyimide, polyethylene terephthalate (PET), polycarbonate, polyethylene naphthalate, polyarylate (PAR), polyetheramide, or any combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. In one or more embodiments, when the first electrode 110 is a transmissive electrode, a material for forming the first electrode 110 may include indium tin oxide (ITO), Indium zinc oxide (IZO), tin oxide ($SnO_2$), zinc oxide (ZnO), or any combination thereof. In one or more embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layered structure including (e.g., consisting of) a single layer or a multi-layered structure including a plurality of layers. For example, the first electrode 110 may have a three-layered structure of ITO/Ag/ITO.

Interlayer 130

The interlayer 130 is on the first electrode 110. The interlayer 130 may include an emission layer.

The interlayer 130 may further include a hole transport region between the first electrode 110 and the emission layer, and an electron transport region between the emission layer and the second electrode 150.

In one or more embodiments, the interlayer 130 may further include, in addition to various suitable organic materials, a metal-containing compound such as an organometallic compound, an inorganic material such as a quantum dot, and/or the like.

In one or more embodiments, the interlayer 130 may further include: i) two or more emitting units sequentially stacked between the first electrode 110 and the second electrode 150; and ii) a charge generation layer between adjacent ones of the two or more emitting units. When the interlayer 130 includes the two or more emitting units and the charge generation layer, the light-emitting device 10 may be a tandem light-emitting device.

Hole Transport Region in interlayer 130

The hole transport region may have i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron-blocking layer structure, wherein layers of each structure are sequentially stacked from the first electrode 110.

The hole transport region may include a compound represented by Formula 201, a compound represented by Formula 202, or any combination thereof:

Formula 201

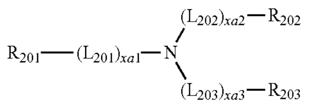

Formula 202

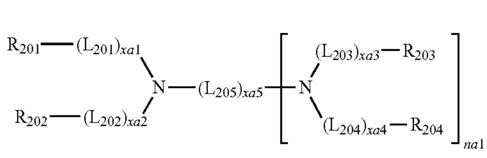

, wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', —N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (for example, a carbazole group and/or the like) unsubstituted or substituted with at least one $R_{10a}$ (for example, Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

For example, each of Formulae 201 and 202 may include at least one of groups represented by Formulae CY201 to CY217:

CY201

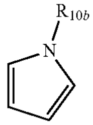

CY202

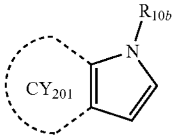

CY203

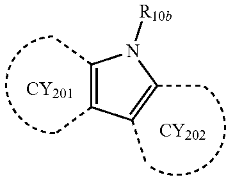

CY204

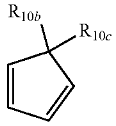

CY205

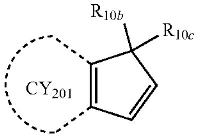

CY206

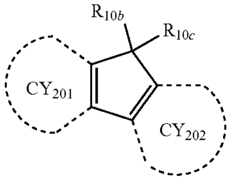

CY207

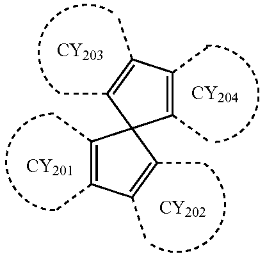

CY208

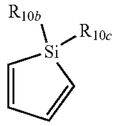

-continued

CY209

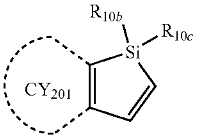

CY210

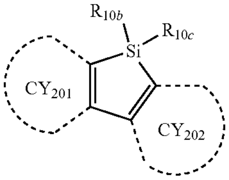

CY211

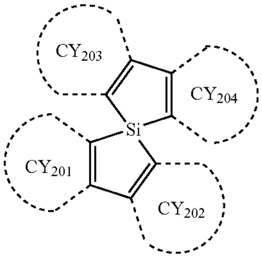

CY212

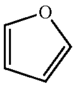

CY213

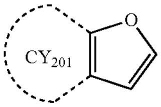

CY214

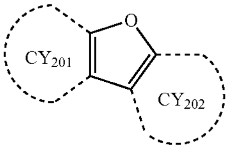

CY215

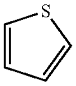

CY216

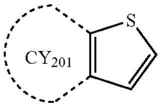

CY217

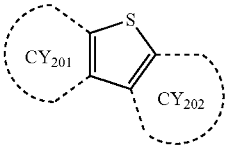

.

In Formulae CY201 to CY217, $R_{10a}$ and $R_{10c}$ may respectively be the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in each of Formulae CY201 to CY217 may be unsubstituted or substituted with $R_{10a}$.

In one or more embodiments, in Formulae CY201 to CY217, ring CY201 to ring CY204 may each independently be a benzene group, a naphthalene group, a phenanthrene group, or an anthracene group.

In one or more embodiments, each of Formulae 201 and 202 may include at least one of groups represented by Formulae CY201 to CY203.

In one or more embodiments, Formula 201 may include at least one of groups represented by Formulae CY201 to CY203 and at least one of groups represented by Formulae CY204 to CY217.

In one or more embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include a group represented by one of Formulae CY201 to CY203.

In one or more embodiments, each of Formulae 201 and 202 may not include a group represented by one of Formulae CY201 to CY203, and may include at least one of groups represented by Formulae CY204 to CY217.

In one or more embodiments, each of Formulae 201 and 202 may not include a group represented by one of Formulae CY201 to CY217.

In one or more embodiments, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

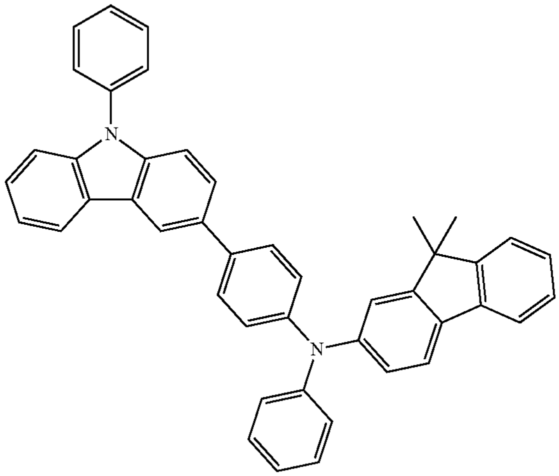

HT2

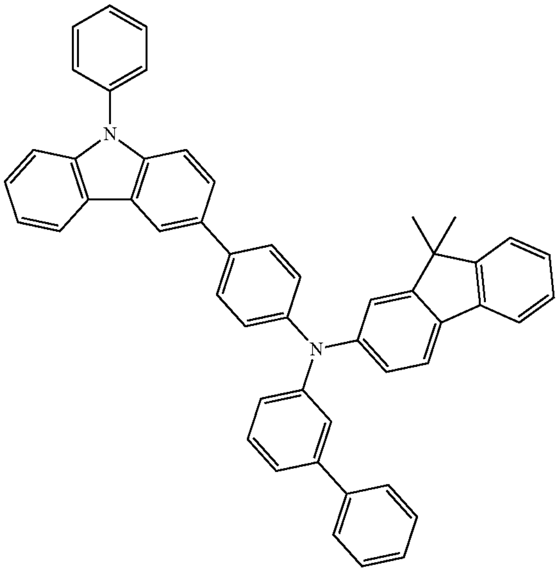

HT3

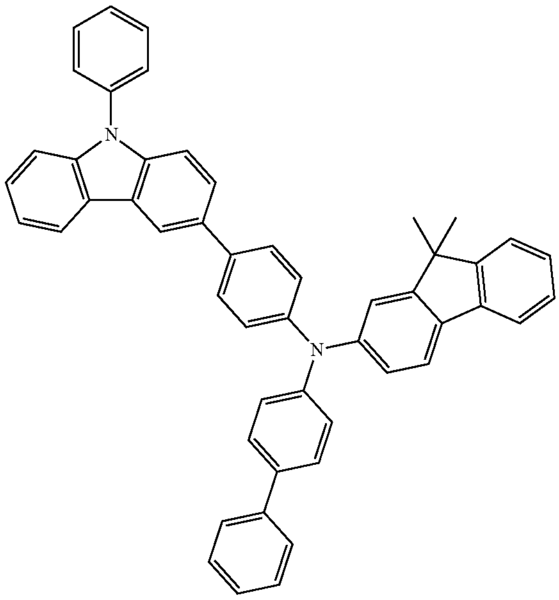

HT4

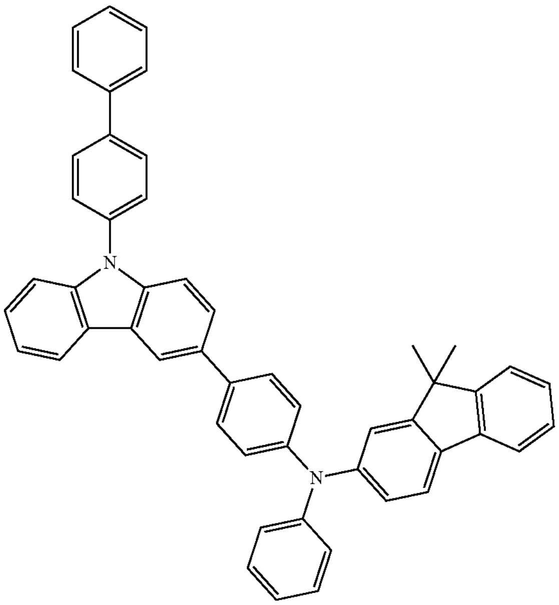

-continued
HT5
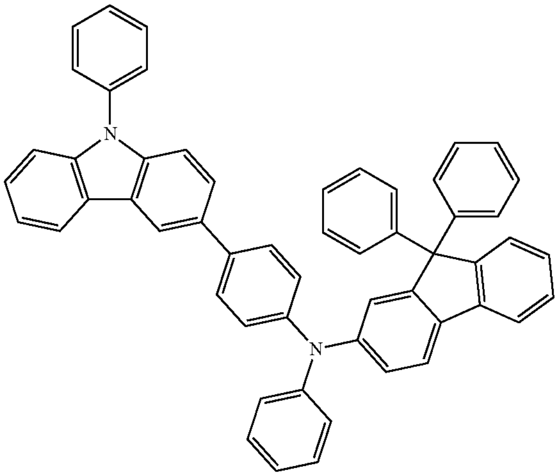
HT6
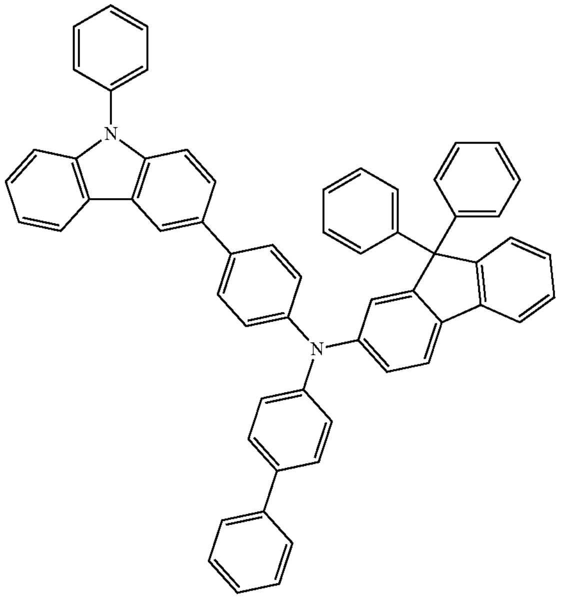
HT7
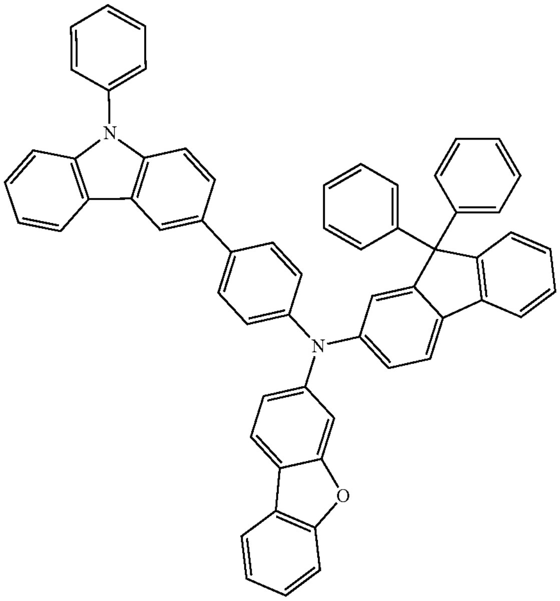
HT8
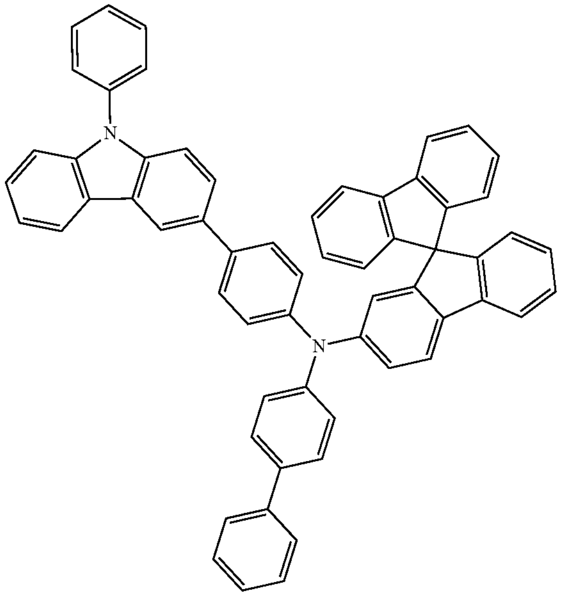

-continued
HT9
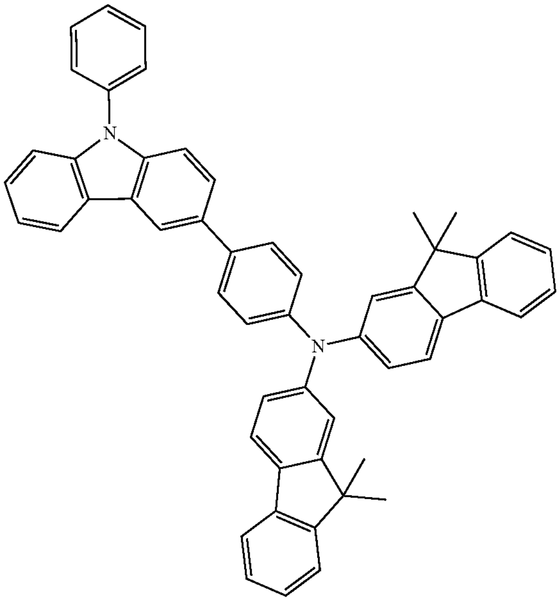
HT10
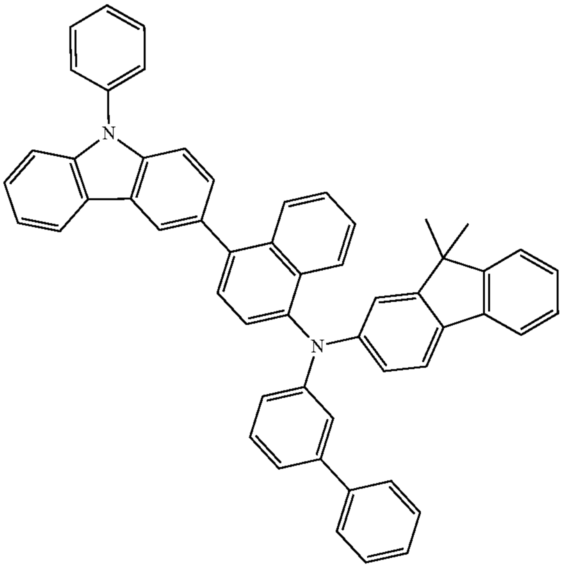
HT11
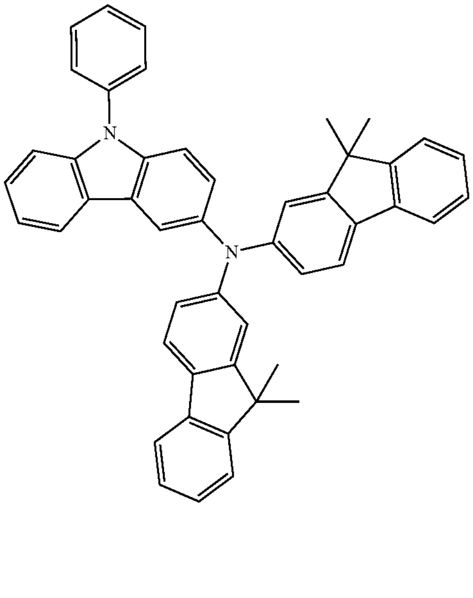
HT12
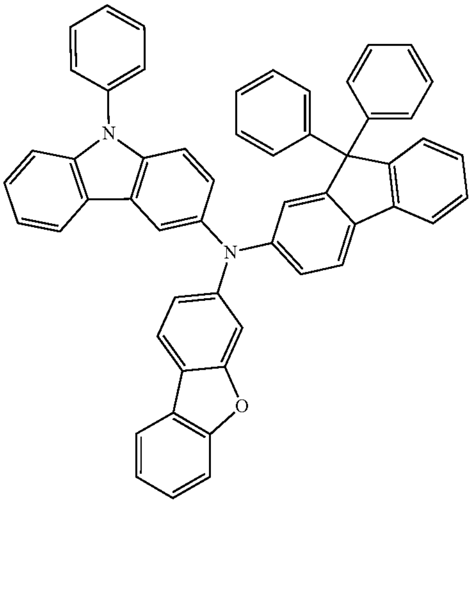

-continued
HT13
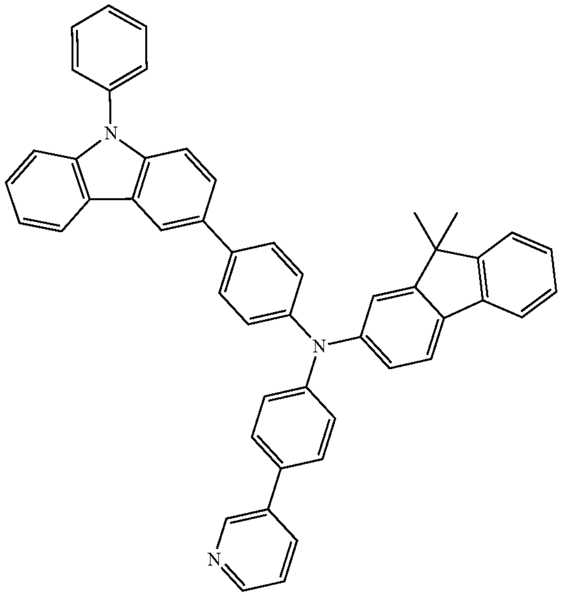
HT14
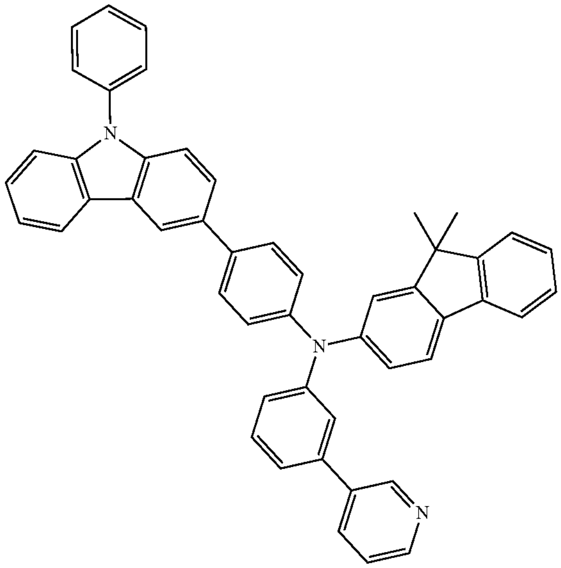
HT15
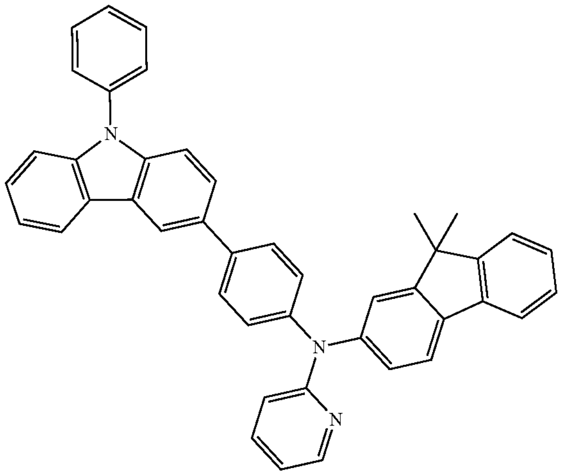
HT16
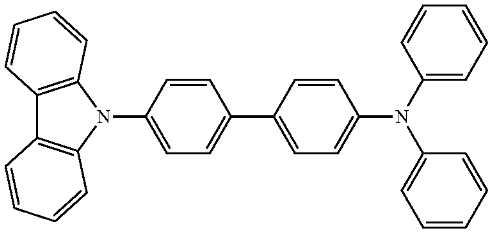
HT17
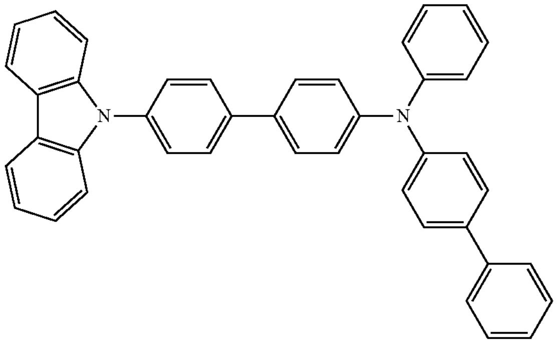
HT18
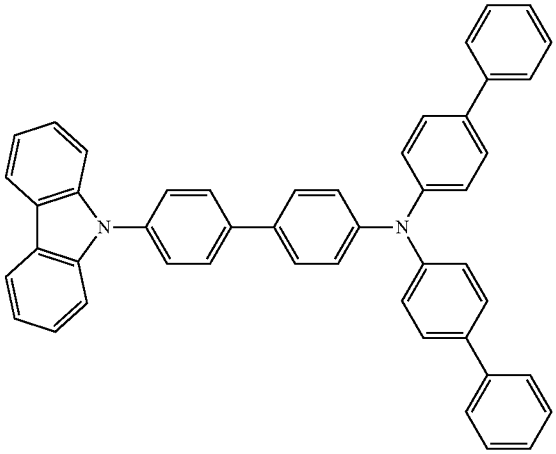

-continued
HT19
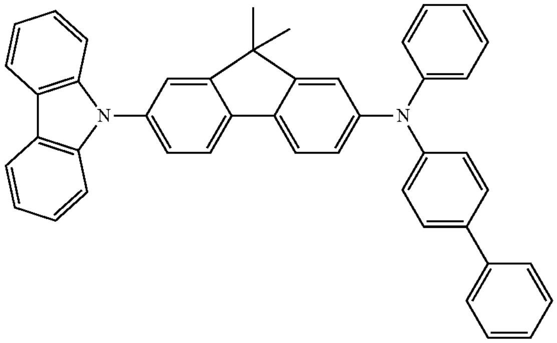
HT20
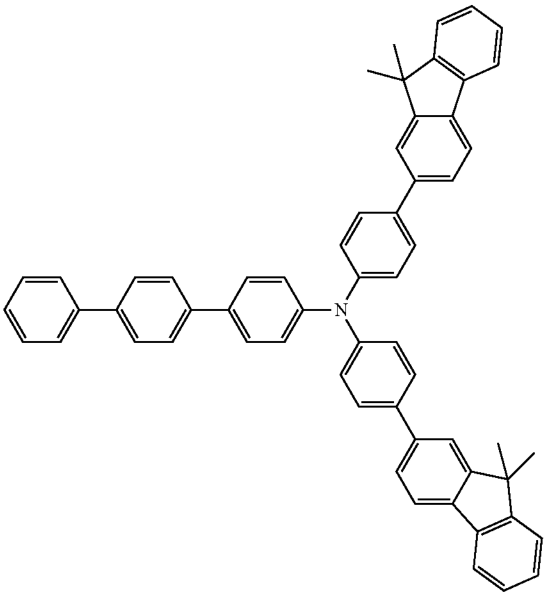
HT21
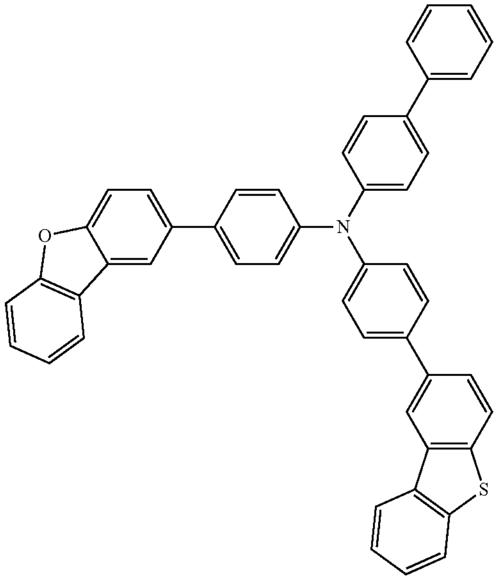
HT22
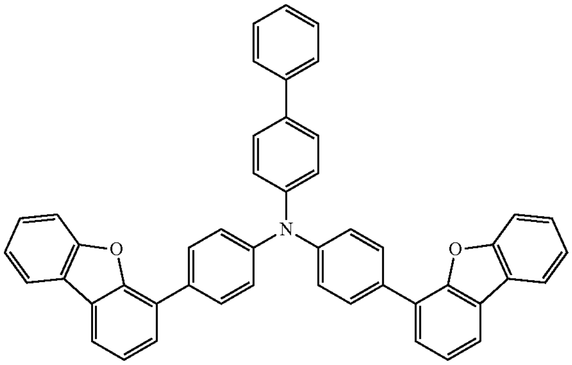

-continued
HT23
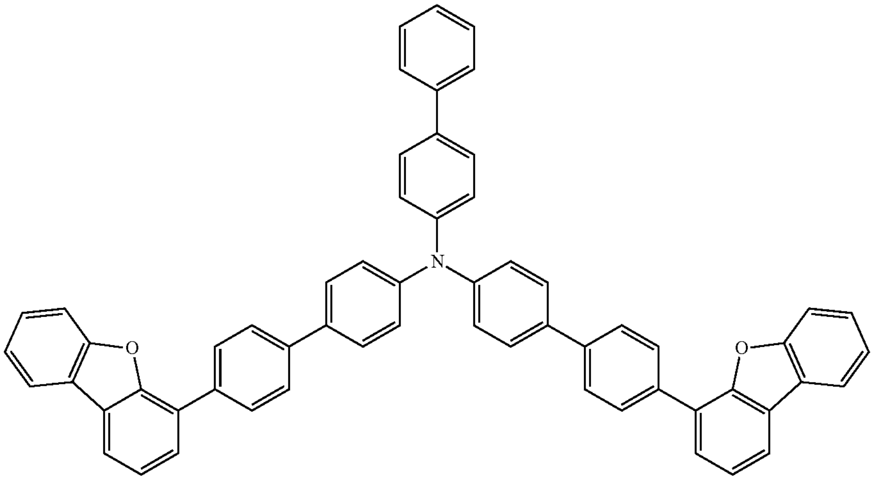
HT24
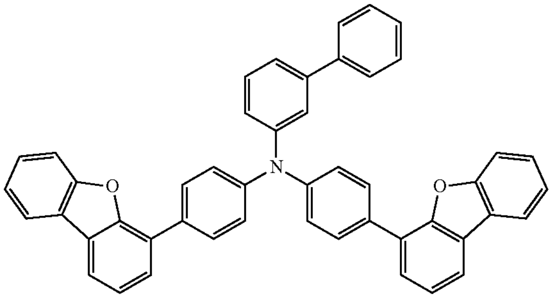
HT25
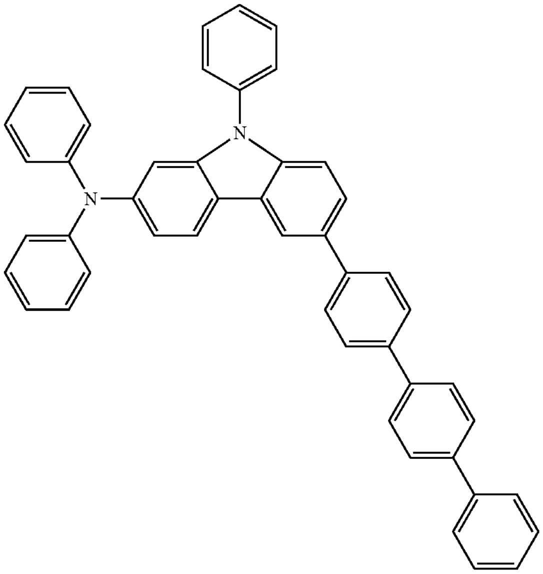
HT26
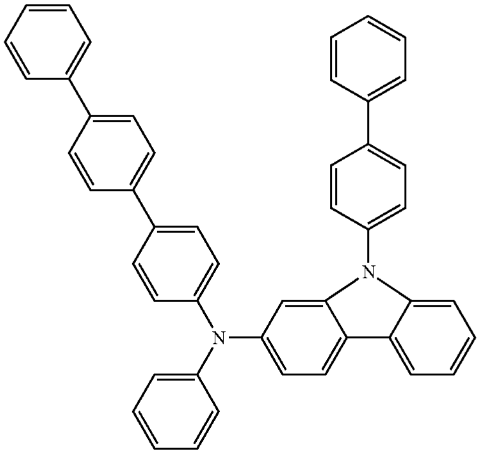
HT27
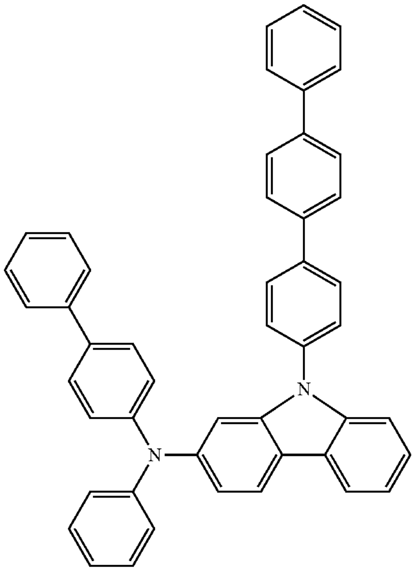

-continued
HT28
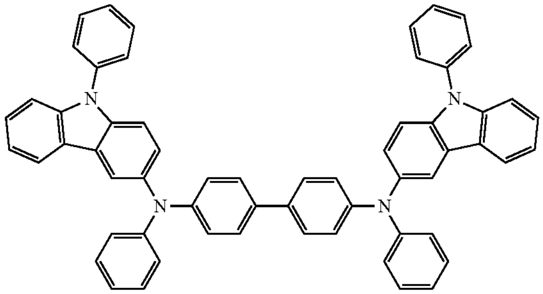
HT29
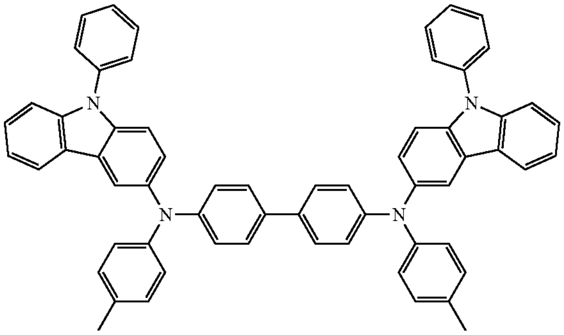
HT30
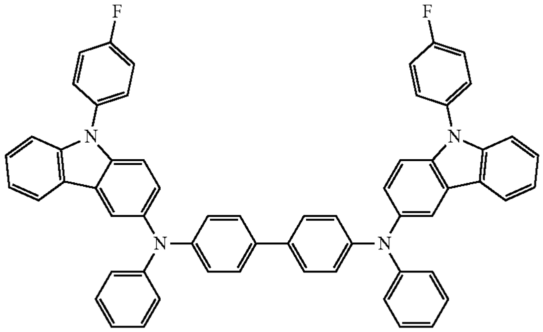
HT31
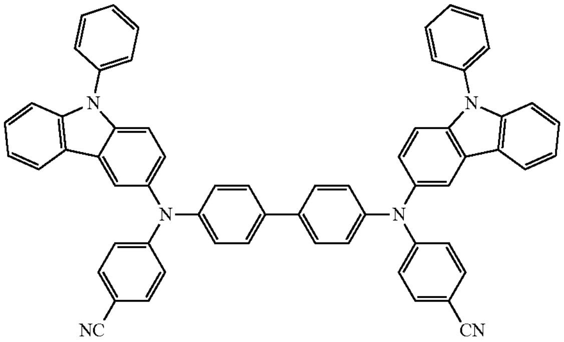
HT32
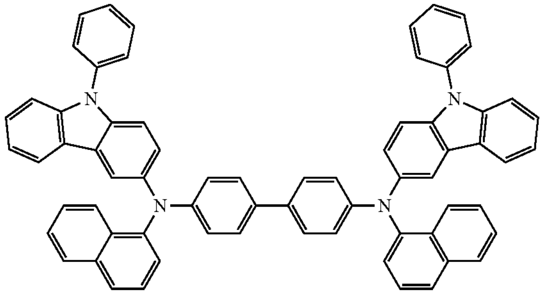
HT33
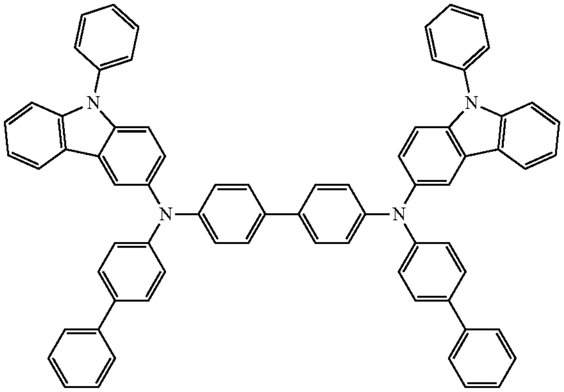

-continued
HT34
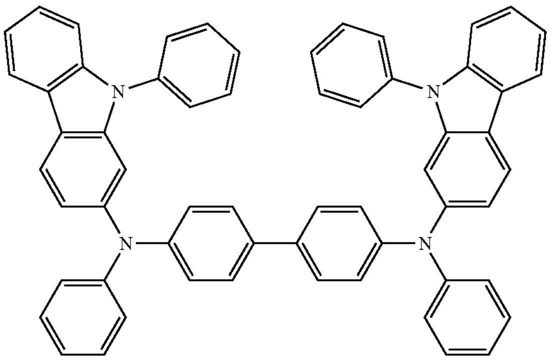
HT35
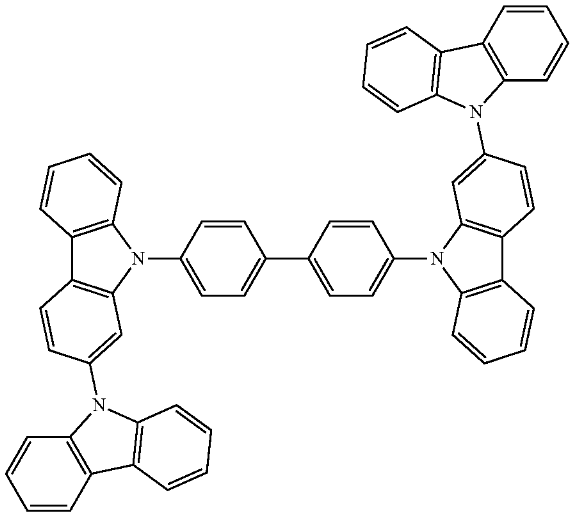
HT36
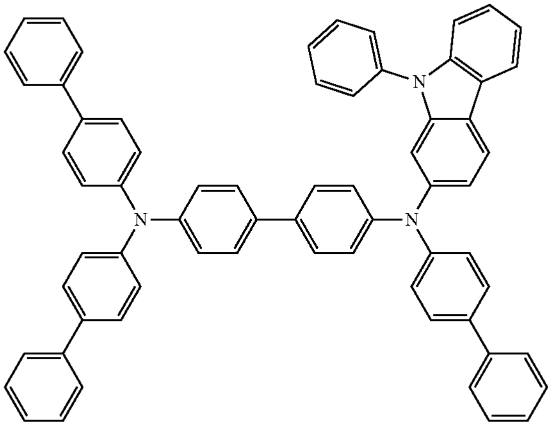
HT37
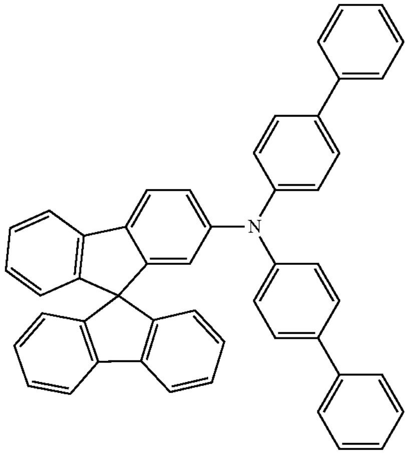
HT38
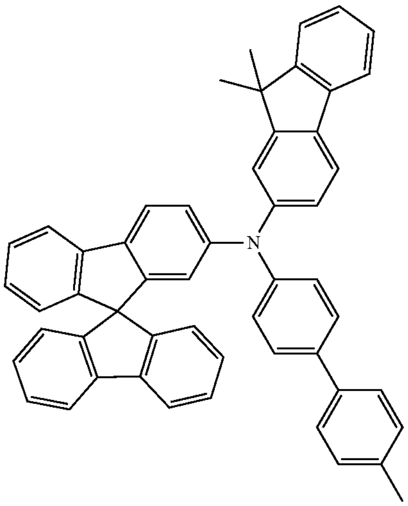
HT39
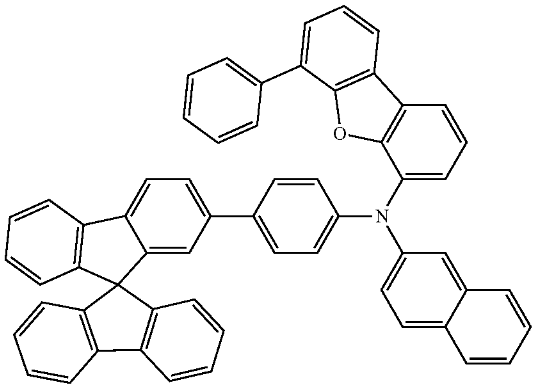

-continued
HT40
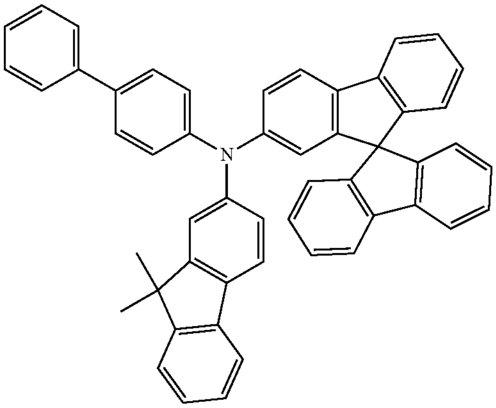
HT41
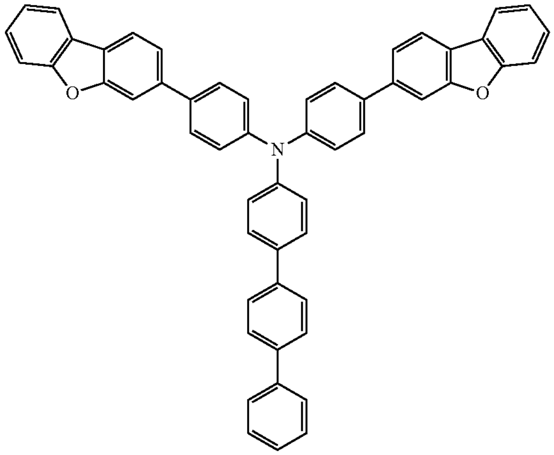
HT42
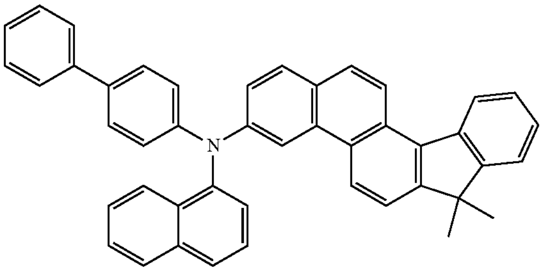
HT43
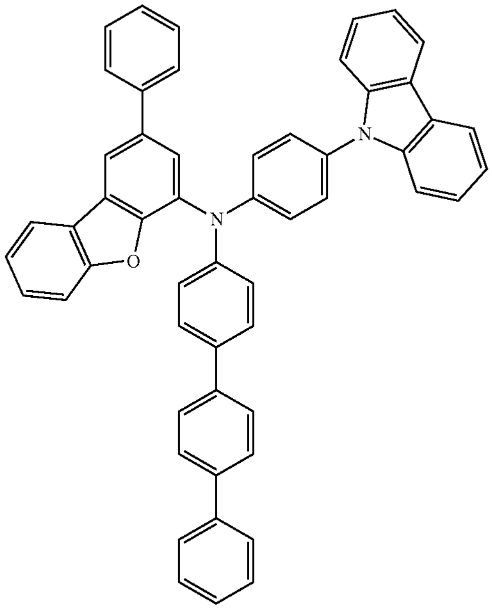
HT44
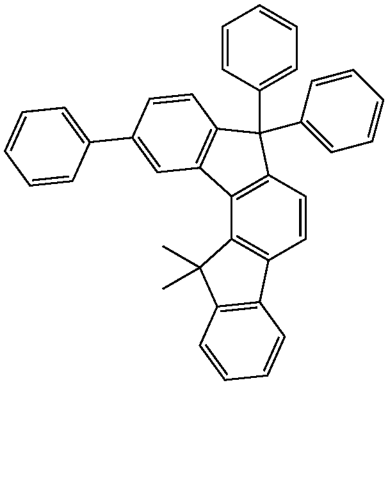
HT45
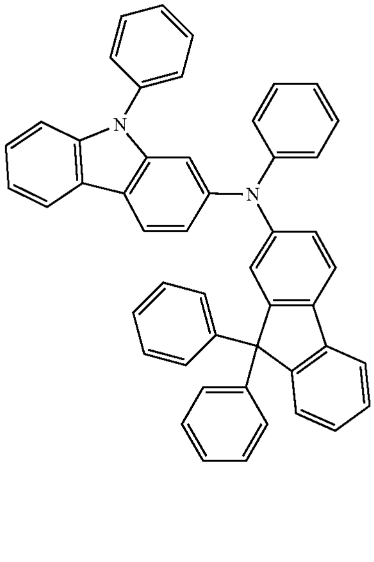

-continued
HT46
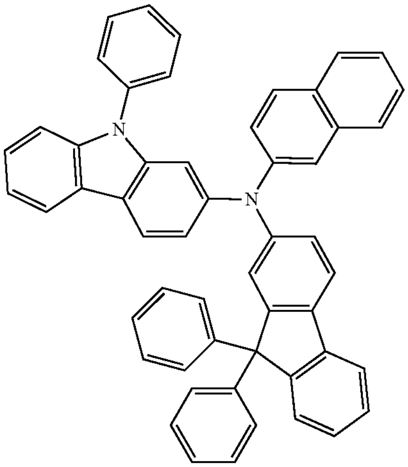
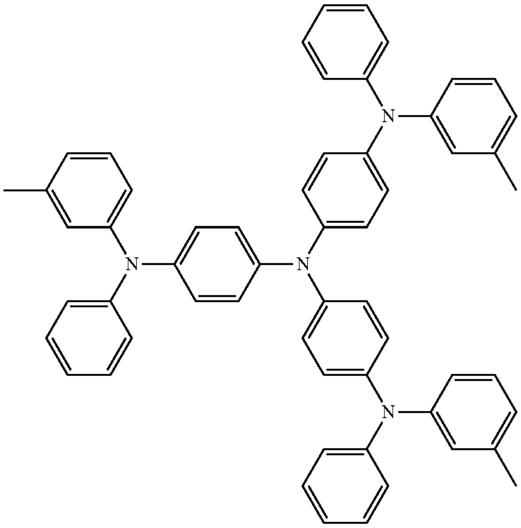
m-MTDATA
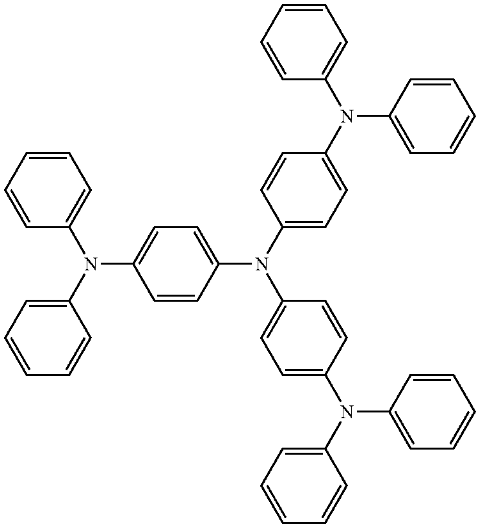
TDATA
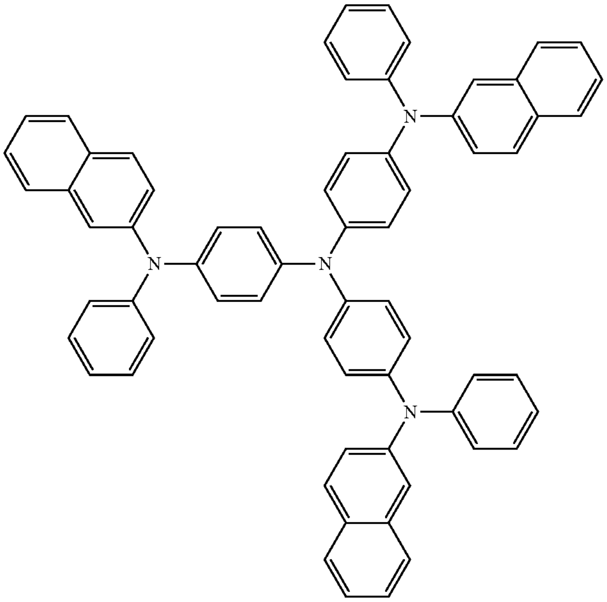
2-TNATA
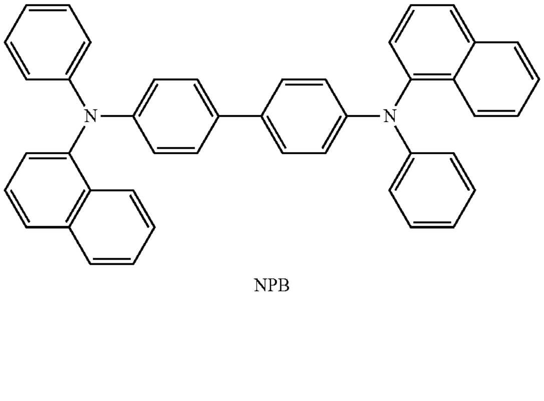
NPB -continued
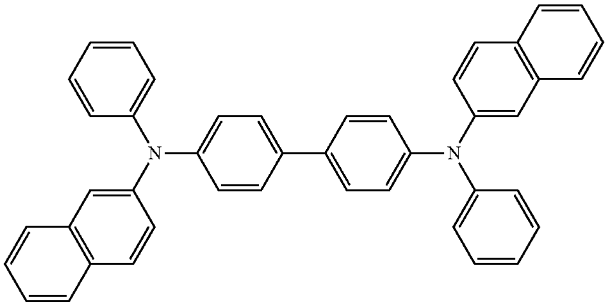
β-NPB
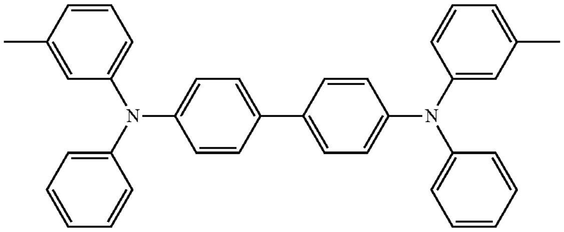
TPD
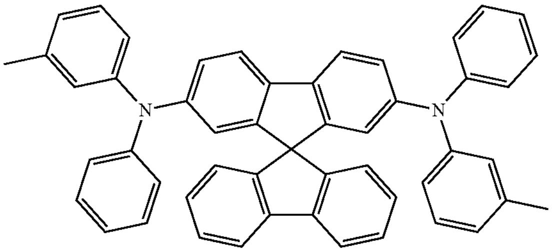
Spiro-TPD
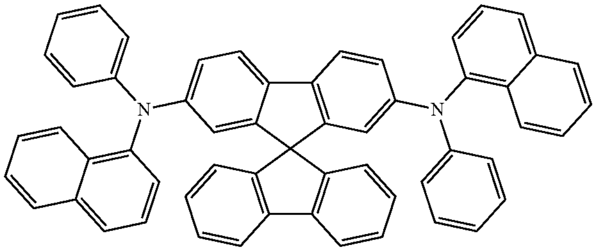
Spiro-NPB
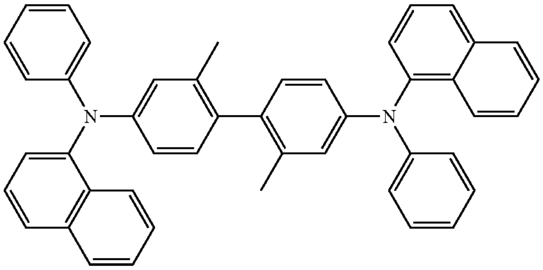
methylated-NPB
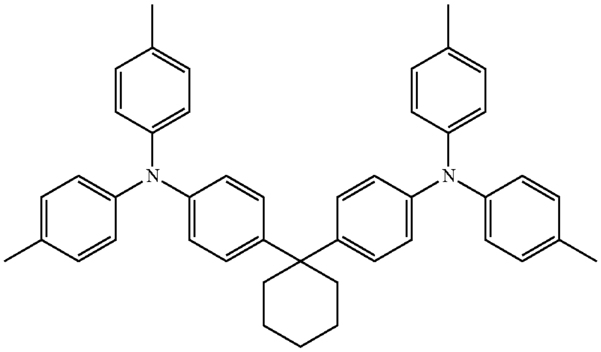
TAPC
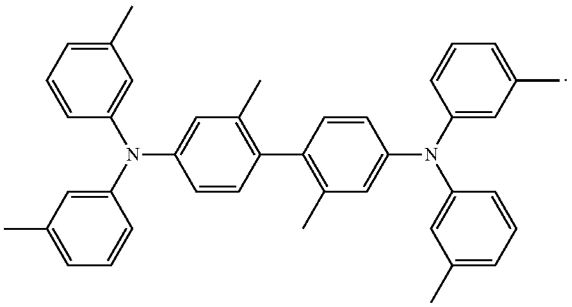
HMTPD A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within any of these ranges, satisfactory (or suitable) hole transporting characteristics may be obtained without a substantial increase in driving voltage.

The emission auxiliary layer may increase light-emission efficiency by compensating for an optical resonance distance according to the wavelength of light emitted by the emission layer, and the electron blocking layer may block or reduce the leakage of electrons from the emission layer to the hole transport region. Materials that may be included in the hole transport region may be included in the emission auxiliary layer and/or the electron-blocking layer.

p-Dopant

The hole transport region may further include, in addition to the materials described above, a charge-generation material for the improvement of conductive properties. The charge-generation material may be uniformly or non-uniformly dispersed in the hole transport region (for example, in the form of a single layer including (e.g., consisting of) a charge-generation material).

The charge-generation material may be, for example, a p-dopant.

For example, the p-dopant may have a lowest unoccupied molecular orbital (LUMO) energy level of equal to or less than −3.5 eV.

In one or more embodiments, the p-dopant may include a quinone derivative, a cyano group-containing compound, a compound containing element EL1 and element EL2, or any combination thereof.

Examples of the quinone derivative may include (e.g., may be) TCNQ, F4-TCNQ, and the like, and examples of the cyano group-containing compound may include (e.g., may be) HAT-CN, a compound represented by Formula 221, and the like:

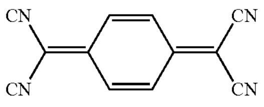

TCNQ

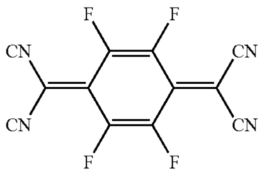

F4-TCNQ

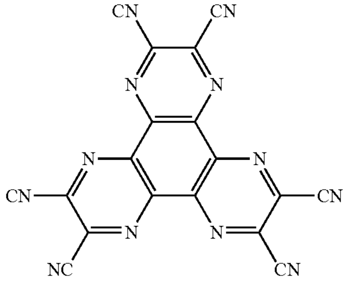

HAT-CN

-continued

Formula 221

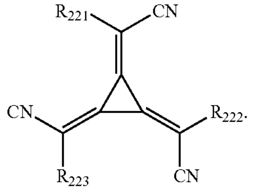

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be metal, metalloid, or any combination thereof, and element EL2 may be non-metal, metalloid, or any combination thereof.

Examples of the metal may include (e.g., may be) an alkali metal (for example, lithium (Li), sodium (Na), potassium (K), rubidium (Rb), cesium (Cs), and the like); alkaline earth metal (for example, beryllium (Be), magnesium (Mg), calcium (Ca), strontium (Sr), barium (Ba), and the like); transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), and the like); post-transition metal (for example, zinc (Zn), indium (In), tin (Sn), and the like); and lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and the like).

Examples of the metalloid may include (e.g., may be) silicon (Si), antimony (Sb), tellurium (Te), and the like.

Examples of the non-metal may include (e.g., may be) oxygen (O), halogen (for example, F, Cl, Br, I, and the like), and the like.

Examples of the compound containing element EL1 and element EL2 may include (e.g., may be) metal oxide, metal halide (for example, metal fluoride, metal chloride, metal bromide, metal iodide, and the like), metalloid halide (for example, metalloid fluoride, metalloid chloride, metalloid bromide, metalloid iodide, and the like), metal telluride, or any combination thereof.

Examples of the metal oxide may include (e.g., may be) tungsten oxide (for example, WO, $W_2O_3$, $WO_2$, WO, $W_2O_5$, and the like), vanadium oxide (for example, VO, $V_2O_3$, $VO_2$, $V_2O_5$, and the like), molybdenum oxide (MoO, $Mo_2O_3$, $MoO_2$, $MoO_3$, $Mo_2O_5$, and the like), rhenium oxide (for example, $ReO_3$, and the like), and the like.

Examples of the metal halide may include (e.g., may be) alkali metal halide, alkaline earth metal halide, transition metal halide, post-transition metal halide, lanthanide metal halide, and the like.

Examples of the alkali metal halide may include (e.g., may be) LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of the alkaline earth metal halide may include (e.g., may be) $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like.

Examples of the transition metal halide may include (e.g., may be) titanium halide (for example, $TiF_4$, $TiCl_4$, $TiBr_4$, $TiI_4$, and the like), zirconium halide (for example, $ZrF_4$, $ZrCl_4$, $ZrBr_4$, $ZrI_4$, and the like), hafnium halide (for example, $HfF_4$, $HfCl_4$, $HfBr_4$, $HfI_4$, and the like), vanadium halide (for example, $VF_3$, $VCl_3$, $VBr_3$, $VI_3$, and the like), niobium halide (for example, $NbF_3$, $NbCl_3$, $NbBr_3$, $NbI_3$, and the like), tantalum halide (for example, $TaF_3$, $TaCl_3$, $TaBr_3$, $TaI_3$, and the like), chromium halide (for example, $CrF_3$, $CrCl_3$, $CrBr_3$, $CrI_3$, and the like), molybdenum halide (for example, $MoF_3$, $MoCl_3$, $MoBr_3$, $MoI_3$, and the like), tungsten halide (for example, $WF_3$, $WCl_3$, $WBr_3$, $WI_3$, and the like), manganese halide (for example, $MnF_2$, $MnCl_2$, $MnBr_2$, $MnI_2$, and the like), technetium halide (for example, $TcF_2$, $TcCl_2$, $TcBr_2$, $TcI_2$, and the like), rhenium halide (for example, $ReF_2$, $ReCl_2$, $ReBr_2$, $ReI_2$, and the like), iron halide (for example, $FeF_2$, $FeCl_2$, $FeBr_2$, $FeI_2$, and the like), ruthenium halide (for example, $RuF_2$, $RuCl_2$, $RuBr_2$, $RuI_2$, and the like), osmium halide (for example, $OsF_2$, $OsCl_2$, $OsBr_2$, $OsI_2$, and the like), cobalt halide (for example, $CoF_2$, $CoCl_2$, $CoBr_2$, $CoI_2$, and the like), rhodium halide (for example, $RhF_2$, $RhCl_2$, $RhBr_2$, $RhI_2$, and the like), iridium halide (for example, $IrF_2$, $IrCl_2$, $IrBr_2$, $IrI_2$, and the like), nickel halide (for example, $NiF_2$, $NiCl_2$, $NiBr_2$, $NiI_2$, and the like), palladium halide (for example, $PdF_2$, $PdCl_2$, $PdBr_2$, $PdI_2$, and the like), platinum halide (for example, $PtF_2$, $PtCl_2$, $PtBr_2$, $PtI_2$, and the like), copper halide (for example, CuF, CuCl, CuBr, CuI, and the like), silver halide (for example, AgF, AgCl, AgBr, AgI, and the like), gold halide (for example, AuF, AuCl, AuBr, AuI, and the like), and the like.

Examples of the post-transition metal halide may include (e.g., may be) zinc halide (for example, $ZnF_2$, $ZnCl_2$, $ZnBr_2$, $ZnI_2$, and the like), indium halide (for example, $InI_3$, etc.), tin halide (for example, $SnI_2$, and the like), and the like.

Examples of the lanthanide metal halide may include (e.g., may be) YbF, $YbF_2$, $YbF_3$, $SmF_3$, YbCl, $YbCl_2$, $YbCl_3$ $SmCl_3$, YbBr, $YbBr_2$, $YbBr_3$, $SmBr_3$, YbI, $YbI_2$, $YbI_3$, $SmI_3$, and the like.

Examples of the metalloid halide may include (e.g., may be) antimony halide (for example, $SbCl_5$ and the like) and the like.

Examples of the metal telluride may include (e.g., may be) alkali metal telluride (for example, $Li_2Te$, $Na_2Te$, $K_2Te$, $Rb_2Te$, $Cs_2Te$, and the like), alkaline earth metal telluride (for example, BeTe, MgTe, CaTe, SrTe, BaTe, and the like), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, and the like), post-transition metal telluride (for example, ZnTe, and the like), lanthanide metal telluride (for example, LaTe, CeTe, PrTe, NdTe, PmTe, EuTe, GdTe, TbTe, DyTe, HoTe, ErTe, TmTe, YbTe, LuTe, and the like), and the like.

Emission Layer in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and a blue emission layer, in which the two or more layers contact each other or are separated from each other to emit white light. In one or more embodiments, the emission layer may a structure in which two or more materials of a red light-emitting material, a green light-emitting material, and a blue light-emitting material are mixed with each other in a single layer to emit white light.

In one or more embodiments, the emission layer may include a host and a dopant. The dopant may include a phosphorescent dopant, a fluorescent dopant, or any combination thereof.

In the emission layer, an amount of the dopant may be in a range of about 0.01 parts by weight to about 15 parts by weight based on 100 parts by weight of the host.

In one or more embodiments, the emission layer may include quantum dots.

In one or more embodiments, the emission layer may include a delayed fluorescence material. The delayed fluorescence material may act as a host or a dopant in the emission layer.

A thickness of the emission layer may be in a range of about 100 Å to about 1,000 Å, for example, about 200 Å to about 600 Å. When the thickness of the emission layer is within any of these ranges, excellent (or improved) luminescence characteristics may be obtained without a substantial increase in driving voltage.

Host

The host in the emission layer may include the second compound or the third compound described in the present specification, or any combination thereof.

In one or more embodiments, the host may include a compound represented by Formula 301:

$$[Ar_{301}]_{xb11}\text{-}[(L_{301})_{xb1}\text{-}R_{301}]_{xb21}, \qquad \text{Formula 301}$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, or $—P(=O)(Q_{301})(Q_{302})$, xb21 may be an integer from 1 to 5, and $Q_{301}$ to $Q_{303}$ may respectively be the same as described in connection with $Q_1$.

For example, when xb11 in Formula 301 is 2 or more, two or more of $Ar_{301}$(s) may be linked to each other via a single bond.

In one or more embodiments, the host may include a compound represented by Formula 301-1, a compound represented by Formula 301-2, or any combination thereof:

Formula 301-1

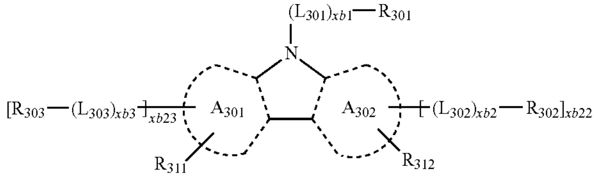

Formula 301-2

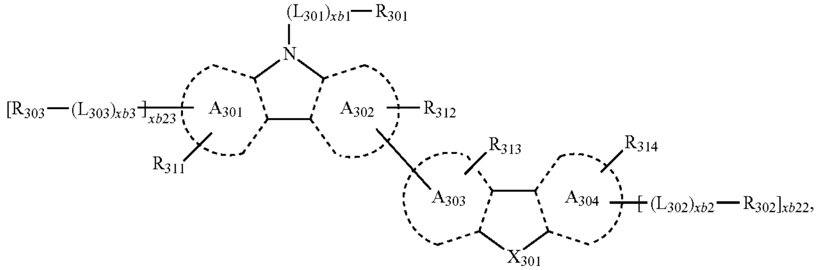

wherein, in Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], $C(R_{304})(R_{305})$, or $Si(R_{304})(R_{305})$, xb22 and xb23 may each independently be 0, 1, or 2, $L_{301}$, xb1, and $R_{301}$ may respectively be the same as described herein, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may respectively be the same as described in connection with $R_{301}$.

In one or more embodiments, the host may include an alkali earth metal complex, a post-transition metal complex, or any combination thereof. For example, the host may include a Be complex (for example, Compound H55), an Mg complex, a Zn complex, or any combination thereof.

In one or more embodiments, the host may include one of Compounds H1 to H124, 9,10-<l(2-naphthyl)anthracene (ADN), 2-methyl-9,10-bis(naphthalen-2-yl)anthracene (MA DN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

H1

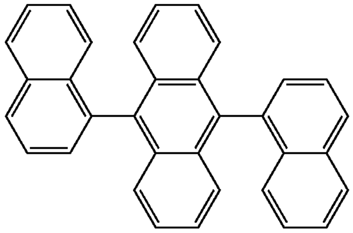

-continued

H2

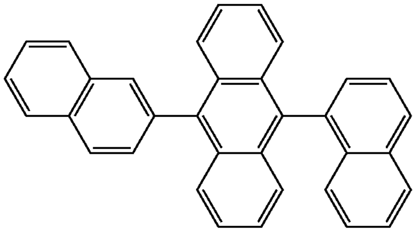

H3

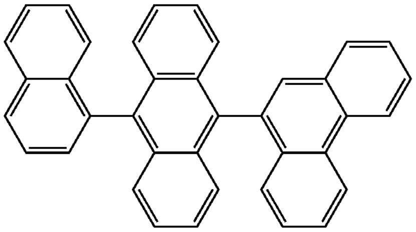

H4

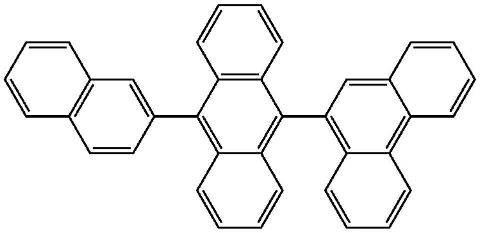

H5

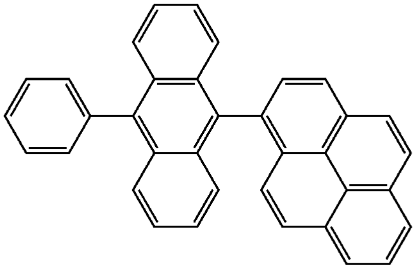

-continued
H6
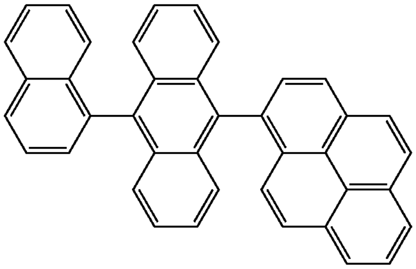
H7
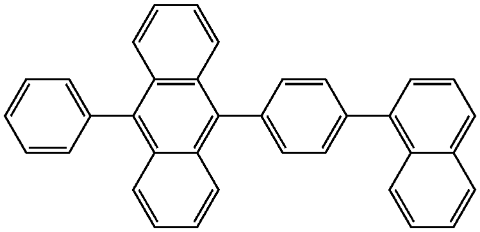
H8
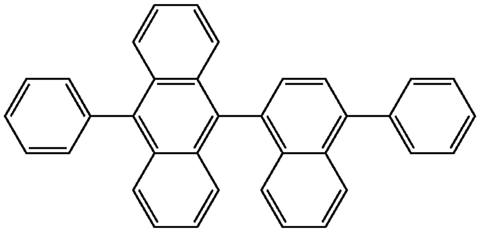
H9
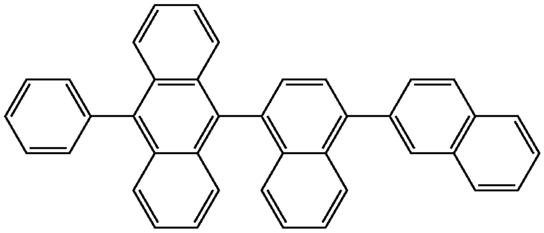
H10
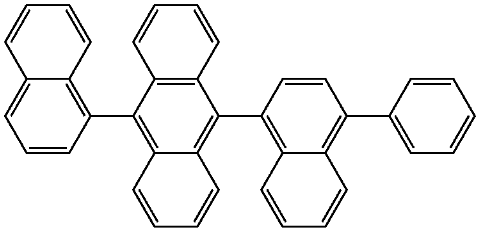
H11
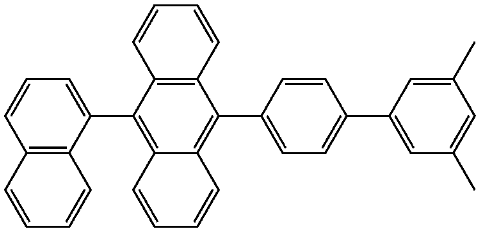
-continued
H12
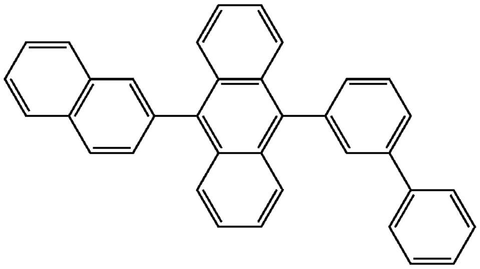
H13
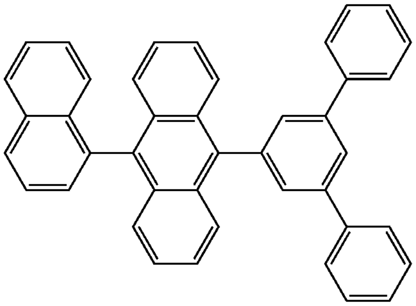
H14
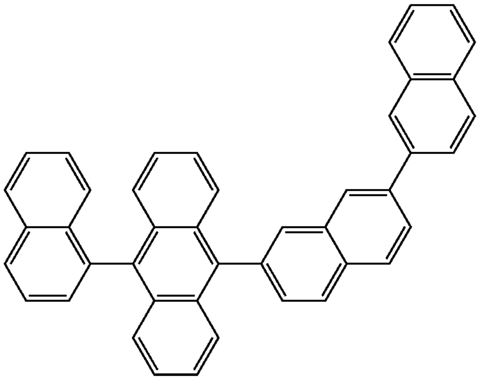
H15
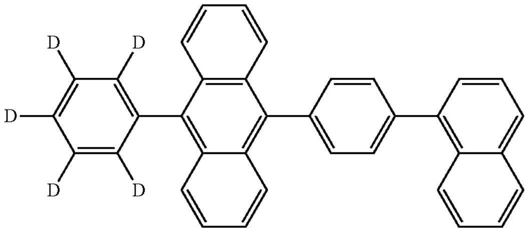
H16
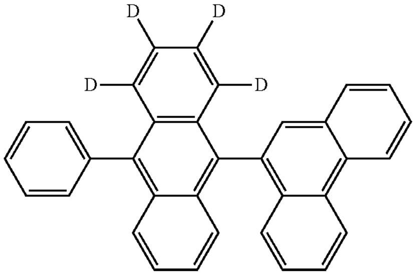

H17
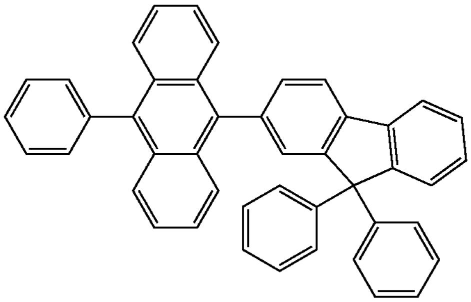
H18
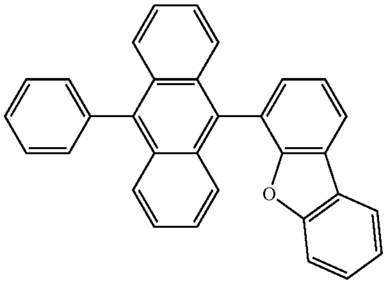
H19
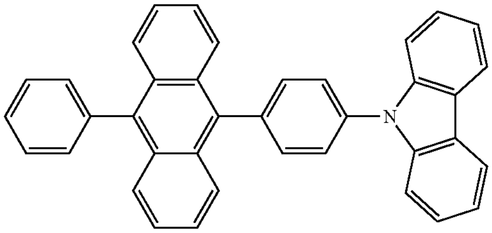
H20
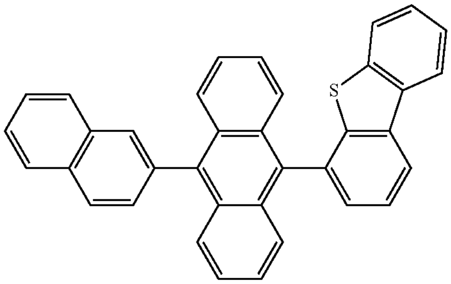
H21
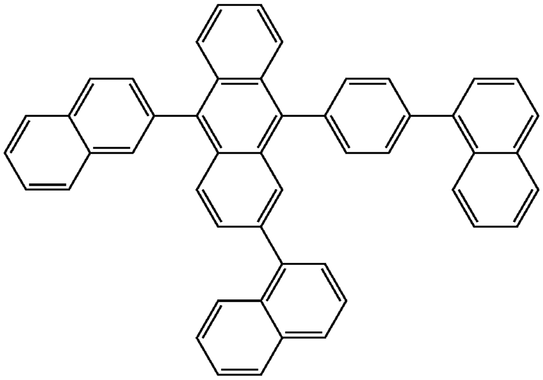
H22
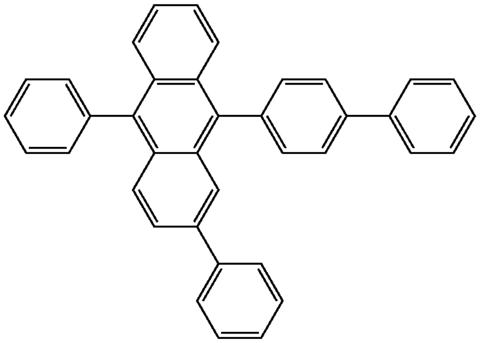
H23
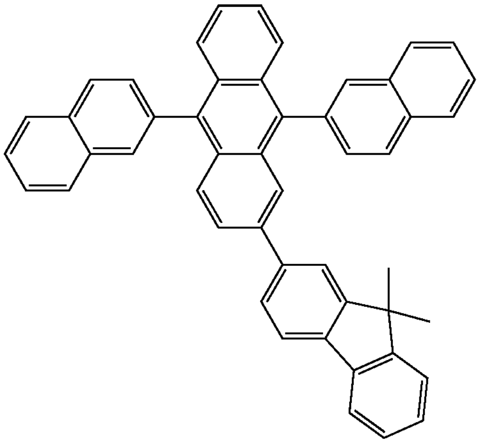
H24
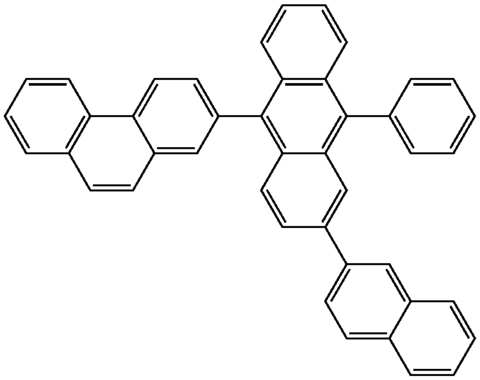

-continued
H25
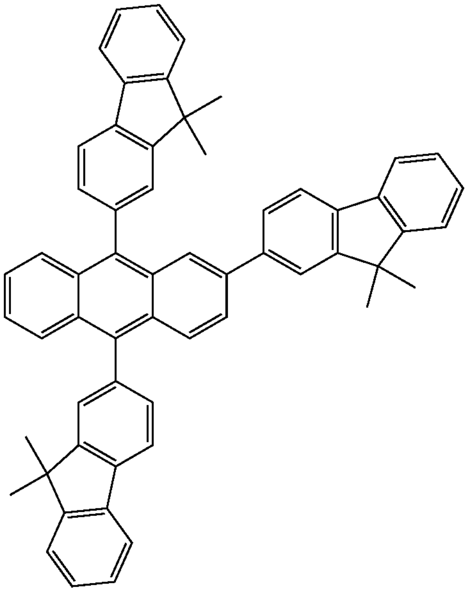
H26
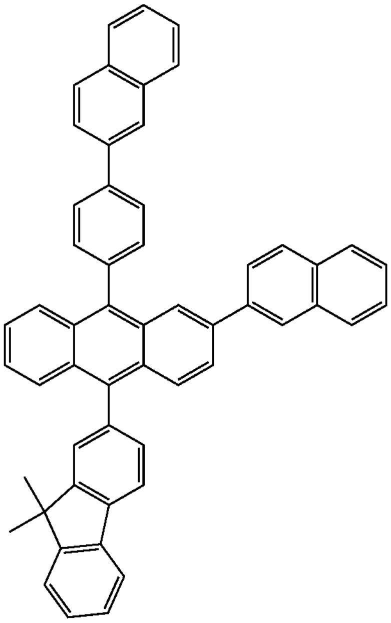
-continued
H27
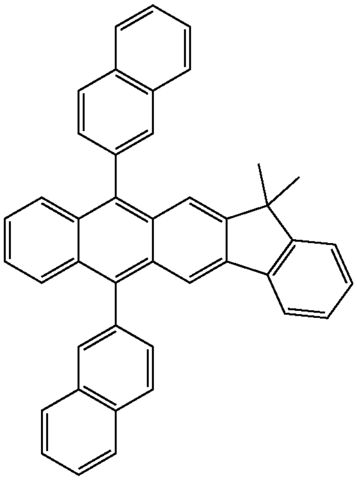
H28
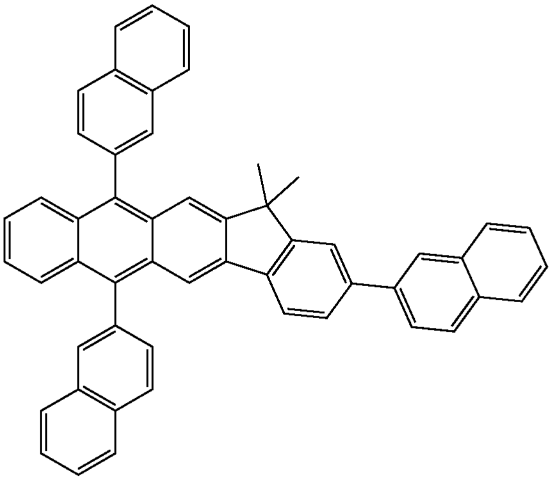
H29
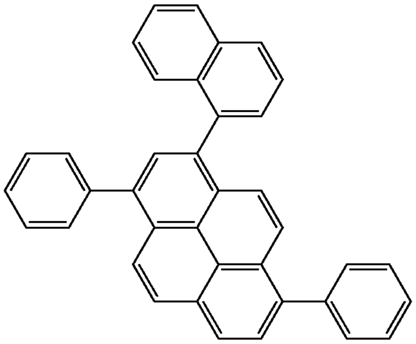

-continued
H30
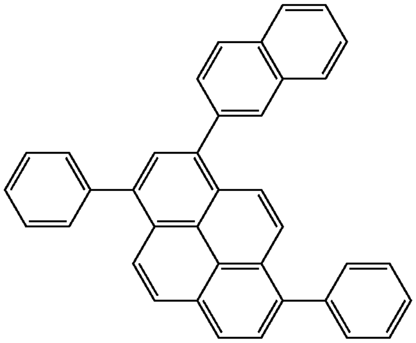
H31
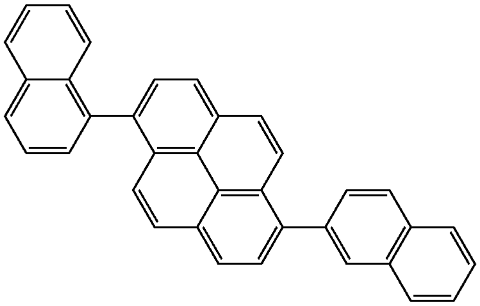
H32
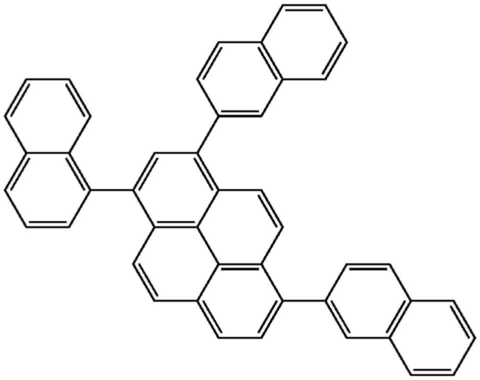
H33
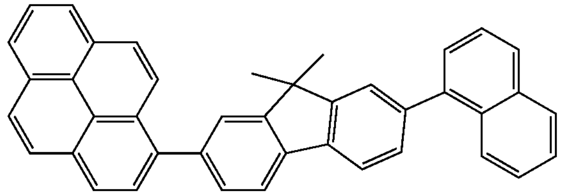
H34
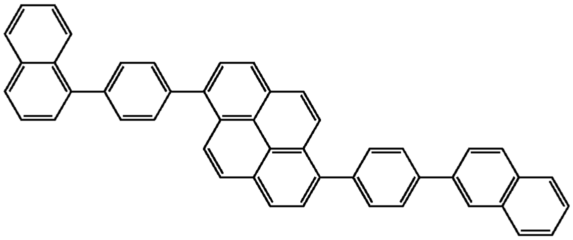
-continued
H35
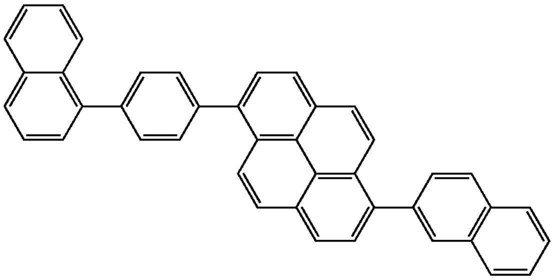
H36
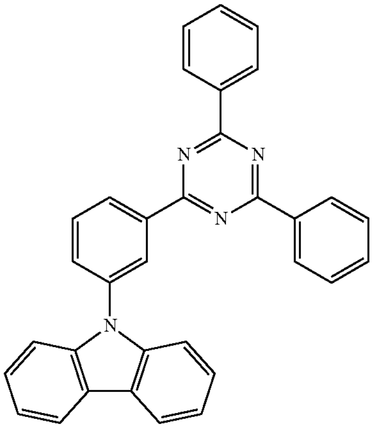
H37
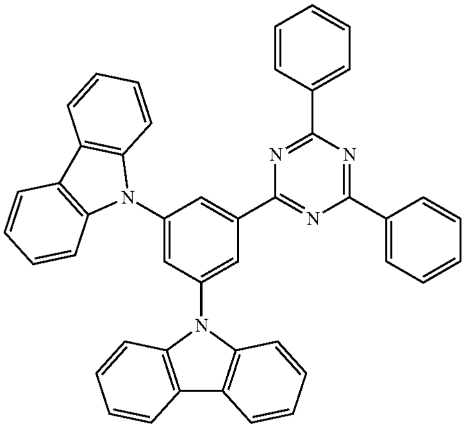
H38
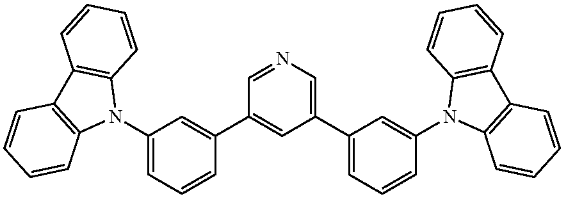

-continued
H39
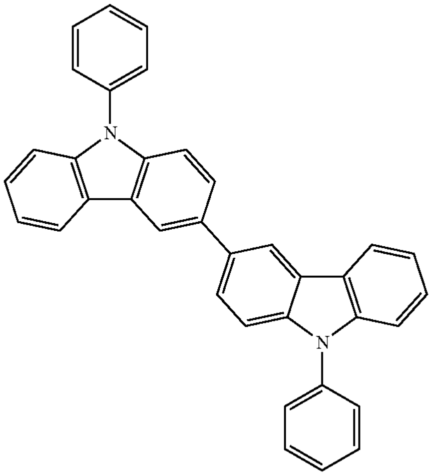
H40
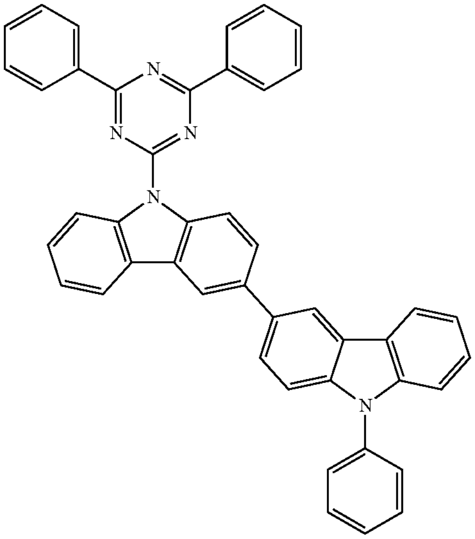
H41
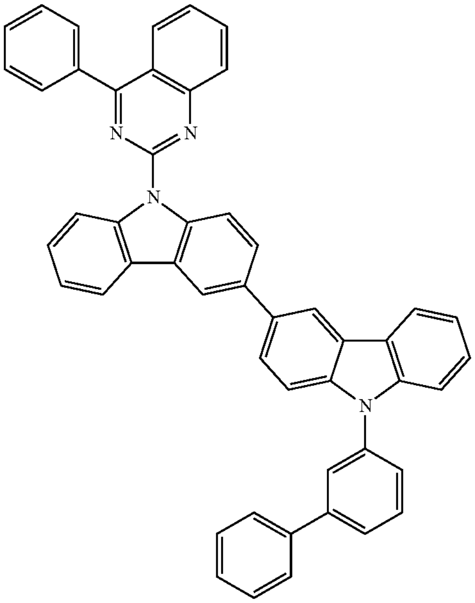
-continued
H42
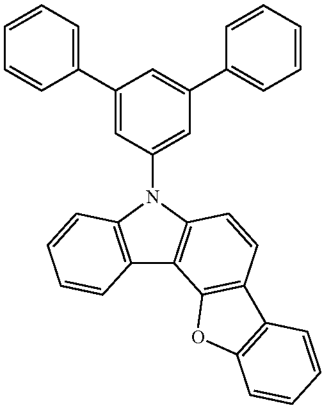
H43
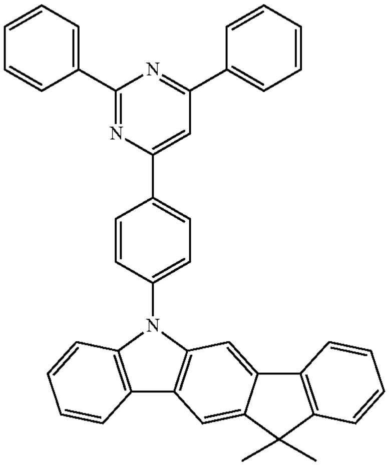
H44
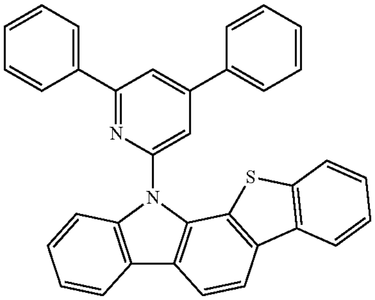
H45
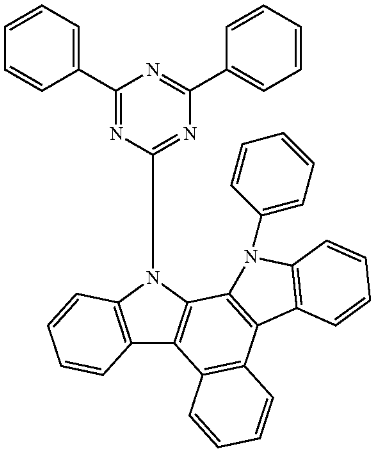

-continued
H46
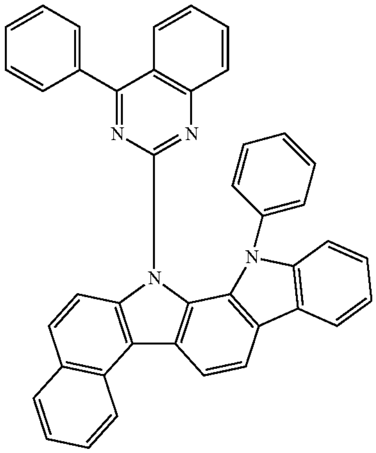
H47
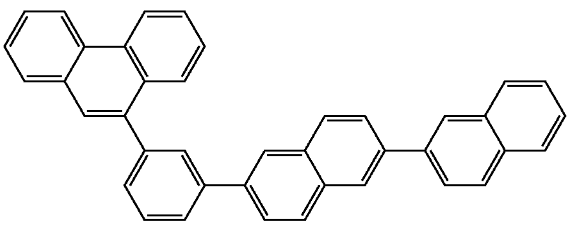
H48
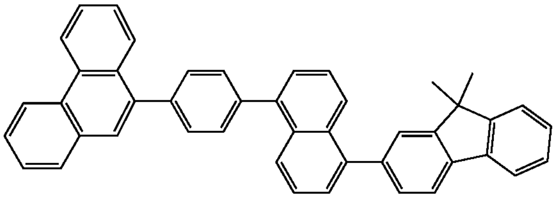
H49
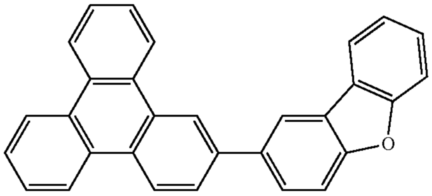
H50
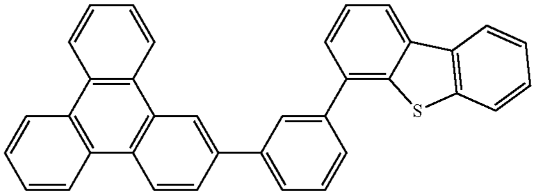
H51
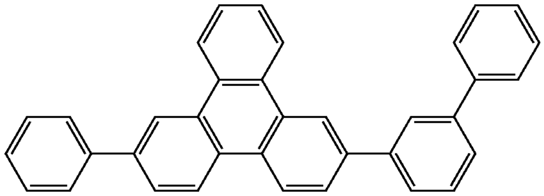
-continued
H52
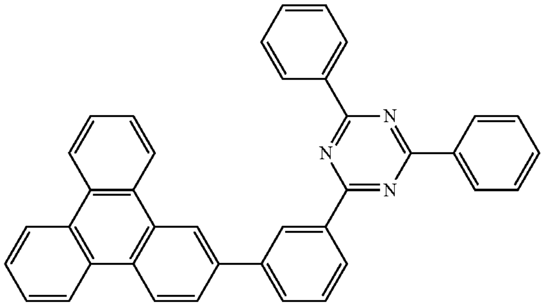
H53
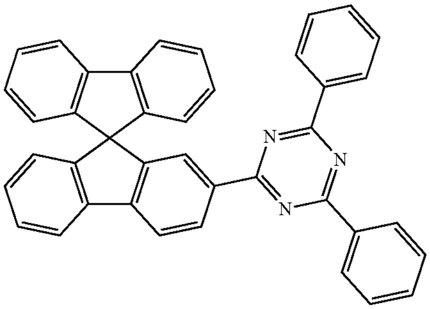
H54
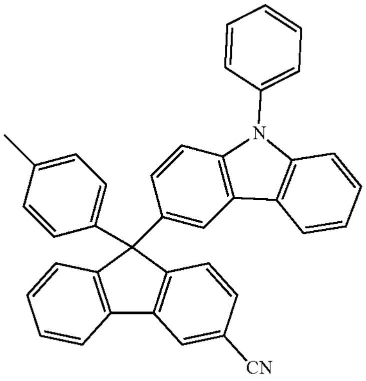
H55
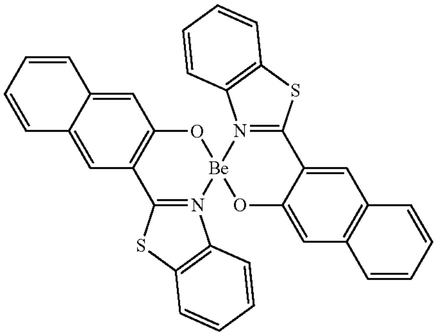

-continued
H56
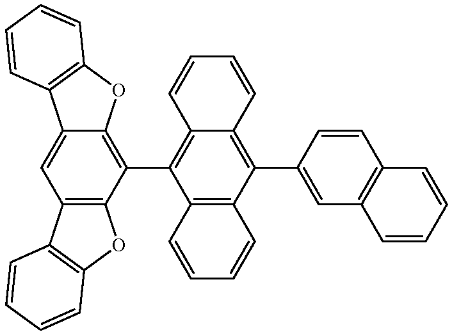
H57
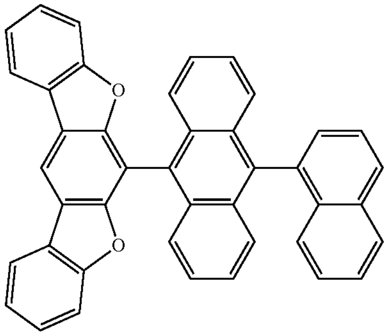
H58
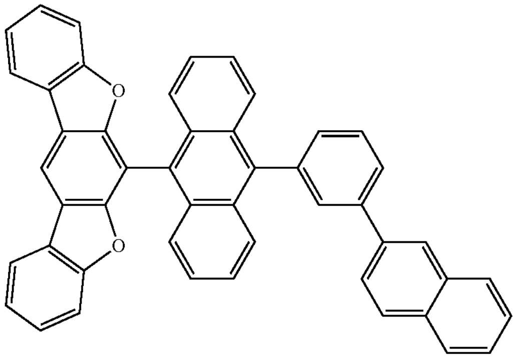
H59
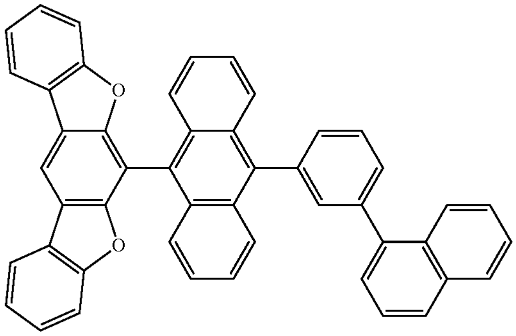
-continued
H60
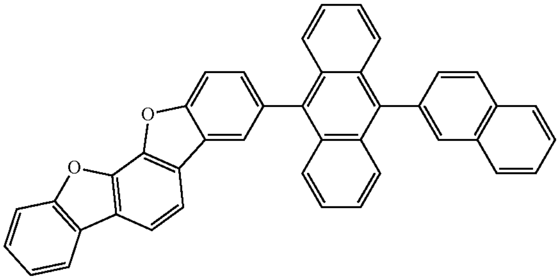
H61
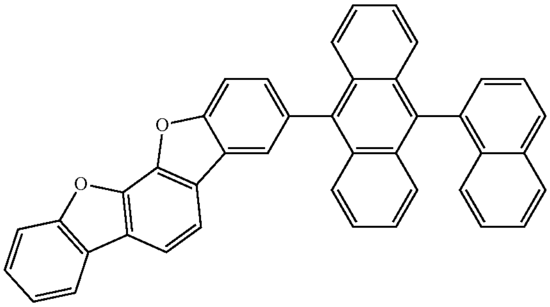
H62
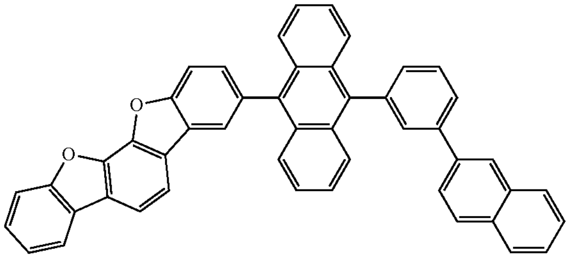
H63
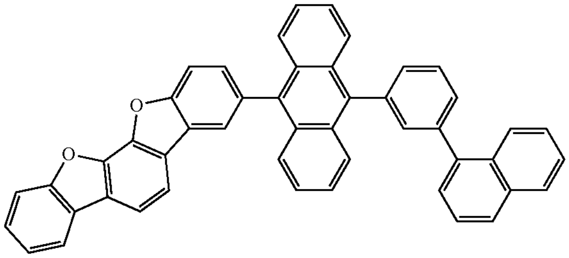
H64
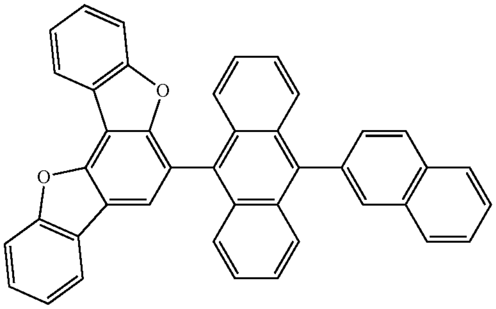

-continued
H65
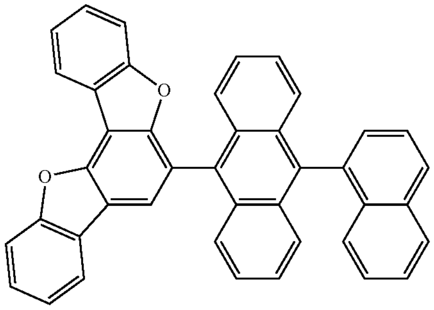
H66
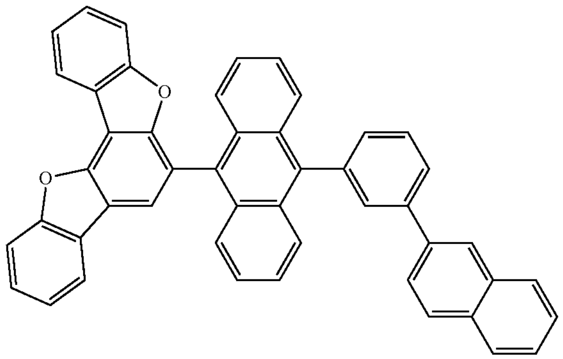
H67
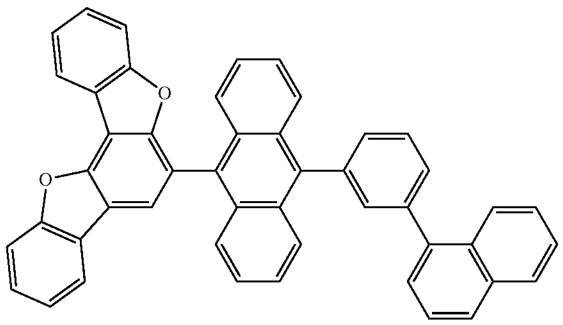
H68
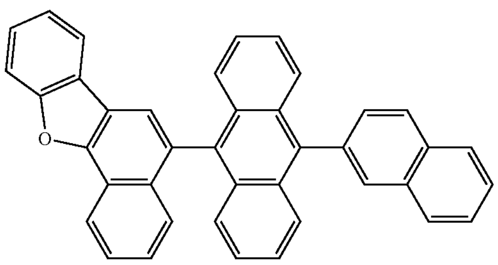
H69
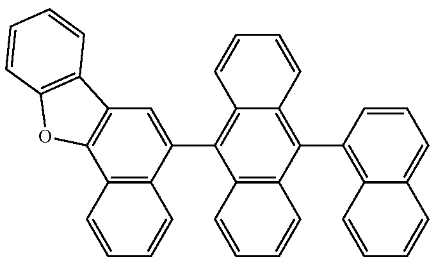
-continued
H70
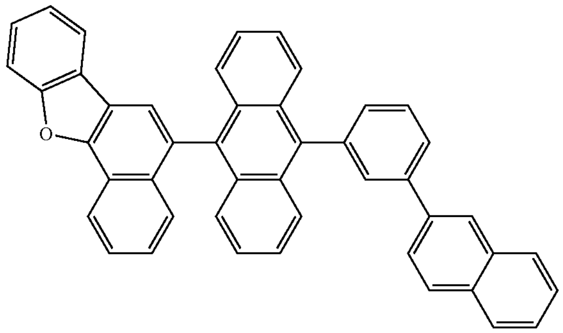
H71
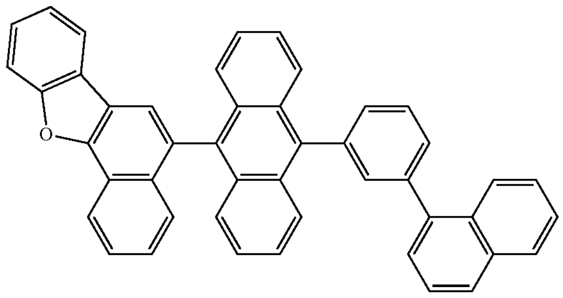
H72
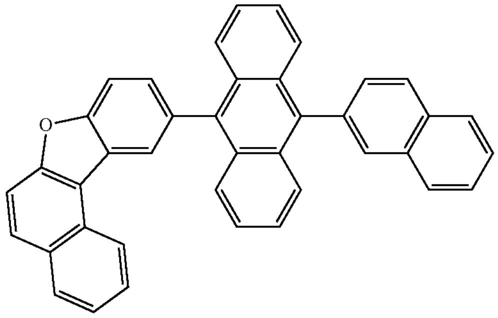
H73
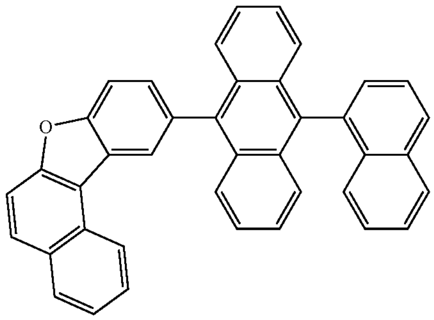

-continued
H74
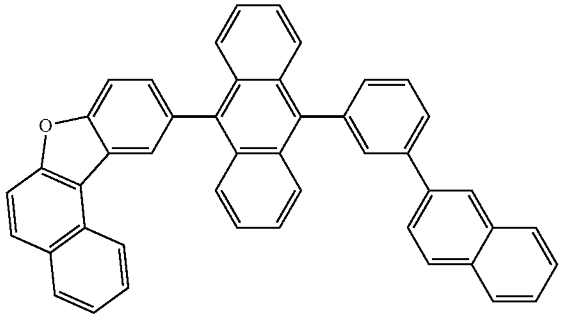
H75
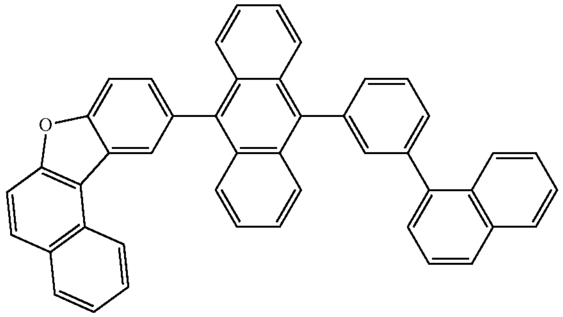
H76
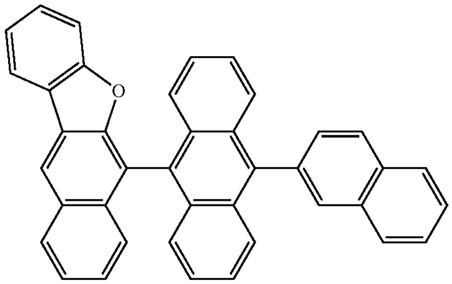
H77
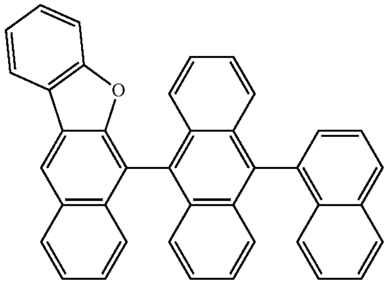
H78
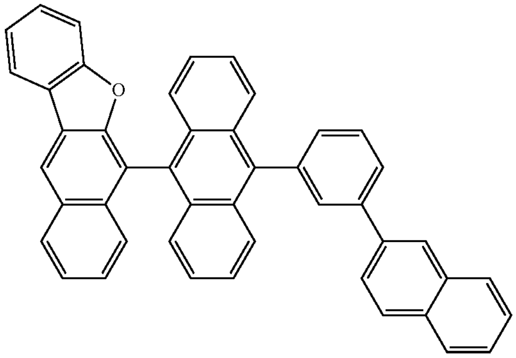
-continued
H79
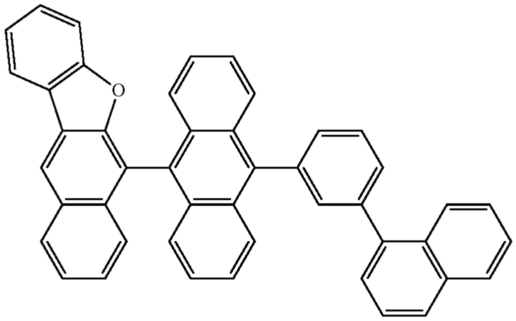
H80
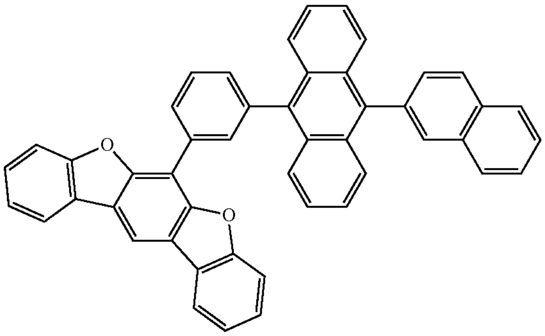
H81
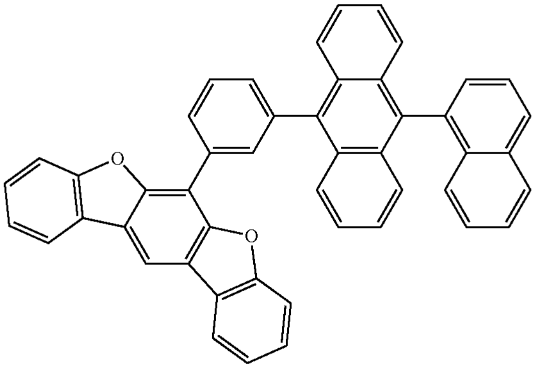
H82
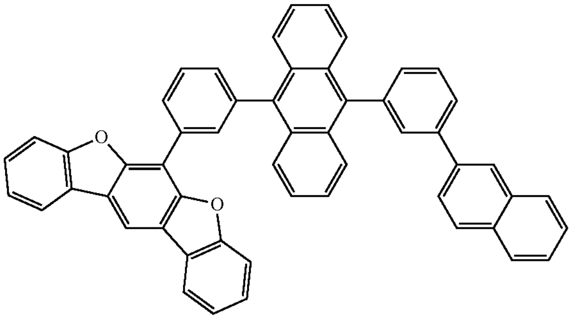

-continued
H83
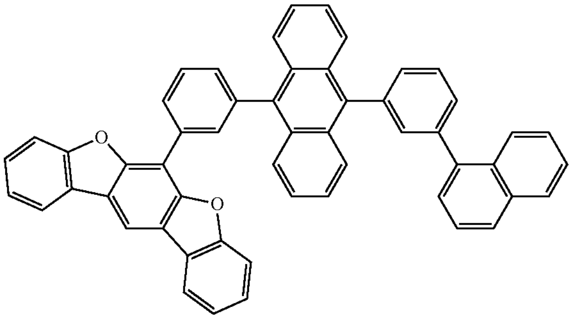
H84
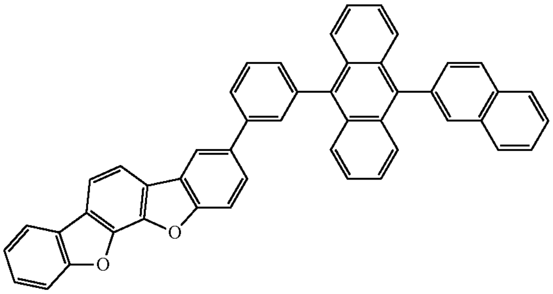
H85
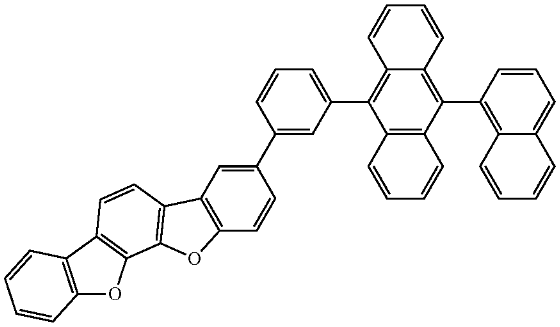
H86
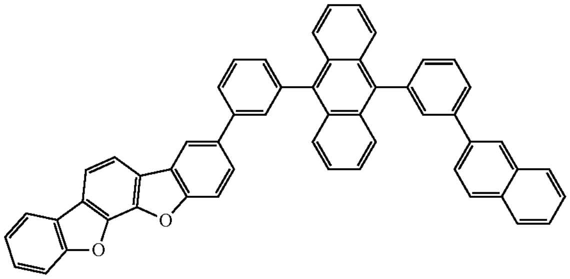
H87
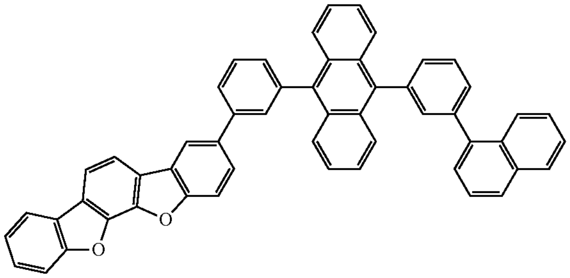
-continued
H88
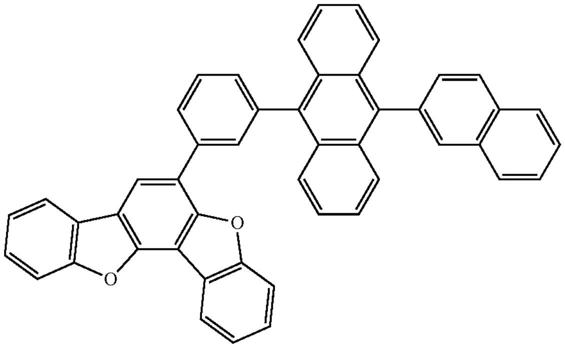
H89
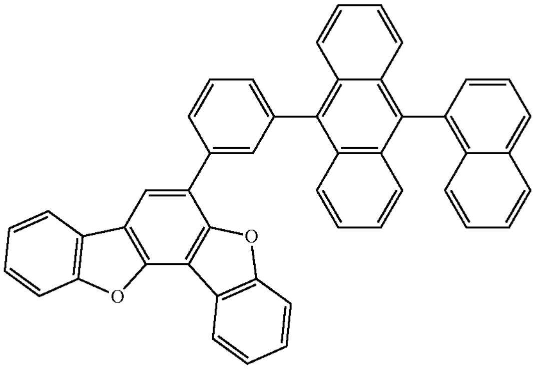
H90
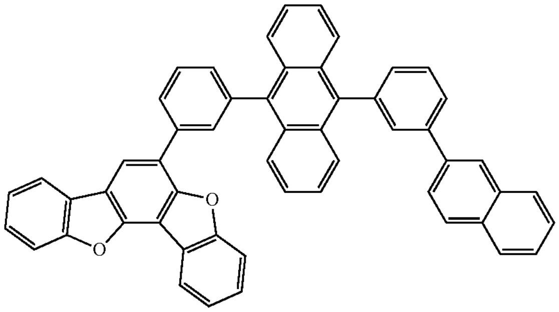
H91
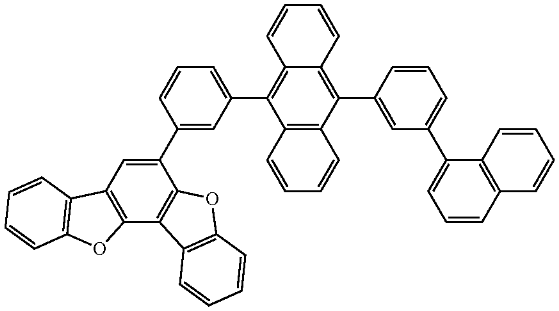

-continued
H92
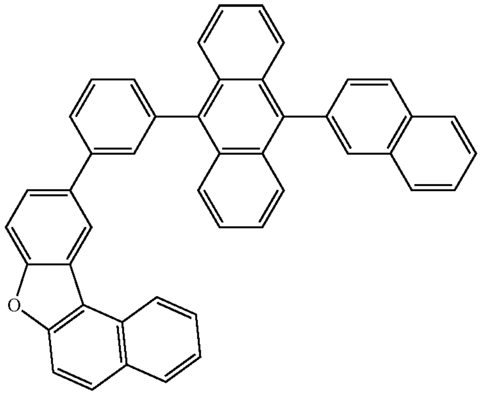
H93
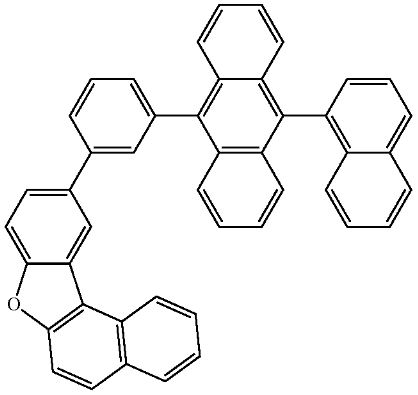
H94
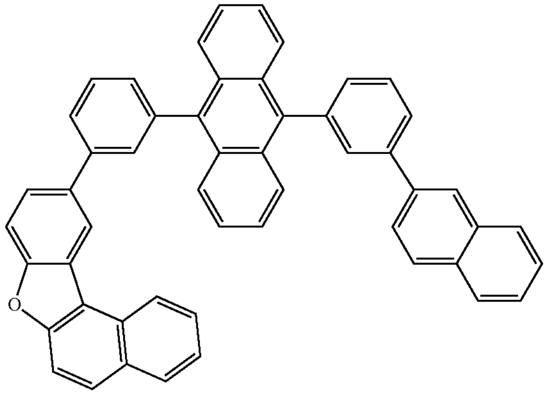
H95
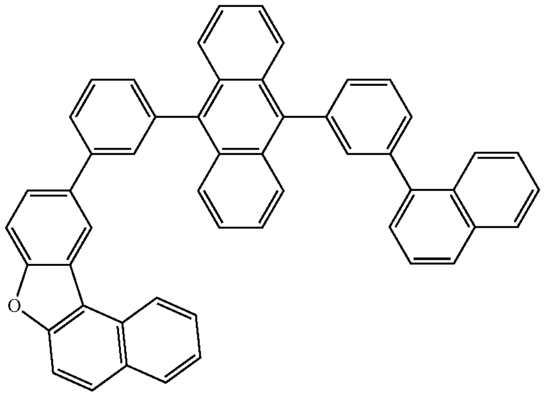
-continued
H96
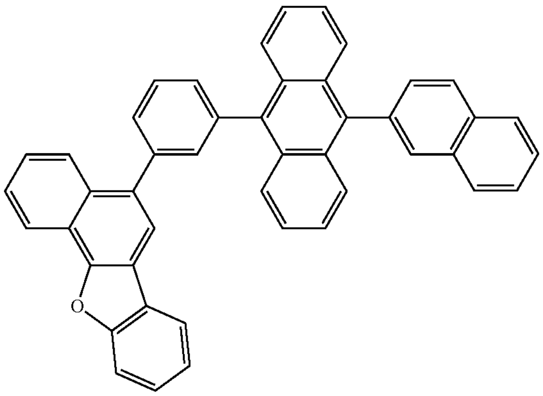
H97
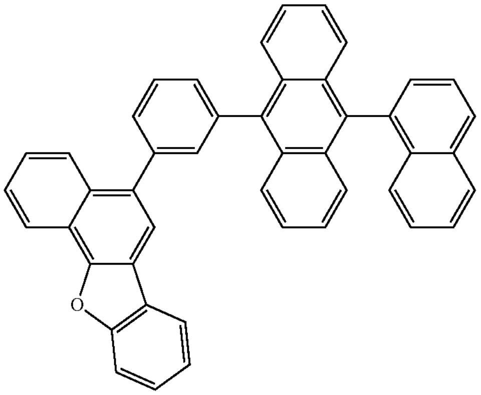
H98
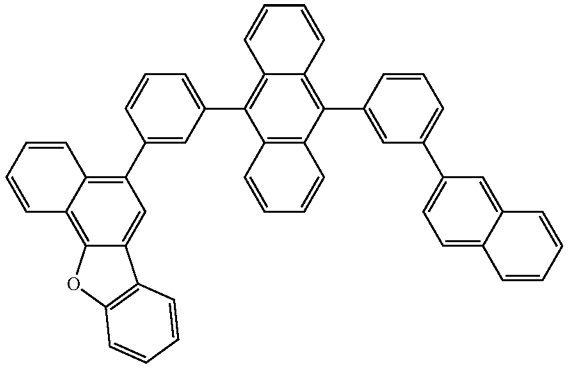
H99
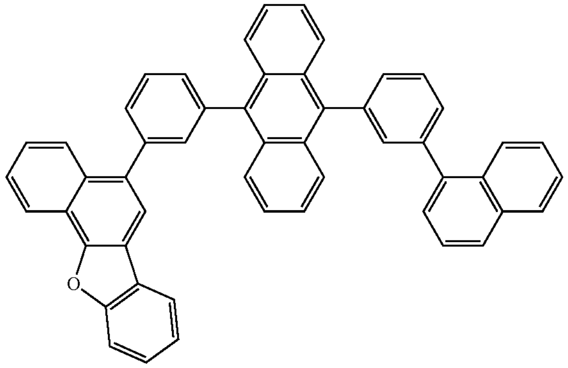

-continued
H100
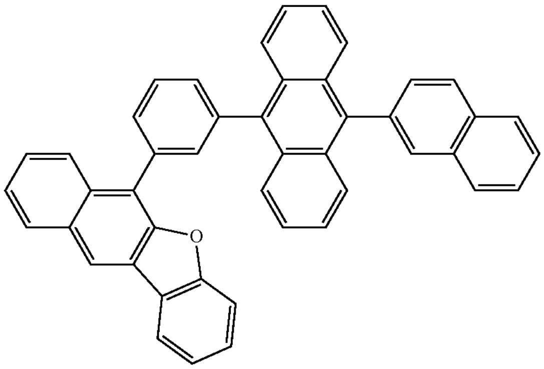
H101
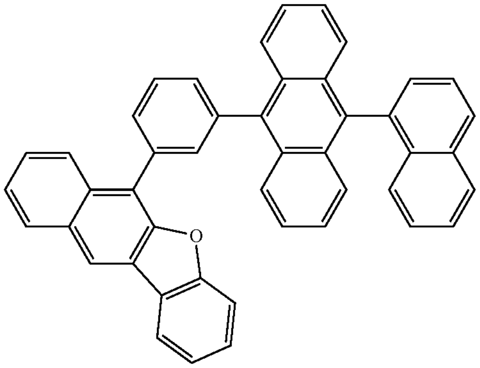
H102
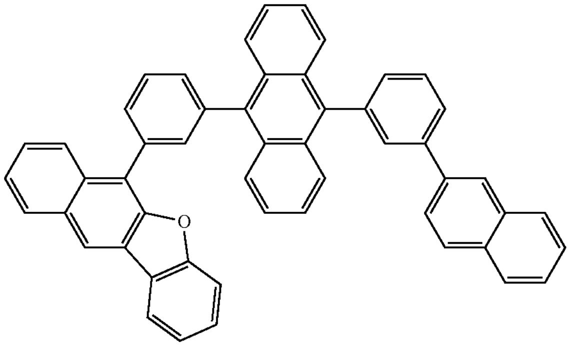
H103
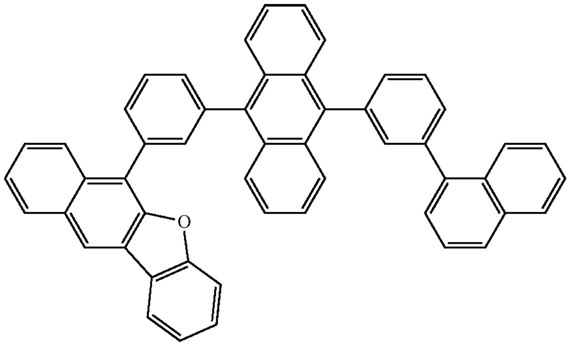
-continued
H104
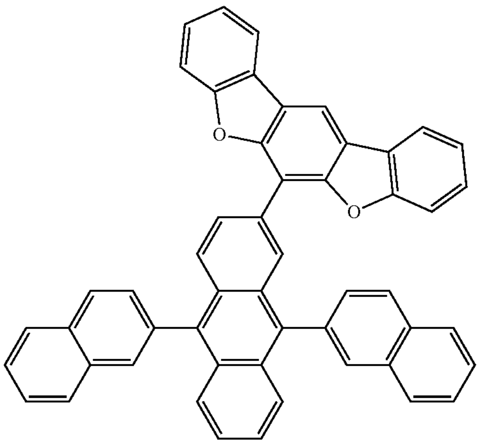
H105
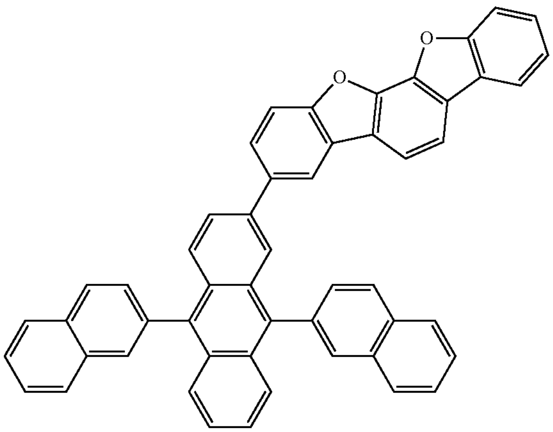
H106
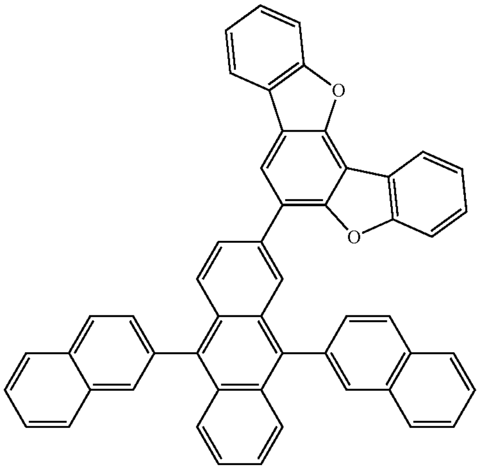

-continued
H107
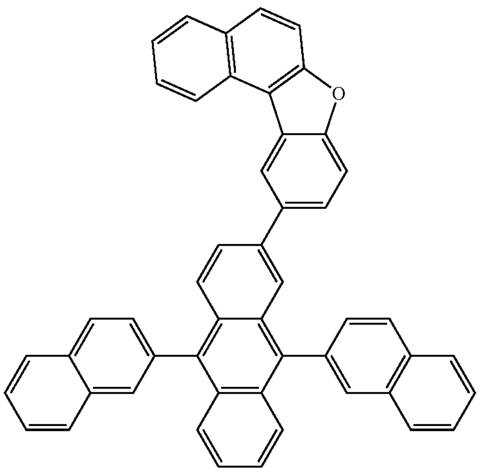
H108
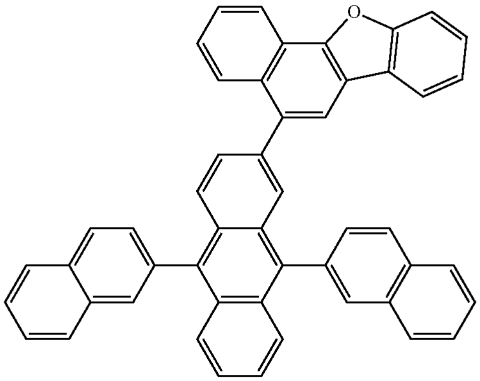
H109
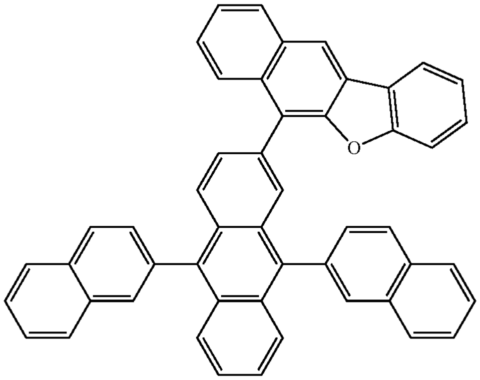
H110
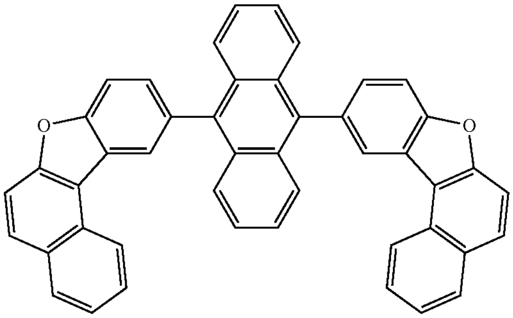
-continued
H111
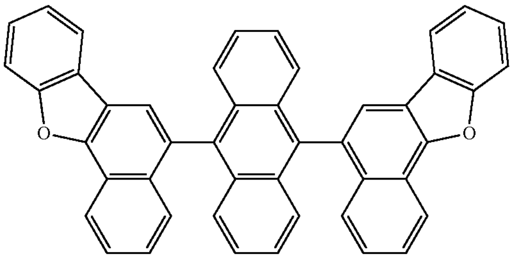
H112
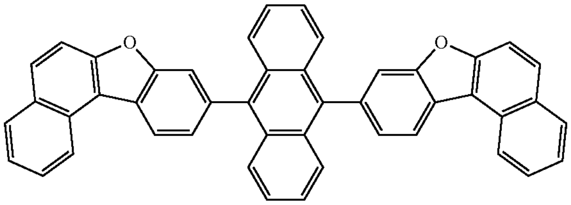
H113
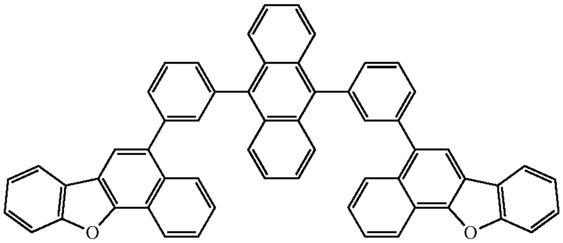
H114
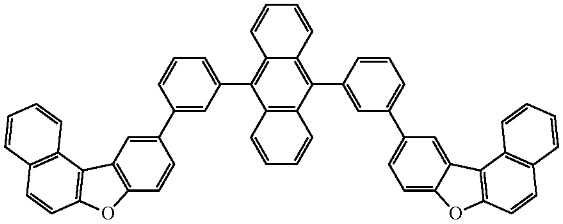
H115
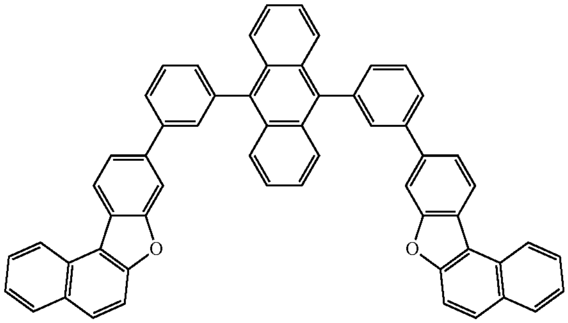

-continued
H116
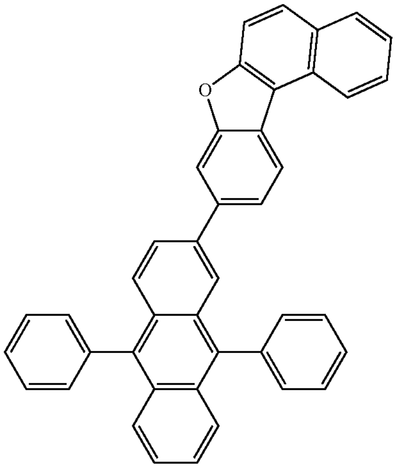
H117
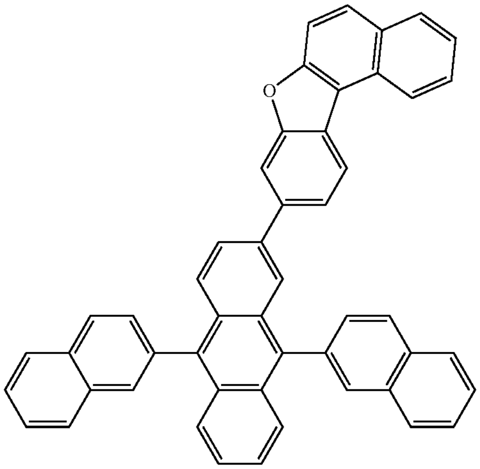
H118
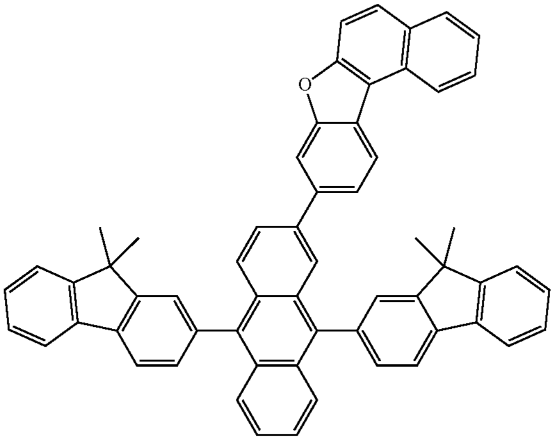
-continued
H119
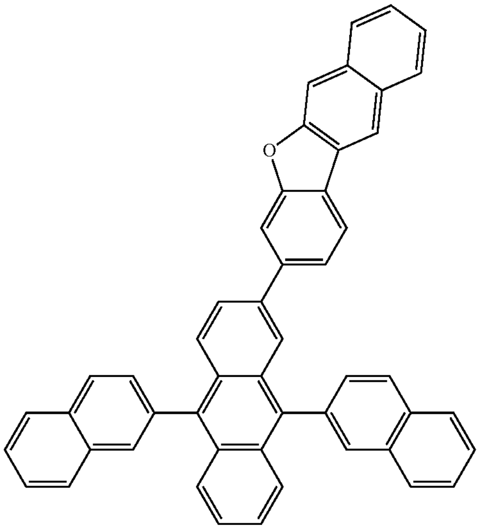
H120
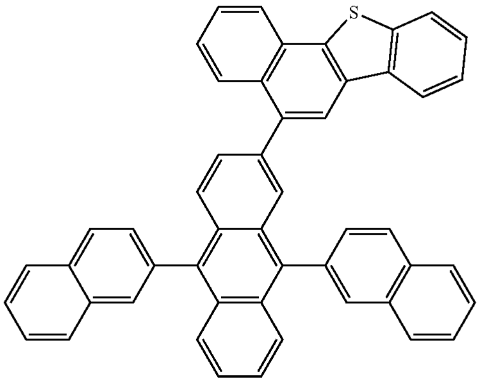
H121
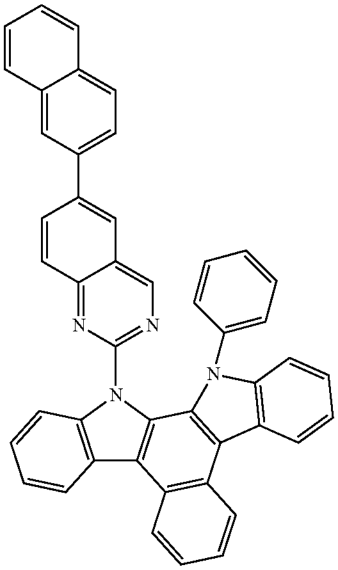

-continued

H122

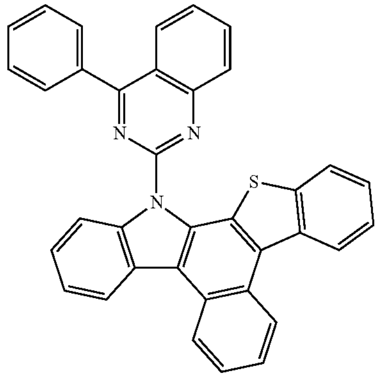

H123

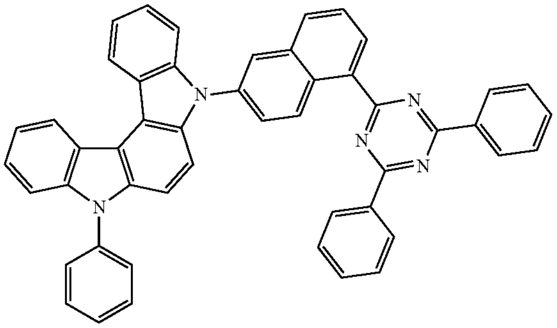

H124

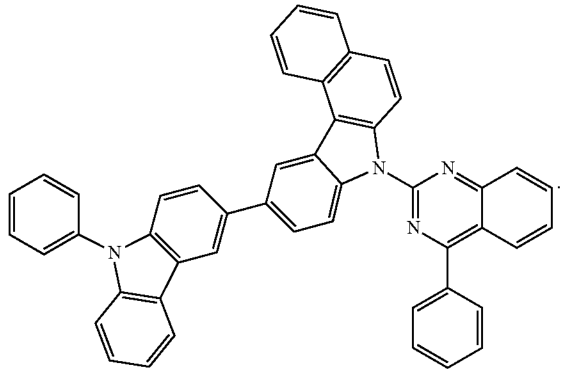

In one or more embodiments, the host may include a silicon-containing compound, a phosphine oxide-containing compound, or any combination thereof.

The host may have various suitable modifications. For example, the host may include only one compound, or may include two or more different compounds.

In one or more embodiments, the host may include a silicon-containing compound, a phosphine oxide-containing compound, or any combination thereof.

Phosphorescent Dopant

In one or more embodiments, the emission layer may include, as a phosphorescent dopant, the first compound described above.

In one or more embodiments, when the emission layer includes the first compound, and the first compound serves as an auxiliary dopant, the emission layer may include a phosphorescent dopant.

In one or more embodiments, the phosphorescent dopant may include at least one transition metal as a central metal.

In one or more embodiments, the phosphorescent dopant may include a monodentate ligand, a bidentate ligand, a tridentate ligand, a tetradentate ligand, a pentadentate ligand, a hexadentate ligand, or any combination thereof.

In one or more embodiments, the phosphorescent dopant may be electrically neutral.

In one or more embodiments, the phosphorescent dopant may include an organometallic compound represented by Formula 401:

Formula 401

$M(L_{401})_{xc1}(L_{402})_{xc2}$

Formula 402

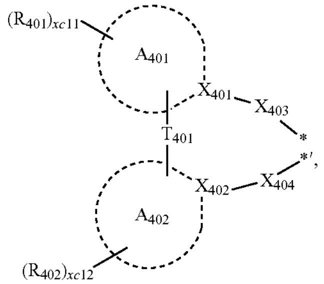

wherein, in Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more of $L_{401}$ (s) may be identical to or different from each other, $L_{402}$ may be an organic ligand, and xc2 may be 0, 1, 2, 3, or 4, wherein, when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may respectively be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may respectively be the same as described in connection with $Q_1$, xc11 and xc12 may each independently be an integer from 0 to 10, and

* and *' in Formula 402 each indicate a binding site to M in Formula 401.

For example, in Formula 402, i) $X_{401}$ may be nitrogen and $X_{402}$ may be carbon, or ii) each of $X_{401}$ and $X_{402}$ may be nitrogen.

When xc1 in Formula 401 is 2 or more, two ring $A_{401}$(s) in two or more of $L_{401}$(s) may optionally be linked to each other via $T_{402}$, which is a linking group, and two ring $A_{402}$(s) in two or more of $L_{401}$(s) may optionally be linked to each other via $T_{403}$, which is a linking group (see e.g., Compounds PD1 to PD4 and PD7), wherein $T_{402}$ and $T_{403}$ may respectively be the same as described in connection with $T_{401}$.

In Formula 401, $L_{402}$ may be any suitable organic ligand. For example, $L_{402}$ may include a halogen group, a diketone group (for example, an acetylacetonate group), a carboxylic acid group (for example, a picolinate group), —C(═O), an isonitrile group, a —CN group, a phosphorus group (for example, a phosphine group, a phosphite group, and/or the like), or any combination thereof.

In one or more embodiments, the phosphorescent dopant may include, for example, one of Compounds PD1 to PD39, or any combination thereof:

PD1

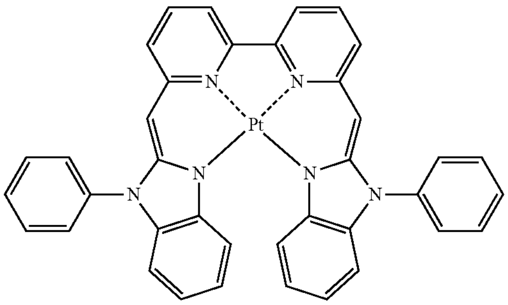

PD2

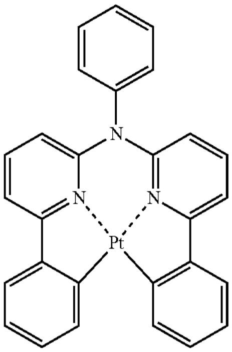

PD3

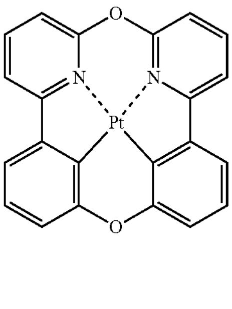

-continued

PD4

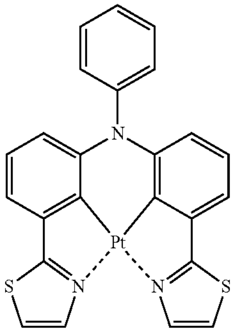

PD5

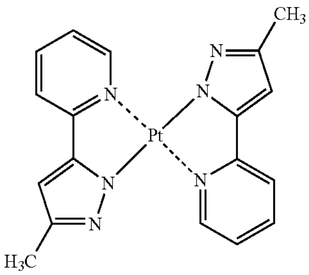

PD6

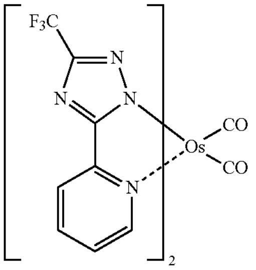

PD7

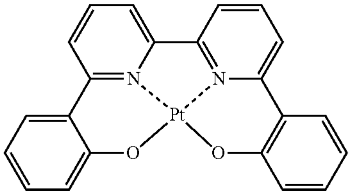

PD8

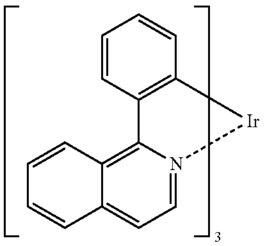

PD9

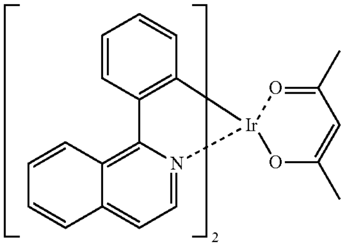

-continued
PD10
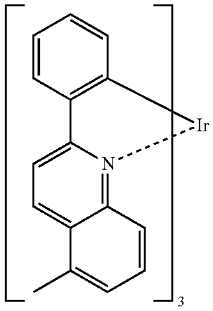
PD11
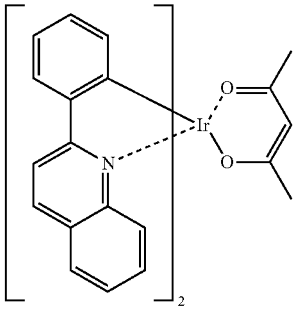
PD12
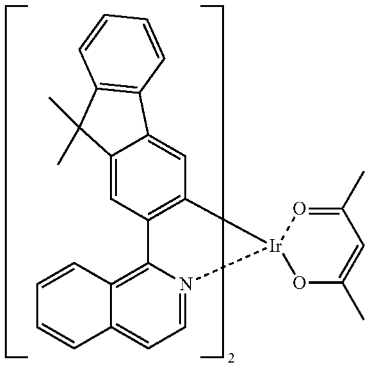
PD13
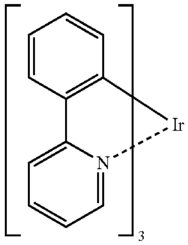
PD14
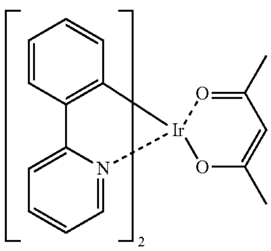
-continued
PD15
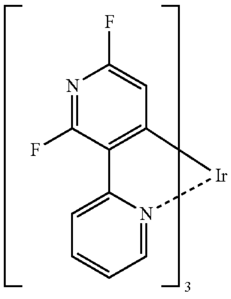
PD16
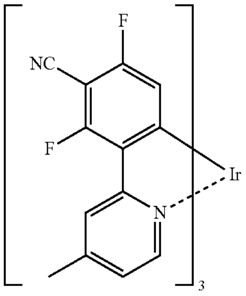
PD17
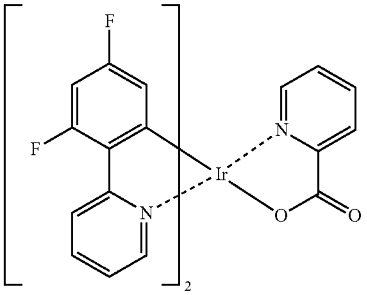
PD18
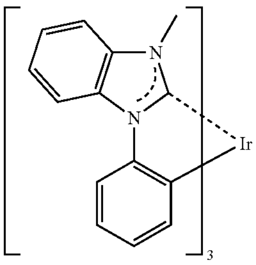
PD19
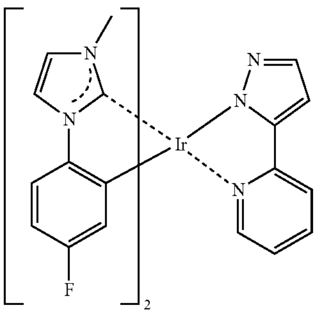

-continued
PD20
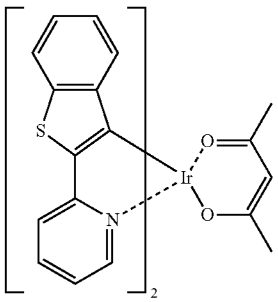
PD21
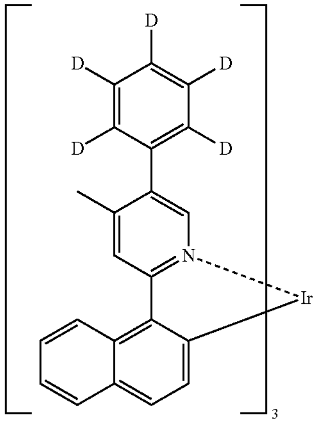
PD22
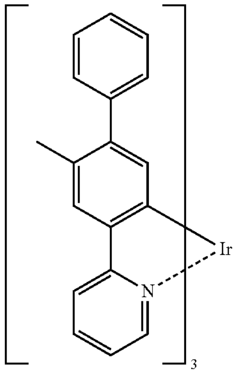
PD23
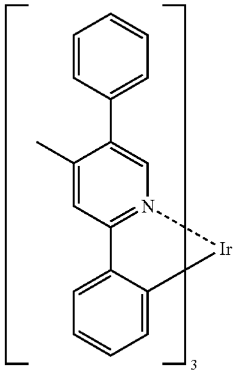
-continued
PD24
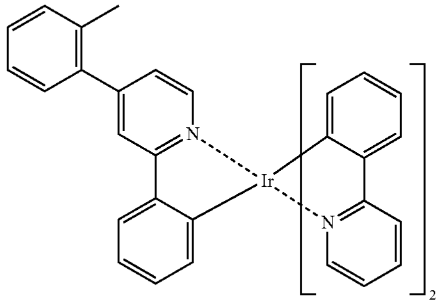
PD25
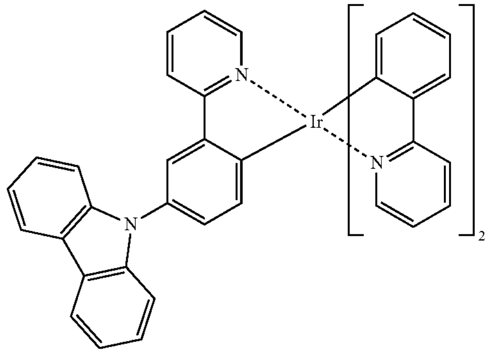
PD26
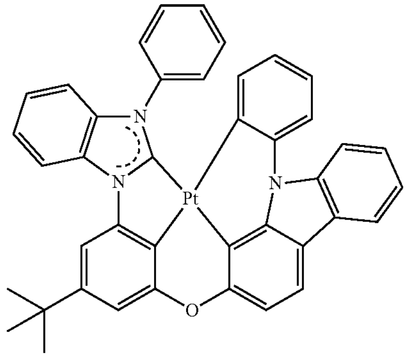
PD27
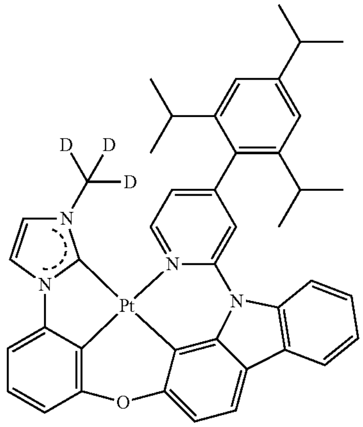

-continued
PD28
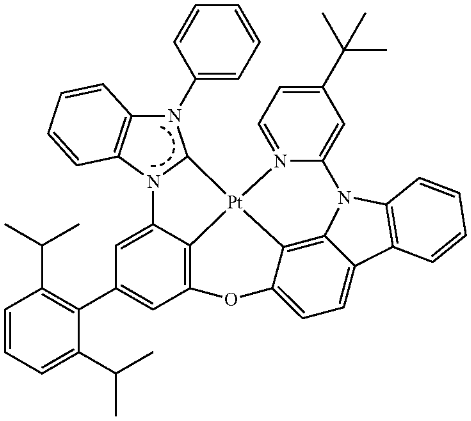
PD29
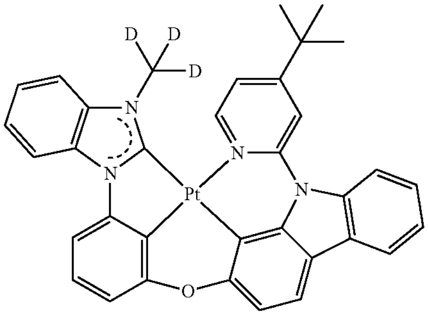
PD30
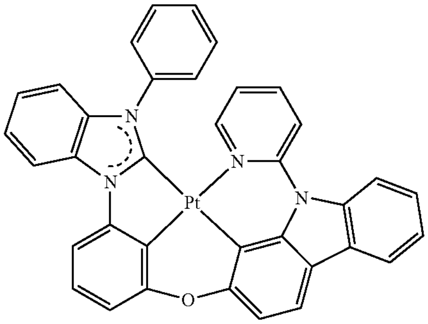
PD31
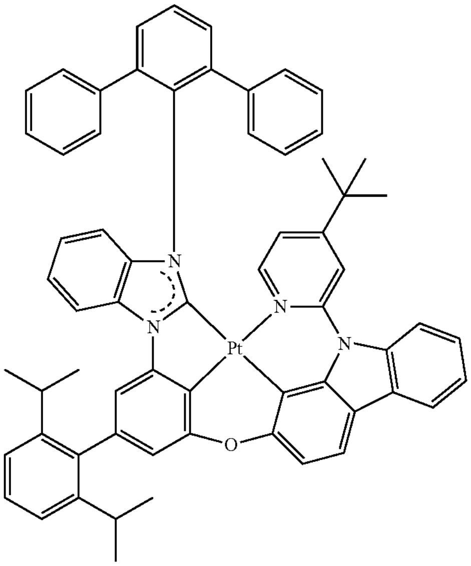
-continued
PD32
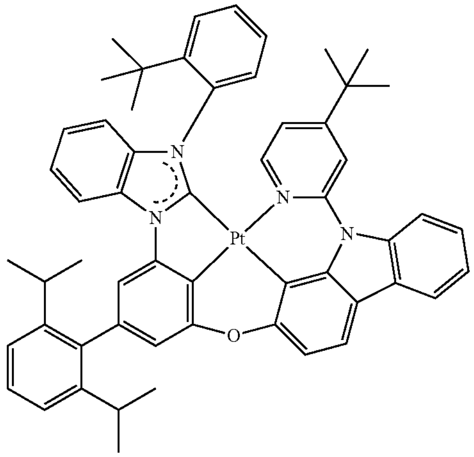
PD33
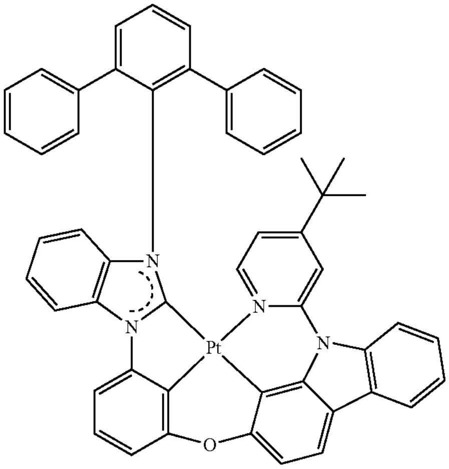
PD34
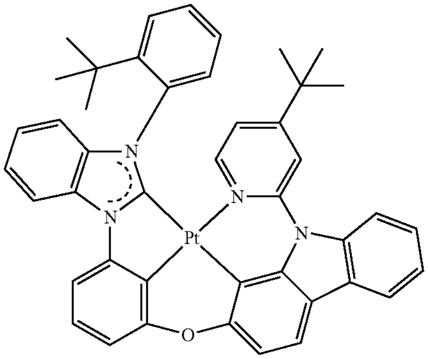

-continued

PD35

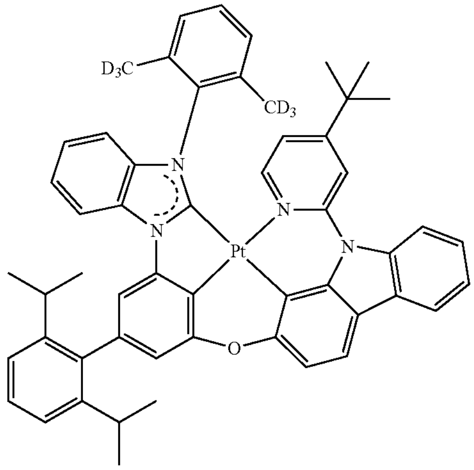

PD36

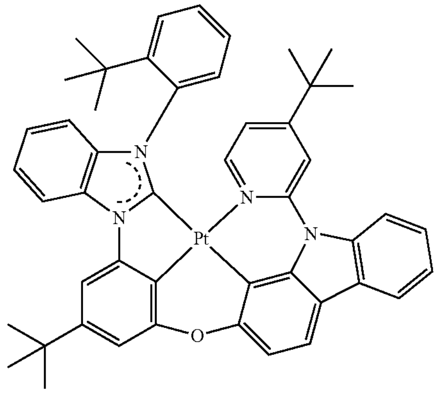

PD37

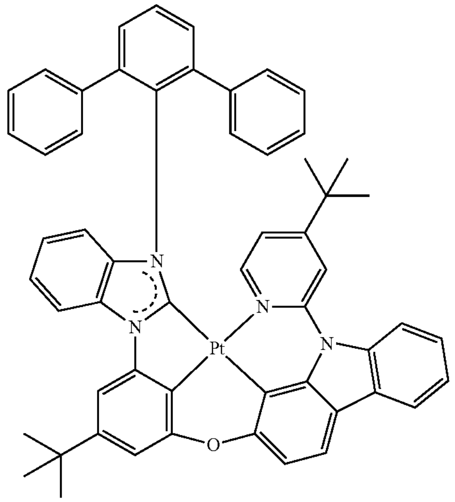

-continued

PD38

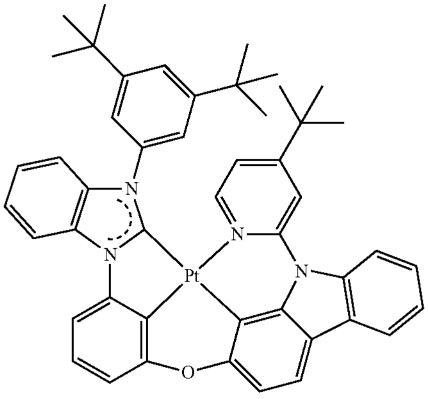

PD39

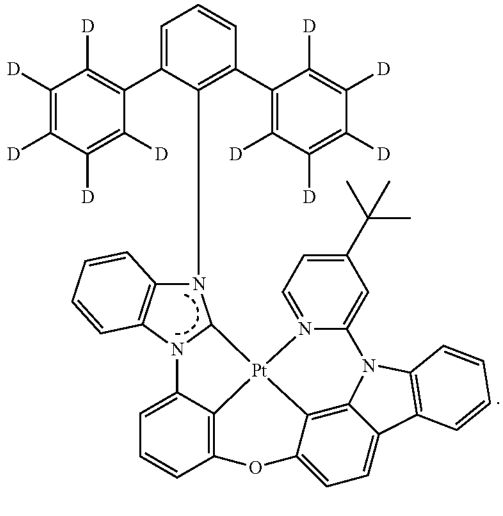

Fluorescent Dopant

In one or more embodiments, when the emission layer includes the first compound and the first compound serves as an auxiliary dopant, the emission layer may further include a fluorescent dopant.

In one or more embodiments, when the emission layer includes the first compound and the first compound serves as a phosphorescent dopant, the emission layer may further include an auxiliary dopant.

The fluorescent dopant and the auxillary dopant may each independently include an amine group-containing compound, a styryl group-containing compound, or any combination thereof.

In one or more embodiments, the fluorescent dopant and the auxiliary dopant may each independently include a compound represented by Formula 501:

Formula 501

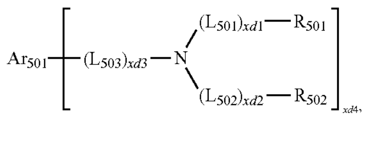

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

For example, $Ar_{501}$ in Formula 501 may be a condensed cyclic group (for example, an anthracene group, a chrysene group, and/or a pyrene group) in which three or more monocyclic groups are condensed together.

For example, xd4 in Formula 501 may be 2.

In one or more embodiments, the fluorescent dopant and the auxiliary dopant may each independently include one of the following Compounds FD1 to FD36, DPVBi, DPAVBi, or any combination thereof:

FD1

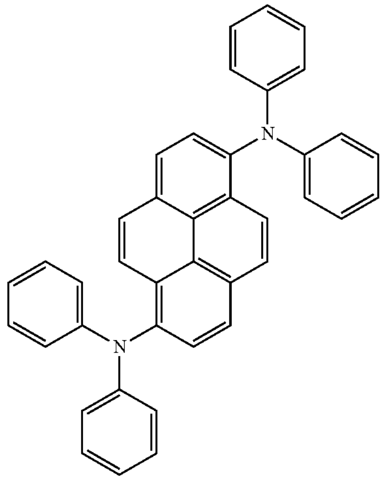

FD2

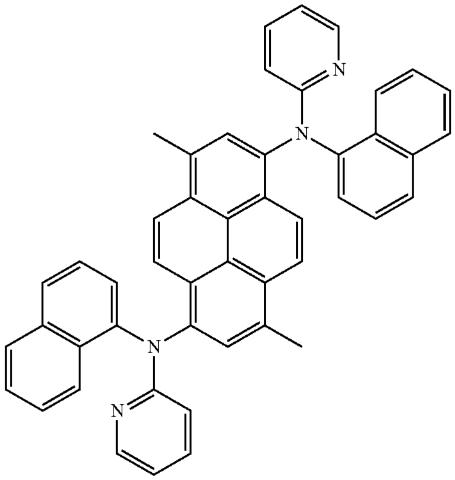

FD3

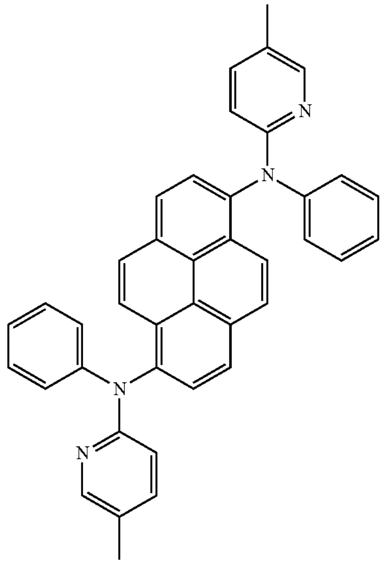

FD4

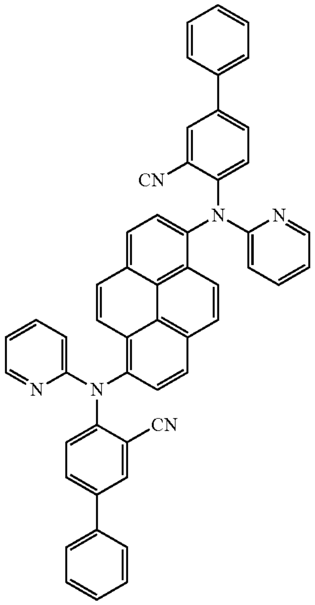

-continued
FD5
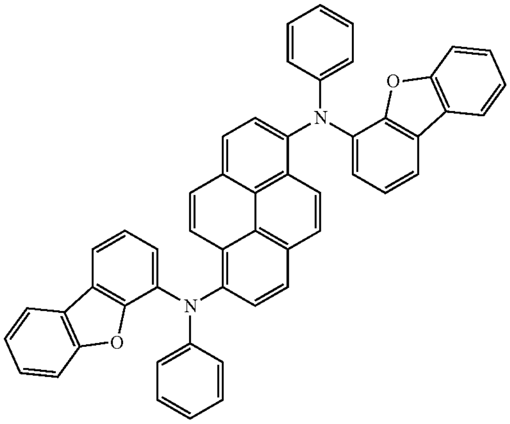
FD6
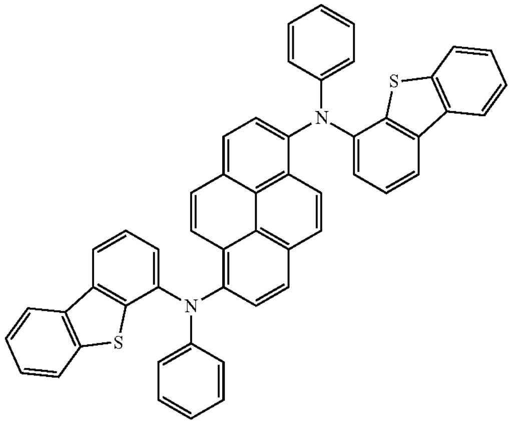
FD7
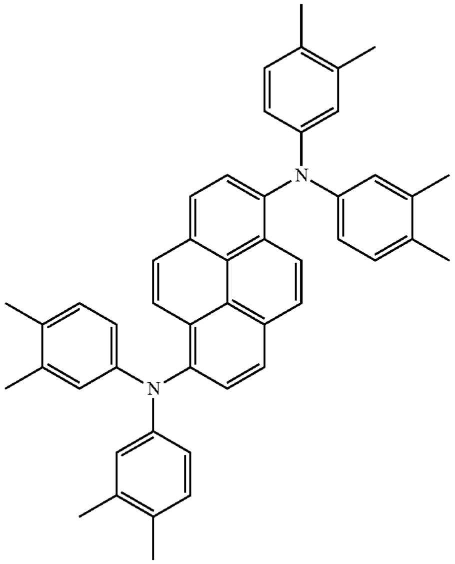
FD8
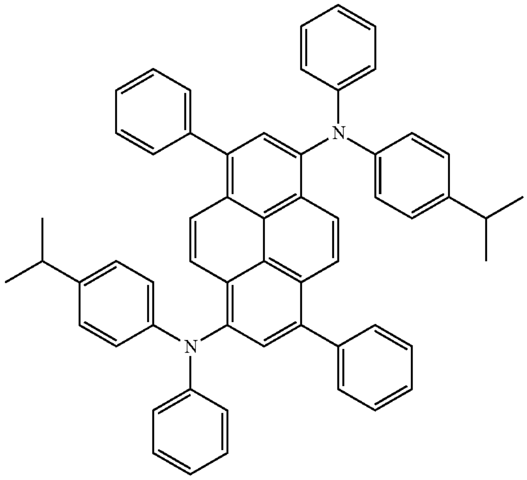
FD9
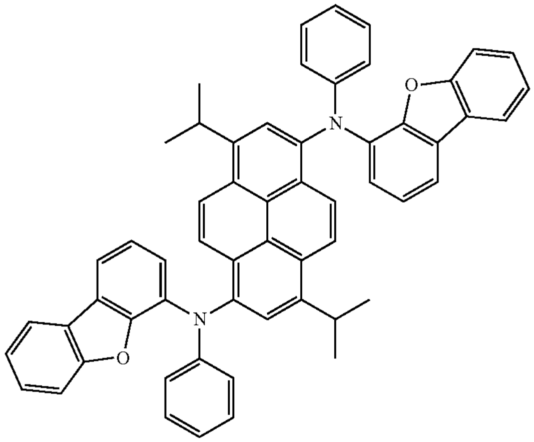
FD10
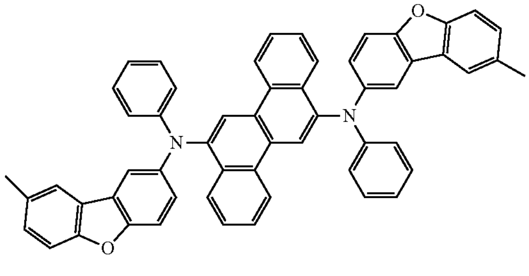

-continued
FD11
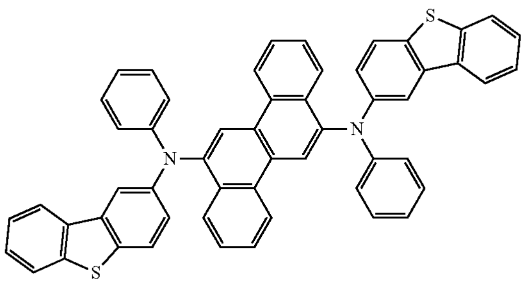
FD12
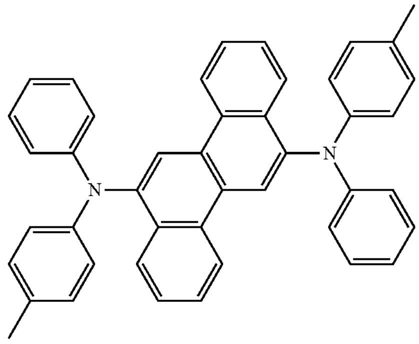
FD13
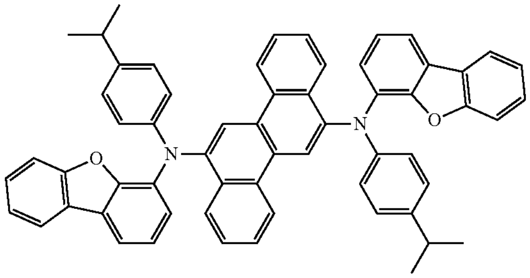
FD14
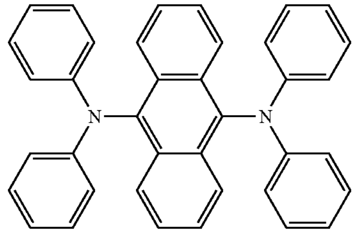
FD15
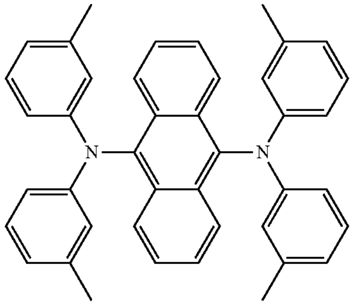
FD16
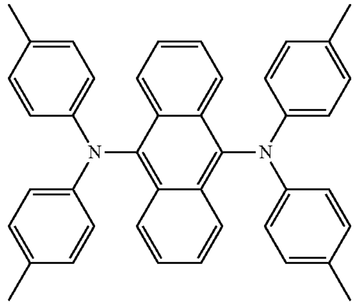
FD17
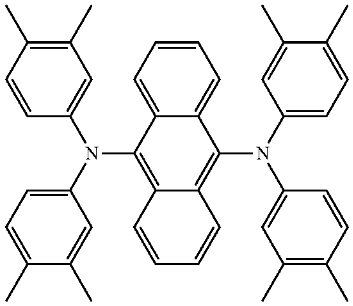
FD18
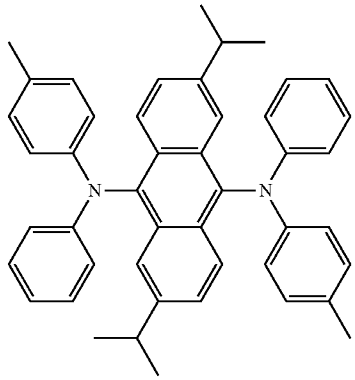

-continued
FD19
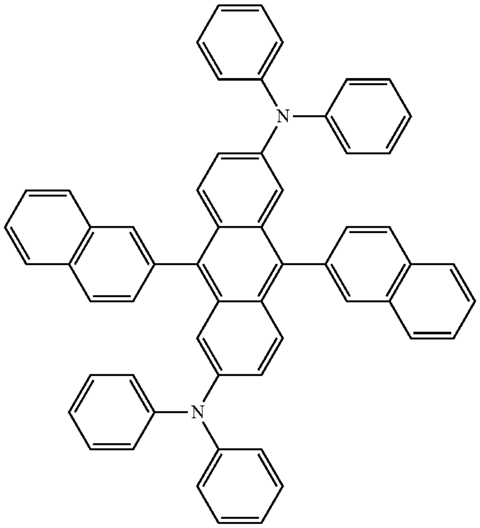
FD20
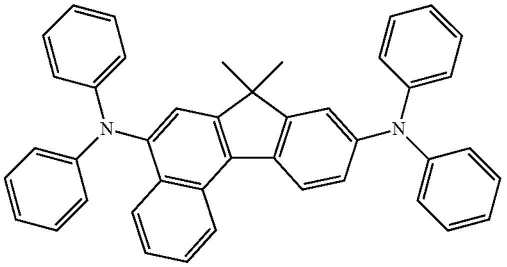
FD21
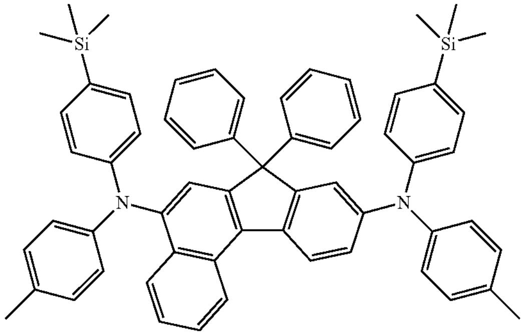
FD22
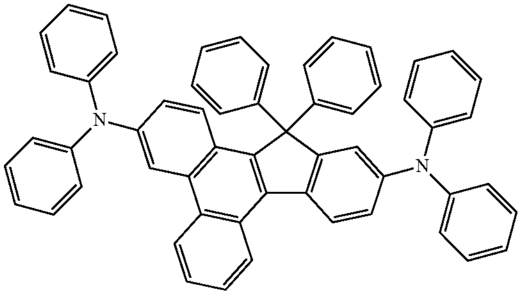
FD23
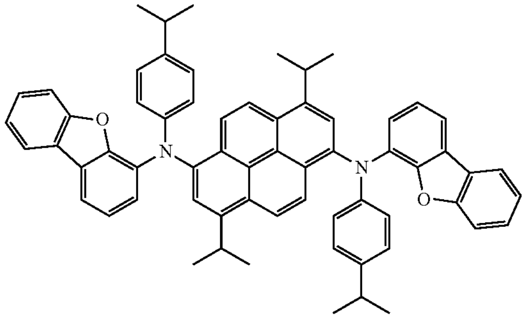
FD24
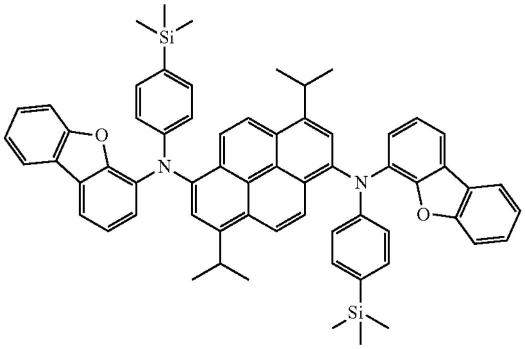
FD25
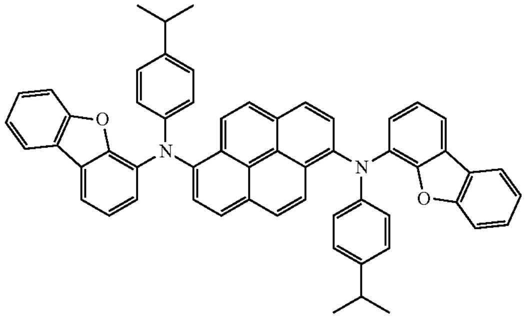
FD26
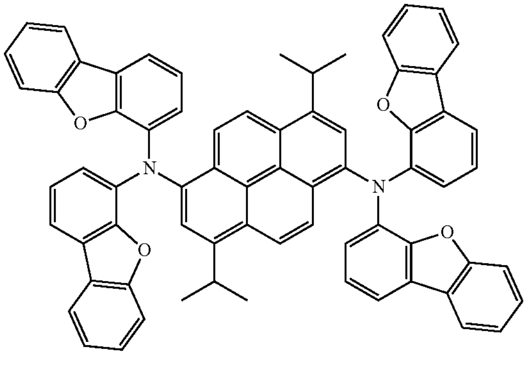

-continued
FD27
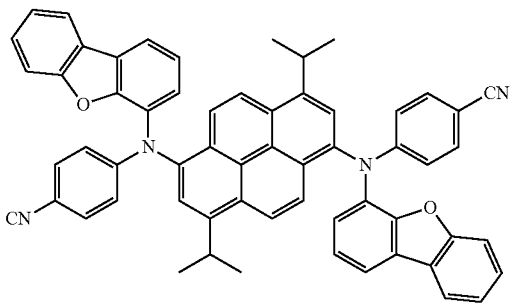
FD28
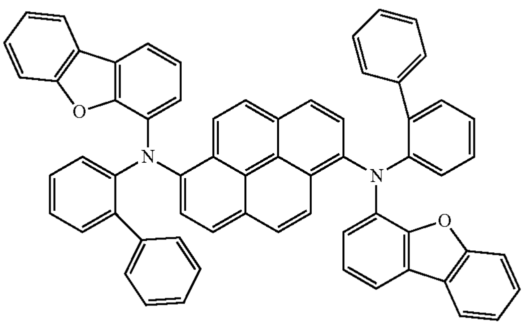
FD29
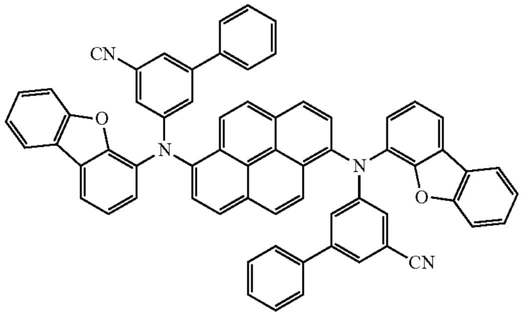
FD30
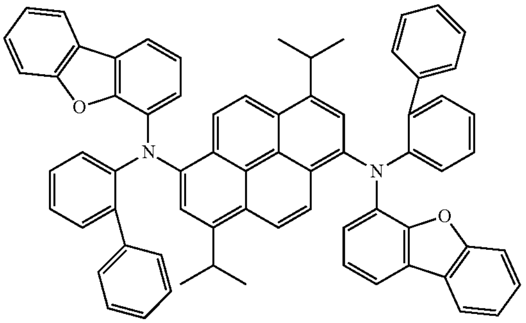
FD31
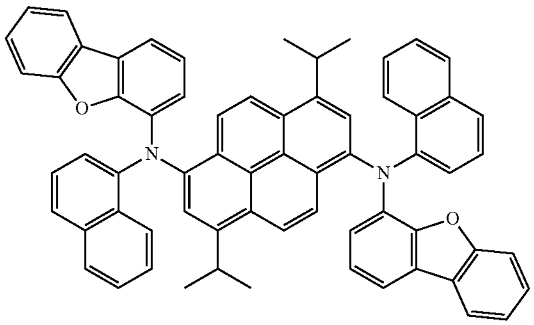
FD32
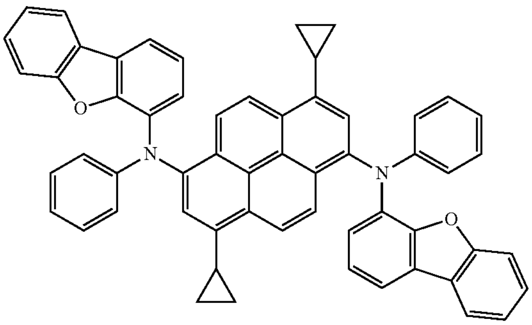
FD33
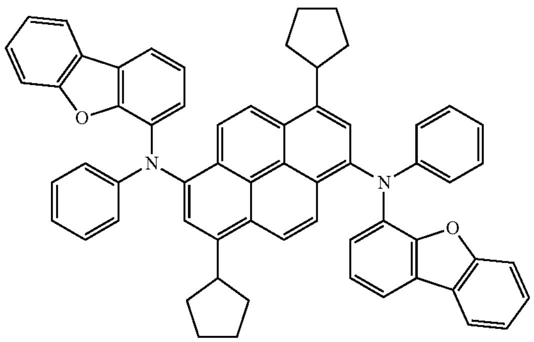
FD34
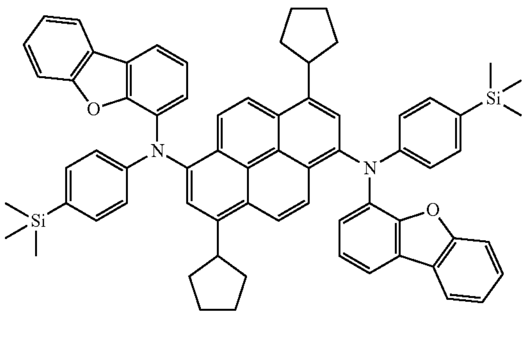

-continued

FD35

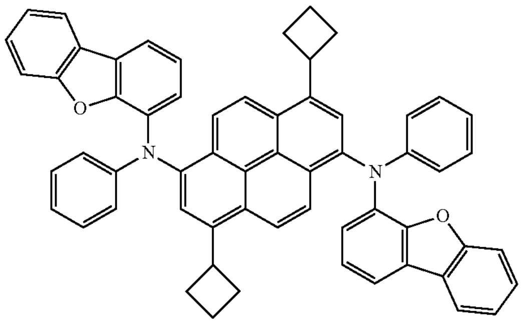

FD36

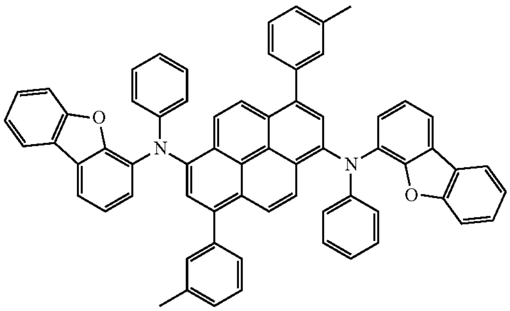

DPVBi

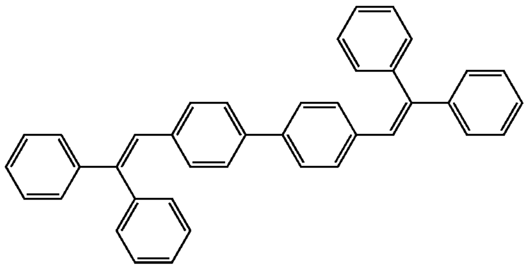

DPAVBi

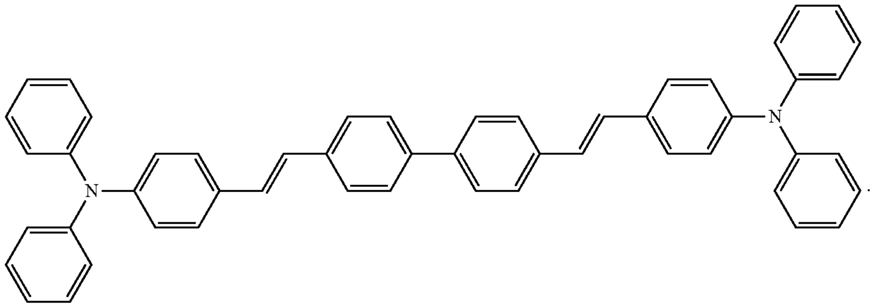

In one or more embodiments, the fluorescent dopant and the auxiliary dopant may each independently include the fourth compound represented by Formula 502 or 503.

Delayed Fluorescence Material

In one or more embodiments, the emission layer may include, as a delayed fluorescence material, the fourth compound.

In one or more embodiments, the emission layer may include the fourth compound, and may further include a delayed fluorescence material.

In the present specification, the delayed fluorescence material may be selected from compounds capable of emitting delayed fluorescent light based on a delayed fluorescence emission mechanism.

The delayed fluorescence material included in the emission layer may act as a host or a dopant depending on the type (or kind) of other materials included in the emission layer.

In one or more embodiments, a difference between a triplet energy level (eV) and a singlet energy level (eV) of the delayed fluorescence material may be about 0 eV or more and about 0.5 eV or less. When the difference between the triplet energy level (eV) and the singlet energy level (eV) of the delayed fluorescence material is within these ranges, up-conversion from the triplet state to the singlet state of the delayed fluorescence material may effectively (or suitably) occur, thereby improving luminescence efficiency of the light-emitting device 10.

In one or more embodiments, the delayed fluorescence material may include: i) a material including at least one electron donor (for example, a π electron-rich $C_3$-$C_{60}$ cyclic group and/or the like, such as a carbazole group) and at least one electron acceptor (for example, a sulfoxide group, a cyano group, a π electron-deficient nitrogen-containing $C_1$-$C_{60}$ cyclic group, and/or the like), ii) a material including a $C_8$-$C_{60}$ polycyclic group including at least two cyclic groups condensed to each other while sharing boron (B), and/or the like.

In one or more embodiments, the delayed fluorescence material may include at least one of Compounds DF1 to DF9:

DF1
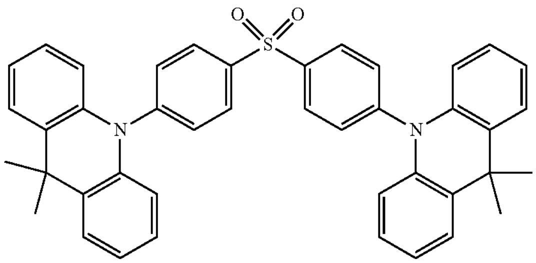
(DMAC-DPS)
DF2
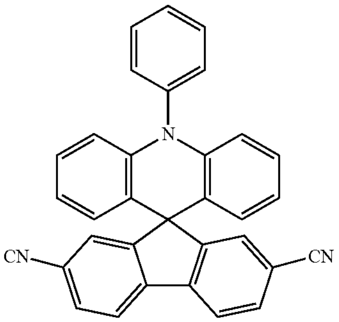
(ACRFLCN)
DF3
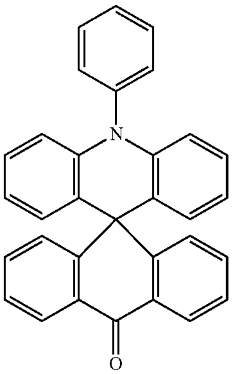
(ACRSA)
-continued
DF4
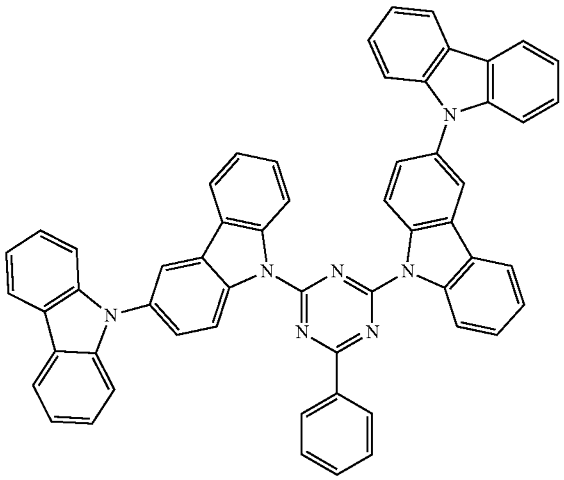
(CC2TA)
DF5
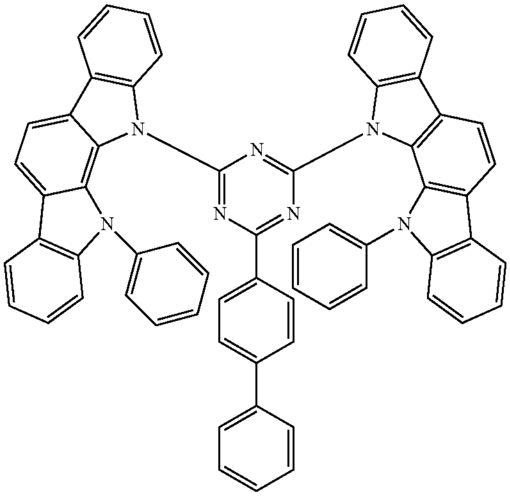
(PIC-TRZ)
DF6
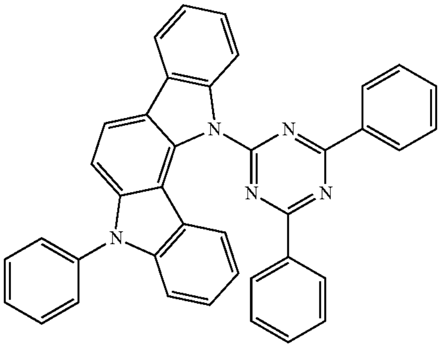
(PIC-TRZ2)

-continued

DF7

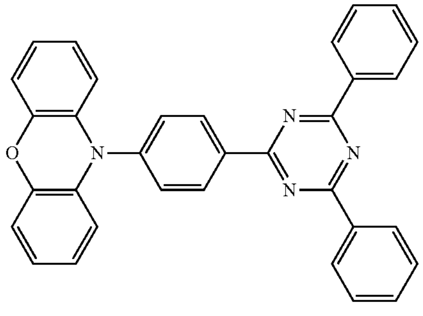

(PXZ-TRZ)

DF8

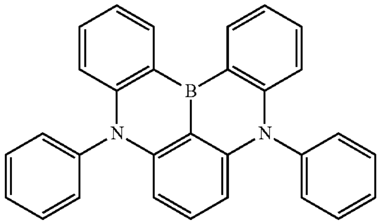

(DABNA-1)

DF9

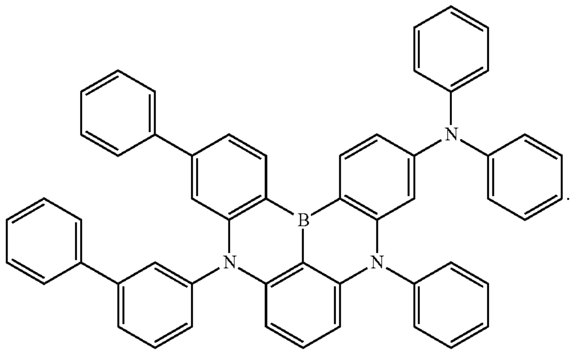

(DABNA-2)

Quantum Dot

The emission layer may include quantum dots.

The term "quantum dot" as used herein refers to a crystal of a semiconductor compound, and may include any suitable material capable of emitting light of various emission wavelengths according to the size of the crystal.

A diameter of the quantum dot may be, for example, in a range of about 1 nm to about 10 nm.

The quantum dots may be synthesized by a wet chemical process, a metal organic chemical vapor deposition process, a molecular beam epitaxy process, or any suitable process similar thereto.

The wet chemical process is a method including mixing a precursor material with an organic solvent and then growing a quantum dot particle crystal. When the crystal grows, the organic solvent naturally acts as a dispersant coordinated on the surface of the quantum dot crystal and controls the growth of the crystal so that the growth of quantum dot particles can be controlled through a process which costs lower, and is easier than vapor deposition methods, such as metal organic chemical vapor deposition (MOCVD) or molecular beam epitaxy (MBE).

The quantum dot may include: a Group II-VI semiconductor compound; a Group III-V semiconductor compound;

a Group III-VI semiconductor compound; a Group I-III-VI semiconductor compound; a Group IV-VI semiconductor compound; a Group IV element; a Group IV compound; or any combination thereof.

Examples of the Group II-VI semiconductor compound may include (e.g., may be): a binary compound, such as CdSe, CdTe, ZnS, ZnSe, ZnTe, ZnO, HgS, HgSe, HgTe, MgSe, MgS, and/or the like; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and/or the like; a quaternary compound, such as CdZnSeS, CdZnSeTe, CdZnSTe, CdHgSeS, CdHgSeTe, CdHgSTe, HgZnSeS, HgZnSeTe, HgZnSTe, and/or the like; or any combination thereof.

Examples of the Group III-V semiconductor compound may include (e.g., may be): a binary compound, such as GaN, GaP, GaAs, GaSb, AlN, AlP, AlAs, AlSb, InN, InP, InAs, InSb, and/or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or the like; or any combination thereof. The Group III-V semiconductor compound may further include a Group II element. Examples of the Group III-V semiconductor compound further including the Group II element may include (e.g., may be) InZnP, InGaZnP, InAlZnP, and the like.

Examples of the Group III-VI semiconductor compound may include (e.g., may be): a binary compound, such as GaS, GaSe, $Ga_2Se_3$, GaTe, InS, InSe, $In_2S_3$, $In_2Se_3$, InTe, and/or the like; a ternary compound, such as $inGaS_3$, $InGaSe_3$, and/or the like; or any combination thereof.

Examples of the Group I-III-VI semiconductor compound may include (e.g., may be): a ternary compound, such as AgInS, $AgInS_2$, CuInS, $CuInS_2$, $CuGaO_2$, $AgGaO_2$, $AgAlO_2$, and/or the like; or any combination thereof.

Examples of the Group IV-VI semiconductor compound may include (e.g., may be): a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; a quaternary compound, such as SnPbSSe, SnPbSeTe, SnPbSTe, and/or the like; or any combination thereof.

The Group IV element and/or the Group IV compound may include: a single element compound, such as Si, Ge, and/or the like; a binary compound, such as SiC, SiGe, and/or the like; or any combination thereof.

Each element included in a multi-element compound, such as the binary compound, the ternary compound, and/or the quaternary compound, may exist in a particle thereof at a uniform concentration or non-uniform concentration.

The quantum dot may have a single structure or a dual core-shell structure. In the case of the quantum dot having a single structure, a concentration of each element included in the corresponding quantum dot may be uniform. For example, a material included in the core and a material included in the shell may be different from each other.

The shell of the quantum dot may act as a protective layer that prevents or reduces chemical degeneration of the core to maintain semiconductor characteristics, and/or as a charging layer that imparts electrophoretic characteristics to the quantum dot. The shell may be a single layer or a multi-layer. The interface between the core and the shell may have a concentration gradient in which the concentration of an element existing in the shell decreases toward the center of the core.

Examples of the shell of the quantum dot may include (e.g., may be)oxide of metal, metalloid, or non-metal, a semiconductor compound, or any combination thereof. Examples of the oxide of metal, metalloid, or non-metal may include (e.g., may be): a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and/or the like; a ternary compound, such as $MgAl_2O_4$, $CoFe_2O_4$, $NiFe_2O_4$, $CoMn_2O_4$, and/or the like; or any combination thereof. Examples of the semiconductor compound may include (e.g., may be): as described herein, a Group II-VI semiconductor compound; a Group III-V semiconductor compound; a Group III-VI semiconductor compound; a Group I-III-VI semiconductor compound; a Group IV-VI semiconductor compound; or any combination thereof. Examples of the semiconductor compound may include (e.g., may be) CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dots may be equal to or less than about 45 nm, for example, equal to or less than about 40 nm, and for example, equal to or less than about 30 nm, and within any of these ranges, color purity and/or color reproducibility may be improved. In addition, because the light emitted through the quantum dots is emitted in all directions, the wide viewing angle may be improved.

In one or more embodiments, the quantum dot may be spherical, pyramidal, multi-arm, and/or cubic nanoparticle(s), nanotube(s), nanowire(s), nanofiber(s), and/or nanoplate particle(s).

Because the energy band gap may be adjusted by controlling the size of the quantum dots, light having various wavelength bands may be obtained from the emission layer including the quantum dots. Accordingly, by using the quantum dots of different sizes, a light-emitting device that emits light of various wavelengths may be implemented. In one or more embodiments, the size of the quantum dots may be selected to emit red light, green light, and/or blue light. In addition, the size of the quantum dots may be selected to emit white light by combination of light of various colors.

Electron Transport Region in Interlayer 130

The electron transport region may have i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein layers of each structure are sequentially stacked from the emission layer.

In one or more embodiments, the electron transport region (for example, the buffer layer, the hole blocking layer, the electron control layer, and/or the electron transport layer in the electron transport region) may include a metal-free compound including at least one $\pi$ electron-deficient nitrogen-containing $C_1$-$C_{60}$ cyclic group.

In one or more embodiments, the electron transport region may include a compound represented by Formula 601:

$$[Ar_{601}]_{xe11}\text{-}[(L_{601})_{xe1}\text{-}R_{601}]_{xe21}, \qquad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may respectively be the same as described in connection with $Q_1$, xe21 may be 1, 2, 3, 4, or 5, and at least one selected from $Ar_{601}$, $L_{601}$, and $R_{601}$ may each independently be a $\pi$ electron-deficient nitrogen-containing $C_1$-$C_{60}$ cyclic group unsubstituted or substituted with at least one $R_{10a}$.

In one or more embodiments, when xe11 in Formula 601 is 2 or more, two or more of $Ar_{601}$(s) may be linked to each other via a single bond.

In one or more embodiments, $Ar_{601}$ in Formula 601 may be a substituted or unsubstituted anthracene group.

In one or more embodiments, the electron transport region may include a compound represented by Formula 601-1:

Formula 601-1

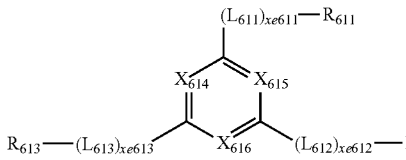

wherein, in Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may respectively be the same as described in connection with $L_{601}$, xe611 to xe613 may respectively be the same as described in connection with xe1, $R_{611}$ to $R_{613}$ may respectively be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

In one or more embodiments, the electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

-continued
ET1
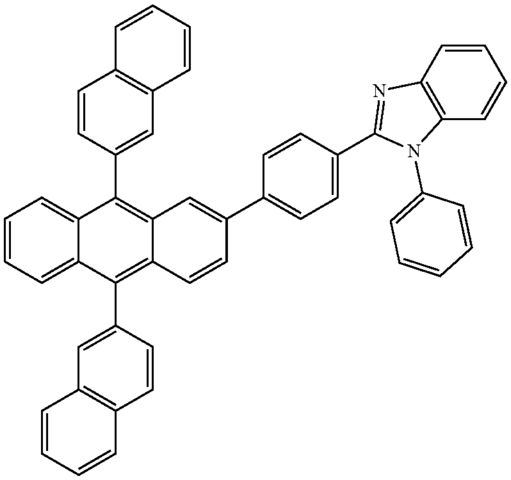
ET2
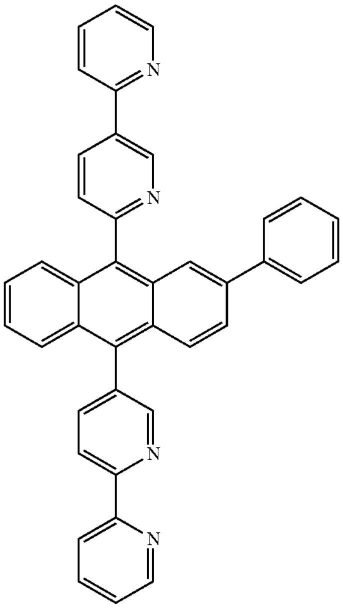
ET3
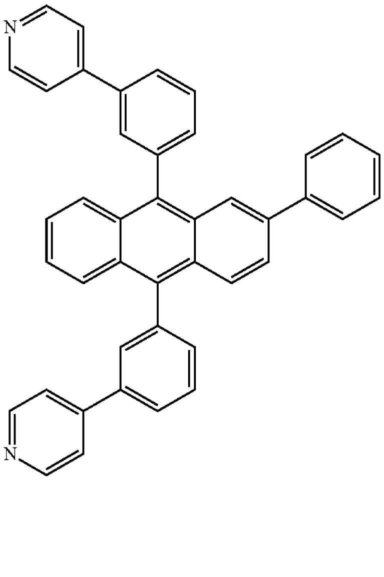
ET4
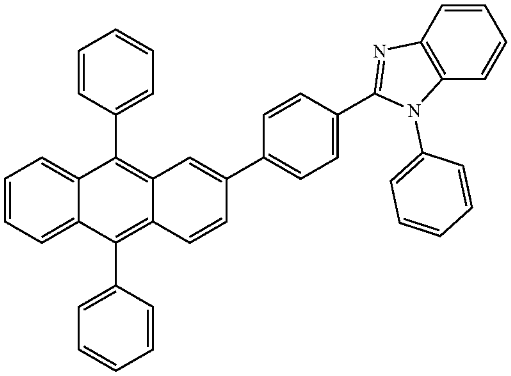
ET5
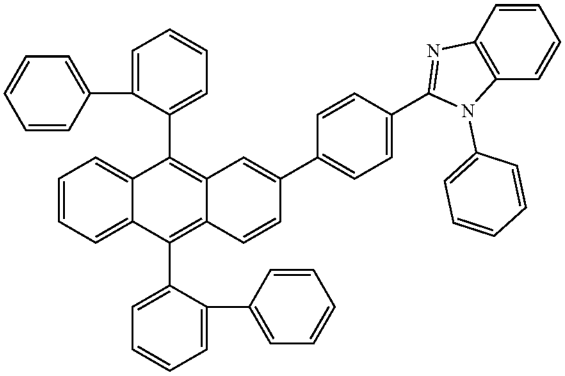
ET6
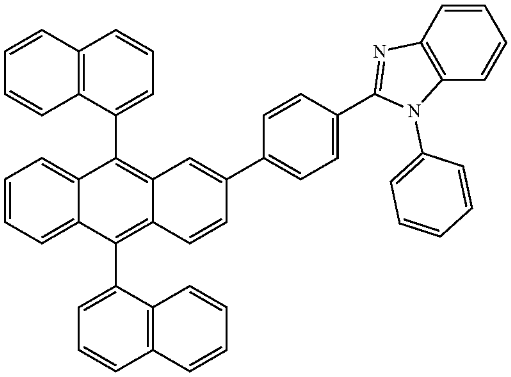

-continued
ET7
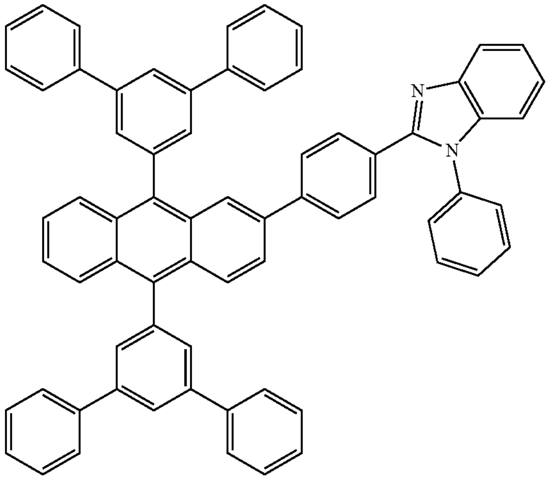
ET8
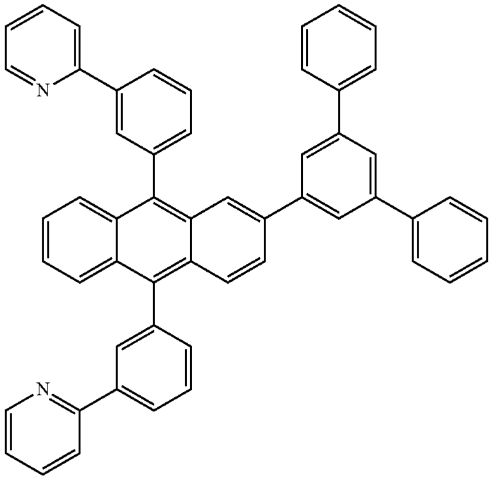
ET9
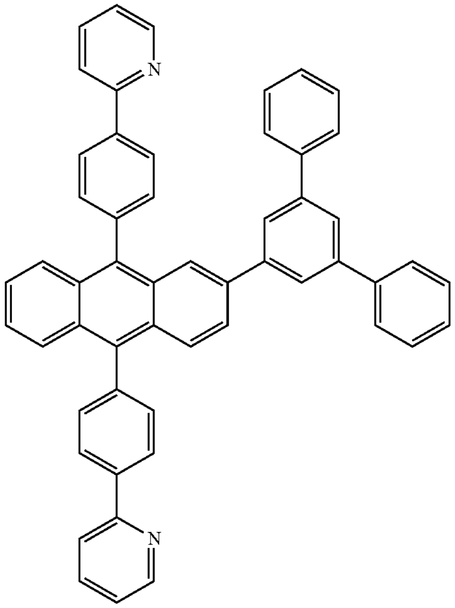
-continued
ET10
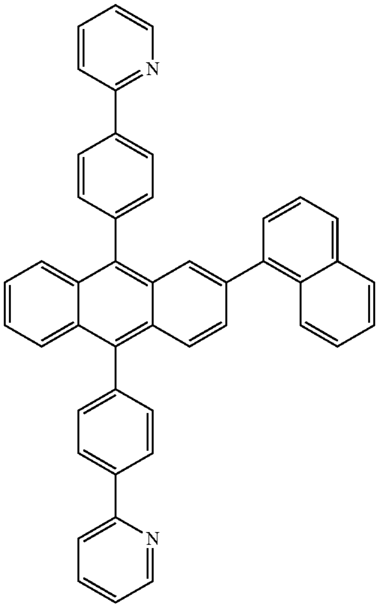
ET11
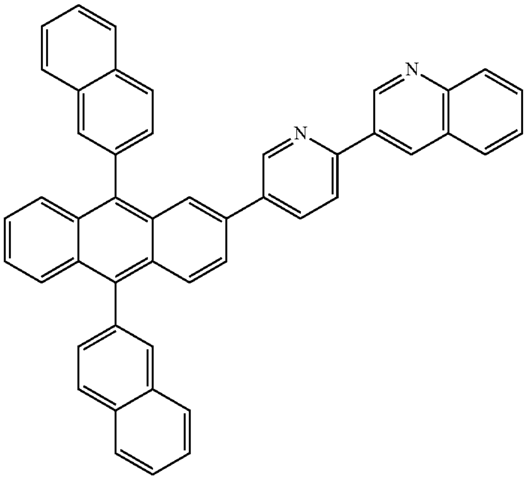
ET12
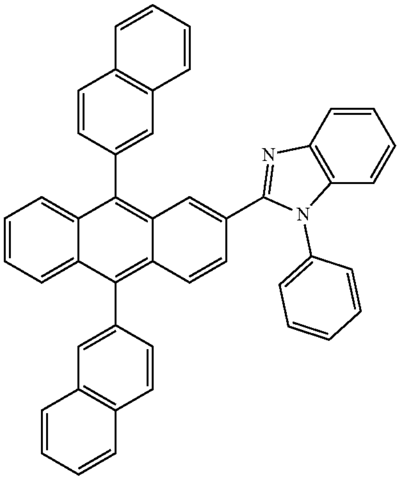

-continued
ET13
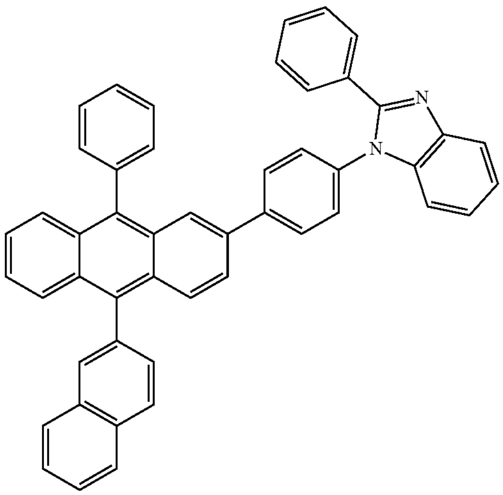
ET14
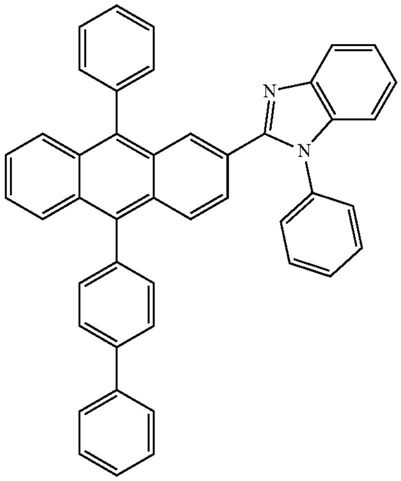
ET15
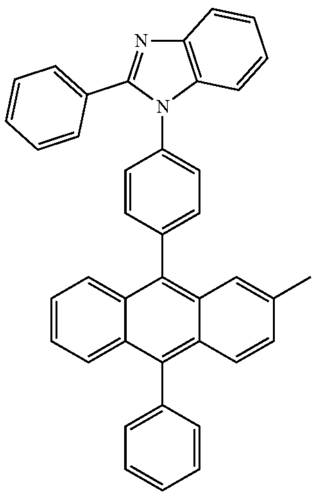
-continued
ET16
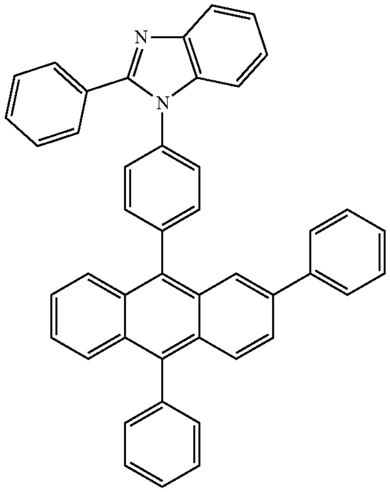
ET17
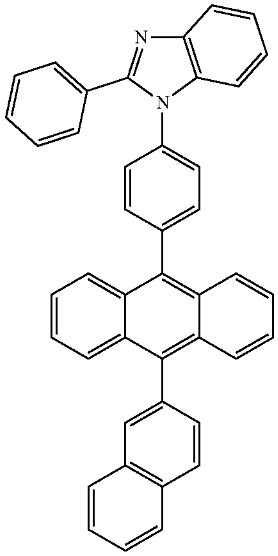
ET18
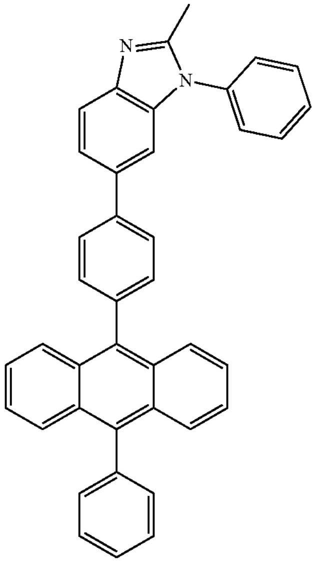

-continued
ET19
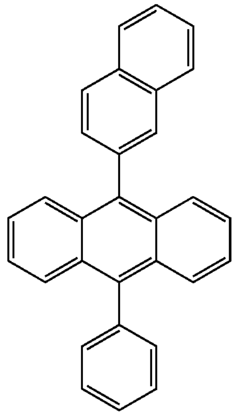
ET20
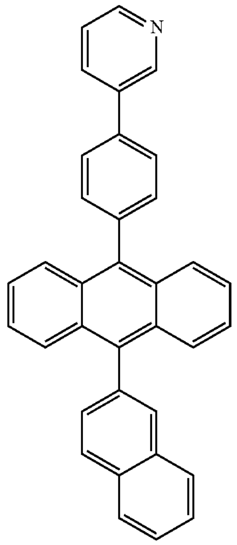
ET21
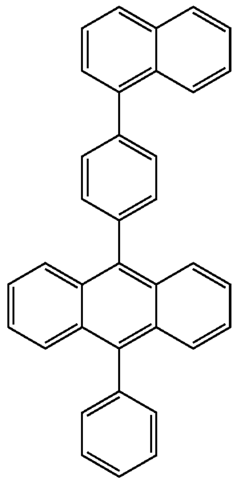
-continued
ET22
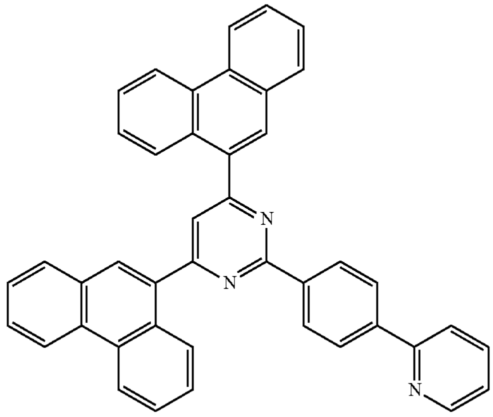
ET23
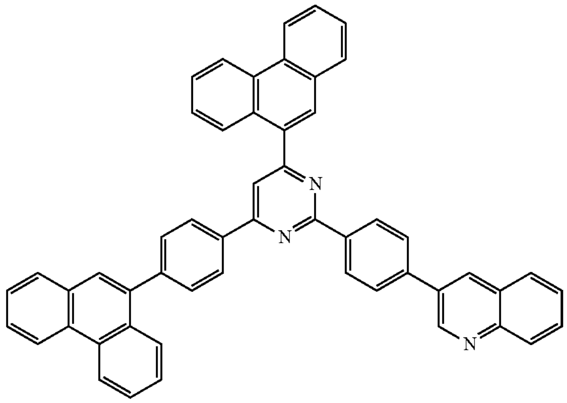
ET24
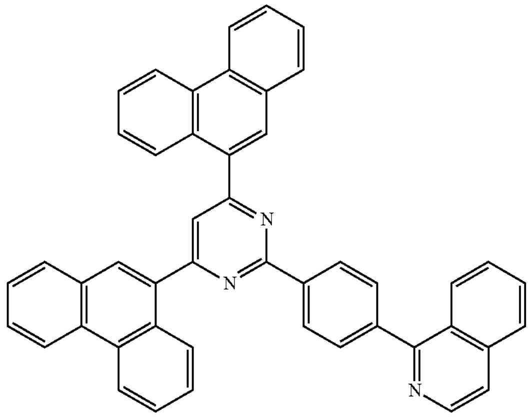

-continued
ET25
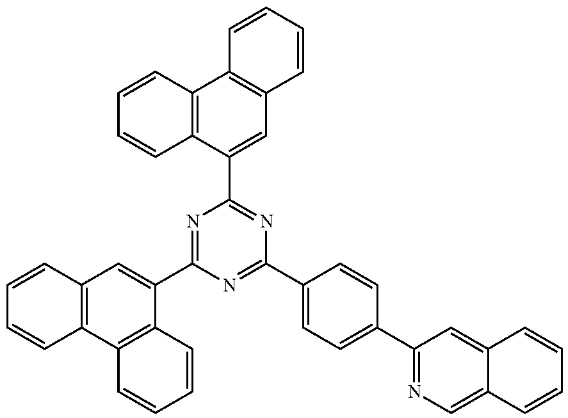
ET26
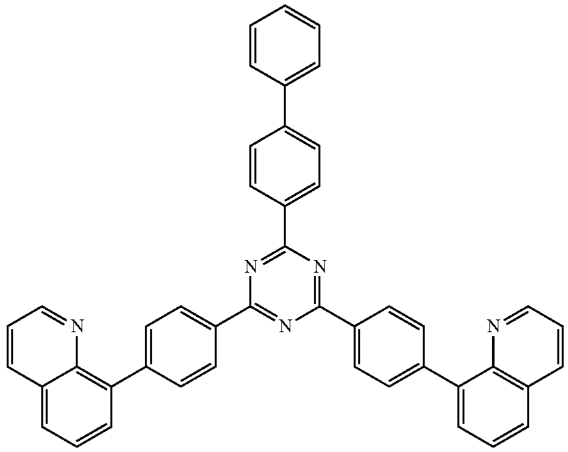
ET27
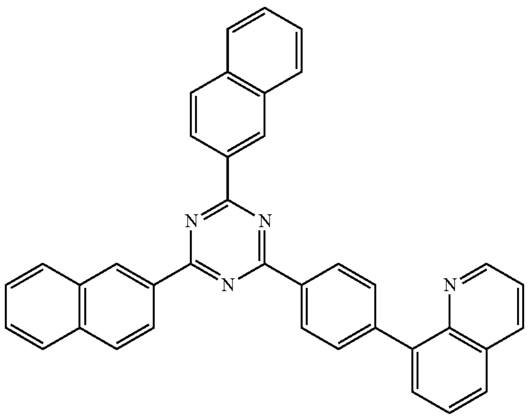
-continued
ET28
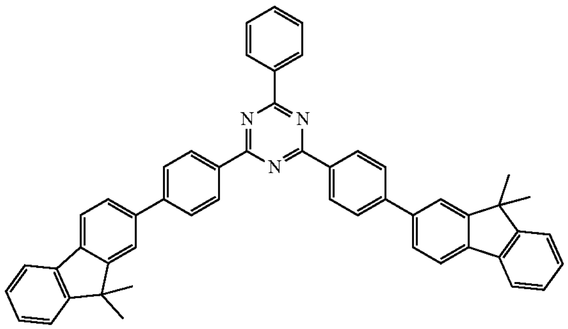
ET29
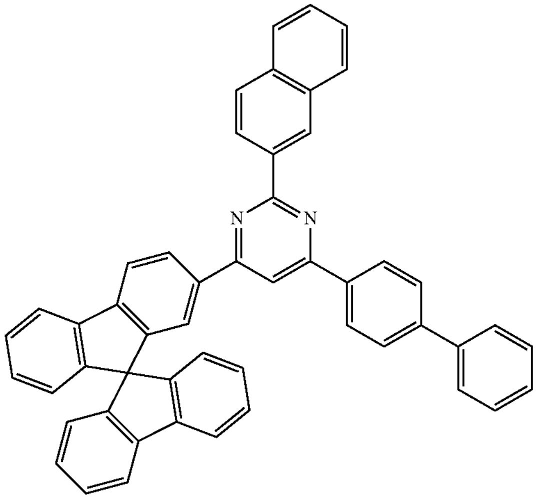
ET30
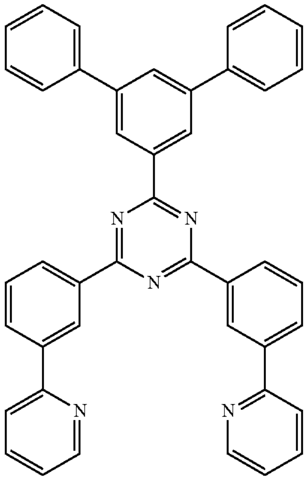

-continued
ET31
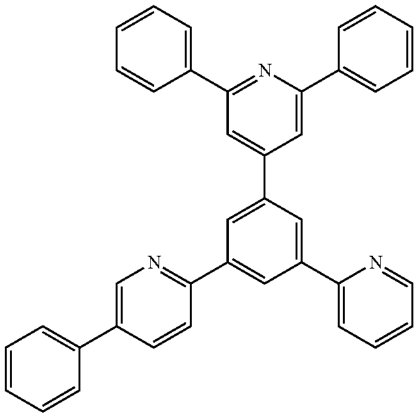
ET32
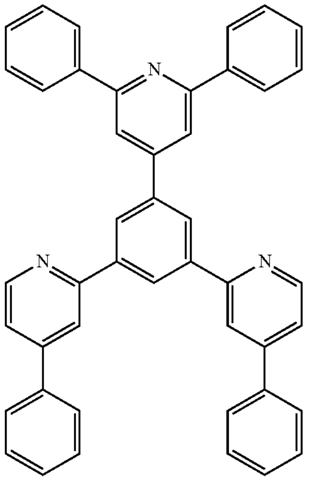
ET33
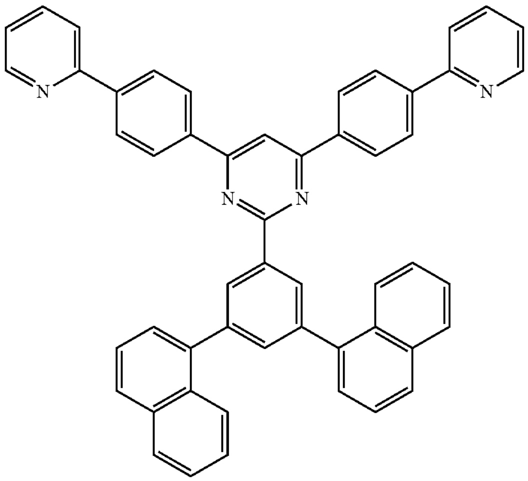
-continued
ET34
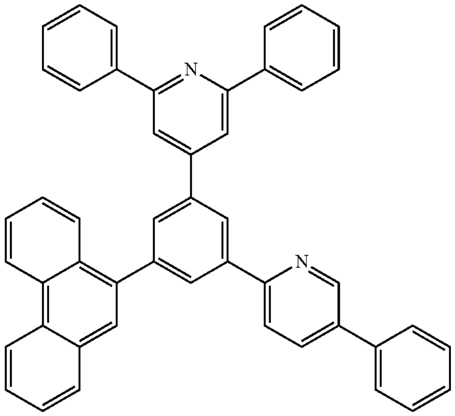
ET35
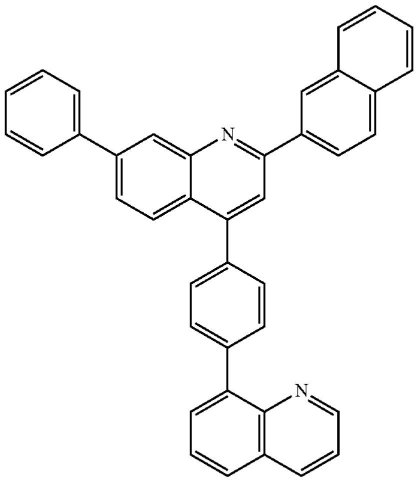
ET36
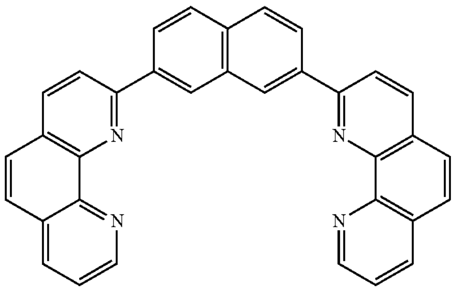
ET37
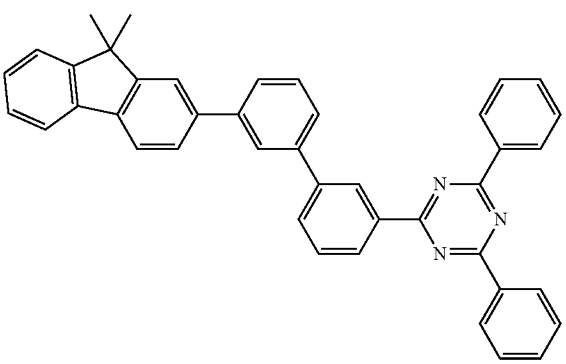

ET38
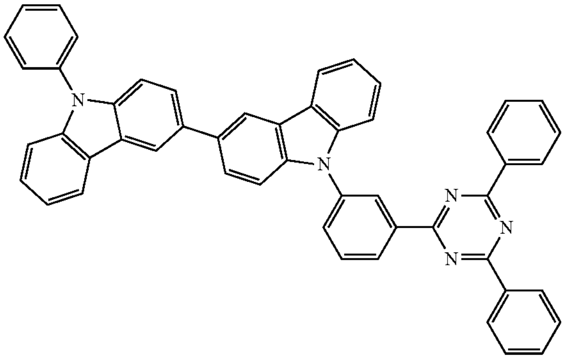
ET39
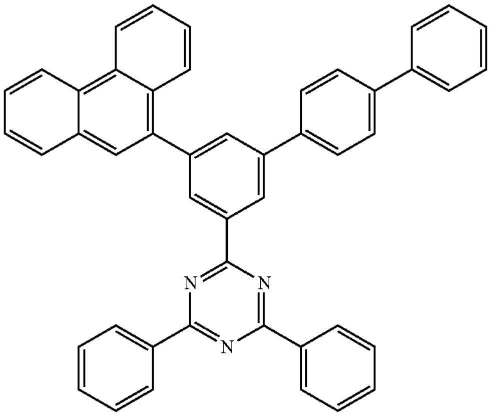
ET40
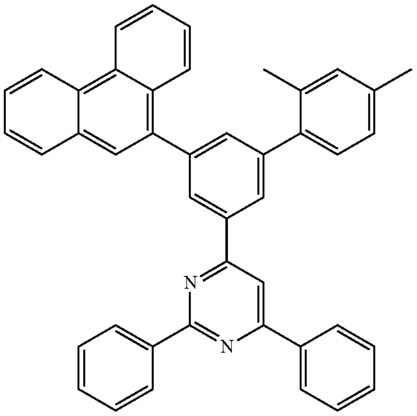
ET41
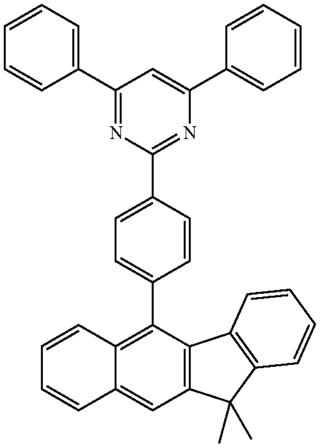
ET42
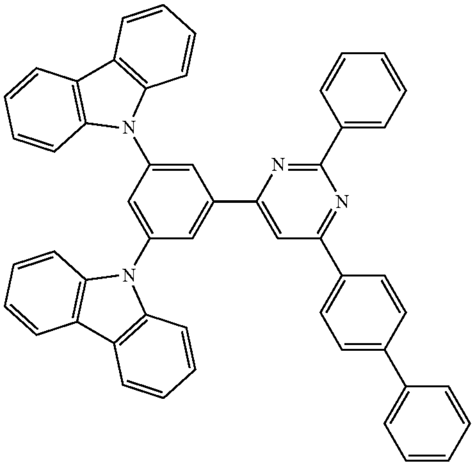
ET43
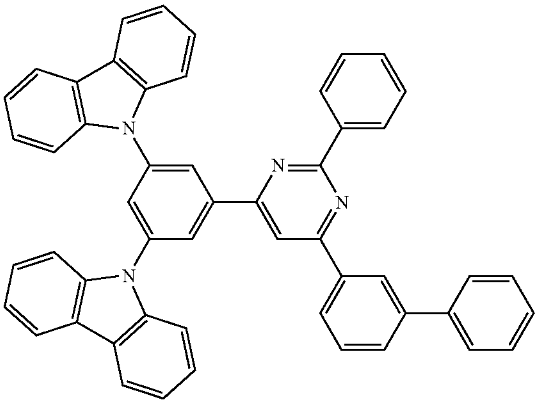

-continued

ET44

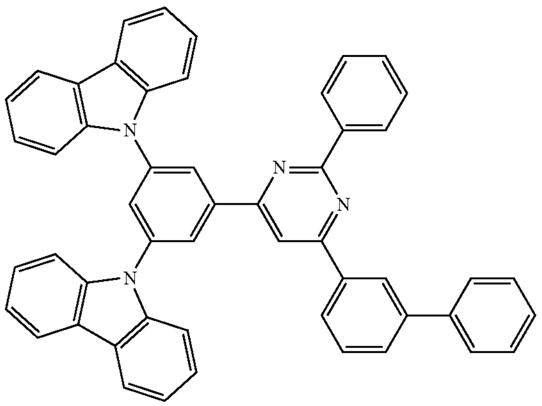

ET45

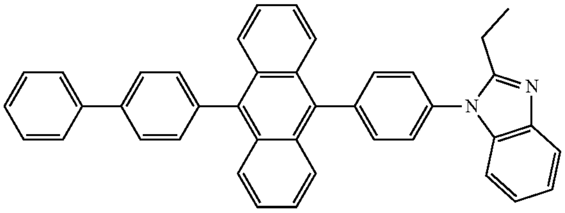

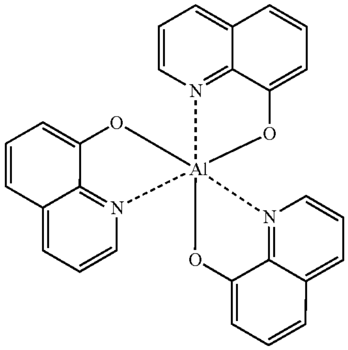

Alq3

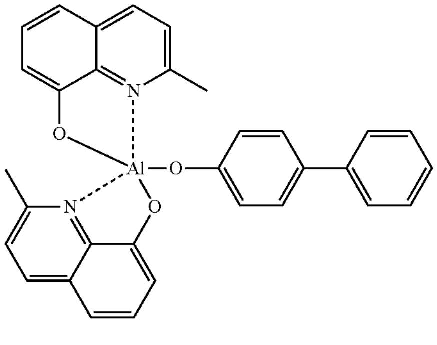

BAlq

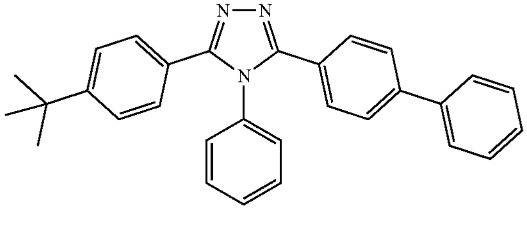

TAZ

-continued

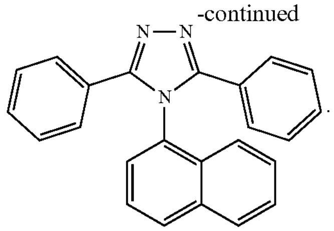

NTAZ

A thickness of the electron transport region may be from about 60 Å to about 5,000 Å, for example, from about 100 Å to about 4,000 Å. When the electron transport region includes a buffer layer, a hole blocking layer, an electron control layer, an electron transport layer, or any combination thereof, a thickness of the buffer layer, the hole blocking layer, and/or the electron control layer may each independently be in a range of about 20 Å to about 1,000 Å, for example, about 30 Å to about 300 Å, and a thickness of the electron transport layer may be in a range of about 100 Å to about 1,000 Å, for example, about 150 Å to about 500 Å. When the thicknesses of the buffer layer, the hole blocking layer, the electron control layer, the electron transport layer, and/or the electron transport layer are within their respective ranges, satisfactory (or suitable) electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. The metal ion of an alkali metal complex may be a Li ion, a Na ion, a K ion, a Rb ion, or a Cs ion, and the metal ion of an alkaline earth metal complex may be a Be ion, a Mg ion, a Ca ion, a Sr ion, or a Ba ion. A ligand coordinated with the metal ion of the alkali metal complex, the alkaline earth-metal complex, or any combination thereof may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) and/or Compound ET-D2:

ET-D1

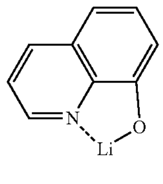

-continued

ET-D2

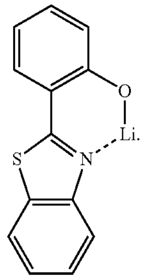

The electron transport region may include an electron injection layer that facilitates the injection of electrons from the second electrode 150. The electron injection layer may directly contact the second electrode 150.

The electron injection layer may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron injection layer may include alkali metal, alkaline earth metal, rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be selected from oxides, halides (for example, fluorides, chlorides, bromides, iodides, and the like), and tellurides of the alkali metal, the alkaline earth metal, and the rare earth metal, respectively, or any combination thereof.

The alkali metal-containing compound may include alkali metal oxides, such as $Li_2O$, $Cs_2O$, $K_2O$, and/or the like; alkali metal halides, such as LiF, NaF, CsF, KF, LiI, NaI, CsI, KI, and/or the like; or any combination thereof. The alkaline earth metal-containing compound may include an alkaline earth metal compound, such as BaO, SrO, CaO, $Ba_xSr_{1-x}O$ (wherein x is a real number satisfying the condition of $0<x<1$), $Ba_xCa_{1-x}O$ (wherein x is a real number satisfying the condition of $0<x<1$), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. For example, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth-metal complex, and the rare earth metal complex may include i) ion(s) of the alkali metal, the alkaline earth metal, and the rare earth metal, respectively, and ii), as a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

In one or more embodiments, the electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, the compound represented by Formula 601).

In one or more embodiments, the electron injection layer may include (e.g., consist of): i) an alkali metal-containing compound (for example, an alkali metal halide); or ii) a) an alkali metal-containing compound (for example, an alkali metal halide), and b) an alkali metal, an alkaline earth metal, a rare earth metal, or any combination thereof. In one or more embodiments, the electron injection layer may be a KI:Yb co-deposited layer, an RbI:Yb co-deposited layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within any of these ranges, satisfactory (or suitable) electron injection characteristics may be obtained without a substantial increase in driving voltage.

Second Electrode 150

The second electrode 150 may be on the interlayer 130 having a structure as described above. The second electrode 150 may be a cathode, which is an electron injection electrode, and a material for forming the second electrode 150 may include a metal, an alloy, a suitable electrically conductive compound, or any combination thereof, each having a low-work function.

The material for forming the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including a plurality of layers.

Capping Layer

A first capping layer may be arranged outside the first electrode 110, and/or a second capping layer may be arranged outside the second electrode 150. For example, the light-emitting device 10 may have a structure in which the first capping layer, the first electrode 110, the interlayer 130, and the second electrode 150 are sequentially stacked in the stated order, a structure in which the first electrode 110, the interlayer 130, the second electrode 150, and the second capping layer are sequentially stacked in the stated order, or a structure in which the first capping layer, the first electrode 110, the interlayer 130, the second electrode 150, and the second capping layer are sequentially stacked in the stated order.

Light generated in the emission layer of the interlayer 130 of the light-emitting device 10 may be extracted toward the outside through the first electrode 110, which is a semi-transmissive electrode or a transmissive electrode, and the first capping layer, and/or light generated in the emission layer of the interlayer 130 of the light-emitting device 10 may be extracted toward the outside through the second electrode 150, which is a semi-transmissive electrode or a transmissive electrode, and the second capping layer.

The first capping layer and the second capping layer may increase external luminescence efficiency according to the principle of constructive interference. Accordingly, the light extraction efficiency of the light-emitting device 10 may be increased, so that the luminescence efficiency of the light-emitting device 10 may be improved.

Each of the first capping layer and the second capping layer may include a material having a refractive index equal to or greater than 1.6 (at 589 nm).

The first capping layer and the second capping layer may each independently be an organic capping layer including an organic material, an inorganic capping layer including an inorganic material, or an organic-inorganic composite capping layer including an organic material and an inorganic material.

In one or more embodiments, at least one selected from the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may each optionally be substituted with a substituent including O, N, S, Se, Si, F, Cl, Br, I, or any combination thereof. In one or more embodiments, at least one selected from the first capping layer and the second capping layer may each independently include an amine group-containing compound.

For example, at least one selected from the first capping layer and the second capping layer may each independently include a compound represented by Formula 201, a compound represented by Formula 202, or any combination thereof.

In one or more embodiments, at least one selected from the first capping layer and the second capping layer may each independently include one of Compounds HT28 to HT33, one of Compounds CP1 to CP6, β-NPB, or any combination thereof:

CP1

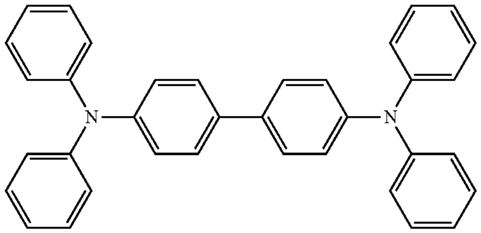

-continued

CP2

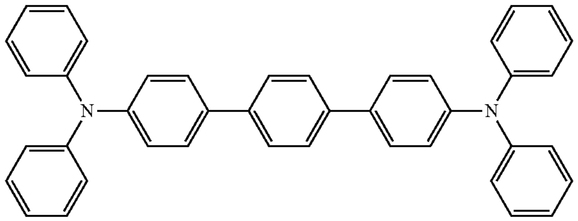

CP3

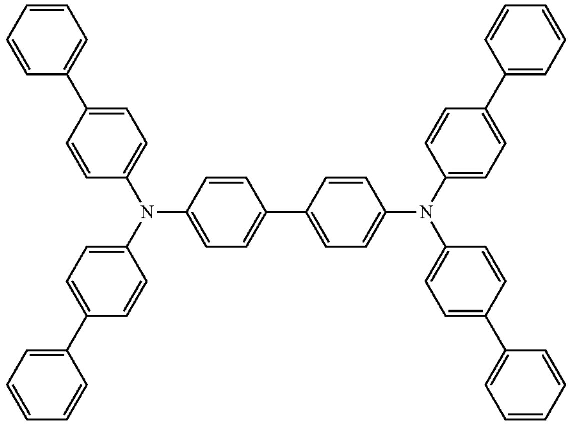

CP4

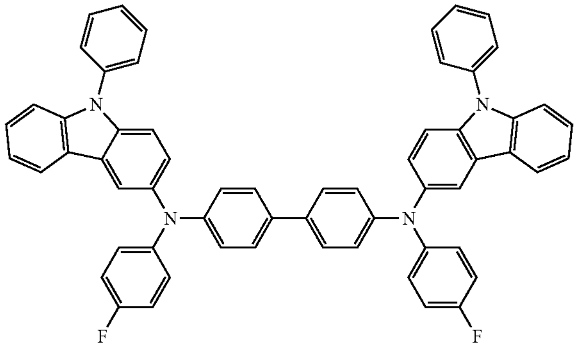

CP5

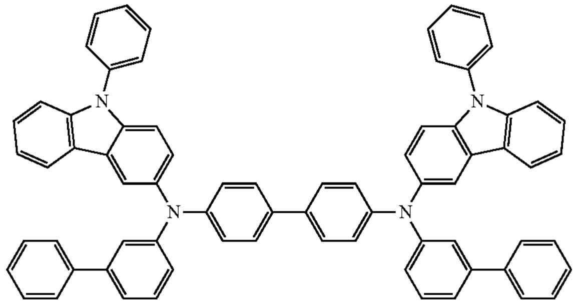

-continued

CP6

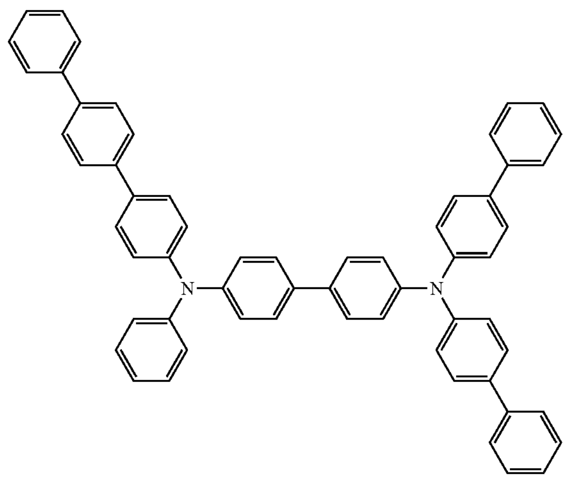

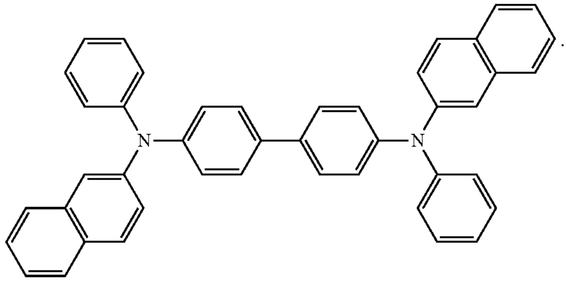

β-NPB

Film

The organometallic compound represented by Formula 1 may be included in various suitable films. According to one or more embodiments, a film including an organometallic compound represented by Formula 1 may be provided. The film may be, for example, an optical member (or a light control means) (for example, a color filter, a color conversion member, a capping layer, a light extraction efficiency enhancement layer, a selective light absorbing layer, a polarizing layer, a quantum dot-containing layer, and/or like), a light-blocking member (for example, a light reflective layer, a light absorbing layer, and/or the like), a protective member (for example, an insulating layer, a dielectric layer, and/or the like).

Electronic Apparatus

The light-emitting device may be included in various suitable electronic apparatuses. For example, the electronic apparatus including the light-emitting device may be a light-emitting apparatus, an authentication apparatus, and/or the like.

The electronic apparatus (for example, a light-emitting apparatus) may further include, in addition to the light-emitting device, i) a color filter, ii) a color conversion layer, or Iii) both a color filter and a color conversion layer. The color filter and/or the color conversion layer may be arranged in at least one traveling direction of light emitted from the light-emitting device. For example, the light emitted from the light-emitting device may be blue light or white light. For details on the light-emitting device, related description provided above may be referred to. In one or more embodiments, the color conversion layer may include quantum dots. The quantum dots may be, for example, the same as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be arranged among the subpixel areas to define each of the subpixel areas.

The color filter including the plurality of the color filter areas may further include light-shielding patterns interposed between the color filter areas, and the color conversion layer including the plurality of the color conversion areas may further include light-shielding patterns interposed between the color conversion areas.

The plurality of color filter areas (or the plurality of color conversion areas) may include a first area emitting (e.g., to emit) first color light, a second area emitting (e.g., to emit) second color light, and/or a third area emitting (e.g., to emit) third color light, wherein the first color light, the second color light, and/or the third color light may have different maximum emission wavelengths from one another. For example, the first color light may be red light, the second color light may be green light, and the third color light may be blue light. For example, the color filter areas (or the color conversion areas) may include quantum dots. In one or more embodiments, the first area may include red quantum dots, the second area may include green quantum dots, and the third area may not include quantum dots. Details for the quantum dots may be the same as described herein. Each of the first region, the second region, and/or the third region may further include a scatter.

In one or more embodiments, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths from one another. In one or more embodiments, the first light may be blue light, the first-first color light may be red light, the second-first color light may be green light, and the third-first color light may be blue light.

The electronic apparatus may further include a thin-film transistor, in addition to the light-emitting device described above. The thin-film transistor may include a source electrode, a drain electrode, and an activation layer, wherein any one of the source electrode and the drain electrode may be electrically connected (e.g., electrically coupled) to any one of the first electrode and the second electrode of the light-emitting device.

The thin-film transistor may further include a gate electrode, a gate insulating film, and/or the like.

The activation layer may include crystalline silicon, amorphous silicon, an organic semiconductor, an oxide semiconductor, and/or the like.

The electronic apparatus may further include a sealing portion for sealing the light-emitting device. The sealing portion and/or the color conversion layer may be arranged between the color filter and the light-emitting device. The sealing portion allows light from the light-emitting device to be extracted to the outside, while simultaneously (or concurrently) preventing (or reducing) ambient air and/or moisture from penetrating into the light-emitting device. The sealing portion may be a sealing substrate including a transparent glass substrate and/or a plastic substrate. The sealing portion may be a thin-film encapsulation layer including at least one layer of an organic layer and/or an inorganic layer. When sealing portion is a thin-film encapsulating layer, the electronic apparatus may be flexible.

Various functional layers may be additionally arranged on the sealing portion, in addition to the color filter and/or the color conversion layer, according to the use of the electronic apparatus. Examples of the functional layers may include a touch screen layer, a polarizing layer, and the like. The touch screen layer may be a pressure-sensitive touch screen layer, a capacitive touch screen layer, and/or an infrared touch screen layer. The authentication apparatus may be, for example, a biometric authentication apparatus that authenticates an individual by using biometric information of a living body (for example, fingertips, pupils, and/or the like).

The authentication apparatus may further include, in addition to the light-emitting device as described above, a biometric information collector.

The electronic apparatus may be applied to various suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various measuring instruments, meters (for example, meters for a vehicle, an aircraft, and/or a vessel), projectors, and/or the like.

Figure 2:
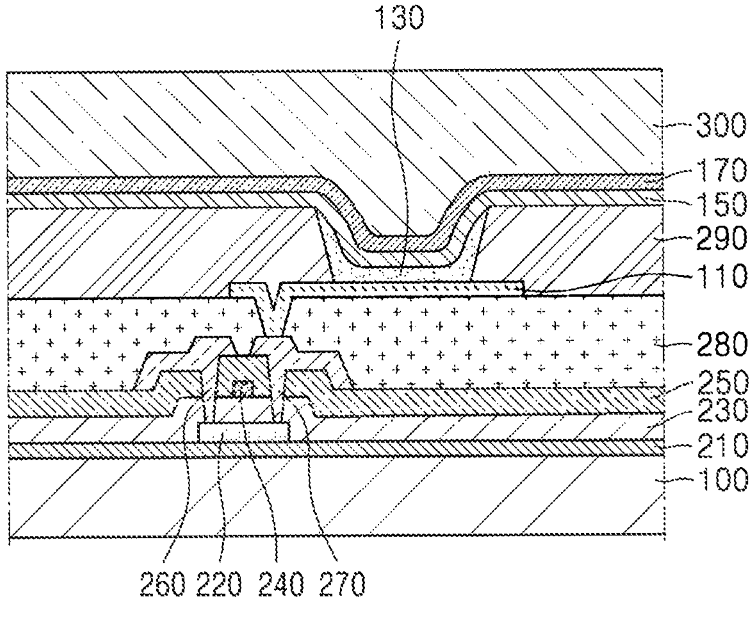
FIG. 2 shows a schematic view of an electronic apparatus according to one or more embodiments.
Figure 3:
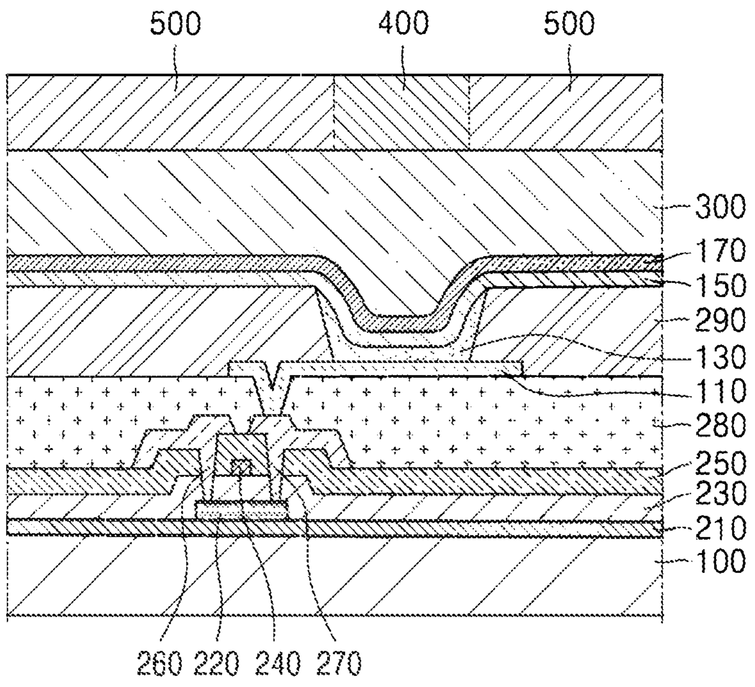
FIG. 3 shows a schematic view of an electronic apparatus according to one or more other embodiments.

Description of FIGS. 2 and 3

FIG. 2 is a cross-sectional view showing a light-emitting apparatus according to one or more embodiments of the present disclosure.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, and/or a metal substrate. A buffer layer 210 may be arranged on the substrate 100. The buffer layer 210 may prevent or reduce penetration of impurities through the substrate 100 and may provide a flat (or substantially flat) surface on the substrate 100.

The TFT may be arranged on the buffer layer 210. The TFT may include an activation layer 220, a gate electrode 240, a source electrode 260, and a drain electrode 270.

The activation layer 220 may include an inorganic semiconductor (such as silicon and/or polysilicon), an organic semiconductor, and/or an oxide semiconductor, and may include a source region, a drain region, and a channel region.

A gate insulating film 230 for insulating the activation layer 220 from the gate electrode 240 may be arranged on the activation layer 220, and the gate electrode 240 may be arranged on the gate insulating film 230.

An interlayer insulating film 250 may be arranged on the gate electrode 240. The interlayer insulating film 250 may be arranged between the gate electrode 240 and the source electrode 260 and between the gate electrode 240 and the drain electrode 270, so as to provide insulation therebetween.

The source electrode 260 and the drain electrode 270 may be arranged on the interlayer insulating film 250. The interlayer insulating film 250 and the gate insulating film 230 may be formed to expose the source region and the drain region of the activation layer 220, and the source electrode 260 and the drain electrode 270 may be arranged in contact with the exposed portions of the source region and the drain region of the activation layer 220.

The TFT may be electrically connected (e.g., electrically coupled) to the light-emitting device to drive the light-emitting device, and may be covered by a passivation layer 280. The passivation layer 280 may include an inorganic insulating film, an organic insulating film, or any combination thereof. The light-emitting device may be provided on the passivation layer 280. The light-emitting device may include the first electrode 110, the interlayer 130, and the second electrode 150.

The first electrode 110 may be arranged on the passivation layer 280. The passivation layer 280 may expose a portion of the drain electrode 270 without completely covering the drain electrode 270, and the first electrode 110 may be arranged to be connected to the exposed portion of the drain electrode 270.

A pixel defining layer 290 including an insulating material may be arranged on the first electrode 110. The pixel defining layer 290 may expose a region of the first electrode 110, and the interlayer 130 may be formed in the exposed region of the first electrode 110. The pixel defining layer 290 may be a polyimide organic film and/or a polyacrylic organic film. In one or more embodiments, at least some layers of the interlayer 130 may extend beyond the upper portion of the pixel defining layer 290 to be arranged in the form of a common layer.

The second electrode 150 may be arranged on the interlayer 130, and a capping layer 170 may be additionally formed on the second electrode 150. The capping layer 170 may be formed to cover the second electrode 150.

The encapsulation portion 300 may be arranged on the capping layer 170. The encapsulation portion 300 may be arranged on the light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE) and/or the like), or any combination thereof; or any combination of the inorganic film and the organic film.

FIG. 3 shows a cross-sectional view showing a light-emitting apparatus according to one or more other embodiments of the present disclosure.

The light-emitting apparatus of FIG. 3 is the same as the light-emitting apparatus of FIG. 2, except that a light-shielding pattern 500 and a functional region 400 are additionally arranged on the encapsulation portion 300. The functional region 400 may include i) a color filter area, ii) a color conversion area, or iii) a combination of a color filter area and a color conversion area. In one or more embodiments, a light-emitting device included in the light-emitting apparatus of FIG. 3 may be a tandem light-emitting device.

Manufacturing Method

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, laser-induced thermal imaging, and the like.

When respective layers included in the hole transport region, the emission layer, and respective layers included in the electron transport region are formed by vacuum deposition, the deposition conditions may include a deposition temperature in a range of about 100° C. to about 500° C., a vacuum degree of about $10^{-8}$ torr to about $10^{-3}$ torr, and a deposition speed in a range of about 0.01 Å/sec to about 100 Å/sec, depending on a material to be included in a layer to be formed and the structure of a layer to be formed.

Definition of Terms

The term "$C_3$-$C_{60}$ carbocyclic group" as used herein refers to a cyclic group consisting of carbon atoms only as ring-forming atoms and having three to sixty carbon atoms, and the term "$C_1$-$C_{60}$ heterocyclic group" as used herein refers to a cyclic group that has one to sixty carbon atoms and further has, in addition to carbon, at least one heteroatom as a ring-forming atom. Each of the $C_3$-$C_{60}$ carbocyclic group and the $C_1$-$C_{60}$ heterocyclic group may be a monocyclic group consisting of one ring or a polycyclic group consisting of two or more rings that are condensed together. For example, the $C_1$-$C_{60}$ heterocyclic group may have 3 to 61 ring-forming atoms.

The term "cyclic group" as used herein may include both the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has 3 to 60 carbon atoms and does not include *—N=*' as a ring-forming moiety, and the term "π electron-deficient nitrogen-containing $C_1$-$C_{60}$ cyclic group" as used herein refers to a heterocyclic group that has 1 to 60 carbon atoms and includes *—N=*' as a ring-forming moiety.

For example, the $C_3$-$C_{60}$ carbocyclic group may be i) a T1 group or ii) a condensed cyclic group in which at least two T1 groups are condensed with each other (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a condensed cyclic group in which at least two T2 groups are condensed with each other, or iii) a condensed cyclic group in which at least one T2 group and at least one T1 group are condensed with each other (for example, the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), the π electron-rich $C_3$-$C_{60}$ cyclic group may be i) group T1, ii) a condensed cyclic group in which two or more groups T1 are condensed with each other, iii) group T3, iv) a condensed cyclic group in which two or more groups T3 are condensed with each other, or v) a condensed cyclic group in which at least one group T3 and at least one group T1 are condensed with each other (for example, the u electron-rich $C_3$-$C_{60}$ cyclic group may be the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be 1) a T4 group, ii) a condensed cyclic group in which at least two T4 groups are condensed with each other, iii) a condensed cyclic group in which at least one T4 group and at least one T1 group are condensed with each other, iv) a condensed cyclic group in which at least one T4 group and at least one T3 group are condensed with each other, or v) a condensed cyclic group in which at least one T4 group, at least one T1 group, and at least one T3 group are condensed with one another (for example, the u electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as used herein refer to a group condensed to any cyclic group, a monovalent group, or a polyvalent group (for example, a divalent group, a trivalent group, a tetravalent group, etc.) according to the structure of a formula for which the corresponding term is used. In one or more embodiments, "a benzene group" may be a benzene ring, a phenyl group, a phenylene group, and/or the like, which may be easily understood by one of ordinary skill in the art according to the structure of a formula including the "benzene group".

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the monovalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an iso-nonyl group, a sec-nonyl group, a tert-nonyl group, an n-decyl group, an isodecyl group, a sec-decyl group, a tert-decyl group, and the like. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle and/or at the terminus of the $C_2$-$C_{60}$ alkyl group, and examples thereof may include an ethenyl group, a propenyl group, a butenyl group, and the like. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle and/or at the terminus of the $C_2$-$C_{60}$ alkyl group, and examples thereof may include an ethynyl group, a propynyl group, and the like. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by $-OA_{101}$ (wherein $A_{101}$ is the $C_1$-$C_{60}$ alkyl group), and examples thereof may include a methoxy group, an ethoxy group, an isopropyloxy group, and the like.

The term "$C_3$-$C_{10}$ cycloalkyl group" as used herein refers to a monovalent saturated hydrocarbon cyclic group having three to ten carbon atoms, and examples thereof may include a cyclopropyl group, a cyclobutyl group, a cyclopentyl group, a cyclohexyl group, a cycloheptyl group, a cyclooctyl group, an adamantanyl group, a norbornyl group (or bicyclo[2.2.1]heptyl group), a bicyclo[1.1.1]pentyl group, a bicyclo[2.1.1]hexyl group, a bicyclo[2.2.2]octyl group, and the like. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to carbon atoms, at least one heteroatom as a ring-forming atom and has 1 to 10 carbon atoms, and examples thereof may include a 1,2,3,4-oxatriazolidinyl group, a tetrahydrofuranyl group, a tetrahydrothiophenyl group, and the like. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms, at least one carbon-carbon double bond in the ring thereof, and no aromaticity, and examples thereof may include a cyclopentenyl group, a cyclohexenyl group, a cycloheptenyl group, and the like. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to carbon atoms, at least one heteroatom as a ring-forming atom, 1 to 10 carbon atoms, and at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, a 2,3-dihydrothiophenyl group, and the like. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, and the like. The term "$C_6$-$C_{60}$ arylene group" as used herein refers to a divalent group having the same structure as the $C_6$-$C_{60}$ aryl group. When the $C_6$-$C_{60}$ aryl group and the $C_6$-$C_{60}$ arylene group each independently include two or more rings, the respective rings may be condensed with each other.

The term "$C_1$-$C_{60}$ heteroaryl group" as used herein refers to a monovalent group having a heterocyclic aromatic system that has, in addition to carbon atoms, at least one heteroatom as a ring-forming atom, and 1 to 60 carbon atoms. The term "$C_1$-$C_{60}$ heteroarylene group" as used herein refers to a divalent group having the same structure as the $C_1$-$C_{60}$ heteroaryl group. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a naphthyridinyl group, and the like. When the $C_1$-$C_{60}$ heteroaryl group and the $C_1$-$C_{60}$ heteroarylene group each independently include two or more rings, the respective rings may be condensed with each other.

The term "monovalent non-aromatic condensed polycyclic group" as used herein refers to a monovalent group having two or more rings condensed to each other, only carbon atoms as ring-forming atoms (for example, having 8 to 60 carbon atoms), and no aromaticity in its entire molecular structure. Examples of the monovalent non-aromatic condensed polycyclic group may include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having the same structure as the monovalent non-aromatic condensed polycyclic group described above.

The term "monovalent non-aromatic condensed heteropolycyclic group" as used herein refers to a monovalent group having two or more rings condensed with each other, at least one heteroatom other than carbon atoms (for example, 1 to 60 carbon atoms), as a ring-forming atom, and no aromaticity in its entire molecular structure. Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, a benzothienodibenzothiophenyl group, and the like. The term "divalent non-aromatic condensed heteropolycyclic group" as used herein refers to a divalent group having the same structure as the monovalent non-aromatic condensed heteropolycyclic group described above.

The term "$C_6$-$C_{60}$ aryloxy group" as used herein refers to a monovalent group represented by $—OA_{102}$ (wherein $A_{102}$ is the $C_6$-$C_{60}$ aryl group), and the term "$C_6$-$C_{60}$ arylthio group" as used herein refers to a monovalent group represented by $—SA_{103}$ (wherein $A_{103}$ is the $C_6$-$C_{60}$ aryl group).

The term "$C_7$-$C_{60}$ arylalkyl group" as used herein refers to a group represented by $-A_{104}A_{105}$ (wherein $A_{104}$ is a $C_1$-$C_{54}$ alkylene group and $A_{105}$ is a $C_6$-$C_{59}$ aryl group), and the term "$C_2$-$C_{60}$ heteroarylalkyl group" as used herein refers to a group represented by $-A_{106}A_{107}$ (wherein $A_{106}$ is a $C_1$-$C_{59}$ alkylene group and $A_{107}$ is a $C_1$-$C_{59}$ heteroaryl group).

The term "$R_{10a}$" as used herein refers to:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-60 aryloxy group, a $C_6$-$C_{60}$ arylthio group, a $C_7$-$C_{60}$ arylalkyl group, a $C_2$-$C_{60}$ heteroarylalkyl group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —C(═O)($Q_{21}$), —S(═O)$_2$($Q_{21}$), —P(═O)($Q_{21}$)($Q_{22}$), or any combination thereof; or —$Si(Q_{31})(Q_{32})(Q_{33})$, —$N(Q_{31})(Q_{32})$, —$B(Q_{31})(Q_{32})$, —C(═O)($Q_{31}$), —S(═O)$_2$($Q_{31}$), or —P(═O)($Q_{31}$)($Q_{32}$).

In the present specification, $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ aryl alkyl group, or a $C_2$-$C_{60}$ heteroaryl alkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Examples of the heteroatom may include O, S, N, P, Si, B, Ge, Se, or any combination thereof.

The term "third-row transition metal" as used herein may include hafnium (Hf), tantalum (Ta), tungsten (W), rhenium (Re), osmium (Os), iridium (Ir), platinum (Pt), gold (Au), and the like.

The term "Ph" as used herein refers to a phenyl group, the term "Me" as used herein refers to a methyl group, the term "Et" as used herein refers to an ethyl group, the term "ter-Bu" or "But" as used herein refers to a tert-butyl group, and the term "OMe" as used herein refers to a methoxy group.

The term "biphenyl group" as used herein refers to "a phenyl group substituted with a phenyl group." For example, the "biphenyl group" may be a substituted phenyl group having a $C_6$-$C_{60}$ aryl group as a substituent.

The term "terphenyl group" as used herein refers to "a phenyl group substituted with a biphenyl group". For example, the "terphenyl group" may be a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula or moiety.

Hereinafter, compounds according to embodiments and light-emitting devices according to embodiments will be described in more detail with reference to the following synthesis examples and examples. The wording "B was used instead of A" used in describing Synthesis Examples refers to an identical molar equivalent of B being used in place of A.

EXAMPLES

Synthesis Example 1: Synthesis of Compound 1

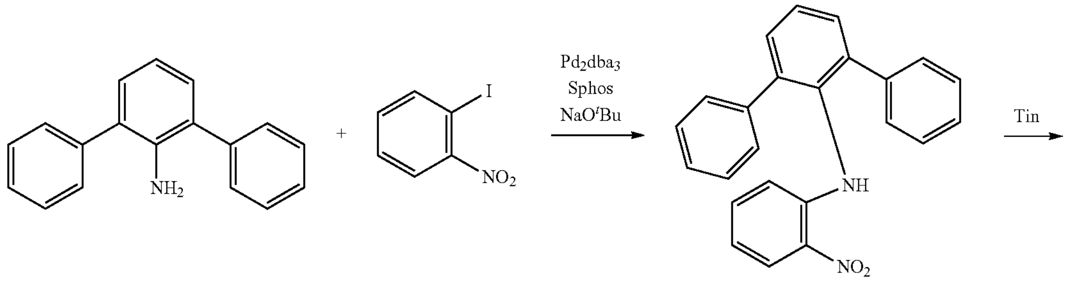

1-a

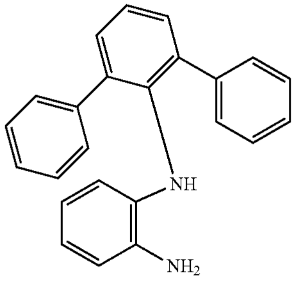

1-b

-continued

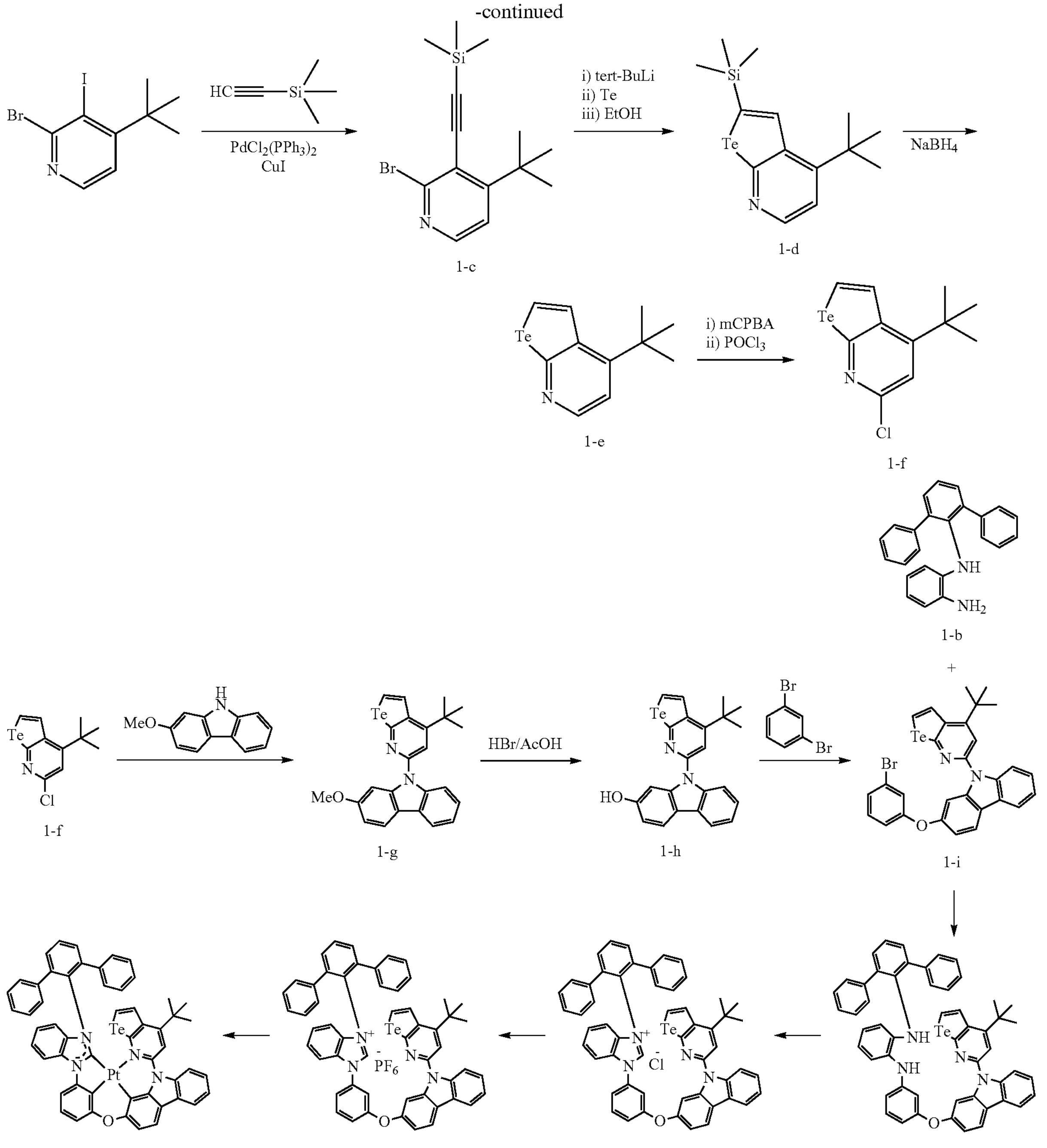

1-c, 1-d, 1-e, 1-f, 1-b, +, 1-f, 1-g, 1-h, 1-i, 1-j, 1-k, 1-l, 1

(1) Synthesis of Intermediate Compound 1-a

[1,1':3',1"-terphenyl]-2'-amine (1.0 eq), 2-iodo-1-nitrobenzene (2.0 eq), $Pd_2(dba)_3$ (5 mol %), Sphos (7 mol %), and sodium tert-butoxide (2.0 eq) were dissolved in toluene (0.1 M) and stirred at 110° C. for 12 hours. The reaction mixture was cooled at room temperature, and an extraction process was performed thereon three times using water, so as to obtain an organic layer. The organic layer thus obtained was dried by using magnesium sulfate and concentrated, and column chromatography was used for synthesis of Intermediate Compound 1-a (yield: 75%).

(2) Synthesis of Intermediate Compound 1-b

Intermediate Compound 1-a (1.0 eq), Sn (1.5 eq), and HCl (30 eq) were dissolved in ethanol and stirred at 80° C. for 12 hours. After the reaction mixture was cooled at room temperature, the resultant reaction mixture was neutralized with a NaOH solution. Next, an extraction process was performed thereon by using dichloromethane and water to obtain an organic layer, which was then filtered by Celite/silica gel. The filtrate was dried by using magnesium sulfate and concentrated, and column chromatography (MC:hexane=1:3, v/v) was used for synthesis of Intermediate Compound 1-b (yield: 86%).

(3) Synthesis of Intermediate Compound 1-c 2-bromo-4-(tert-butyl)-3-iodopyridine (1.0 eq), trimethylsilyl acetylene (1.1 eq), and piperidine (20.0 M) were dissolved in benzene (20.0 M), and bis[triphenylphosphine] palladium dichloride (II) (10 mol %) and copper(I) iodide (20 mol %) were added thereto. The reaction mixture was then stirred at 90° C. for 15 hours. The resultant reaction mixture was cooled at room temperature, and an extraction process was performed thereon three times by using dichloromethane and water to obtain an organic layer. The organic layer thus obtained was dried by using magnesium sulfate and concentrated, and column chromatography was used for synthesis of Intermediate Compound 1-c (yield: 64%).

(4) Synthesis of Intermediate Compound 1-d

Intermediate Compound 1-c (1.0 eq) was dissolved in anhydrous ether, and 1.5 M tert-BuLi in pentane solution (1.1 eq) was slowly added thereto at −80° C. After 1 hour reaction at −80° C., the reaction was allowed for additional 1 hour at −30° C., and then powdered tellurium was added thereto and stirred at room temperature for 2 hours. Ethanol was added to the reaction mixture and stirred at room temperature for 3 hours. An extraction process was performed thereon three times by using dichloromethane and water to obtain an organic layer. The organic layer thus obtained was dried by using magnesium sulfate and concentrated, and column chromatography (n-hexane) was used for synthesis of Intermediate Compound 1-d (yield: 54%).

(5) Synthesis of Intermediate Compound 1-e

Intermediate Compound 1-d (1.0 eq) was dissolved in ethanol at room temperature, and $NaBH_4$ (1.5 eq) was added thereto under nitrogen condition. The reaction mixture was stirred at 80° C. for 12 hours. The resultant reaction mixture was cooled at room temperature, and an extraction process was performed thereon three times by using ethyl acetate and water to obtain an organic layer. The organic layer thus obtained was dried by using magnesium sulfate, concentrated, purified by column chromatography (n-hexane), and recrystallized by using n-pentane, so as to obtain Intermediate Compound 1-e (yield: 50%).

(6) Synthesis of Intermediate Compound 1-f

Intermediate Compound 1-e (1.0 eq) and 3-chloroperbenzoic acid (1.3 eq) were dissolved in dichloromethane and stirred at room temperature for 24 hours. A solution of $POCl_3$ (2.0 eq) diluted in 0.2 M dichloromethane was slowly added to the reaction mixture, and then triethylamine (2.0 eq) was added. After stirring the reaction mixture at room temperature for 1 hour, an extraction process was performed thereon three times by using dichloromethane and water to obtain an organic layer. The organic layer thus obtained was dried by using magnesium sulfate and concentrated, and column chromatography was used for synthesis of Intermediate Compound 1-f (yield: 88%).

(7) Synthesis of Intermediate Compound 1-g 2-methoxycarbazole (1.1 eq), Intermediate Compound 1-f (1.0 eq), $Pd_2(dba)_3$ (5 mol %), Sphos (7 mol %), and sodium tert-butoxide (2.0 eq) were dissolved in toluene (0.1 M) and stirred at 110° C. for 12 hours. The resultant reaction mixture was cooled at room temperature, and an extraction process was performed thereon three times by using dichloromethane and water to obtain an organic layer. The organic layer thus obtained was dried by using magnesium sulfate and concentrated, and column chromatography was used for synthesis of Intermediate Compound 1-g (yield: 72%).

(8) Synthesis of Intermediate Compound 1-h

Intermediate Compound 1-g (1.0 eq), HBr, and acetic acid were stirred at 120° C. for 16 hours. The reaction mixture was cooled at room temperature, and an extraction process was performed thereon three times by using ethyl acetate and water to obtain an organic layer. The organic layer thus obtained was dried by using magnesium sulfate and concentrated, and column chromatography was used for synthesis of Intermediate Compound 1-h (yield: 93%).

(9) Synthesis of Intermediate Compound 14

1,3-dibromobenzene (1.2 eq), Intermediate Compound 1-h (1.0 eq), CuI (10 mol %), BPPO ligand (10 mol %), and potassium phosphate tribasic (2.0 eq) were dissolved in DMF (0.1 M) and stirred at 160° C. for 10 hours. The resultant reaction mixture was cooled at room temperature, and DMF was removed under reduced pressure. Then, an extraction process was performed thereon three times by using dichloromethane and water to obtain an organic layer. The organic layer thus obtained was dried by using magnesium sulfate and concentrated, and column chromatography (EA:hexane=1:10, v/v) was used for synthesis of Intermediate Compound 1-i (yield: 76%).

(10) Synthesis of Intermediate Compound 1-j

Intermediate Compound 1-i (1.0 eq), Intermediate Compound 1-b (1.2 eq), $Pd_2(dba)_3$ (5 mol %), Sphos (7 mol %), and sodium tert-butoxide (2.0 eq) were dissolved in toluene (0.1 M) and stirred at 110° C. for 3 hours. The resultant reaction mixture was cooled at room temperature, and DMF was removed under reduced pressure. Then, an extraction process was performed thereon three times by using dichloromethane and water to obtain an organic layer. The organic layer thus obtained was dried by using magnesium sulfate and concentrated, and column chromatography (EA: hexane=1:10, v/v) was used for synthesis of Intermediate Compound 1-j (yield: 73%).

(11) Synthesis of Intermediate Compound 1-k

Intermediate Compound 1-j (1.0 eq) was dissolved in triethyl orthoformate (30 eq), and 37% HCl (1.5 eq) was added thereto and stirred at 80° C. for 12 hours. After cooling at room temperature, triethyl orthoformate was concentrated and an extraction process was performed thereon by using dichloromethane and water to obtain an organic layer. The obtained organic layer was dried by using magnesium sulfate and concentrated, and column chromatography (MC, MC:5 vol % methanol) was used for synthesis of Intermediate 1-k (yield: 90%).

(12) Synthesis of Intermediate Compound 1-l

Intermediate Compound 1-k (1.0 eq) and ammonium hexafluorophosphate (3.0 eq) were dissolved in methanol (0.5 M), and distilled water was added thereto and stirred at room temperature for 3 hours to 12 hours. After washing with distilled water and filtering to obtain a solid, an extraction process was performed thereon three times by using dichloromethane and water to obtain an organic layer. The organic layer thus obtained was dried by using magnesium sulfate and concentrated, so as to synthesize Intermediate Compound 1-l (yield of 88%).

(13) Synthesis of Compound 1

Intermediate Compound 1-l, dichloro(1,5-cyclooctadiene)platinum (II) (1.1 eq), and sodium acetate (2.0 eq) were dissolved in anhydrous 1,4-dioxane and stirred under nitrogen condition at 120° C. for 4 days. The reaction mixture was cooled at room temperature, and an extraction process was performed thereon three times by using dichloromethane and water to obtain an organic layer. The organic layer thus obtained was dried by using magnesium sulfate and concentrated, and column chromatography (30 vol % MC:hexane) was used for synthesis of Compound 1 (yield: 19%).

Synthesis Example 2: Synthesis of Compound 2
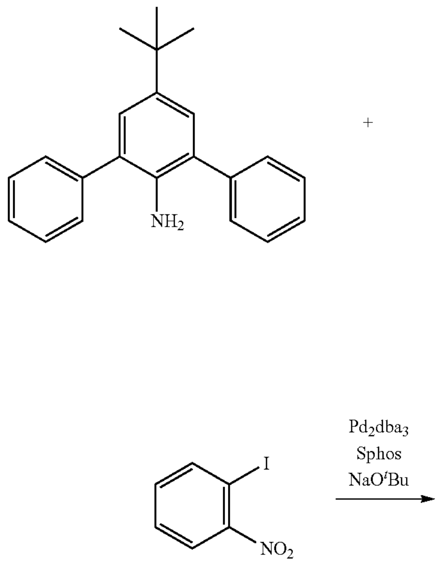
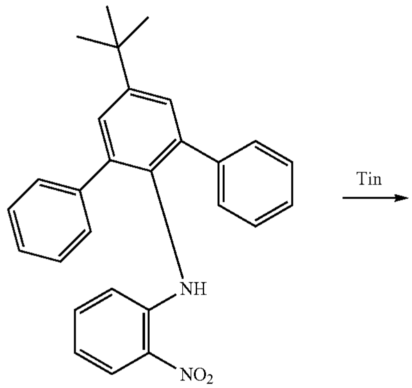
2-a
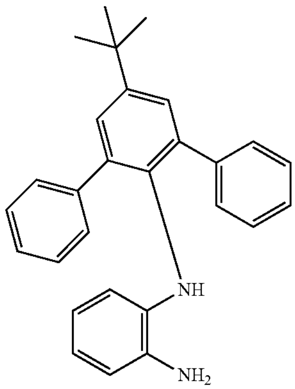
2-b
-continued
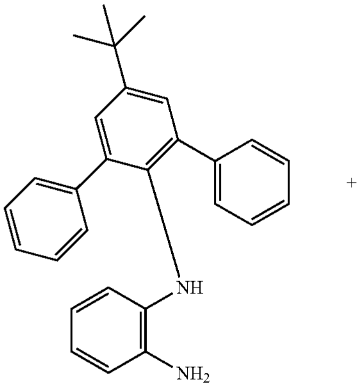
2-b
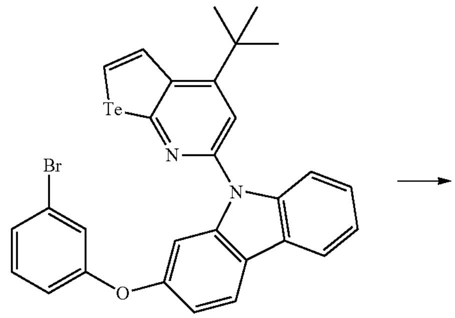
1-i
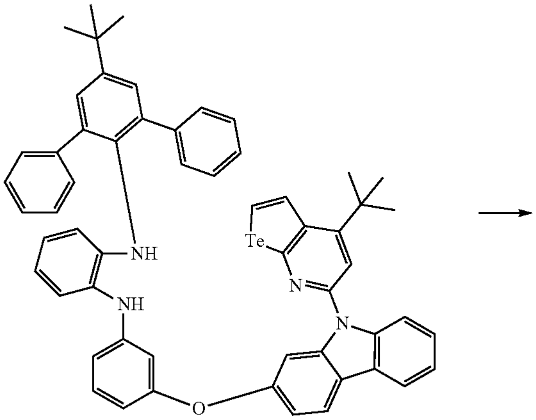
2-c
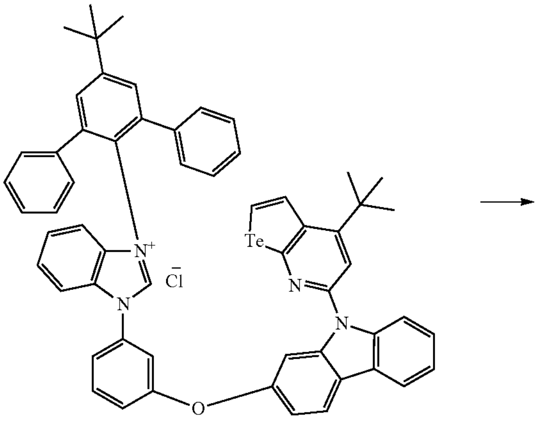
2-d -continued

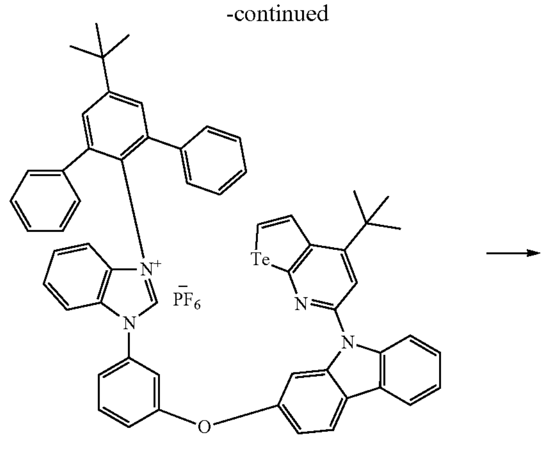

2-e

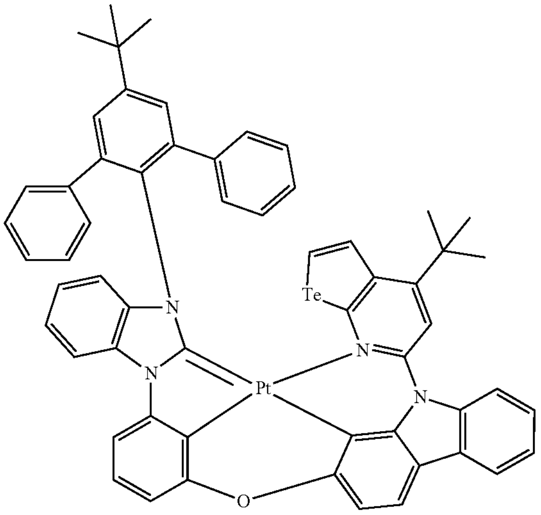

2

(1) Synthesis of Intermediate Compound 2-a

5'-(tert-butyl)-[1,1':3',1"-terphenyl]-2-amine (1.0 eq), 2-iodo-1-nitrobenzene (2.0 eq), $Pd_2(dba)_3$ (5 mol %), Sphos (7 mol %), and sodium tert-butoxide (2.0 eq) were dissolved in toluene (0.1 M) and stirred at 110° C. for 18 hours. The resultant reaction mixture was cooled at room temperature, and an extraction process was performed thereon three times by using dichloromethane and water to obtain an organic layer. The organic layer thus obtained was dried by using magnesium sulfate and concentrated, and column chromatography (MC:hexane=1:9 v/v) was used for synthesis of Intermediate Compound 2-a (yield: 72%).

(2) Synthesis of Intermediate Compound 2-b

Intermediate Compound 2-a (1.0 eq), Sn (1.5 eq), and HCl (30 eq) were dissolved in ethanol and stirred at 80° C. for 12 hours. After the reaction mixture was cooled at room temperature, the resultant reaction mixture was neutralized with a NaOH solution. Next, an extraction process was performed thereon by using dichloromethane and water to obtain an organic layer, which was then filtered by Celite/silica gel. The filtrate was dried by using magnesium sulfate, and concentrated for synthesis of Intermediate Compound 2-b (yield of 90%).

(3) Synthesis of Intermediate Compound 2-c

Intermediate Compound 2-b (1.2 eq), Intermediate Compound 1-i (1.0 eq), $Pd_2(dba)_3$ (5 mol %), Xphos (7 mol %), and sodium tert-butoxide (2.0 eq) were dissolved in 1,4-dioxane (0.1 M) and stirred at 110° C. for 2 hours. The resultant reaction mixture was cooled at room temperature, and the remaining solvent was removed under reduced pressure. Then, an extraction process was performed thereon three times by using ethyl acetate and water to obtain an organic layer. The organic layer thus obtained was dried by using magnesium sulfate and concentrated, and column chromatography (EA:hexane=1:9 v/v) was used for synthesis of Intermediate Compound 2-c (yield: 79%).

(4) Synthesis of Intermediate Compound 2-d

Intermediate Compound 2-c (1.0 eq) was dissolved in triethyl orthoformate (30 eq), and 37% HCl (1.5 eq) was added thereto and stirred at 80° C. for 12 hours. After cooling at room temperature, triethyl orthoformate was concentrated and an extraction process was performed thereon by using dichloromethane and water to obtain an organic layer. The obtained organic layer was dried by using magnesium sulfate and concentrated, and column chromatography (MC, MC:5 vol % methanol) was used for synthesis of Intermediate Compound 2-d (yield: 91%).

(5) Synthesis of Intermediate Compound 2-e

Intermediate Compound 2-d (1.0 eq) and ammonium hexafluorophosphate (3.0 eq) were dissolved in methanol (0.5 M), and distilled water was added thereto and stirred at room temperature for 3 hours to 12 hours. After washing with distilled water and filtering to obtain a solid, an extraction process was performed thereon three times by using dichloromethane and water to obtain an organic layer. The organic layer thus obtained was dried by using magnesium sulfate and concentrated, so as to synthesize Intermediate Compound 2-e (yield of 85%).

(6) Synthesis of Compound 2

Intermediate Compound 2-e, dichloro(1,5-cyclooctadiene)platinum (II) (1.1 eq), and sodium acetate (2.0 eq) were dissolved in anhydrous 1,4-dioxane and stirred under nitrogen condition at 120° C. for 4 days. The reaction mixture was cooled at room temperature, and an extraction process was performed thereon three times by using dichloromethane and water to obtain an organic layer. The organic layer thus obtained was dried by using magnesium sulfate and concentrated, and column chromatography (30 vol % MC:hexane) was used for synthesis of Compound 2 (yield: 17%).

Synthesis Example 3: Synthesis of Compound 10

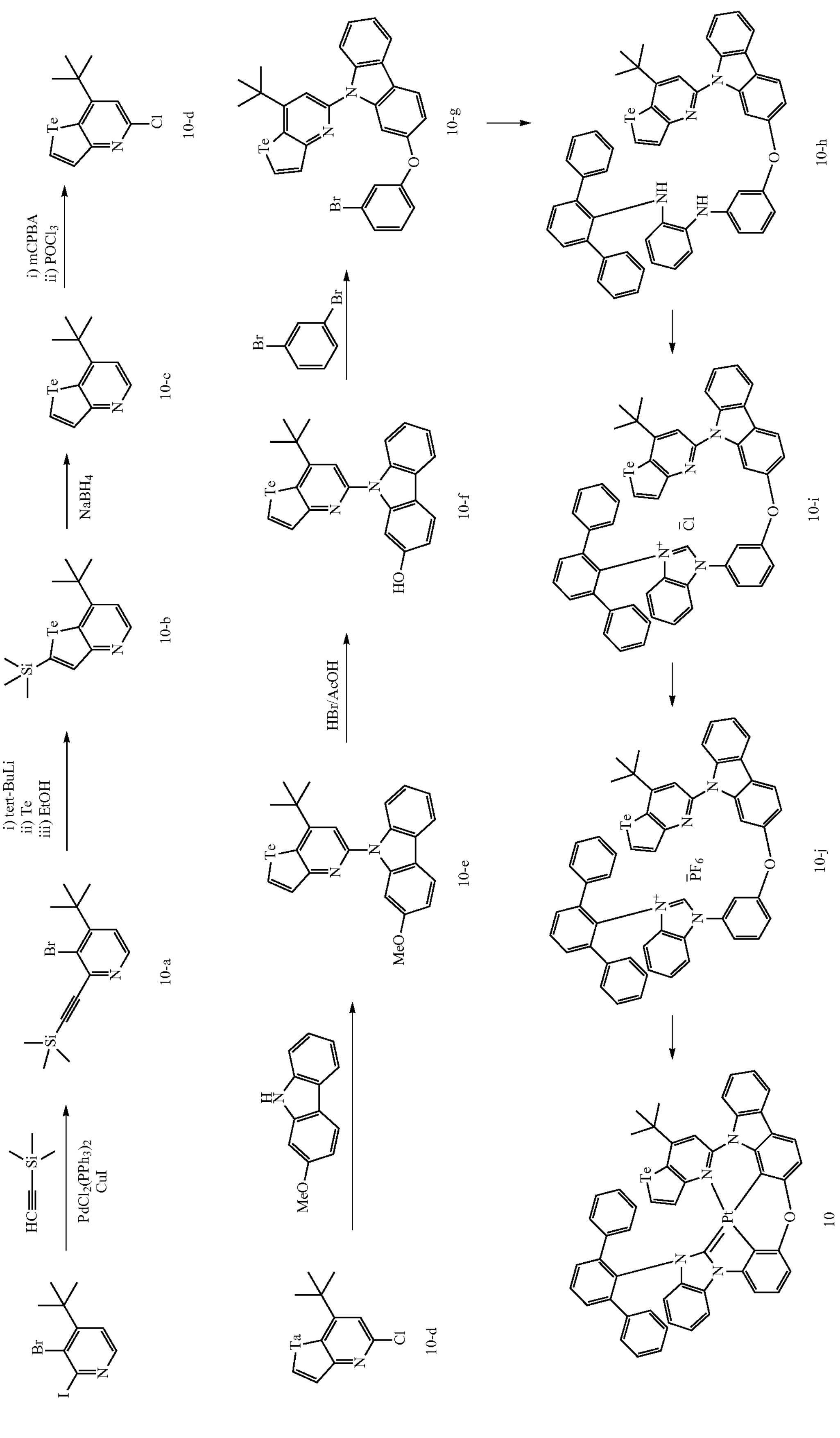
10-a, 10-b, 10-c, 10-d, 10-d, 10-e, 10-f, 10-g, 10-h, 10-i, 10-j, 10

(1) Synthesis of Intermediate Compound 10-a 3-bromo-4-(tert-butyl)-2-iodopyridine (1.0 eq), trimethylsilyl acetylene (1.1 eq), and piperidine (20.0 M) were dissolved in benzene (20.0 M), and bis[triphenylphosphine] palladium dichloride (II) (10 mol %) and copper(I) iodide (20 mol %) were added thereto. The reaction mixture was then stirred at 90° C. for 15 hours. The resultant reaction mixture was cooled at room temperature, and an extraction process was performed thereon three times by using dichloromethane and water to obtain an organic layer. The organic layer thus obtained was dried by using magnesium sulfate and concentrated, and column chromatography was used for synthesis of Intermediate Compound 10-a (yield: 65%).

(2) Synthesis of Intermediate Compound 10-b

Intermediate Compound 10-a (1.0 eq) was dissolved in anhydrous ether, and 1.5 M tert-BuLi in pentane solution (1.1 eq) was slowly added thereto at −80° C. After 1 hour reaction at −80° C., the reaction was allowed for additional 1 hour at −30° C., and then powdered tellurium was added thereto and stirred at room temperature for 2 hours. Ethanol was added to the reaction mixture and stirred at room temperature for 3 hours. An extraction process was performed thereon three times by using dichloromethane and water to obtain an organic layer. The organic layer thus obtained was dried by using magnesium sulfate and concentrated, and column chromatography (n-hexane) was used for synthesis of Intermediate Compound 10-b (yield: 54%).

(3) Synthesis of Intermediate Compound 10-c

Intermediate Compound 10-b (1.0 eq) was dissolved in ethanol at room temperature, and $NaBH_4$ (1.5 eq) was added thereto under nitrogen condition. The reaction mixture was stirred at 80° C. for 12 hours. The resultant reaction mixture was cooled at room temperature, and an extraction process was performed thereon three times by using ethyl acetate and water to obtain an organic layer. The organic layer thus obtained was dried by using magnesium sulfate, concentrated, purified by column chromatography (n-hexane), and recrystallized by using n-pentane, so as to obtain Intermediate Compound 10-c (yield: 40%).

(4) Synthesis of Intermediate Compound 10-d

Intermediate Compound 10-c (1.0 eq) and 3-chloroperbenzoic acid (1.3 eq) were dissolved in dichloromethane and stirred at room temperature for 24 hours. A solution of $POCl_3$ (2.0 eq) diluted in 0.2 M dichloromethane was slowly added to the reaction mixture, and then triethylamine (2.0 eq) was added. After stirring the reaction mixture at room temperature for 1 hour, an extraction process was performed thereon three times by using dichloromethane and water to obtain an organic layer. The organic layer thus obtained was dried by using magnesium sulfate and concentrated, and column chromatography was used for synthesis of Intermediate Compound 10-d (yield: 87%).

(5) Synthesis of Intermediate Compound 10-e 2-methoxycarbazole (1.1 eq), Intermediate Compound 10-d (1.0 eq), $Pd_2(dba)_3$ (5 mol %), Sphos (7 mol %), and sodium tert-butoxide (2.0 eq) were dissolved in toluene (0.1 M) and stirred at 110° C. for 12 hours. The reaction mixture was cooled at room temperature, and then subjected to an extraction process three times using water to obtain an organic layer. The organic layer thus obtained was dried by using magnesium sulfate and concentrated, and column chromatography was used for synthesis of Intermediate Compound 10-e (yield: 72%).

(6) Synthesis of Intermediate Compound 10-f

Intermediate Compound 10-e (1.0 eq), HBr, and acetic acid were stirred at 120° C. for 16 hours. The resultant reaction mixture was cooled at room temperature, and an extraction process was performed thereon three times by using ethyl acetate and water to obtain an organic layer. The organic layer thus obtained was dried by using magnesium sulfate and concentrated, and column chromatography was used for synthesis of Intermediate Compound 10-f (yield: 85%).

(7) Synthesis of Intermediate Compound 10-g 1,3-dibromobenzene (1.2 eq), Intermediate Compound 10-f (1.0 eq), CuI (10 mol %), BPPO ligand (10 mol %), and potassium phosphate tribasic (2.0 eq) were dissolved in DMF (0.1 M) and stirred at 160° C. for 10 hours. The resultant reaction mixture was cooled at room temperature, and DMF was removed under reduced pressure. Then, an extraction process was performed thereon three times by using dichloromethane and water to obtain an organic layer. The organic layer thus obtained was dried by using magnesium sulfate and concentrated, and column chromatography (EA:hexane=1:10, v/v) was used for synthesis of Intermediate Compound 10-g (yield: 55%).

(8) Synthesis of Intermediate Compound 10-h

Intermediate Compound 10-g (1.0 eq), Intermediate Compound 1-b (1.2 eq), $Pd_2(dba)_3$ (5 mol %), Sphos (7 mol %), and sodium tert-butoxide (2.0 eq) were dissolved in toluene (0.1 M) and stirred at 110° C. for 3 hours. The resultant reaction mixture was cooled at room temperature, and DMF was removed under reduced pressure. Then, an extraction process was performed thereon three times by using dichloromethane and water to obtain an organic layer. The organic layer thus obtained was dried by using magnesium sulfate and concentrated, and column chromatography (EA: hexane=1:10, v/v) was used for synthesis of Intermediate Compound 10-h (yield: 86%).

(9) Synthesis of Intermediate Compound 10-i

Intermediate Compound 10-h (1.0 eq) was dissolved in triethyl orthoformate (30 eq), and 37% HCl (1.5 eq) was added thereto and stirred at 80° C. for 12 hours. After cooling at room temperature, triethyl orthoformate was concentrated and extracted three times with dichloromethane and water to obtain an organic layer. The obtained organic layer was dried by using magnesium sulfate and concentrated, and column chromatography (MC, MC:5 vol % methanol) was used for synthesis of Intermediate 10-i (yield: 90%).

(10) Synthesis of Intermediate Compound 10-j

Intermediate Compound 10-i (1.0 eq) and ammonium hexafluorophosphate (3.0 eq) were dissolved in methanol (0.5 M), and distilled water was added thereto and stirred at room temperature for 3 hours to 12 hours. After washing with distilled water and filtering to obtain a solid, an extraction process was performed thereon three times using dichloromethane and water to obtain an organic layer. The organic layer thus obtained was dried by using magnesium sulfate and concentrated, so as to synthesize Intermediate Compound 10-j (yield of 91%).

(11) Synthesis of Compound 10

Intermediate Compound 10-j, dichloro(1,5-cyclooctadiene)platinum (II) (1.1 eq), and sodium acetate (2.0 eq) were dissolved in anhydrous 1,4-dioxane and stirred under nitrogen condition at 120° C. for 4 days. The reaction mixture was cooled at room temperature, and an extraction process was performed thereon three times by using dichloromethane and water to obtain an organic layer. The organic layer thus obtained was dried by using magnesium sulfate and concentrated, and column chromatography (30 vol % MC:hexane) was used for synthesis of Compound 10 (yield: 20%).

Synthesis Example 4: Synthesis of Compound 28

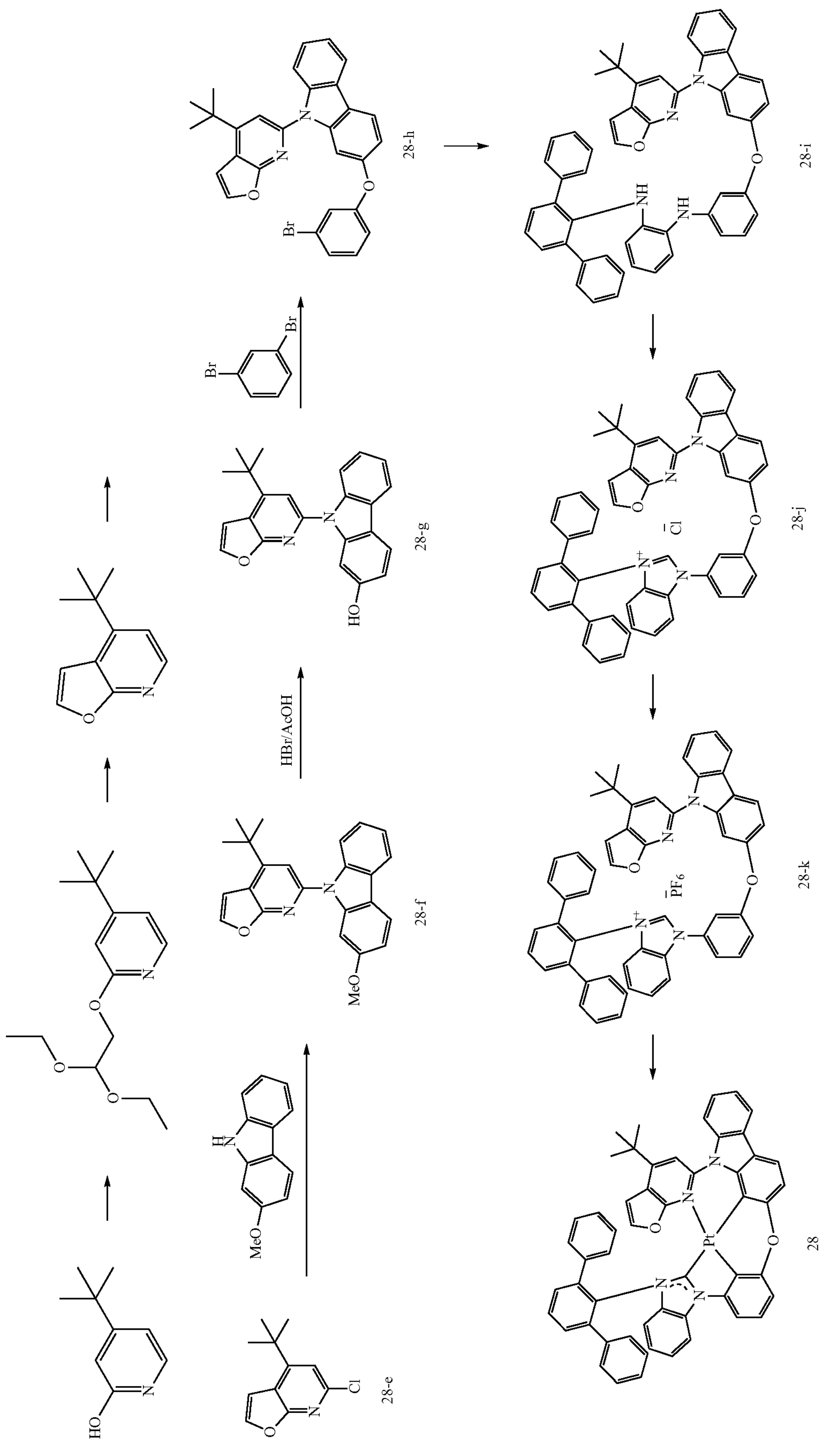
28-e 28-f 28-g 28-h 28-i 28-j 28-k 28

(1) Synthesis of Intermediate Compound 28-c 4-(tert-butyl)pyridin-2-ol (1.0 eq) and bromoacetaldehyde diethyl acetal (1.1 eq) were dissolved in acetone and stirred under reflux for 12 hours. The resultant reaction mixture was cooled at room temperature, and an extraction process was performed thereon three times by using dichloromethane and water to obtain an organic layer. The organic layer thus obtained was dried by using magnesium sulfate and concentrated, and column chromatography was used for synthesis of Intermediate Compound 28-c (yield: 55%).

(2) Synthesis of Intermediate Compound 28-d

Intermediate Compound 28-c was dissolved in 1,2-dichloroethane and stirred under reflux for 4 hours. After removing the solvent under reduced pressure, an extraction process was performed thereon three times by using dichloromethane and water to obtain an organic layer. The organic layer thus obtained was dried by using magnesium sulfate and concentrated, and column chromatography was used for synthesis of Intermediate Compound 28-d (yield: 79%).

(3) Synthesis of Intermediate Compound 28-e

Intermediate Compound 28-d (1.0 eq) and 3-chloroperbenzoic acid (1.3 eq) were dissolved in dichloromethane and stirred at room temperature for 24 hours. An extraction process was performed thereon three times by using dichloromethane and water to obtain an organic layer. The organic layer thus obtained was dried by using magnesium sulfate and concentrated, and column chromatography was used for synthesis of Intermediate Compound 28-e (yield: 86%).

(4) Synthesis of Intermediate Compound 28-f 2-methoxycarbazole (1.1 eq), Intermediate Compound 28-e (1.0 eq), $Pd_2(dba)_3$ (5 mol %), Sphos (7 mol %), and sodium tert-butoxide (2.0 eq) were dissolved in toluene (0.1 M) and stirred at 110° C. for 12 hours. The resultant reaction mixture was cooled at room temperature, and an extraction process was performed thereon three times by using dichloromethane and water to obtain an organic layer. The organic layer thus obtained was dried by using magnesium sulfate and concentrated, and column chromatography was used for synthesis of Intermediate Compound 28-f (yield: 78%).

(5) Synthesis of Intermediate Compound 28-g

Intermediate Compound 28-f (1.0 eq), HBr, and acetic acid were stirred at 120° C. for 16 hours. The resultant reaction mixture was cooled at room temperature, and an extraction process was performed thereon three times by using ethyl acetate and water to obtain an organic layer. The organic layer thus obtained was dried by using magnesium sulfate and concentrated, and column chromatography was used for synthesis of Intermediate Compound 28-g (yield: 93%).

(6) Synthesis of Intermediate Compound 28-h 1,3-dibromobenzene (1.2 eq), Intermediate Compound 28-g (1.0 eq), CuI (10 mol %), BPPO ligand (10 mol %), and potassium phosphate tribasic (2.0 eq) were dissolved in DMF (0.1 M) and stirred at 160° C. for 10 hours. The resultant reaction mixture was cooled at room temperature, and DMF was removed under reduced pressure. Then, an extraction process was performed thereon three times by using dichloromethane and water to obtain an organic layer. The organic layer thus obtained was dried by using magnesium sulfate and concentrated, and column chromatography (EA-hexane=1:10, v/v) was used for synthesis of Intermediate Compound 28-h (yield: 71%).

(7) Synthesis of Intermediate Compound 28-i

Intermediate Compound 28-h (1.0 eq), Intermediate Compound 1-b (1.2 eq), $Pd_2(dba)_3$ (5 mol %), Sphos (7 mol %), and sodium tert-butoxide (2.0 eq) were dissolved in toluene (0.1 M) and stirred at 110° C. for 3 hours. The resultant reaction mixture was cooled at room temperature, and DMF was removed under reduced pressure. Then, an extraction process was performed thereon three times by using dichloromethane and water to obtain an organic layer. The organic layer thus obtained was dried by using magnesium sulfate and concentrated, and column chromatography (EA: hexane=1:4, v/v) was used for synthesis of Intermediate Compound 28-i (yield: 68%).

(8) Synthesis of Intermediate Compound 28-j

Intermediate Compound 28-j (1.0 eq) was dissolved in triethyl orthoformate (30 eq), and 37% HCl (1.5 eq) was added thereto and stirred at 80° C. for 12 hours. After cooling at room temperature, triethyl orthoformate was concentrated and extracted three times with dichloromethane and water to obtain an organic layer. The obtained organic layer was dried by using magnesium sulfate and concentrated, and column chromatography (MC, MC:5 vol % methanol) was used for synthesis of Intermediate 28-j (yield: 90%).

(9) Synthesis of Intermediate Compound 28-k

Intermediate Compound 28-j (1.0 eq) and ammonium hexafluorophosphate (3.0 eq) were dissolved in methanol (0.5 M), and distilled water was added thereto and stirred at room temperature for 3 hours to 12 hours. After washing with distilled water and filtering to obtain a solid, an extraction process was performed thereon three times using dichloromethane and water to obtain an organic layer. The organic layer thus obtained was dried by using magnesium sulfate and concentrated for synthesis of Intermediate Compound 28-k (yield of 93%).

(10) Synthesis of Compound 28

Intermediate Compound 28-k, dichloro(1,5-cyclooctadiene)platinum (II) (1.1 eq), and sodium acetate (2.0 eq) were dissolved in anhydrous 1,4-dioxane and stirred under nitrogen condition at 120° C. for 4 days. The reaction mixture was cooled at room temperature, and an extraction process was performed thereon three times by using dichloromethane and water to obtain an organic layer. The organic layer thus obtained was dried by using magnesium sulfate and concentrated, and column chromatography (30 vol % MC:hexane) was used for synthesis of Compound 28 (yield: 20%).

Synthesis Example 5: Synthesis of Compound 37

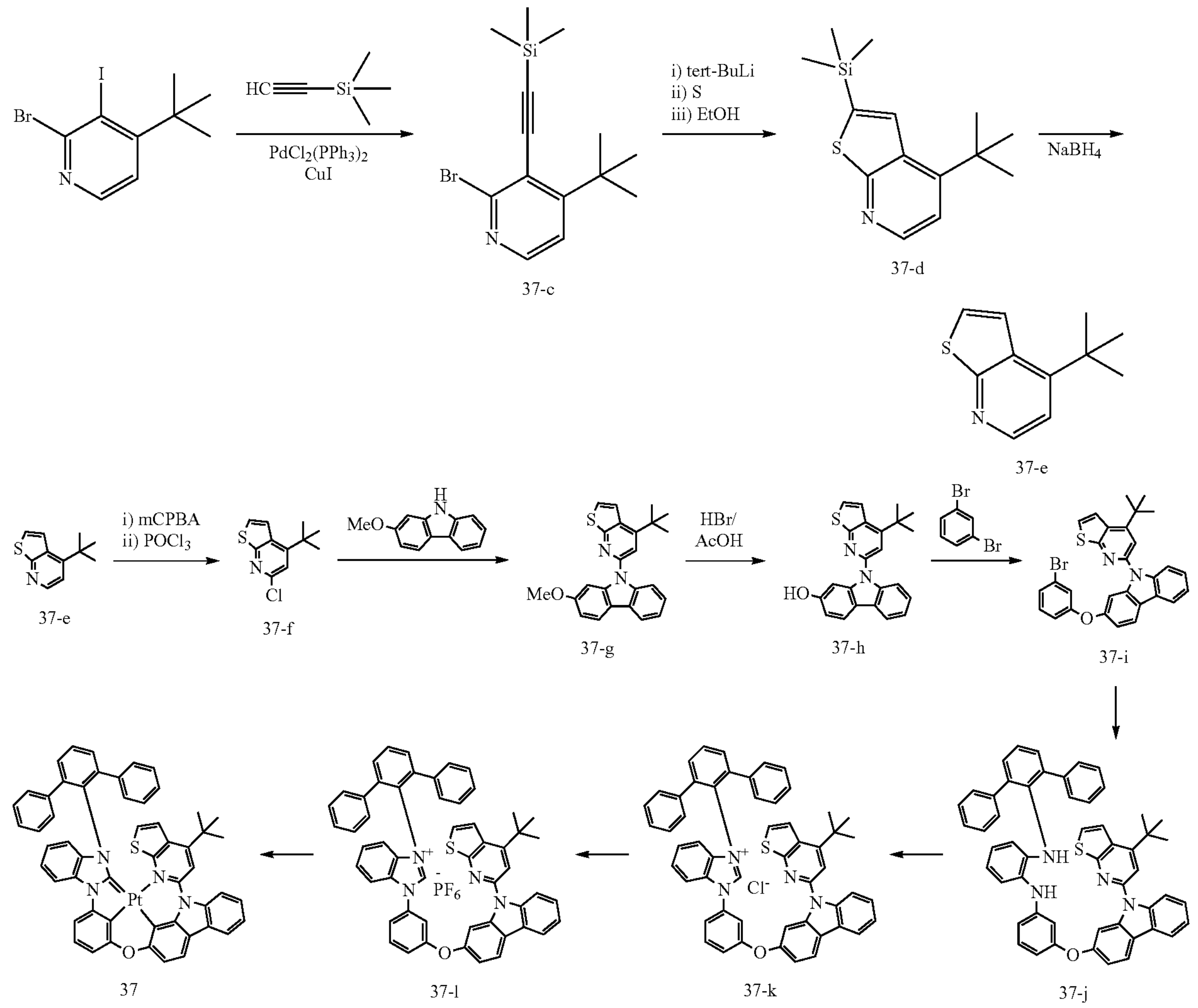

(1) Synthesis of Intermediate Compound 37-c 2-bromo-4-(tert-butyl)-3-iodopyridine (1.0 eq), trimethylsilyl acetylene (1.1 eq), and piperidine (20.0 M) were dissolved in benzene (20.0 M), and bis[triphenylphosphine] palladium dichloride (II) (10 mol %) and copper(I) iodide (20 mol %) were added thereto. The reaction mixture was then stirred at 90° C. for 15 hours. The resultant reaction mixture was cooled at room temperature, and an extraction process was performed thereon three times by using dichloromethane and water to obtain an organic layer. The organic layer thus obtained was dried by using magnesium sulfate and concentrated, and column chromatography was used for synthesis of Intermediate Compound 37-c (yield: 55%).

(2) Synthesis of Intermediate Compound 37-d

Intermediate Compound 37-c (1.0 eq) was dissolved in anhydrous ether, and 1.5 M tert-BuLi in pentane solution (1.1 eq) was slowly added thereto at −80° C. After 1 hour reaction at −80° C., the reaction was allowed for additional 1 hour at −30° C., and then powdered sulfur was added thereto and stirred at room temperature for 2 hours. Ethanol was added to the reaction mixture and stirred at room temperature for 3 hours. An extraction process was performed thereon three times by using dichloromethane and water to obtain an organic layer. The organic layer thus obtained was dried by using magnesium sulfate and concentrated, and column chromatography (n-hexane) was used for synthesis of Intermediate Compound 37-d (yield: 61%).

(3) Synthesis of Intermediate Compound 37-e

Intermediate Compound 37-d (1.0 eq) was dissolved in ethanol at room temperature, and $NaBH_4$ (1.5 eq) was added thereto under nitrogen condition. The reaction mixture was stirred at 80° C. for 12 hours. The resultant reaction mixture was cooled at room temperature, and an extraction process was performed thereon three times by using ethyl acetate and water to obtain an organic layer. The organic layer thus obtained was dried by using magnesium sulfate, concentrated, purified by column chromatography (n-hexane), and recrystallized by using n-pentane, so as to obtain Intermediate Compound 37-e (yield: 45%).

(4) Synthesis of Intermediate Compound 37-f

Intermediate Compound 37-e (1.0 eq) and 3-chloroperbenzoic acid (1.3 eq) were dissolved in dichloromethane and stirred at room temperature for 24 hours. A solution of $POCl_3$ (2.0 eq) diluted in 0.2 M dichloromethane was slowly added to the reaction mixture, and then triethylamine (2.0 eq) was added. After stirring the reaction mixture at room temperature for 1 hour, an extraction process was performed thereon three times by using dichloromethane and water to obtain an organic layer. The organic layer thus obtained was dried by using magnesium sulfate and concentrated, and column chromatography was used for synthesis of Intermediate Compound 37-f (yield: 84%).

(5) Synthesis of Intermediate Compound 37-g 2-methoxycarbazole (1.1 eq), Intermediate Compound 37-f (1.0 eq), $Pd_2(dba)_3$ (5 mol %), Sphos (7 mol %), and sodium tert-butoxide (2.0 eq) were dissolved in toluene (0.1 M) and stirred at 110° C. for 12 hours. The resultant reaction mixture was cooled at room temperature, and an extraction process was performed thereon three times by using dichloromethane and water to obtain an organic layer. The organic layer thus obtained was dried by using magnesium sulfate and concentrated, and column chromatography was used for synthesis of Intermediate Compound 37-g (yield: 75%).

(6) Synthesis of Intermediate Compound 37-h

Intermediate Compound 37-g (1.0 eq), HBr, and acetic acid were stirred at 120° C. for 16 hours. The resultant reaction mixture was cooled at room temperature, and an extraction process was performed thereon three times by using ethyl acetate and water to obtain an organic layer. The organic layer thus obtained was dried by using magnesium sulfate and concentrated, and column chromatography was used for synthesis of Intermediate Compound 37-h (yield: 85%).

(7) Synthesis of Intermediate Compound 37-i 1,3-dibromobenzene (1.2 eq), Intermediate Compound 37-h (1.0 eq), CuI (10 mol %), BPPO ligand (10 mol %), and potassium phosphate tribasic (2.0 eq) were dissolved in DMF (0.1 M) and stirred at 160° C. for 10 hours. The resultant reaction mixture was cooled at room temperature, and DMF was removed under reduced pressure. Then, an extraction process was performed thereon three times by using dichloromethane and water to obtain an organic layer. The organic layer thus obtained was dried by using magnesium sulfate and concentrated, and column chromatography (EA:hexane=1:10, v/v) was used for synthesis of Intermediate Compound 37-i (yield: 56%).

(8) Synthesis of Intermediate Compound 37-j

Intermediate Compound 37-i (1.0 eq), Intermediate Compound 1-b (1.2 eq), $Pd_2(dba)_3$ (5 mol %), Sphos (7 mol %), and sodium tert-butoxide (2.0 eq) were dissolved in toluene (0.1 M) and stirred at 110° C. for 3 hours. The resultant reaction mixture was cooled at room temperature, and DMF was removed under reduced pressure. Then, an extraction process was performed thereon three times by using dichloromethane and water to obtain an organic layer. The organic layer thus obtained was dried by using magnesium sulfate and concentrated, and column chromatography (EA: hexane=1:4, v/v) was used for synthesis of Intermediate Compound 37-j (yield: 56%).

(9) Synthesis of Intermediate Compound 37-k

Intermediate Compound 37-j (1.0 eq) was dissolved in triethyl orthoformate (30 eq), and 37% HCl (1.5 eq) was added thereto and stirred at 80° C. for 12 hours. After cooling at room temperature, triethyl orthoformate was concentrated and extracted three times with dichloromethane and water to obtain an organic layer. The obtained organic layer was dried by using magnesium sulfate and concentrated, and column chromatography (MC, MC:5 vol % methanol) was used to obtain Intermediate compound 37-k (yield: 85%).

(10) Synthesis of Intermediate Compound 37-l

Intermediate Compound 37-k (1.0 eq) and ammonium hexafluorophosphate (3.0 eq) were dissolved in methanol (0.5 M), and distilled water was added thereto and stirred at room temperature for 3 hours to 12 hours. After washing with distilled water and filtering to obtain a solid, an extraction process was performed thereon three times using dichloromethane and water to obtain an organic layer. The organic layer thus obtained was dried by using magnesium sulfate and concentrated for synthesis of Intermediate Compound 37-l (yield of 90%).

(11) Synthesis of Compound 37

Intermediate Compound 37-l, dichloro(1,5-cyclooctadiene)platinum (II) (1.1 eq), and sodium acetate (2.0 eq) were dissolved in anhydrous 1,4-dioxane and stirred under nitrogen condition at 120° C. for 4 days. The reaction mixture was cooled at room temperature, and an extraction process was performed thereon three times by using dichloromethane and water to obtain an organic layer. The organic layer thus obtained was dried by using magnesium sulfate and concentrated, and column chromatography (30 vol % MC:hexane) was used for synthesis of Compound 37 (yield: 19%).

Synthesis Example 6: Synthesis of Compound 46

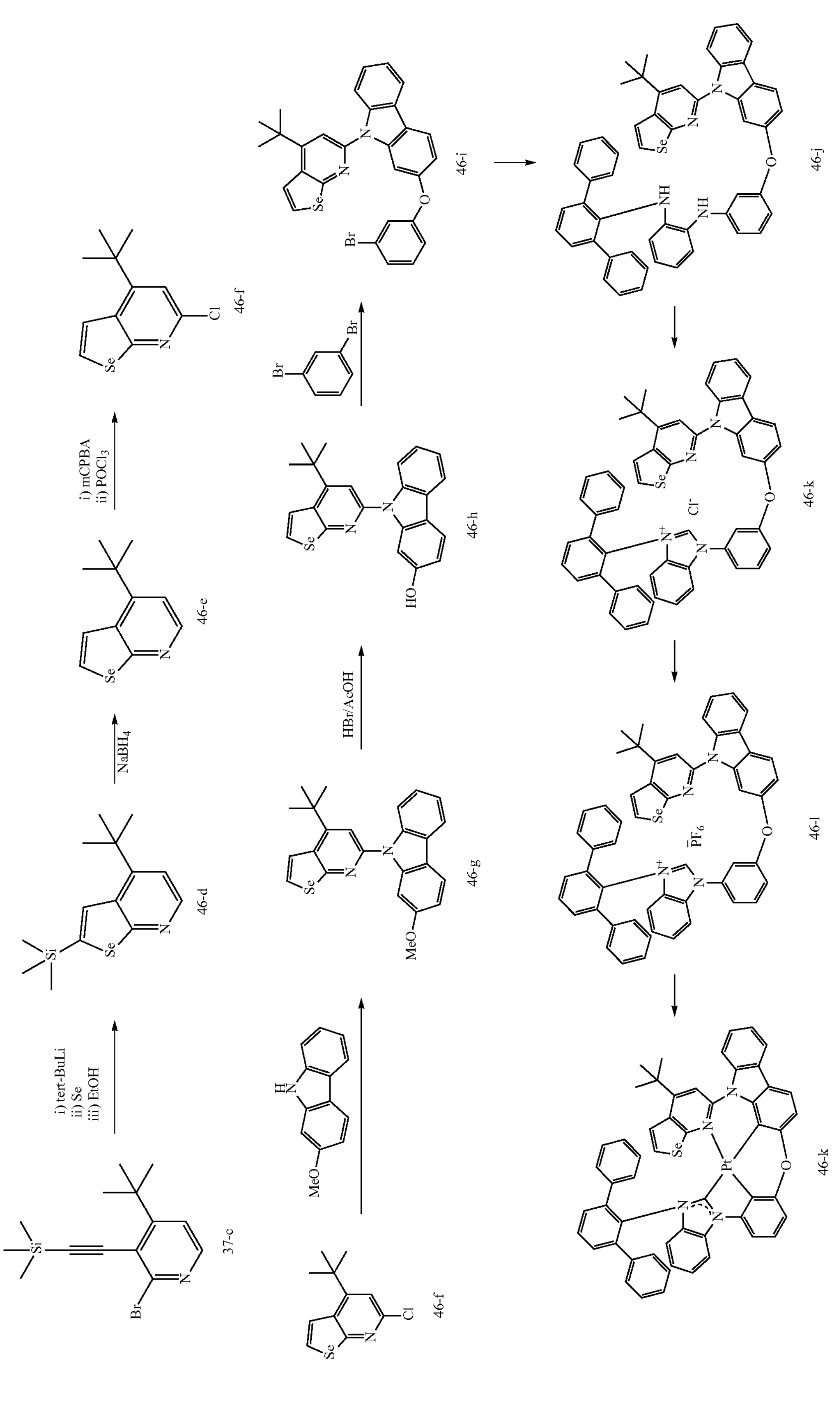
37-c
46-d
46-e
46-f
46-f
46-g
46-h
46-i
46-j
46-k
46-l
46-k (1) Synthesis of Intermediate Compound 46-d Intermediate Compound 37-c (1.0 eq) was dissolved in anhydrous ether, and 1.5 M tert-BuLi in pentane solution (1.1 eq) was slowly added thereto at −80° C. After 1 hour reaction at −80° C., the reaction was allowed for additional 1 hour at −30° C., and then powdered selenium was added thereto and stirred at room temperature for 2 hours. Ethanol was added to the reaction mixture and stirred at room temperature for 3 hours. An extraction process was performed thereon three times by using dichloromethane and water to obtain an organic layer. The organic layer thus obtained was dried by using magnesium sulfate and concentrated, and column chromatography (n-hexane) was used for synthesis of Intermediate Compound 46-d (yield: 57%).

(2) Synthesis of Compound 46

Compound 46 was synthesized in substantially the same manner as in the synthesis of Intermediate Compounds 37-e to Compound 37, except for using corresponding intermediate compounds resulting from Intermediate Compound 46-d.

TABLE 1

| | | MS/FAB | |
|---|---|---|---|
| | $^1$H NMR ($CDCl_3$, 500 MHz) | found | calc. |
| Compound 1 | 8.39 (1H, dd), 8.20 (2H, s), 8.19 (1H, s), 7.58 (1H, dd), 7.50 (1H, s), 7.43 (4H, m), 7.41 (2H, m), 7.39 (1H, s), 7.25 (1H, dd), 7.20 (1H, s), 7.17 (1H, s), 7.14 (2H, dd), 7.08 (4H, m), 6.95 (4H, m), 6.66 (1H, s), 6.60 (1H, s), 5.20 (1H, d), 1.35 (9H, s) | 1081.66 | 1081.61 |
| Compound 2 | 8.40 (1H, dd), 8.19 (3H, m), 7.58 (1H, dd), 7.50 (1H, s), 7.43 (4H, m), 7.41 (2H, m), 7.25 (1H, dd), 7.20 (1H, s), 7.17 (1H, s), 7.14 (2H, dd), 7.08 (4H, m), 6.95 (4H, m), 6.66 (1H, s), 6.60 (1H, s), 5.20 (1H, d), 1.35 (9H, s), 1.32 (9H, s) | 1137.7 | 1137.72 |
| Compound 10 | 8.39 (1H, d), 8.20 (2H, m), 8.19 (1H, s), 7.58 (1H, dd), 7.50 (1H, s), 7.43 (4H, m), 7.41 (2H, m), 7.39 (1H, s), 7.20 (1H, s), 7.19 (1H, dd), 7.17 (1H, s), 7.14 (2H, s), 7.08 (4H, m), 6.95 (2H, m), 6.90 (1H, s), 6.80 (1H, s), 6.69 (1H, s), 6.66 (1H, s), 5.50 (1H, d), 1.35 (9H, s) | 1081.63 | 1081.61 |
| Compound 28 | 8.39 (1H, dd), 8.20-8.19 (3H, m), 7.58 (1H, dd), 7.50 (1H, s), 7.43 (4H, m), 7.41 (2H, m), 7.39 (1H, s), 7.25 (1H, dd), 7.20 (1H, s), 7.17 (1H, s), 7.14 (2H, dd), 7.08 (4H, m), 6.95 (4H, m), 6.66 (1H, s), 6.60 (1H, s), 5.20 (1H, d), 1.33 (9H, s) | 970.13 | 970.01 |
| Compound 37 | 8.39 (1H, dd), 8.20 (2H, s), 8.19 (1H, s), 7.58 (1H, dd), 7.50 (1H, s), 7.43 (4H, m), 7.41 (2H, m), 7.39 (1H, s), 7.25 (1H, dd), 7.20 (1H, s), 7.17 (1H, s), 7.14 (2H, dd), 7.08 (4H, m), 6.95 (4H, m), 6.66 (1H, s), 6.60 (1H, s), 5.20 (1H, d), 1.33 (9H, s) | 986.00 | 986.07 |
| Compound 46 | 8.39 (1H, dd), 8.20 (2H, s), 8.19 (1H, s), 7.58 (1H, dd), 7.50 (1H, s), 7.43 (4H, m), 7.41 (2H, m), 7.39 (1H, s), 7.25 (1H, dd), 7.20 (1H, s), 7.17 (1H, s), 7.14 (2H, dd), 7.08 (4H, m), 6.95 (4H, m), 6.66 (1H, s), 6.60 (1H, s), 5.20 (1H, d), 1.35 (9H, s) | 1032.85 | 1032.98 |

Evaluation Example 1

By using the DFT method of the Gaussian 09 program (with the structure optimization at the level of B3LYP, 6-311G(d,p)), $^3$MLCT, $\lambda_{max}^{sim}$, $\lambda_{max}^{exp}$, $^3$MC state of the compounds synthesized according to Synthesis Examples above were evaluated. The evaluation results are shown in Table 2.

TABLE 2

| | $^3$MLCT (%) | $\lambda_{max}^{sim}$ (nm) | $\lambda_{max}^{exp}$ (nm) | $^3$MC (kcal/mol) |
|---|---|---|---|---|
| Compound 1 | 13.2 | 466 | 460 | 0.81 |
| Compound 2 | 12.5 | 467 | 460 | 0.77 |
| Compound 10 | 12.0 | 468 | 460 | 0.65 |
| Compound 28 | 14.1 | 471 | 462 | 0.83 |
| Compound 37 | 11.7 | 465 | 461 | 0.43 |
| Compound 46 | 10.2 | 467 | 460 | 0.31 |
| Comparative Compound A | 8.8 | 468 | 471 | 0.21 |

Evaluation Example 2

Regarding Compounds 1, 2, 10, 28, 37, and 46 and Comparative Compound A, the highest occupied molecular orbital (HOMO) and lowest unoccupied molecular orbital (LUMO) energy levels of each compound were evaluated according to the methods described in Table 3. Then, the decay time of each compound was measured, and results were shown in Table 4.

TABLE 3

| | |
|---|---|
| HOMO energy level evaluation method | By using cyclic voltammetry (CV) (electrolyte: 0.1M $Bu_4NPF_6$/solvent: dimethylformamide (DMF)/ electrode: 3-electrode system (working electrode: GC, reference electrode: Ag/AgCl, and auxiliary electrode: Pt)), the potential (V)-current (A) |

TABLE 3-continued

| | |
|---|---|
| | graph of each compound was obtained, and then, from the oxidation onset of the graph, the HOMO energy level of each compound was calculated. |
| LUMO energy level evaluation method | By using cyclic voltammetry (CV) (electrolyte: 0.1M $Bu_4NPF_6$/solvent: dimethylformamide (DMF)/ electrode: 3-electrode system (working electrode: GC, reference electrode: Ag/AgCl, and auxiliary electrode: Pt)), the potential (V)-current (A) graph of each compound was obtained, and then, from the reduction onset of the graph, the LUMO energy level of each compound was calculated. |

TABLE 4

| | HOMO | LUMO | Decay time (μs) |
|---|---|---|---|
| Compound 1 | −4.91 | −1.39 | 2.4 |
| Compound 2 | −4.91 | −1.52 | 2.5 |
| Compound 10 | −4.90 | −1.46 | 2.2 |
| Compound 28 | −4.89 | −1.45 | 2.3 |
| Compound 37 | −4.92 | −1.43 | 2.4 |
| Compound 46 | −4.90 | −1.47 | 2.4 |
| Comparative Compound A | −4.88 | −1.50 | 2.9 |

Example 1

As an anode, a glass substrate (product of Corning, Inc.) with a 15 $\Omega/cm^2$ (1,200 Å) ITO formed thereon was cut to a size of 50 mm×50 mm×0.7 mm, sonicated using isopropyl alcohol and pure water each for 5 minutes, washed by irradiation of ultraviolet rays and exposure of ozone thereto for 30 minutes, and then mounted on a vacuum deposition apparatus.

2-TNATA was vacuum-deposited on the anode to form a hole injection layer having a thickness of 600 Å, and 4,4'-bis[N-(1-naphthyl)-N-phenylamino]biphenyl (hereinafter, referred to as "NPB") was vacuum-deposited on the hole injection layer to form a hole transport layer having a thickness of 300 Å.

Compound 1 (as first compound), Compound ETH29 (as second compound), and Compound HTH29 (as third compound) were vacuum-deposited on the hole transport layer to form an emission layer having a third compound of 400 Å. Here, an amount of Compound 1 was 10 wt % based on a total weight (100 wt %) of the emission layer, and a weight ratio of Compound ETH29 to Compound HTH29 was adjusted to 3:7.

Compound ET37 was vacuum-deposited on the emission layer to form a hole blocking layer having a thickness of 50 Å, $Alq_3$ was vacuum-deposited on the hole blocking layer to form an electron transport layer having a thickness of 300 Å, LiF was vacuum-deposited on the electron transport layer to form an electron injection layer having a thickness of 10 Å, and then Al was vacuum-deposited on the electron injection layer to form a cathode having a thickness of 3,000 Å, thereby completing manufacture of an organic light-emitting device.

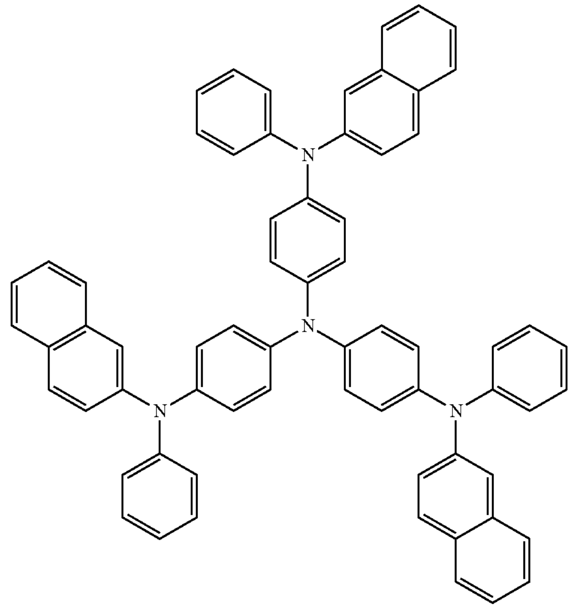

2-TNATA

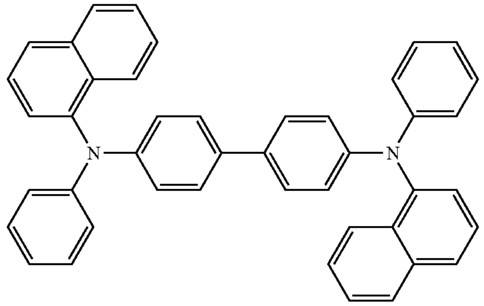

NPB

HTH29

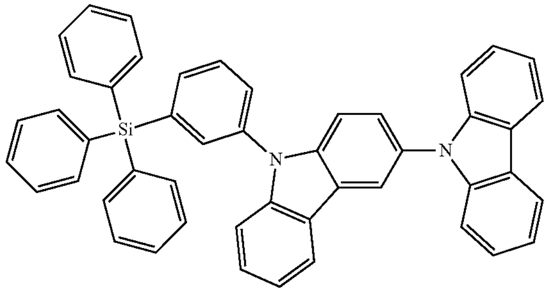

-continued

ETH29

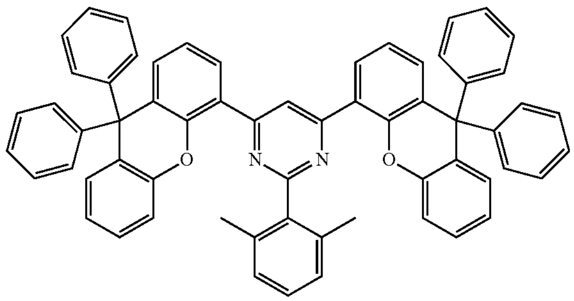

ET37

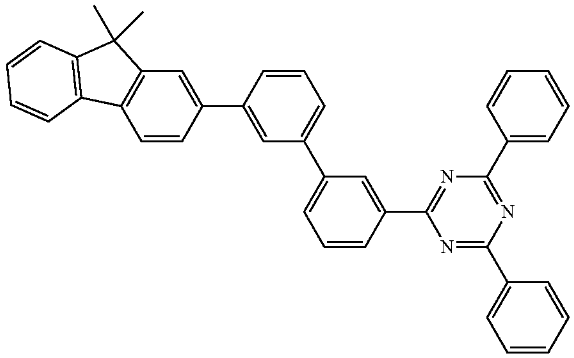

Examples 2 to 8 and Comparative Example 1

Organic light-emitting devices were manufactured in substantially the same manner as in Example 1, except that, in forming an emission layer, compounds shown in Table 5 were respectively used as the first compound, the second compound, the third compound, and the fourth compound.

Evaluation Example 3

The driving voltage (V) at 1,000 cd/m$^2$, color purity (CIEx,y), luminescence efficiency (cd/A), color conversion efficiency (cd/Ay), maximum emission wavelength (nm), and lifespan ($T_{95}$) of the organic light-emitting devices manufactured according to Examples 1 to 8 and Comparative Example 1 were each measured by using a Keithley SMU 236 and a luminance meter PR650, and results thereof are shown in Table 5. In Table 5, the lifespan ($T_{90}$) is a measure of the time taken when the luminance reaches 90% of the initial luminance.

TABLE 5

| | Emission layer | | | | | | | | | | |
|---|---|---|---|---|---|---|---|---|---|---|---|
| | First compound | Second compound | Third compound | Second compound:Third compound (weight ratio) | Fourth compound Amount relative to total emission layer (wt %) | Luminance (cd/m$^2$) | Driving voltage (V) | Luminescence efficiency (cd/A) | Color conversion efficiency (cd/A/y) | Maximum emission wavelength (nm) | Lifespan ($T_{90}$, time) |
| Example 1 | Compound 1 | ETH29 | HTH29 | 3:7 | — — | 1000 | 4.8 | 21.1 | 148 | 460 | 30 |
| Example 2 | Compound 2 | ETH66 | HTH41 | 3:7 | — — | 1000 | 4.9 | 23.7 | 166 | 461 | 29 |
| Example 3 | Compound 10 | ETH29 | HTH29 | 3:7 | — — | 1000 | 4.9 | 21.7 | 152 | 460 | 29 |
| Example 4 | Compound 28 | ETH29 | HTH29 | 3:7 | — — | 1000 | 4.9 | 20.1 | 141 | 462 | 42 |
| Example 5 | Compound 37 | ETH29 | HTH29 | 3:7 | — — | 1000 | 4.8 | 20.8 | 146 | 462 | 19 |
| Example 6 | Compound 46 | ETH29 | HTH29 | 3:7 | — — | 1000 | 4.9 | 20.5 | 144 | 461 | 17 |
| Example 7 | Compound 1 | ETH29 | HTH29 | 3:7 | DFD1 0.5 | 1000 | 4.9 | 34.6 | 242 | 461 | 51 |
| Example 8 | Compound 2 | ETH29 | HTH29 | 3:7 | DFD2 0.5 | 1000 | 4.9 | 35.9 | 251 | 460 | 49 |
| Comparative Example 1 | Compound A | ETH29 | HTH29 | | — | 1000 | 5.0 | 18.1 | 99 | 471 | 15 |

1
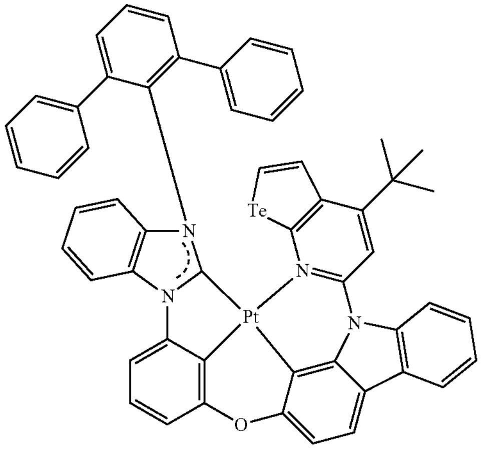
2
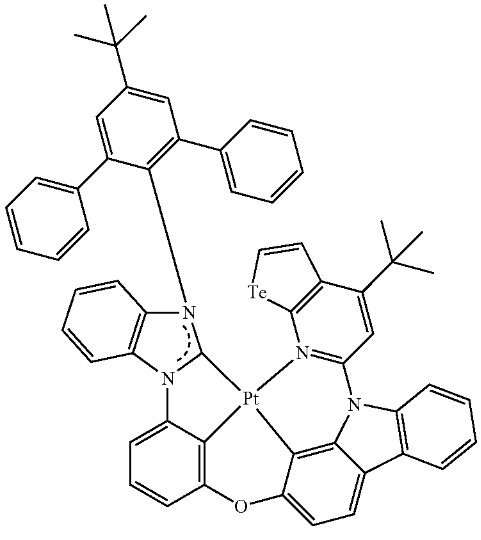
10
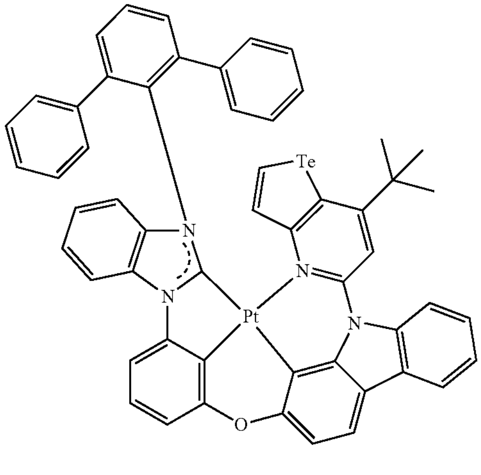
-continued
28
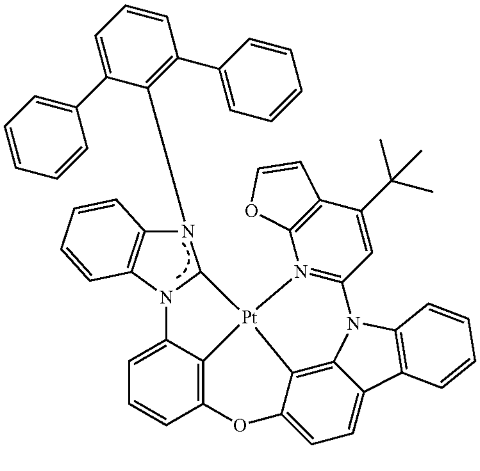
37
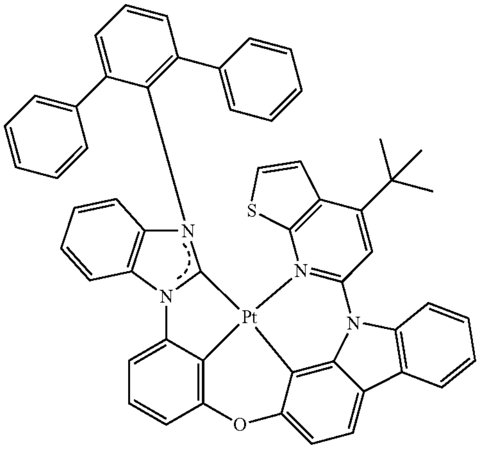
46
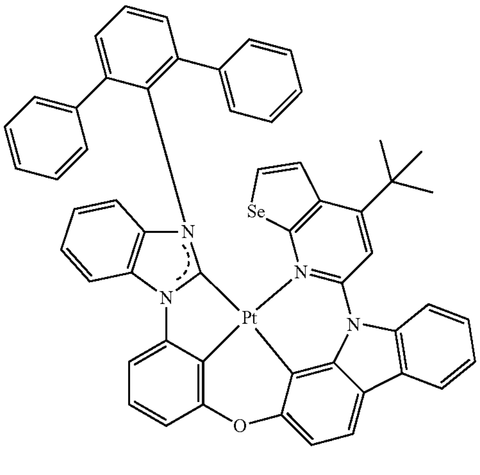

-continued

Compound A

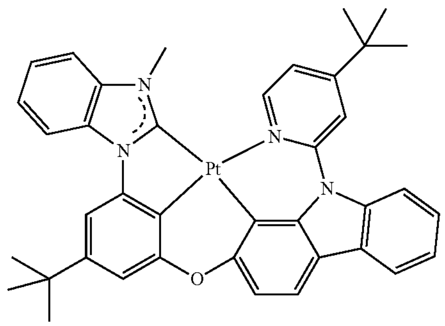

HTH29

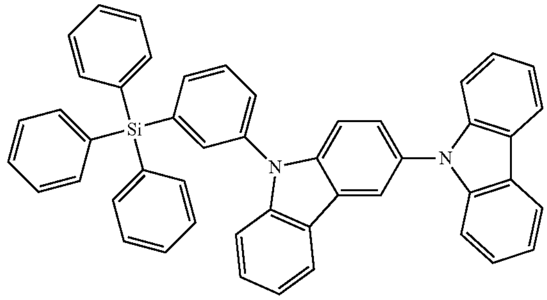

HTH41

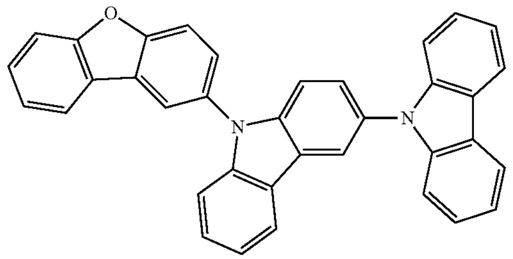

ETH29

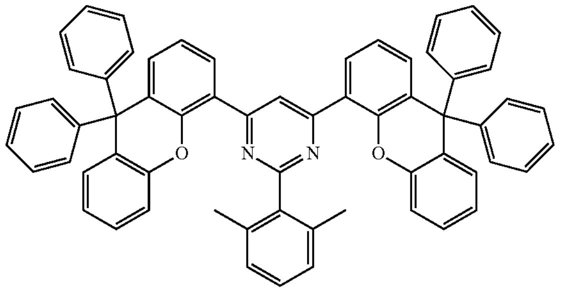

-continued

ETH66

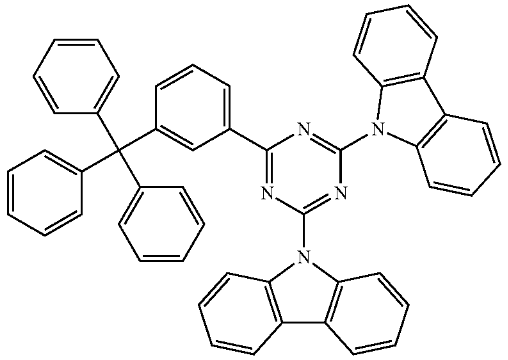

DFD1

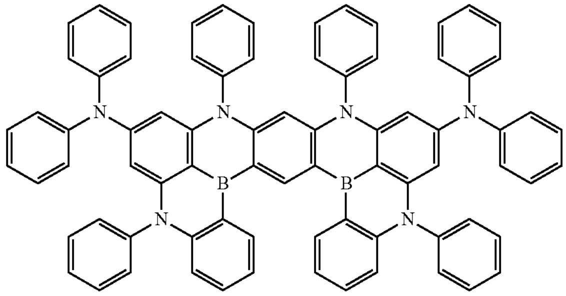

DFD2

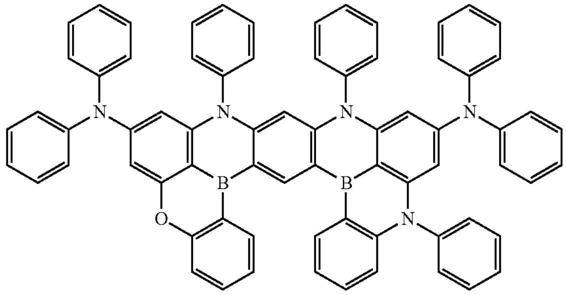

Referring to Table 5, it was confirmed that the organic light-emitting devices of Example 1 to 8 had excellent or improved characteristics in terms of driving voltage, color purity, luminescence efficiency, color conversion efficiency, and lifespan, as compared to the organic light-emitting device of Comparative Example 1.

As described above, according to the one or more embodiments, the use of the organometallic compound may enable the manufacture of a light-emitting device having a long lifespan and a high-quality electronic apparatus including the light-emitting device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and their equivalents.

The invention claimed is:

1. A light-emitting device comprising:

a first electrode;

a second electrode facing the first electrode; and an interlayer between the first electrode and the second electrode, the interlayer comprising an emission layer; and an organometallic compound represented by Formula 1:

Formula 1

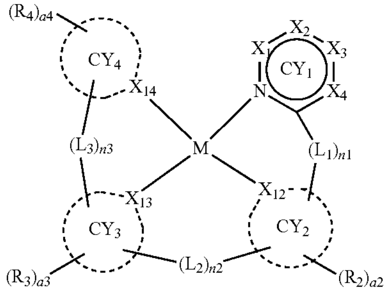

Formula 1A

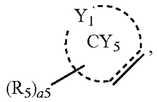

wherein, in Formulae 1 and 1A,

M is platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm), $X_1$ is $C(Z_1)$ or N, $X_2$ is $C(Z_2)$ or N, $X_3$ is $C(Z_3)$ or N, $X_4$ is $C(Z_4)$ or N, i) $X_1$ is $C(Z_1)$, $X_2$ is $C(Z_2)$, and $Z_1$ and $Z_2$ are linked to each other to form ring $CY_5$ represented by Formula 1A, ii) $X_2$ is $C(Z_2)$, $X_3$ is $C(Z_3)$, and $Z_2$ and $Z_3$ are linked to each other to form ring $CY_5$ represented by Formula 1A, or iii) $X_3$ is $C(Z_3)$, $X_4$ is $C(Z_4)$, and $Z_3$ and $Z_4$ are linked to each other to form ring $CY_5$ represented by Formula 1A, ring $CY_1$ in Formula 1 and ring $CY_5$ represented by Formula 1A are condensed with each other,

 in Formula 1A indicates a single bond or a double bond, ring $CY_5$ is a $C_1$-$C_{30}$ heterocyclic group, $Y_1$ is Te, O, S, or Se, ring $CY_2$ to ring $CY_4$ are each independently a $C_5$-$C_{30}$ carbocyclic group or a $C_1$-$C_{30}$ heterocyclic group, $X_{12}$ and $X_{13}$ are each independently C or N, $X_{14}$ is C, $L_1$ to $L_3$ are each independently a single bond, *—$C(R_{1a})(R_{1b})$—*', *—$C(R_{1b})$=*', *=$C(R_{1a})$—*', *—$C(R_{1a})$=$C(R_{1b})$—*', *—C(=O)—*', *—C(=S)—*', *—C≡C—*', *—$B(R_{1a})$—*', *—$N(R_{1a})$—*', *—O—*', *—$P(R_{1a})$—*', *—$Si(R_{1a})(R_{1b})$—*', *—P(=O)$(R_{1a})$—*', *—S—*', *—S(=O)—*', *—$S(=O)_2$—*', or *—$Ge(R_{1a})(R_{1b})$—*', wherein * and *' each indicate a binding site to a neighboring atom, n1 to n3 are each independently an integer from 1 to 5, $Z_1$ to $Z_4$, $R_2$ to $R_5$, $R_{1a}$, and $R_{1b}$ are each independently hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —C(=O)$(Q_1)$, —$S(=O)_2(Q_1)$, or —P(=O)$(Q_1)(Q_2)$, a2 to a5 are each independently an integer from 0 to 10, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —C(=O)$(Q_{11})$, —$S(=O)_2(Q_{11})$, —P(=O)$(Q_{11})(Q_{12})$, or any combination thereof;

a $C_6$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$—$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —C(=O)$(Q_{21})$, —$S(=O)_2(Q_{21})$, —P(=O)$(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —C(=O)$(Q_{31})$, —$S(=O)_2(Q_{31})$, or —P(=O)$(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, wherein $X_1$ is $C(Z_1)$, $X_2$ is $C(Z_2)$, $X_3$ is $C(Z_3)$, and $X_4$ is $C(Z_4)$, i) $Z_1$ and $Z_2$ are linked to each other to form ring $CY_5$ represented by Formula 1A, and at least one selected from $Z_3$ and $Z_4$ is not hydrogen, ii) $Z_2$ and $Z_3$ are linked to each other to form ring $CY_5$ represented by Formula 1A, and at least one selected from $Z_1$ and $Z_4$ is not hydrogen, or iii) $Z_3$ and $Z_4$ are linked to each other to form ring $CY_5$ represented by Formula 1A, and at least one selected from $Z_1$ and $Z_2$ is not hydrogen.

2. The light-emitting device of claim 1, wherein the first electrode is an anode, the second electrode is a cathode, the interlayer further comprises a hole transport region between the first electrode and the emission layer, and an electron transport region between the emission layer and the second electrode, the hole transport region comprises a hole injection layer, a hole transport layer, an emission auxiliary layer, an electron blocking layer, or any combination thereof, and the electron transport region comprises a hole blocking layer, an electron transport layer, an electron injection layer, or any combination thereof.

3. The light-emitting device of claim 1, wherein the organometallic compound represented by Formula 1 has a $^3$MLCT value of about 10% or more.

4. The light-emitting device of claim 1, wherein the organometallic compound represented by Formula 1 has an energy value in a $^3$MC state of about 0.3 kcal/mol or more.

5. The light-emitting device of claim 1, wherein the emission layer is to emit blue light.

6. The light-emitting device of claim 1, wherein the emission layer comprises a host and a dopant, and the dopant comprises the organometallic compound represented by Formula 1.

7. The light-emitting device of claim 1, wherein the interlayer further comprises:

i) a first compound being the organometallic compound represented by Formula 1; and ii) a second compound comprising at least one π electron-deficient nitrogen-containing $C_1$-$C_{60}$ cyclic group, a third compound comprising a group represented by Formula 3, a fourth compound to emit delayed fluorescence, or any combination thereof, and the first compound, the second compound, the third compound, and the fourth compound are different from each other Formula 3

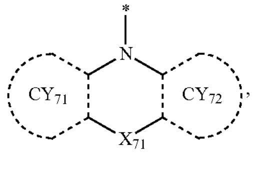

and wherein ring $CY_{71}$ and ring $CY_{72}$ in Formula 3 are each independently a π electron-rich $C_3$-$C_{60}$ cyclic group or a pyridine group, $X_{71}$ in Formula 3 is a single bond, or a linking group comprising O, S, N, B, C, Si, or any combination thereof,

* in Formula 3 indicates a binding site to a neighboring atom in the third compound, and the third compound does not comprise the following compounds:

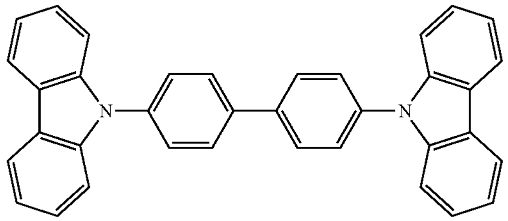

CBP

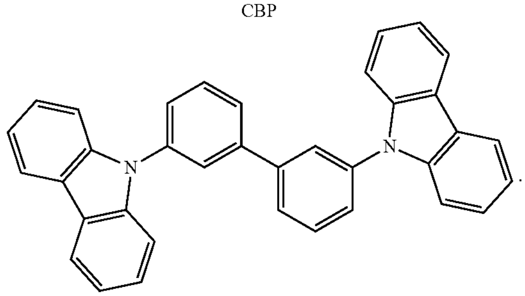

mCBP

8. An electronic apparatus comprising the light-emitting device of claim 1.

9. The electronic apparatus of claim 8, further comprising: a thin-film transistor, wherein the thin-film transistor comprises a source electrode and a drain electrode, and the first electrode of the light-emitting device is electrically connected to at least one selected from the source electrode and the drain electrode of the thin-film transistor.

10. The electronic apparatus of claim 8, further comprising:

a color filter, a color conversion layer, a touch screen layer, a polarizing layer, or any combination thereof.

11. An organometallic compound represented by Formula 1:

Formula 1

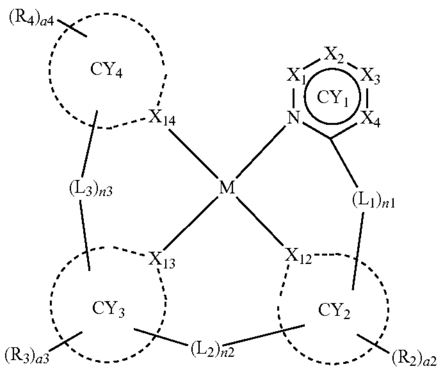

Formula 1A

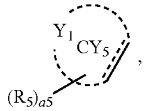

wherein, in Formulae 1 and 1A,

M is platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm), $X_1$ is $C(Z_1)$ or N, $X_2$ is $C(Z_2)$ or N, $X_3$ is $C(Z_3)$ or N, $X_4$ is $C(Z_4)$ or N, i) $X_1$ is $C(Z_1)$, $X_2$ is $C(Z_2)$, and $Z_1$ and $Z_2$ are linked to each other to form ring $CY_5$ represented by Formula 1A, ii) $X_2$ is $C(Z_2)$, $X_3$ is $C(Z_3)$, and $Z_2$ and $Z_3$ are linked to each other to form ring $CY_5$ represented by Formula 1A, or iii) $X_3$ is $C(Z_3)$, $X_4$ is $C(Z_4)$, and $Z_3$ and $Z_4$ are linked to each other to form ring $CY_5$ represented by Formula 1A, ring $CY_1$ in Formula 1 and ring $CY_5$ represented by Formula 1A are condensed with each other,

 in Formula 1A indicates a single bond or a double bond, ring $CY_5$ is a $C_1$-$C_{30}$ heterocyclic group, $Y_1$ is Te, O, S, or Se, ring $CY_2$ to ring $CY_4$ are each independently a $C_5$-$C_{30}$ carbocyclic group or a $C_1$-$C_{30}$ heterocyclic group, $X_{12}$ and $X_{13}$ are each independently C or N, $X_{14}$ is C, $L_1$ to $L_3$ are each independently a single bond, *—$C(R_{1a})(R_{1b})$—*', *—$C(R_{1a})$=*', *=$C(R_{1a})$—*', *—$C(R_{1a})$=$C(R_{1b})$—*', *—C(=O)—*', *—C(=S)—*', *—C≡C—*', *—$B(R_{1a})$—*', *—$N(R_{1a})$—*', *—O—*', *—$P(R_{1a})$—*', *—$Si(R_{1a})(R_{1b})$—*', *—P(=O)$(R_{1a})$—*', *—S—*', *—S(=O)—*', *—$S(=O)_2$—*', or *—$Ge(R_{1a})(R_{1b})$—*', wherein * and *' each indicate a binding site to a neighboring atom, n1 to n3 are each independently an integer from 1 to 5, $Z_1$ to $Z_4$, $R_2$ to $R_5$, $R_{1a}$, and $R_{1b}$ are each independently hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —C(=O)$(Q_1)$, —$S(=O)_2(Q_1)$, or —P(=O)$(Q_1)(Q_2)$, a2 to a5 are each independently an integer from 0 to 10, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —C(=O)$(Q_{11})$, —$S(=O)_2(Q_{11})$, —P(=O)$(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, $B(Q_{21})(Q_{22})$, —C(=O)$(Q_{21})$, —$S(=O)_2(Q_{21})$, —P(=O)$(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —C(=O)$(Q_{31})$, —$S(=O)_2(Q_{31})$, or —P(=O)$(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, wherein $X_1$ is $C(Z_1)$, $X_2$ is $C(Z_2)$, $X_3$ is $C(Z_3)$, and $X_4$ is $C(Z_4)$, i) $Z_1$ and $Z_2$ are linked to each other to form ring $CY_5$ represented by Formula 1A, and at least one selected from $Z_3$ and $Z_4$ is not hydrogen, ii) $Z_2$ and $Z_3$ are linked to each other to form ring $CY_5$ represented by Formula 1A, and at least one selected from $Z_1$ and $Z_4$ is not hydrogen, or iii) $Z_3$ and $Z_4$ are linked to each other to form ring $CY_5$ represented by Formula 1A, and at least one selected from $Z_1$ and $Z_2$ is not hydrogen.

12. The organometallic compound of claim 11, wherein ring $CY_5$ is a $Y_1$-containing pentagonal ring.

13. The organometallic compound of claim 11, wherein a group represented by

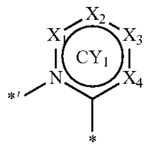

in Formula 1 is one of groups represented by Formulae CY1(4) to CY1(12), CY(16) to CY(24), and CY(28) to CY1(36):

CY1(4)

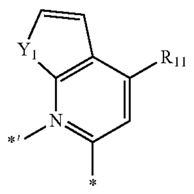

CY1(5)

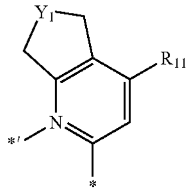

-continued
CY1(6)
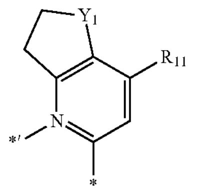
CY1(7)
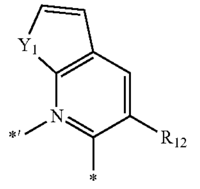
CY1(8)
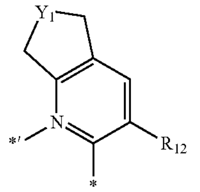
CY1(9)
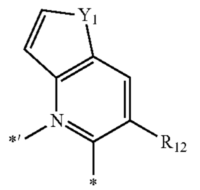
CY1(10)
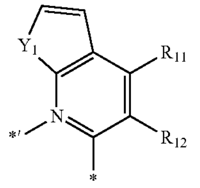
CY1(11)
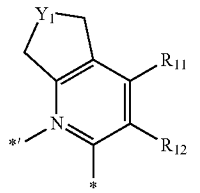
CY1(12)
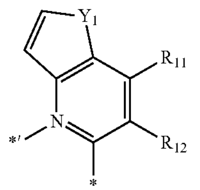
CY1(16)
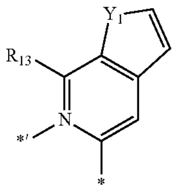
-continued
CY1(17)
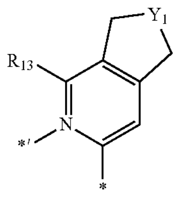
CY1(18)
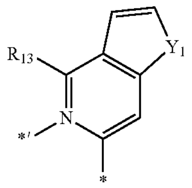
CY1(19)
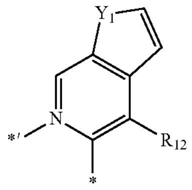
CY1(20)
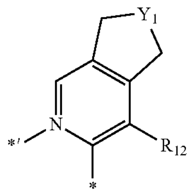
CY1(21)
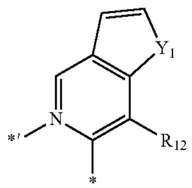
CY1(22)
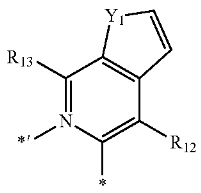
CY1(23)
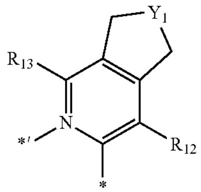
CY1(24)
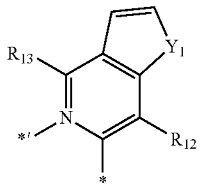

-continued

CY1(28)

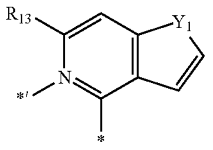

CY1(29)

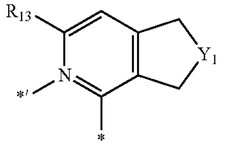

CY1(30)

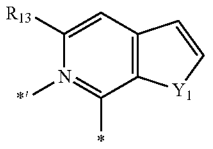

CY1(31)

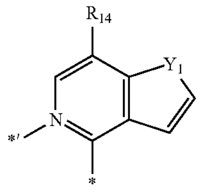

CY1(32)

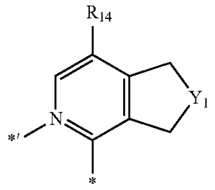

CY1(33)

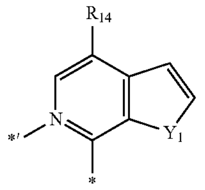

CY1(34)

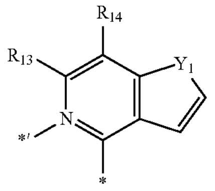

CY1(35)

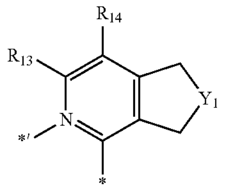

-continued

CY1(36)

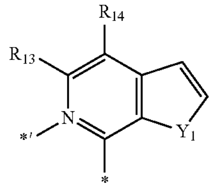

, and wherein, in Formulae CY1(1) to CY1(36), $R_{11}$ to $R_{14}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), $Y_1$, $R_{10a}$, and $Q_1$ to $Q_3$ are respectively as described in Formulae 1 and 1A, and

* and *' each indicate a binding site to a neighboring atom.

14. The organometallic compound of claim 11, wherein ring $CY_2$ and ring $CY_4$ are each independently a $C_1$-$C_{30}$ heterocyclic group, and ring $CY_3$ is a $C_5$-$C_{30}$ carbocyclic group.

15. The organometallic compound of claim 11, wherein a group represented by

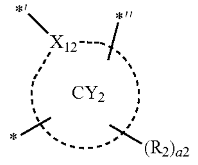

in Formula 1 is one of groups represented by Formulae CY2(1) to CY2(7):

CY2(1)

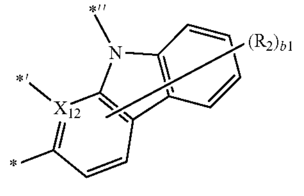

CY2(2)

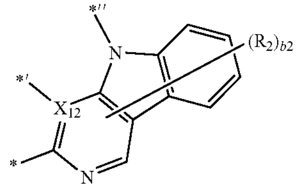

-continued

CY2(3)

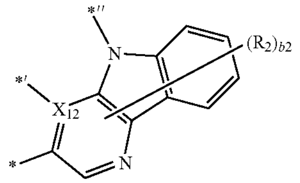

CY2(4)

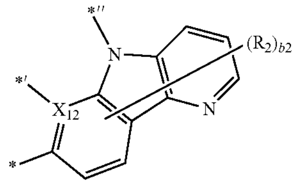

CY2(5)

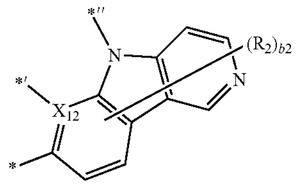

CY2(6)

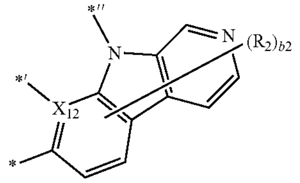

CY2(7)

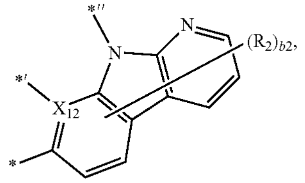

and wherein, in Formulae CY2(1) to CY2(7), b1 is an integer from 0 to 6, b2 is an integer from 0 to 5, $X_{12}$ and $R_2$ are respectively as described in Formulae 1 and 1A, and

* , *', and *" each indicate a binding site to a neighboring atom.

16. The organometallic compound of claim 11, wherein a group represented by

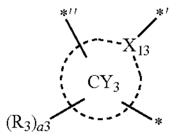

in Formula 1 is one of groups represented by Formulae CY3(1) to CY3(8):

CY3(1)

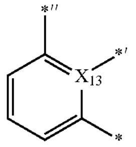

CY3(2)

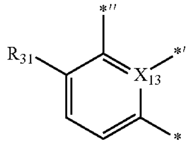

CY3(3)

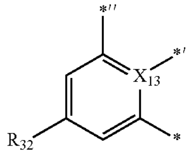

CY3(4)

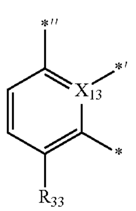

CY3(5)

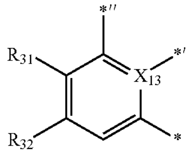

CY3(6)

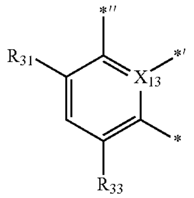

CY3(7)

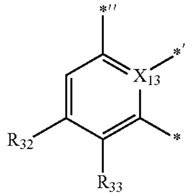

CY3(8)

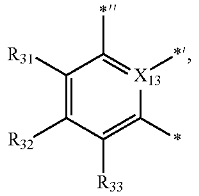

and wherein, in Formulae CY3(1) to CY3(8), $R_{31}$ to $R_{33}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —C(=O)($Q_1$), —S(=O)$_2$($Q_1$), or —P(=O)($Q_1$)($Q_2$), $X_{13}$, $R_{10a}$, and $Q_1$ to $Q_3$ are respectively as described in Formulae 1 and 1A, and

* , *', and *" each indicate a binding site to a neighboring atom.

17. The organometallic compound of claim 11, wherein a group represented by

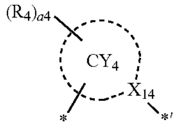

in Formula 1 is one of groups represented by Formulae CY4(1) to CY4(8):

CY4(1)

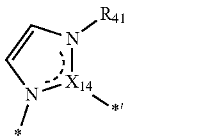

CY4(2)

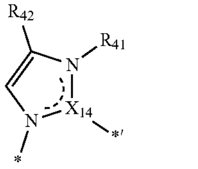

CY4(3)

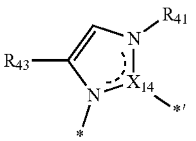

CY4(4)

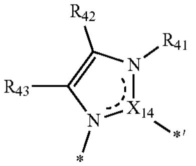

CY4(5)

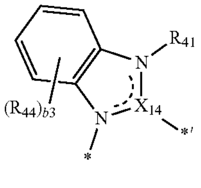

-continued

CY4(6)

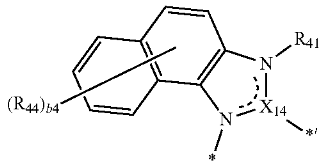

CY4(7)

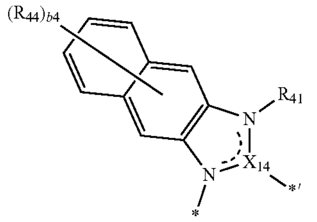

CY4(8)

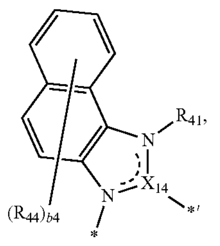

and wherein, in Formulae CY4(1) to CY4(8), $R_{41}$ to $R_{44}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —C(=O)($Q_1$), —S(=O)$_2$($Q_1$), or —P(=O)($Q_1$)($Q_2$), b3 is an integer from 0 to 4, b4 is an integer from 0 to 6, $X_{14}$, $R_{10a}$, and $Q_1$ to $Q_3$ are respectively as described in Formulae 1 and 1A, and

* and *' each indicate a binding site to a neighboring atom.

18. The organometallic compound of claim 11, wherein $L_1$ and $L_3$ are each a single bond, $L_2$ is *—C($R_{1a}$)($R_{1b}$)—*', *—C($R_{1a}$)=*', *=C($R_{1a}$)—*', *—C($R_{1a}$)=C($R_{1b}$)—*', *—C(=O)—*', *—C(=S)—*', *—C≡C—*', *—B($R_{1a}$)—*', *—O—*', *—P($R_{1a}$)—*', *—Si($R_{1a}$)($R_{1b}$)—*', *—P(=O)($R_{1a}$)—*', *—S—*', *—S(=O)—*', *—S(=O)$_2$—*', or *—Ge($R_{1a}$)($R_{1b}$)—*', and

* and *' each indicate a binding site to a neighboring atom.

19. The organometallic compound of claim 11, wherein the organometallic compound is selected from among Compounds 1 to 54:

-continued
1
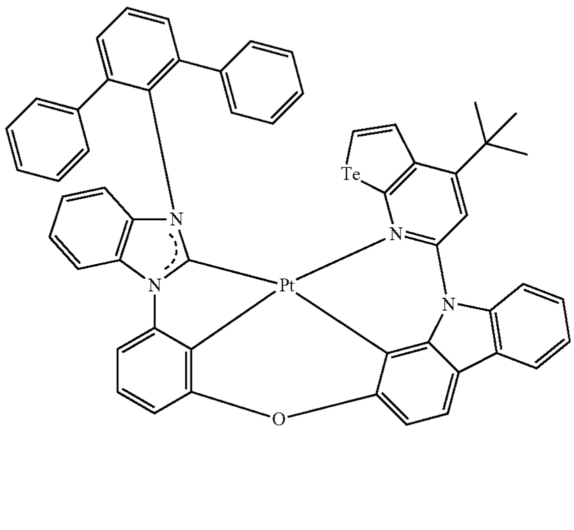
2
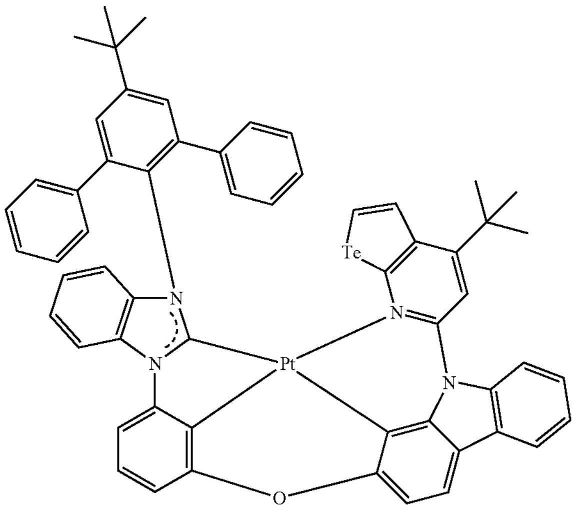
3
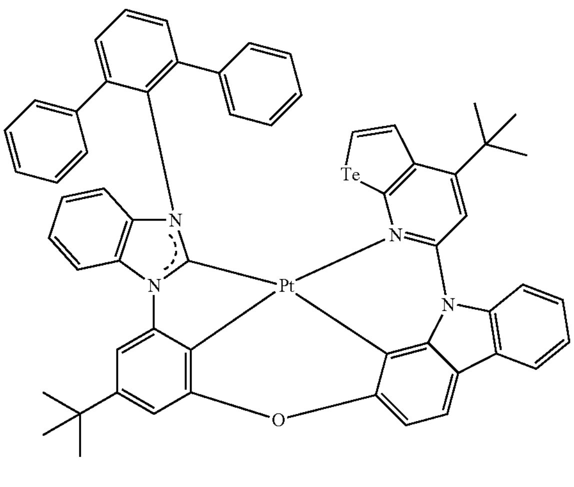
4
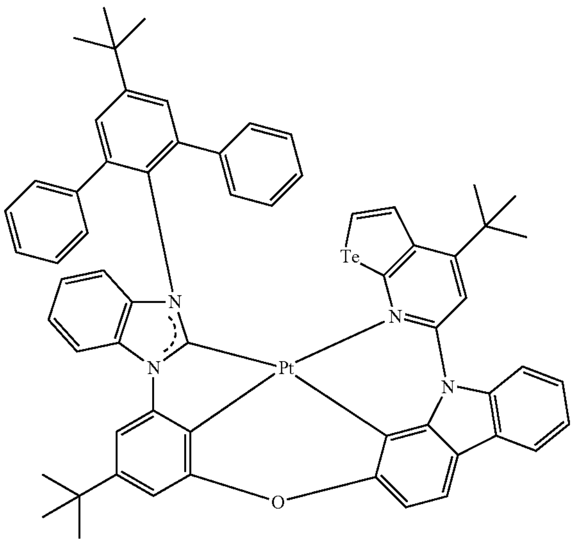
5
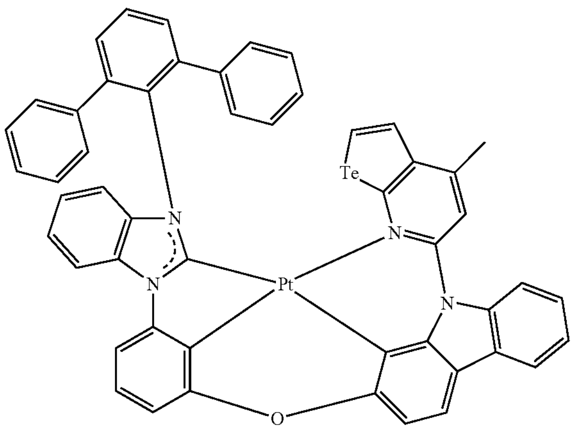
6
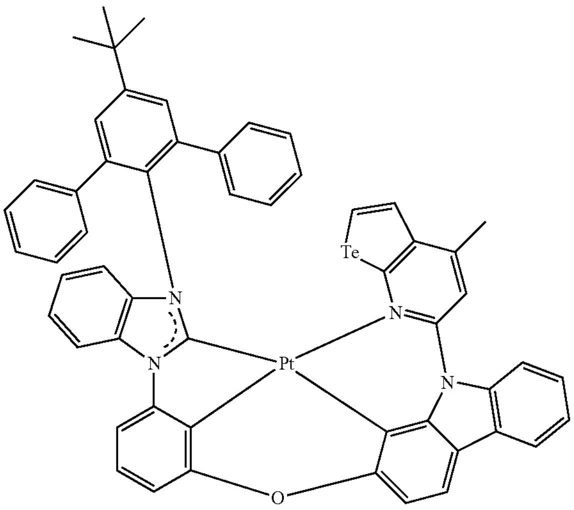

-continued
7
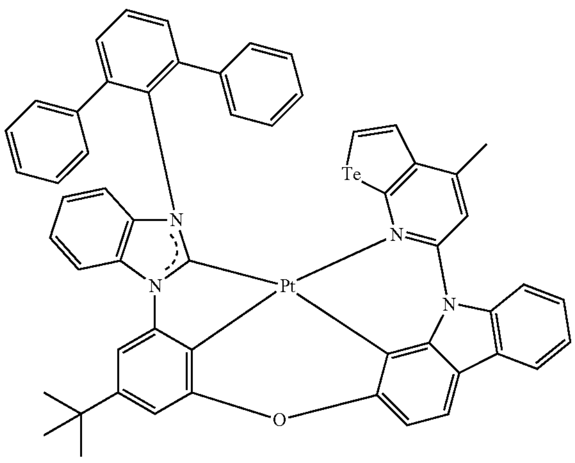
8
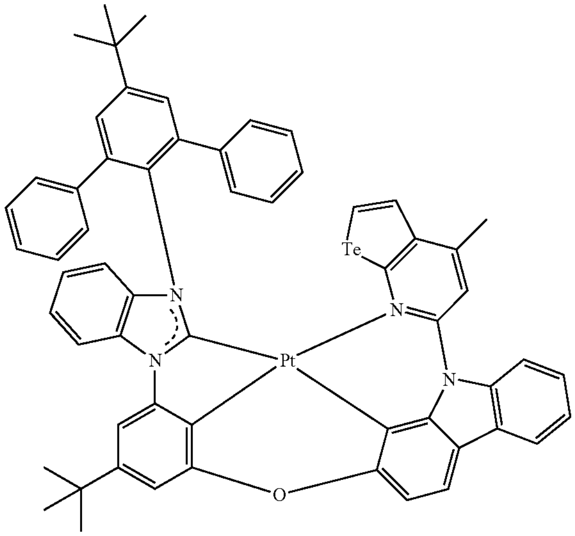
9
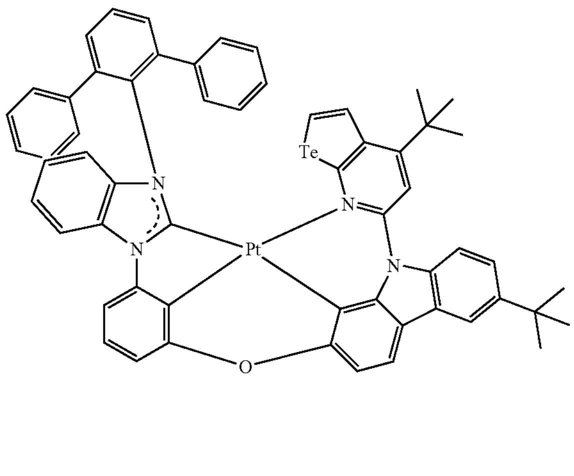
-continued
10
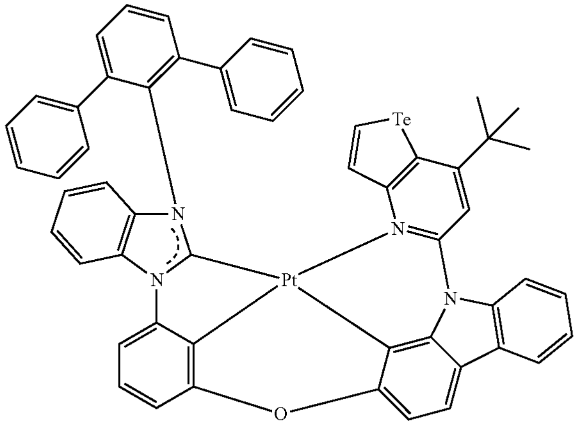
11
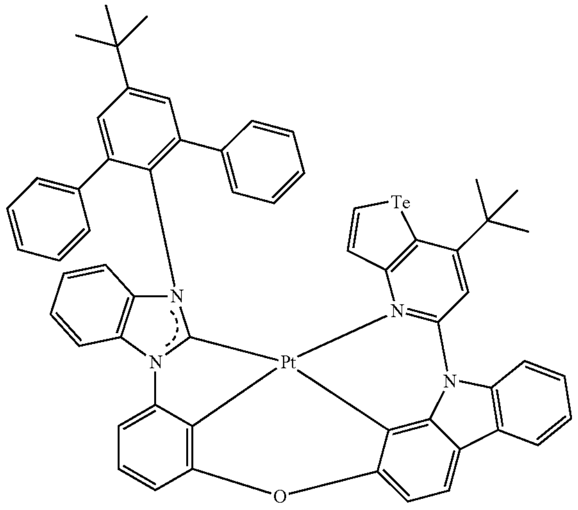
12
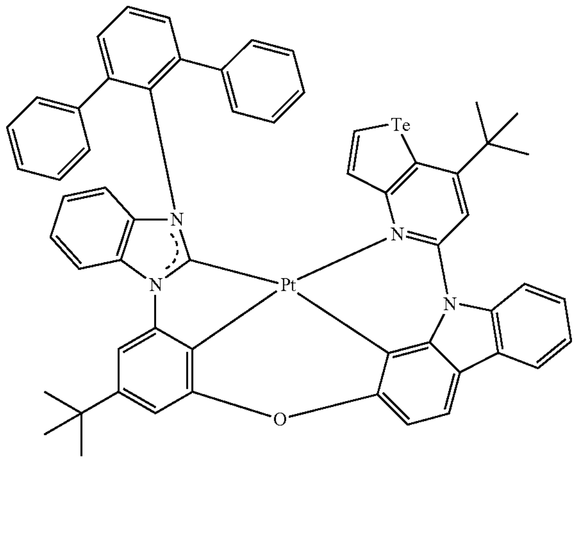

-continued
13
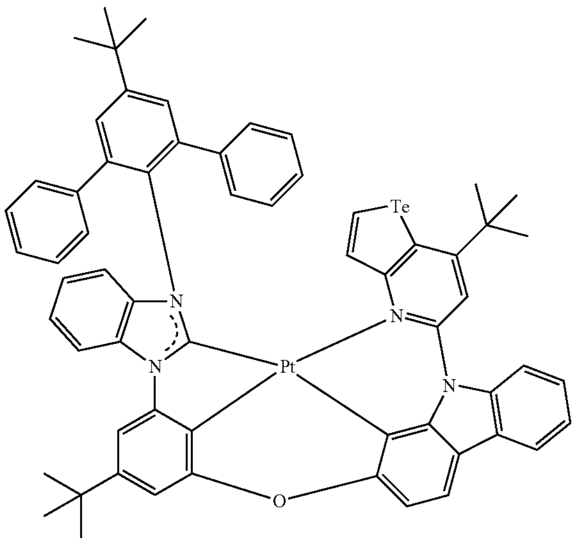
14
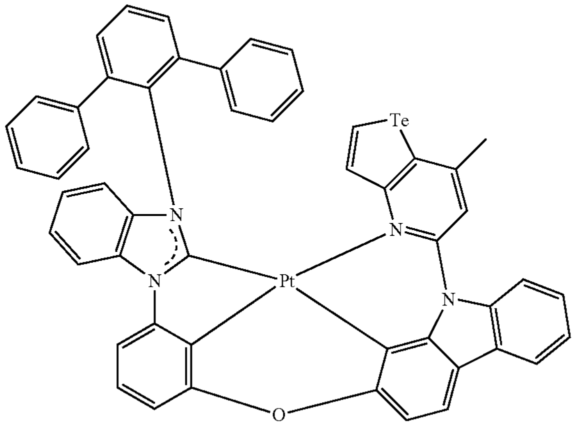
15
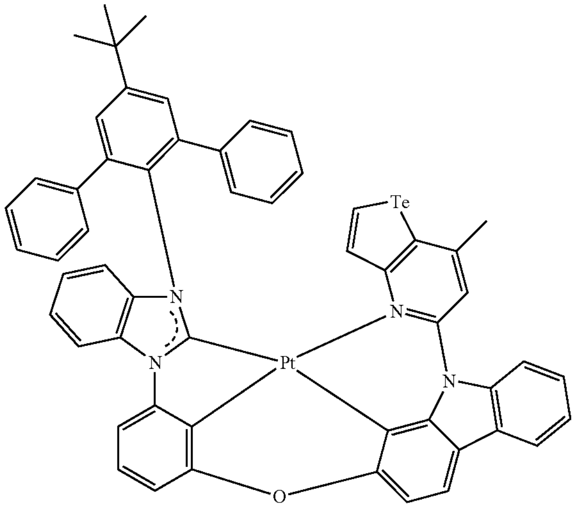
-continued
16
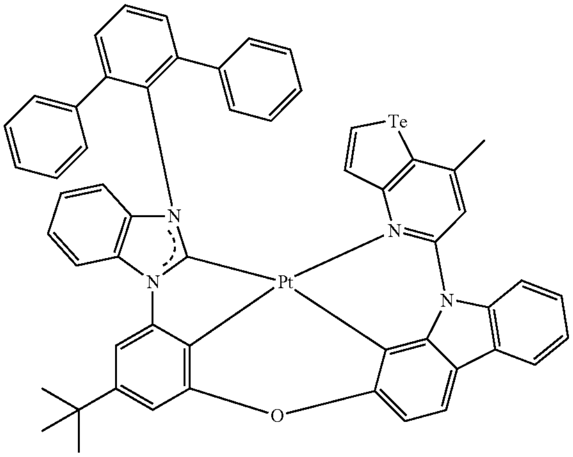
17
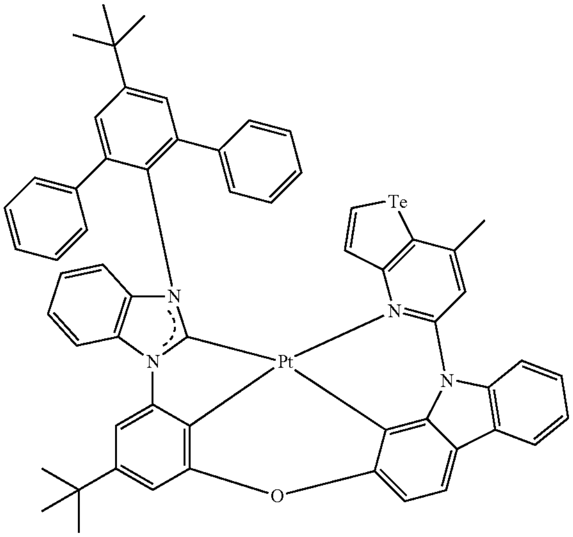
18
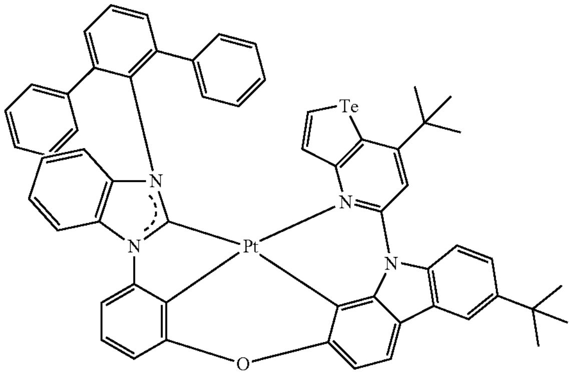

-continued
19
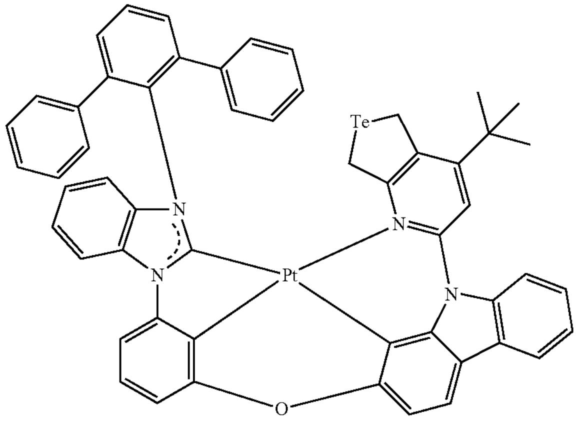
20
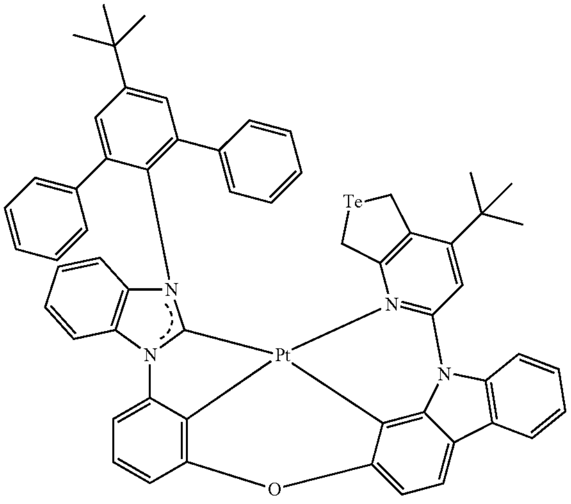
21
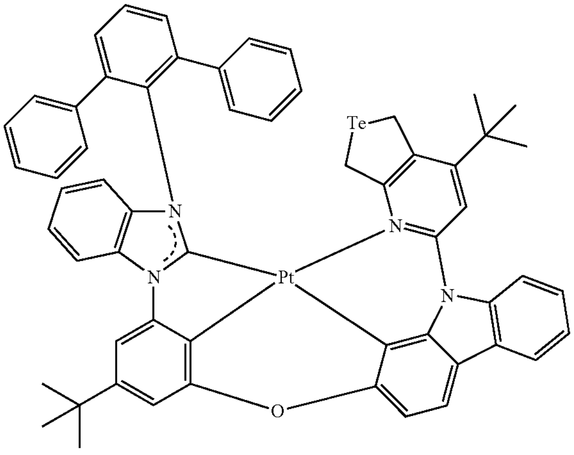
-continued
22
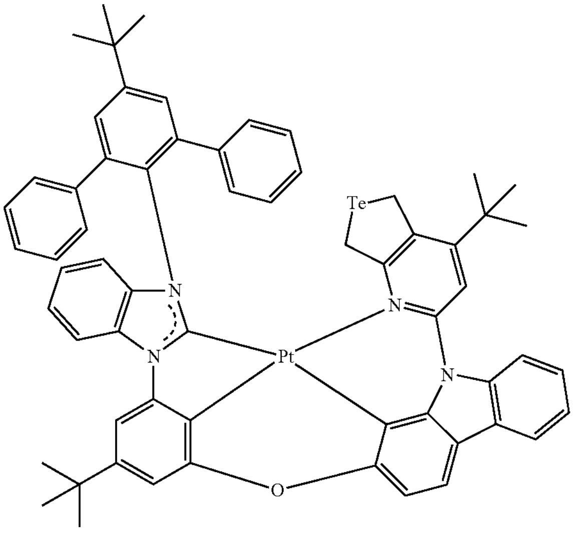
23
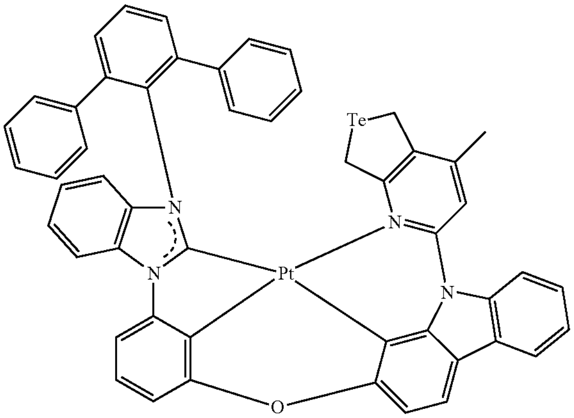
24
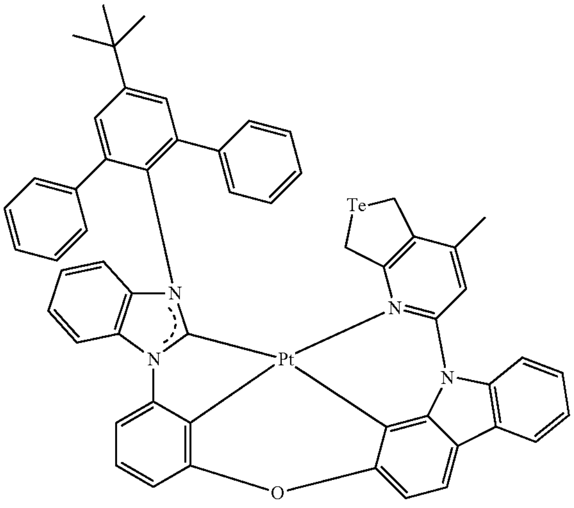

25
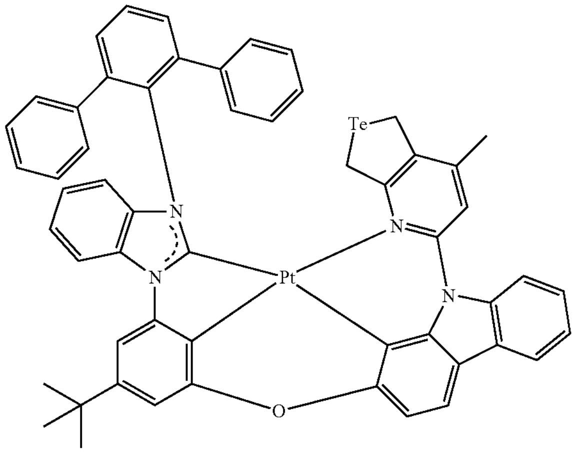
26
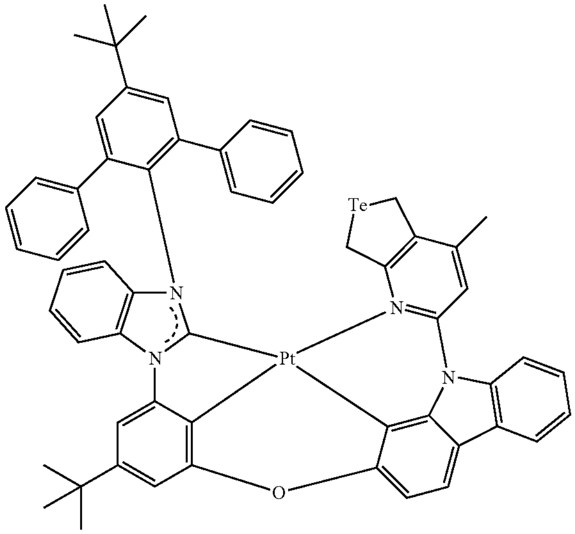
27
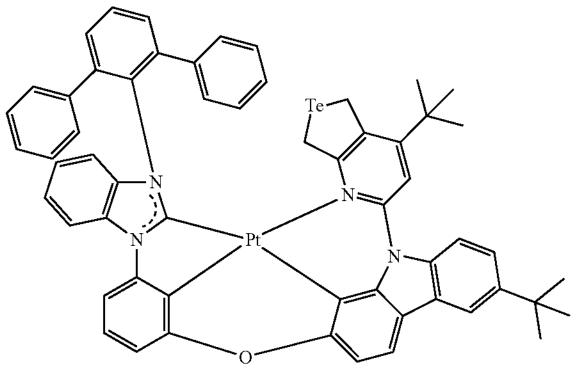
28
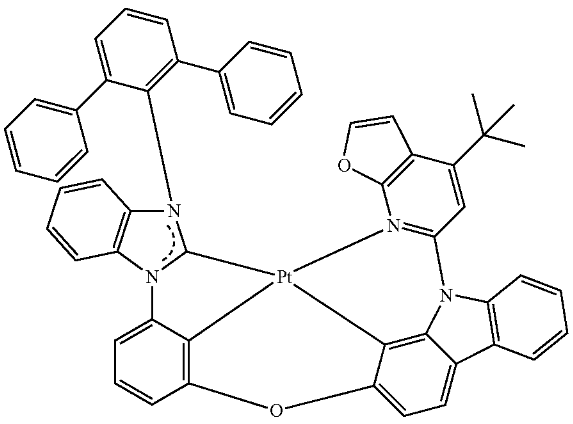
29
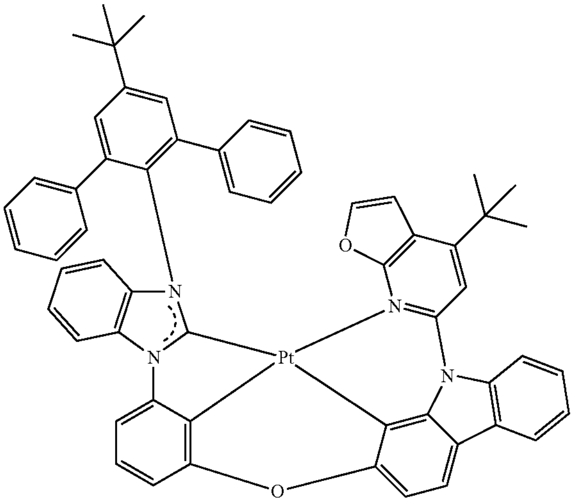
30
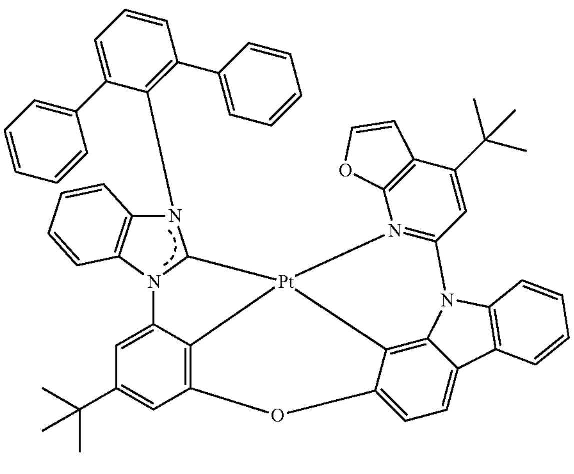

-continued
31
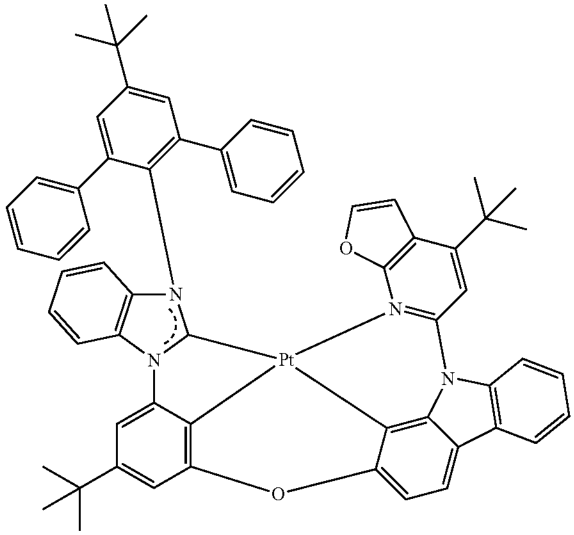
32
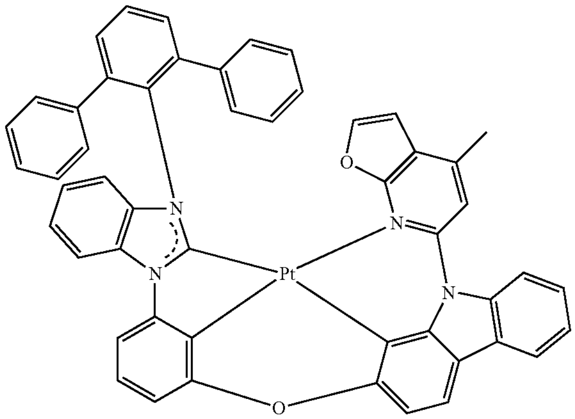
33
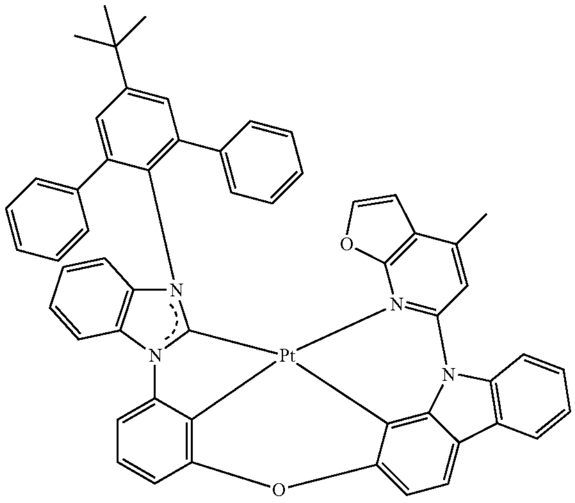
-continued
34
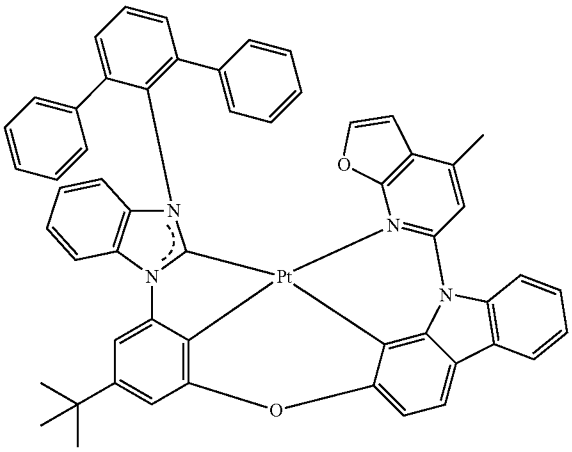
35
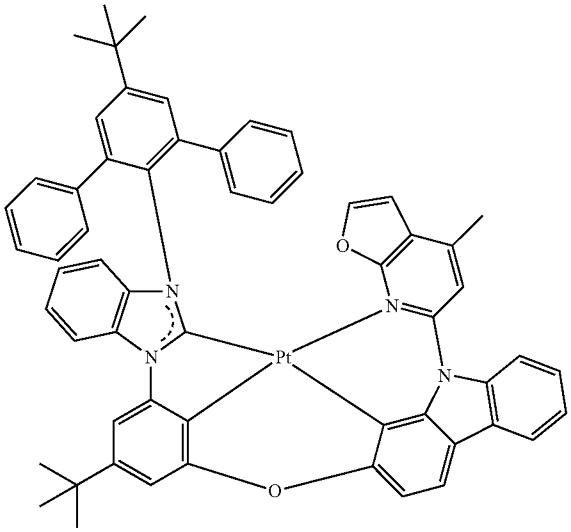
36
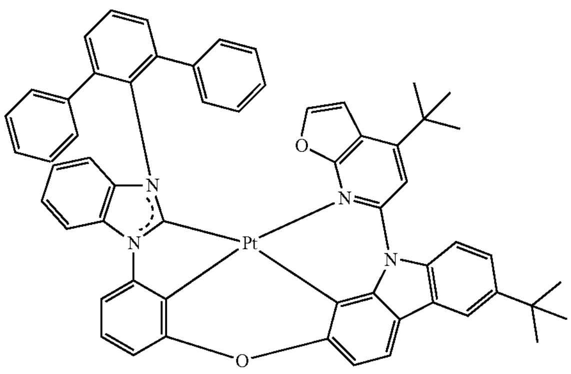

-continued
37
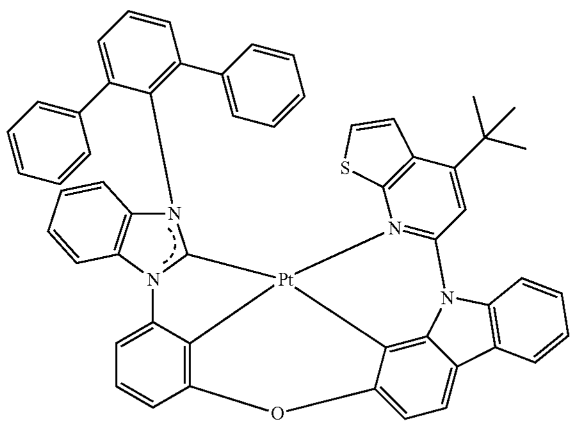
38
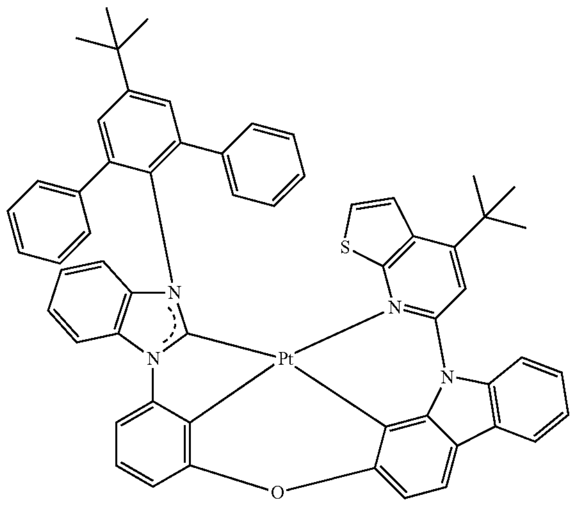
39
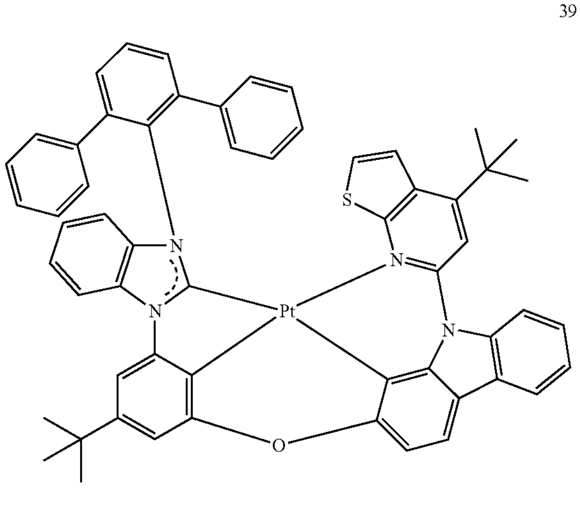
-continued
40
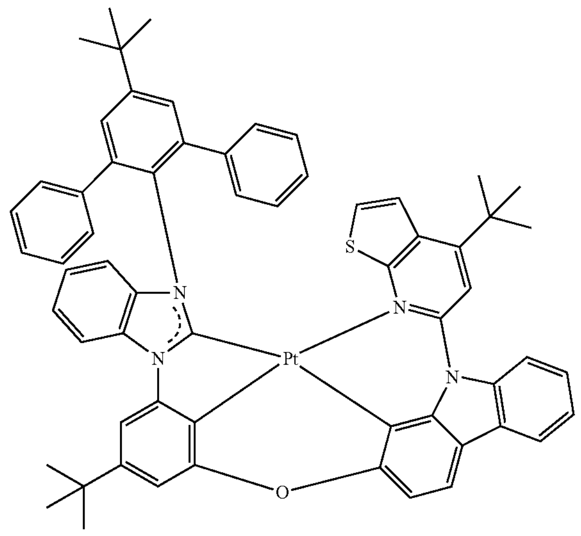
41
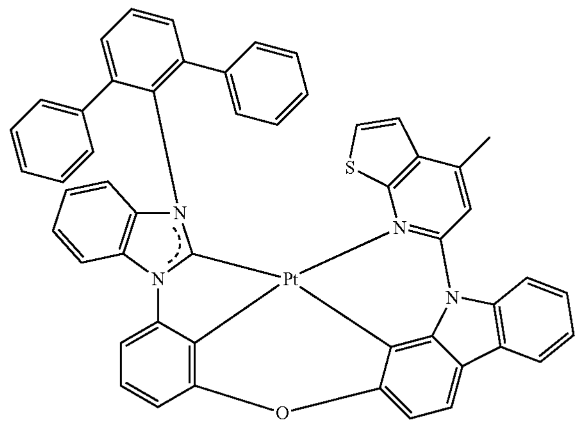
42
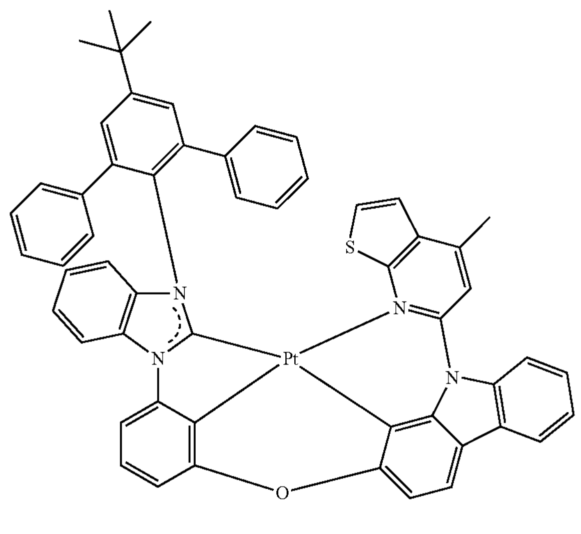

-continued
43
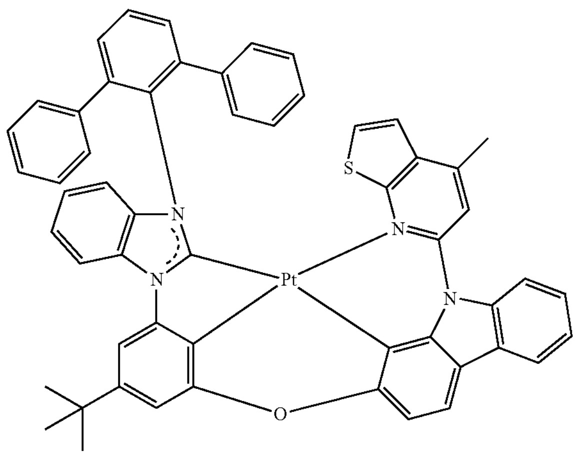
44
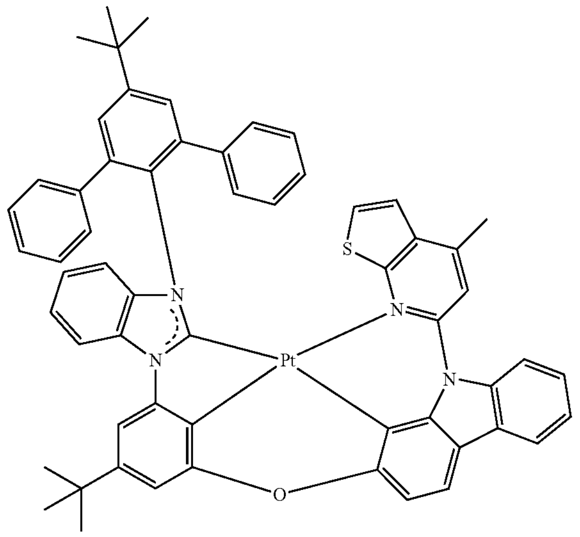
45
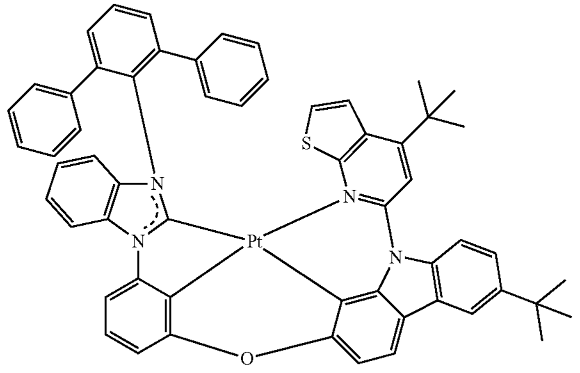
-continued
46
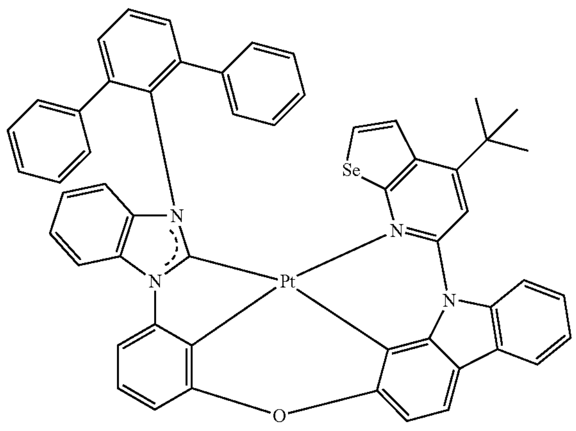
47
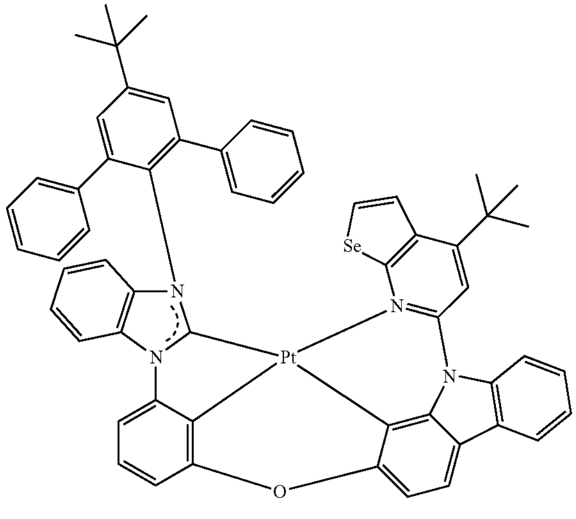
48
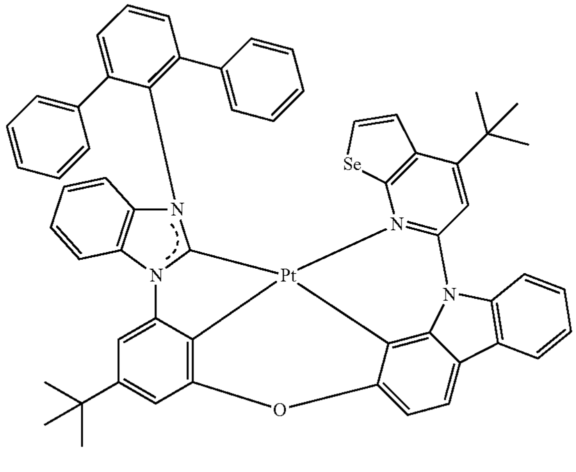

-continued
49
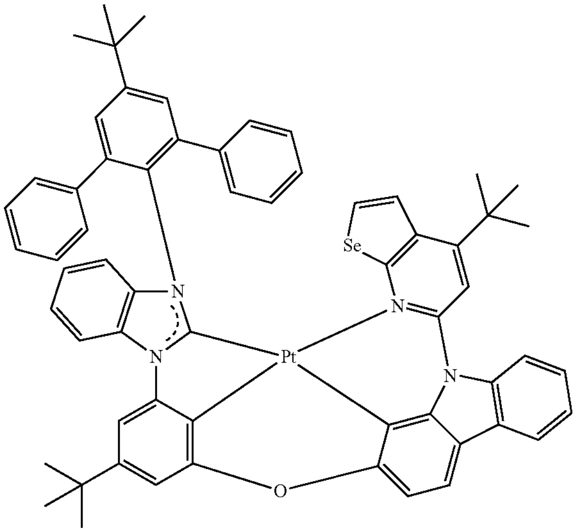
50
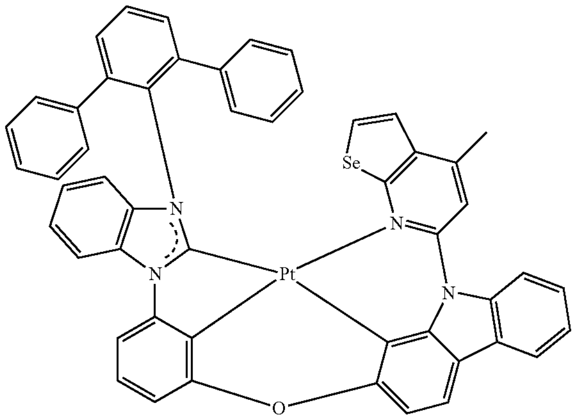
51
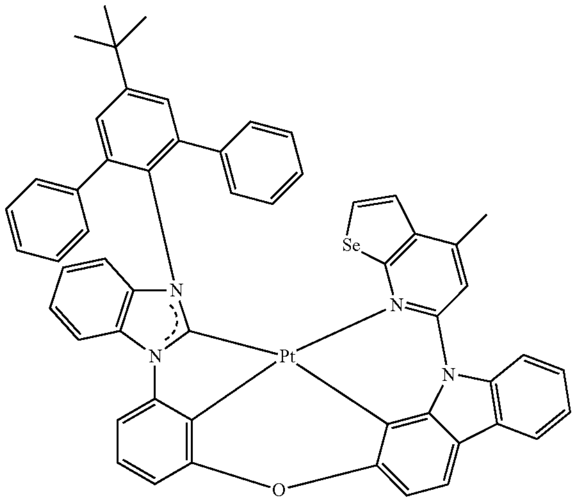
-continued
52
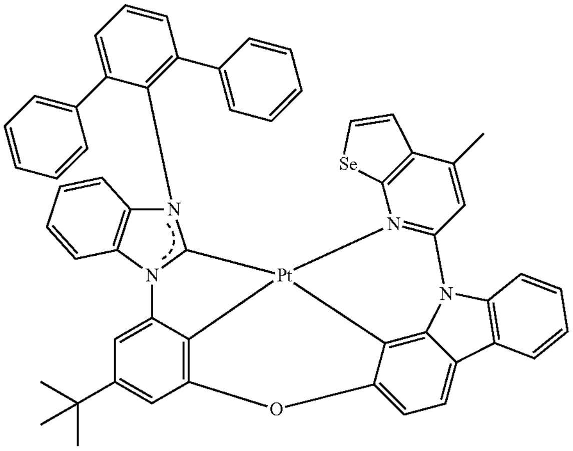
53
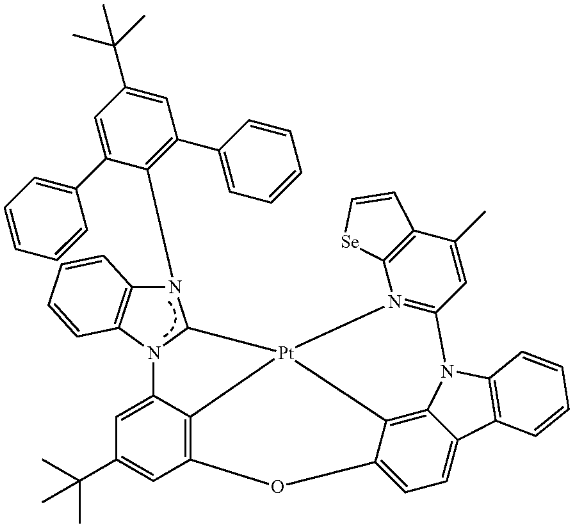
54
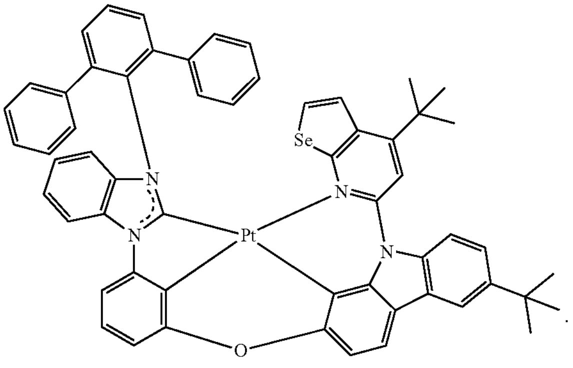
* * * * *